US012772512B2

(12) United States Patent
Lin

(10) Patent No.: US 12,772,512 B2
(45) Date of Patent: Oct. 20, 2026

(54) INTEGRATED CIRCUIT STRUCTURE AND MANUFACTURING METHOD THEREOF

(71) Applicant: TAIWAN SEMICONDUCTOR MANUFACTURING COMPANY, LTD., Hsinchu (TW)

(72) Inventor: Ta-Chun Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 709 days.

(21) Appl. No.: 18/188,234

(22) Filed: Mar. 22, 2023

(65) Prior Publication Data

US 2024/0105772 A1 Mar. 28, 2024

Related U.S. Application Data

(60) Provisional application No. 63/376,778, filed on Sep. 23, 2022.

(51) Int. Cl.

| | |
|---|---|
| ***H10D 62/10*** | (2025.01) |
| ***H10D 30/01*** | (2025.01) |
| ***H10D 30/43*** | (2025.01) |
| ***H10D 30/67*** | (2025.01) |
| ***H10D 64/01*** | (2025.01) |
| ***H10D 84/01*** | (2025.01) |

(Continued)

(52) U.S. Cl.

CPC ......... *H10D 62/121* (2025.01); *H10D 30/014* (2025.01); *H10D 30/43* (2025.01); *H10D 30/6735* (2025.01); *H10D 30/6757* (2025.01); *H10D 62/115* (2025.01); *H10D 64/017* (2025.01); *H10D 84/0151* (2025.01); *H10D 84/038* (2025.01); *H10D 84/85* (2025.01)

(58) Field of Classification Search

CPC .... H10D 62/121; H10D 30/014; H10D 30/43; H10D 30/6735; H10D 30/6757; H10D 84/0151; H10D 84/0188; H10D 84/0167; H10D 84/0128

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |

(Continued)

*Primary Examiner* — Tuan A Hoang

(74) *Attorney, Agent, or Firm* — Birch, Stewart, Kolasch & Birch, LLP

(57) ABSTRACT

A device includes a substrate, a first nanostructure device, a second nanostructure device, a dielectric fin, an isolation structure, and first and second dielectric gate structures. The substrate has a first device region, a second device region, and a connecting region. The first nanostructure device is over the first device region. The second nanostructure device is over the second device region. The dielectric fin is over the first device region and the connecting region and is in contact with a gate structure of the first nanostructure device. The isolation structure is over the second device region and is in contact with the second nanostructure device and the dielectric fin. The first dielectric gate structure is over the substrate and between the first device region and the connecting region. The second dielectric gate structure is over the substrate and between the second device region and the connecting region.

20 Claims, 87 Drawing Sheets

(51) Int. Cl.
*H10D 84/03* (2025.01)
*H10D 84/85* (2025.01)

(56) References Cited

U.S. PATENT DOCUMENTS

| | | | | |
|---|---|---|---|---|
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 10,069,015 | B2 * | 9/2018 | Cheng | H10D 30/6744 |
| 2017/0098709 | A1 * | 4/2017 | Dias | H03D 7/1425 |
| 2021/0210489 | A1 * | 7/2021 | Zhang | H10D 30/014 |

* cited by examiner

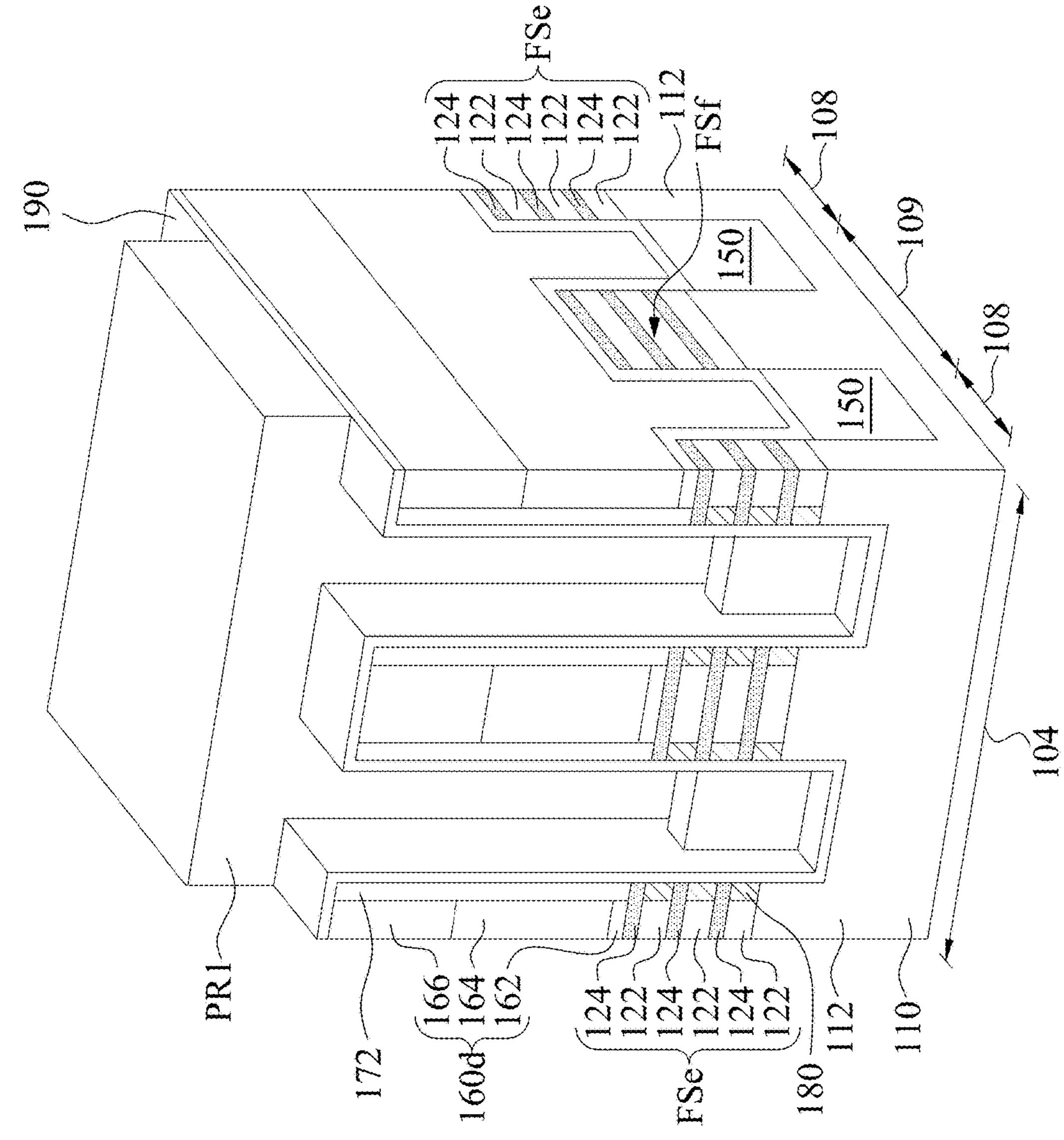
Fig. 11C
R
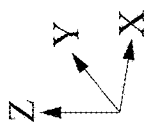

P

Q

P

INTEGRATED CIRCUIT STRUCTURE AND MANUFACTURING METHOD THEREOF

PRIORITY CLAIM AND CROSS-REFERENCE

This application claims priority to U.S. Provisional Application Ser. No. 63/376,778, filed Sep. 23, 2022, which is herein incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
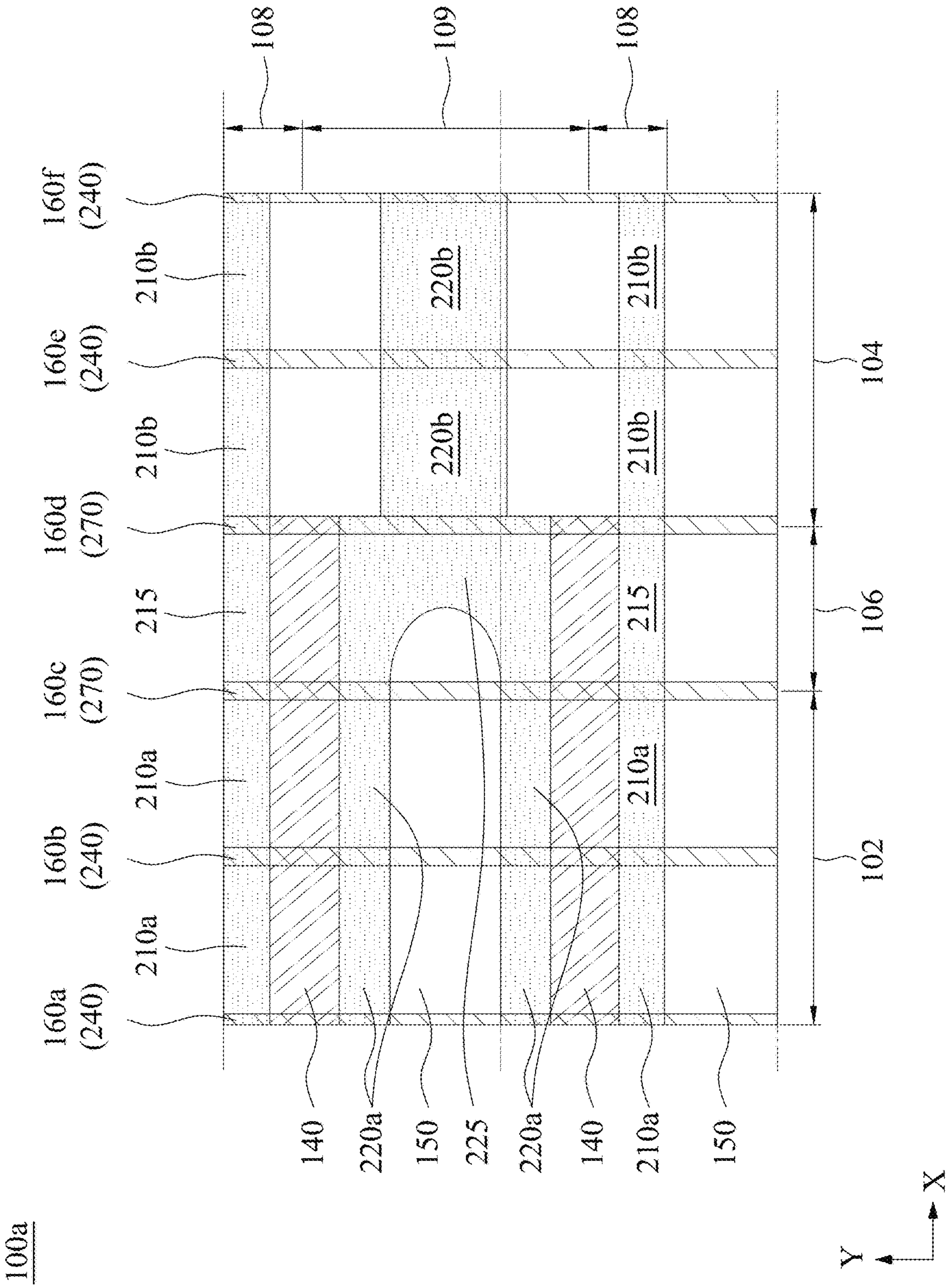
FIG. 1 is a layout diagram of an integrated circuit structure (or semiconductor device) in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath”, “below”, “lower”, “above”, “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, “around”, “about”, “approximately”, or “substantially” shall generally mean within 20 percent, or within 10 percent, or within 5 percent of a given value or range. Numerical quantities given herein are approximate, meaning that the term “around”, “about”, “approximately”, or “substantially” can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

As used herein, the term “etch selectivity” refers to the ratio of the etch rates of two different materials under the same etching conditions. As used herein, the term “high-k” refers to a high dielectric constant. In the field of semiconductor device structures and manufacturing processes, high-k refers to a dielectric constant that is greater than the dielectric constant of $SiO_2$ (e.g., greater than 3.9). As used herein, the term “low-k” refers to a low dielectric constant. In the field of semiconductor device structures and manufacturing processes, low-k refers to a dielectric constant that is less than the dielectric constant of $SiO_2$ (e.g., less than 3.9). As used herein, the term “p-type” defines a structure, layer, and/or region as being doped with p-type dopants, such as boron. As used herein, the term “n-type” defines a structure, layer, and/or region as being doped with n-type dopants, such as phosphorus. As used herein, the term “conductive” refers to an electrically conductive structure, layer, and/or region.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to integrated circuit structures and methods of forming the same. More particularly, some embodiments of the present disclosure are related to semiconductor devices including fork-sheet devices and nanosheet devices.

FIG. 1 is a layout diagram of an integrated circuit structure (or semiconductor device) **100*a* in accordance with some embodiments of the present disclosure. FIGS. 2-21F illustrate perspective views and cross-sectional views of intermediate stages in the formation of the integrated circuit structure (or the semiconductor device) 100*a* in accordance with some embodiments of the present disclosure. In addition to the integrated circuit structure, FIGS. 2, 3A, 4-9A, 9C, 9E, 10A-12A, 12C, 12E, 13A-14A, 14C, 14E, 15**A-

16A, 16C-17A, 17C-18A, 18C-19A, 19C-21A, 21C, and 21E depict X-axis, Y-axis, and Z-axis directions. Throughout the various views and illustrative embodiments, like reference numbers are used to designate like elements. It is understood that additional operations can be provided before, during, and after the processes shown by FIGS. 2-21F, and some of the operations described below can be replaced or eliminated, for additional embodiments of the method. The order of the operations/processes may be interchangeable.

FIGS. 2, 3A, 4-9A, 9C, 9E, 10A-12A, 12C, 12E, 13A-14A, 14C, 14E, 15A-16A, 16C-17A, 17C-18A, 18C-19A, 19C-21A, 21C, and 21E are perspective views of some embodiments of the semiconductor device 100*a* at intermediate stages during fabrication. Specifically, FIGS. 5A, 6A, 7A, 8A, 9A, 10A, 11A, 12A, 13A, 14A, 15A, 16A, 17A, 18A, 19A, 20A, and 21A are perspective views of area P illustrated in FIG. 4 at intermediate stages during fabrication, FIGS. 5B, 6B, 7B, 8B, 9C, 10B, 11B, 12C, 13B, 14C, 15B, 16C, 17C, 18C, 19C, 20B, and 21C are perspective views of area Q illustrated in FIG. 4 at intermediate stages during fabrication, and FIGS. 5C, 6C, 7C, 8C, 9E, 10C, 11C, 12E, 13C, 14E, 15C, 16D, 17D, 18D, 19D, 20C, and 21E are perspective views of area R illustrated in FIG. 4 at intermediate stages during fabrication. FIGS. 3B, 9B, 12B, 14B, and 21B are cross-sectional views of some embodiments of the semiconductor device 100*a* at intermediate stages during fabrication along a first cut (e.g., cut I'-I' or I-I). FIGS. 3C, 9D, 12D, 14D, and 21D are cross-sectional views of some embodiments of the semiconductor device 100*a* at intermediate stages during fabrication along a second cut (e.g., cut II-II). FIGS. 3D, 9F, 12F, 14F, and 21F are cross-sectional views of some embodiments of the semiconductor device 100*a* at intermediate stages during fabrication along a third cut (e.g., cut III-III). FIGS. 16B, 17B, 18B, and 19B are cross-sectional views of some embodiments of the semiconductor device 100*a* at intermediate stages during fabrication along a fourth cut (e.g., cut IV-IV).

Figure 2:
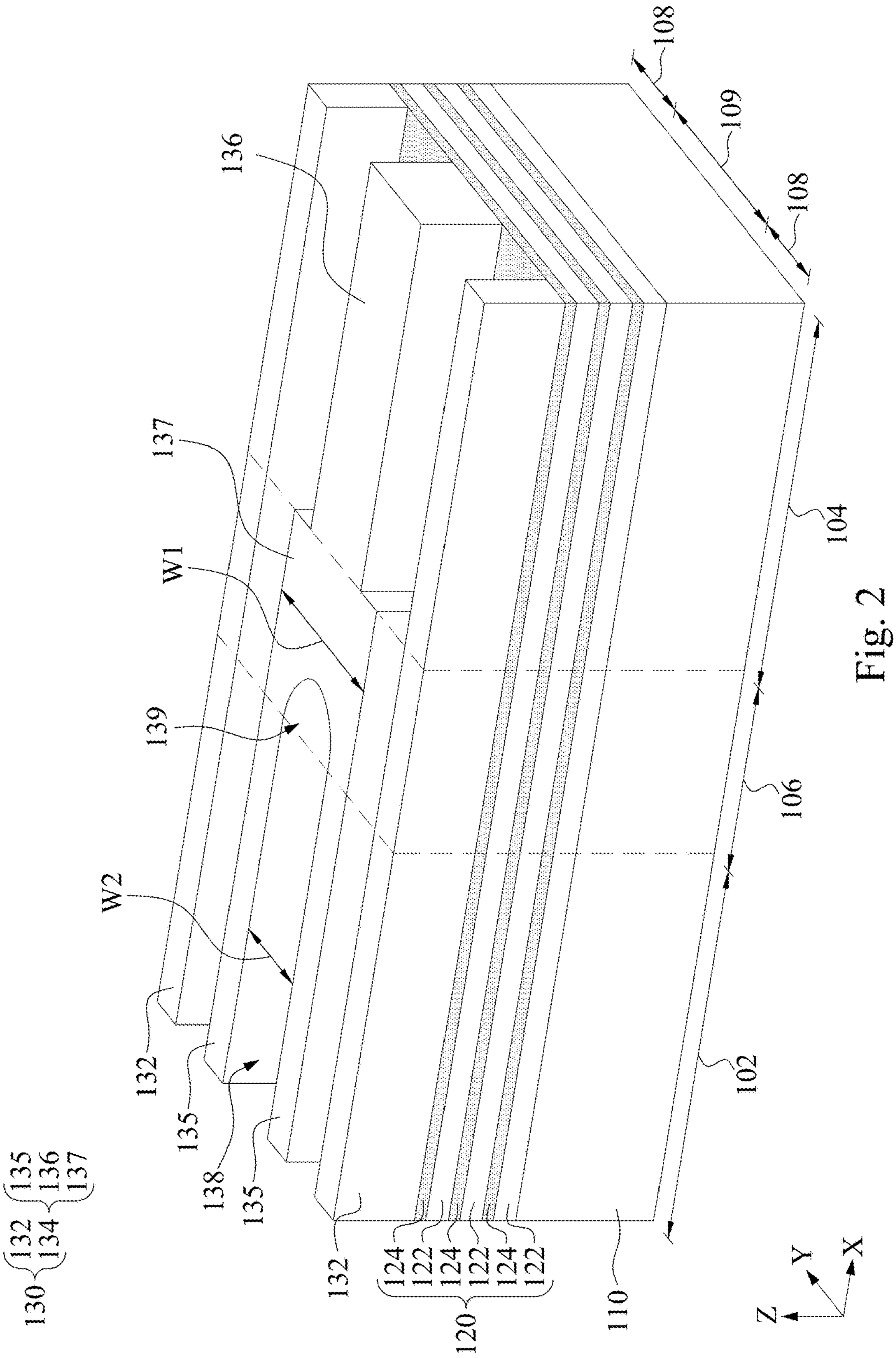
FIGS. 2-21F illustrate perspective views and cross-sectional views of intermediate stages in the formation of the integrated circuit structure (or the semiconductor device) in accordance with some embodiments of the present disclosure.

Reference is made to FIGS. 1 and 2. A substrate 110 is provided. In some embodiments, the substrate 110 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 110 may include an epitaxial layer (epi-layer), which may be strained for performance enhancement, and/or may include a silicon-on-insulator (SOI) structure.

The substrate 110 has a first device region 102, a second device region 104, and a connecting region 106 between the first device region 102 and the second device region 104. That is, the first device region 102, the connecting region 106, and the second device region 104 are sequentially arranged in the X direction. The first device region 102 is a region in which first transistors (or first nanostructure devices) will reside, and the second device region 104 is a region in which second transistors (or second nanostructure devices) will reside. In some embodiments, the first transistors are different from the second transistors at least in the device size. For example, first transistors in the first device region 102 may be denser than the second transistors in the second device region 104. The first transistors in the first device region 102 may be applied to some regions of a (e.g., logic) circuit with low current, while the second transistors in the second device region 104 may be applied to some other regions of the circuit with high current (and high computing speed). In some other embodiments, the first transistors are different from the second transistors at least in the structures of transistors. For example, the first transistors may be fork-sheet transistors, and the second transistors may be nanosheet transistors.

The first device region 102 is connected to the second device region 104 via the connecting region 106, and any number of device features (e.g., other active devices, doped regions, isolation structures, etc.) may be disposed in the first device region 102 and the second device region 104. By contrary, none transistor device or some dummy devices is/are disposed in the connecting region 106.

Each of the first device region 102, the second device region 104, and the connecting region 106 includes at least one N-type region 108 and at least one P-type region 109. The N-type region 108 is a region in which N-type transistors will reside, and the P-type region 109 is a region in which P-type transistors will reside.

A semiconductor stack 120 is formed on the substrate 110 through epitaxy, such that the semiconductor stack 120 forms crystalline layers. The semiconductor stack 120 includes semiconductor layers 122 and 124 stacked alternately. There may be two, three, four, or more of the semiconductor layers 122 and 124. The semiconductor layers 122 may be SiGe layers. The semiconductor layers 124 may be pure silicon layers that are free from germanium. The semiconductor layers 124 may also be substantially pure silicon layers, for example, with a germanium percentage lower than about 1 percent. Furthermore, the semiconductor layers 124 may be intrinsic, which are not doped with p-type and n-type impurities. In some other embodiments, however, the semiconductor layers 124 can be silicon germanium or germanium for p-type semiconductor device, or can be III-V materials, such as InAs, InGaAs, InGaAsSb, GaAs, InPSb, or other suitable materials.

The semiconductor layers 124 or portions thereof may form nanostructure channel(s) of nanostructure transistor. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. For example, the nanostructures are fork-sheets, nanosheets, nanowires, nanoslabs, or nanorings, depending on their geometry. The use of the semiconductor layers 124 to define a channel or channels of the semiconductor device is further discussed below.

As described above, the semiconductor layers 124 may serve as channel region(s) for a subsequently-formed semiconductor device and the thickness is chosen based on device performance considerations. The semiconductor layers 122 in channel regions(s) may eventually be removed and serve to define a vertical distance between adjacent channel region(s) for a subsequently-formed multi-gate device and the thickness is chosen based on device performance considerations. Accordingly, the semiconductor layers 122 may also be referred to as sacrificial layers, and the semiconductor layers 124 may also be referred to as channel layers.

A patterned hard mask 130 is formed over the semiconductor stack 120. The patterned hard mask 130 covers portions of the semiconductor stack 120 while leave another portions of the semiconductor stack 120 uncovered. In some examples, the patterned hard mask 130 is deposited on the semiconductor stack 120 by thermally grown process, chemical vapor deposition (CVD) process, and/or atomic layer deposition (ALD) process.

In FIG. 2, the patterned hard mask 130 includes first hard masks 132 and a second hard mask 134. The first hard masks 132 are respectively disposed on the N-type regions 108 to define N-type active regions thereon, and the second hard mask 134 is disposed on the P-type region 109 to define P-type active regions thereon. As shown in FIG. 2, the second hard mask 134 includes two first portions 135 over the first device region 102, a second portion 136 over the second device region 104, and a third portion 137 over the connecting portion 106.

An opening 138 is defined by the two first portions 135. A width W1 (in the Y direction) of the third portion 137 is greater than a width W2 (in the Y direction) of the opening 138. During the patterning of the hard mask, a concave region 139 is formed at a corner of the opening 138 due to the lithography process. The concave region 139 penetrates into the third portion 137. However, since the third portion 137 has the width W1 greater than the width W2 of the opening 138, the third portion 137 is still connected to the first portions 135 and the second portion 136 even the concave region 139 exists. That is, the second hard mask 134 is integrally formed and is a continuous material.

Reference is made to FIGS. 1 and 3A-3D. The semiconductor stack 120 and the substrate 110 of FIG. 2 are patterned using the patterned hard mask 130 as etching masks to form trenches Ta, Tb, Tc, and Td. Accordingly, a plurality of fin structures (or semiconductor strips or active regions) FSa-FSf are formed. The trenches Ta-Td extend into the substrate 110 and have lengthwise directions substantially parallel to each other. The trenches Ta-Td form protrusion structures 112 in the substrate 110, where the protrusion structures 112 protrude from the substrate 110, and the fin structures FSa-FSf are respectively formed above the protrusion structures 112 of the substrate 110. The remaining portions of the semiconductor stack 120 are accordingly referred to as the fin structures FSa-FSf alternatively.

Figure 3A:
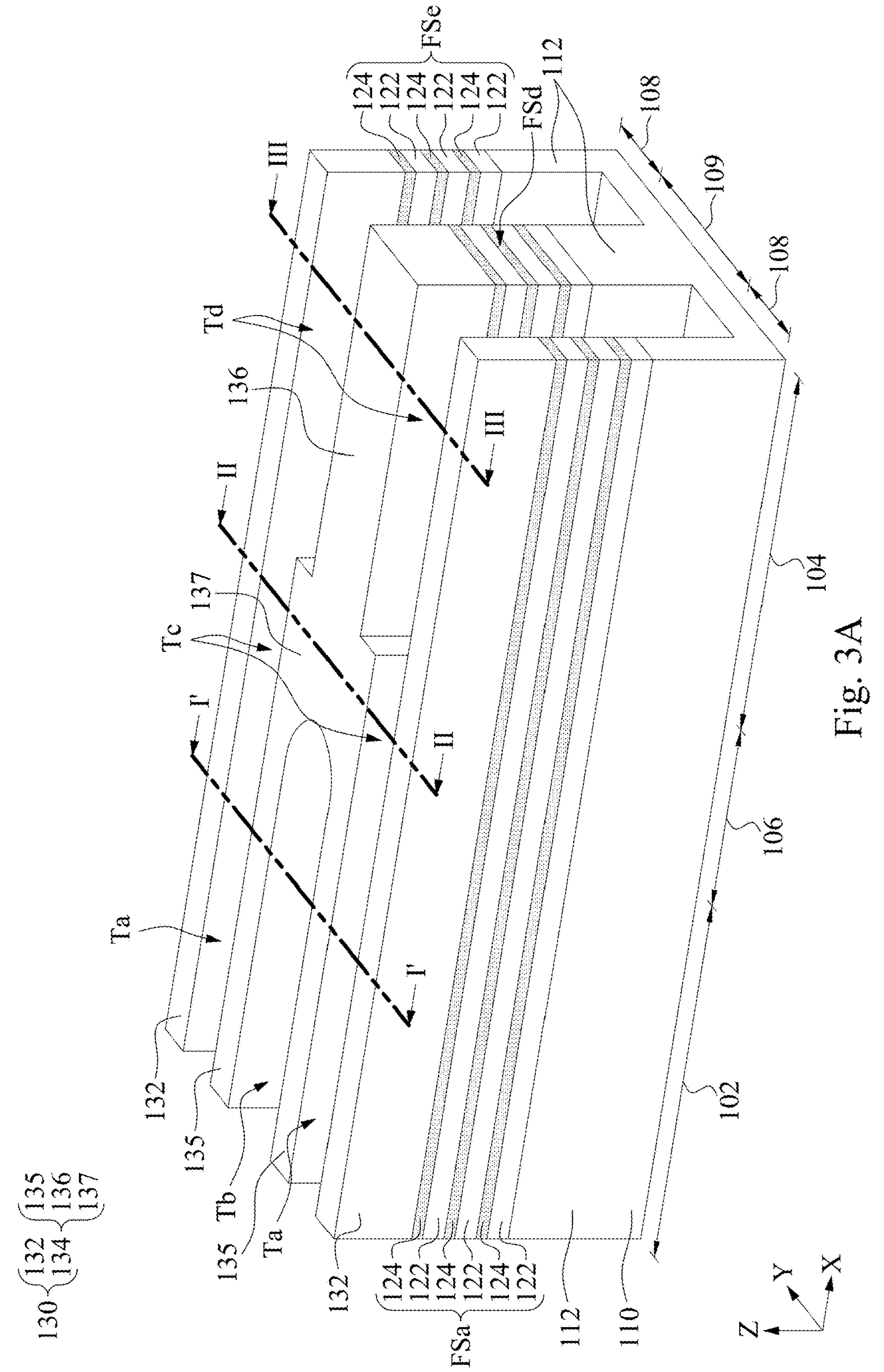
Figure 3C:
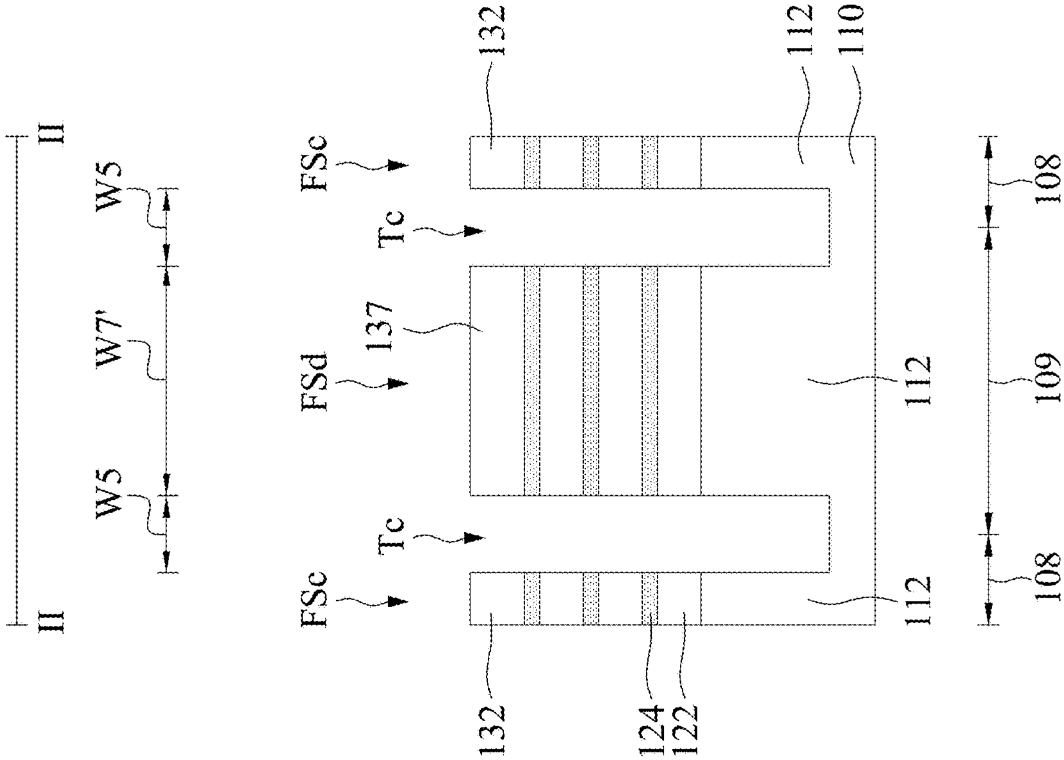
Figure 3B:
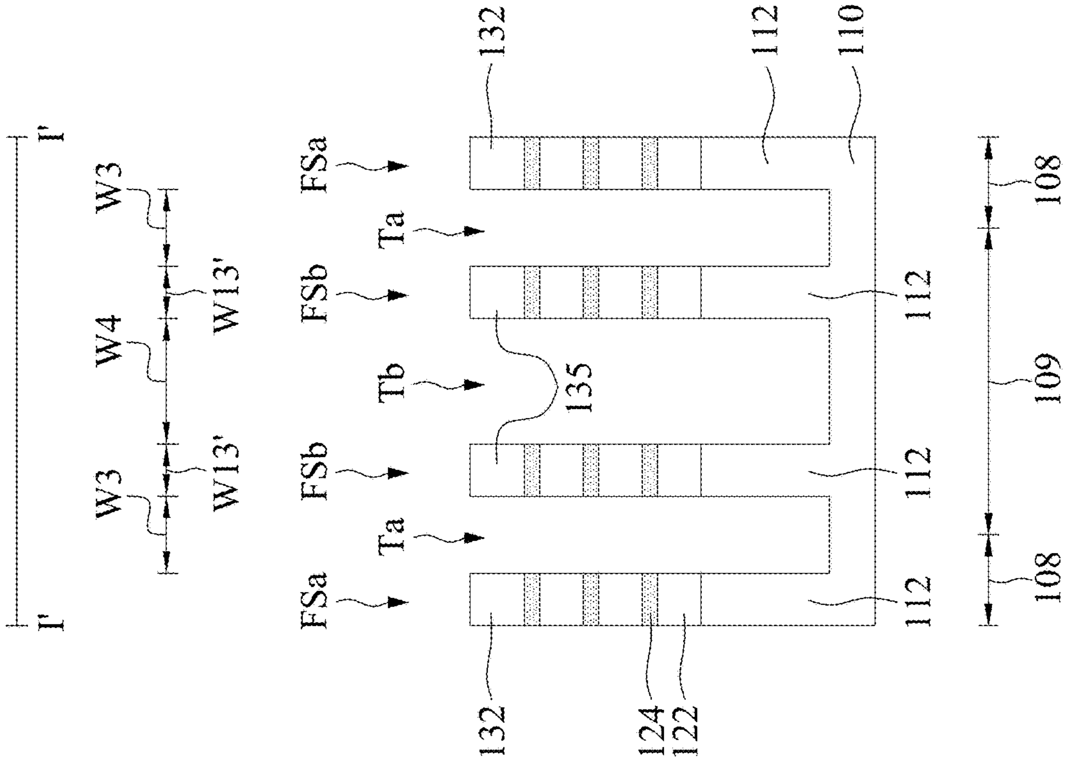
Figure 3D:
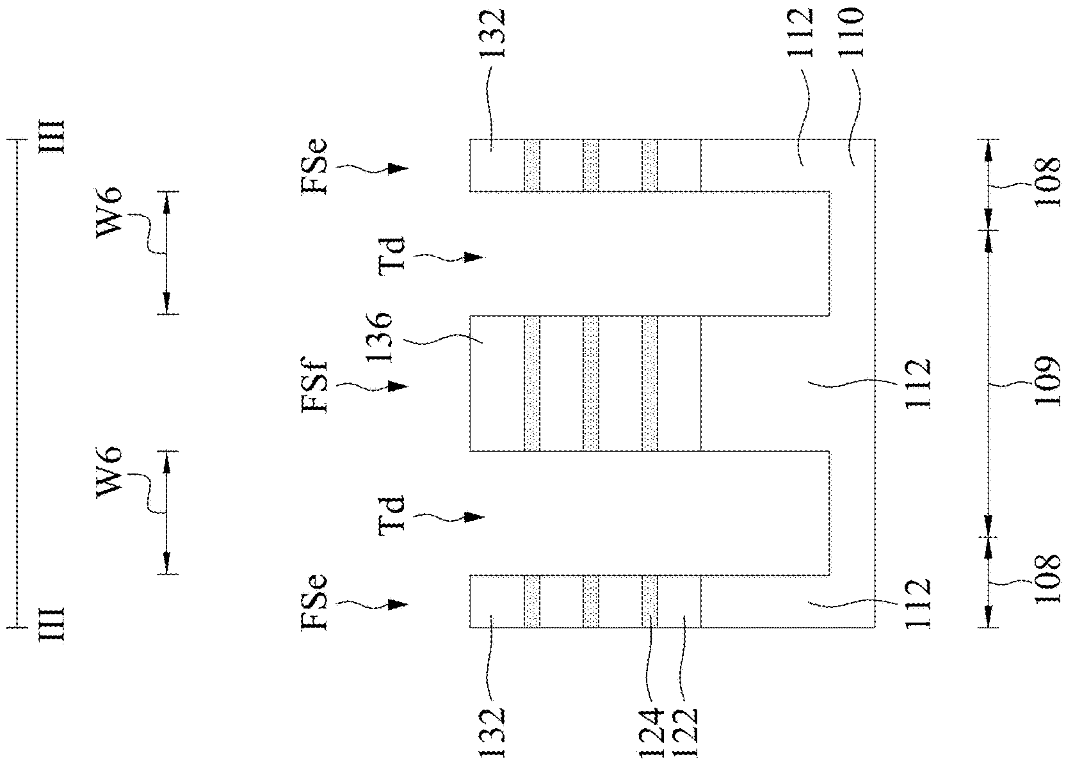

The fin structures FSa, FSc, and FSe are patterned by using the first hard masks 132 as etching masks, and the fin structures FSb, FSd, and FSf are patterned by using the second hard mask 134 as the etching mask. As shown in FIGS. 3A and 3B, the fin structures FSa and FSb are formed over the first device region 102. Specifically, the fin structures FSa are formed over the N-type regions 108, respectively, and the fin structures FSb are formed over the P-type region 109. As shown in FIGS. 3A and 3C, the fin structures FSc and FSd are formed over the connecting region 106. Specifically, the fin structures FSc are formed over the N-type regions 108, respectively, and the fin structure FSd is formed over the P-type region 109. As shown in FIGS. 3A and 3D, the fin structures FSe and FSf are formed over the second device region 104. Specifically, the fin structures FSe are formed over the N-type regions 108, respectively, and the fin structure FSf is formed over the P-type region 109. The fin structure FSc interconnects the fin structures FSa and FSe, and the fin structure FSd interconnects the fin structures FSb and FSf. Further, as shown in FIG. 3A, the fin structures FSb are offset from the fin structure FSf.

In FIGS. 3A and 3B, the trenches Ta are defined by the adjacent fin structures FSa and FSb and each of the trenches Ta has a width W3 in the Y direction; the trench Tb is defined by the adjacent fin structures FSb and the trench Tb has a width W4 in the Y direction. The width W4 is greater than the width W3. Further, each of the fin structures FSb has a width W13'. In FIGS. 3A and 3C, the trenches Tc are defined by the adjacent fin structures FSc and FSd and each of the trenches Tc has a width W5 in the Y direction. The width W5 is substantially the same as the width W3 (see FIG. 3B). Further, the fin structure FSd has a width W7' greater than the width W13'. For example, the width W7' is about 1.2 times to about 5 times the width W13'. In FIG. 3D, the trenches Td are defined by the adjacent fin structures FSe and FSf and each of the trenches Td has a width W6 in the Y direction. The width W6 is greater than the width W3 (see FIG. 3B).

Figure 4:
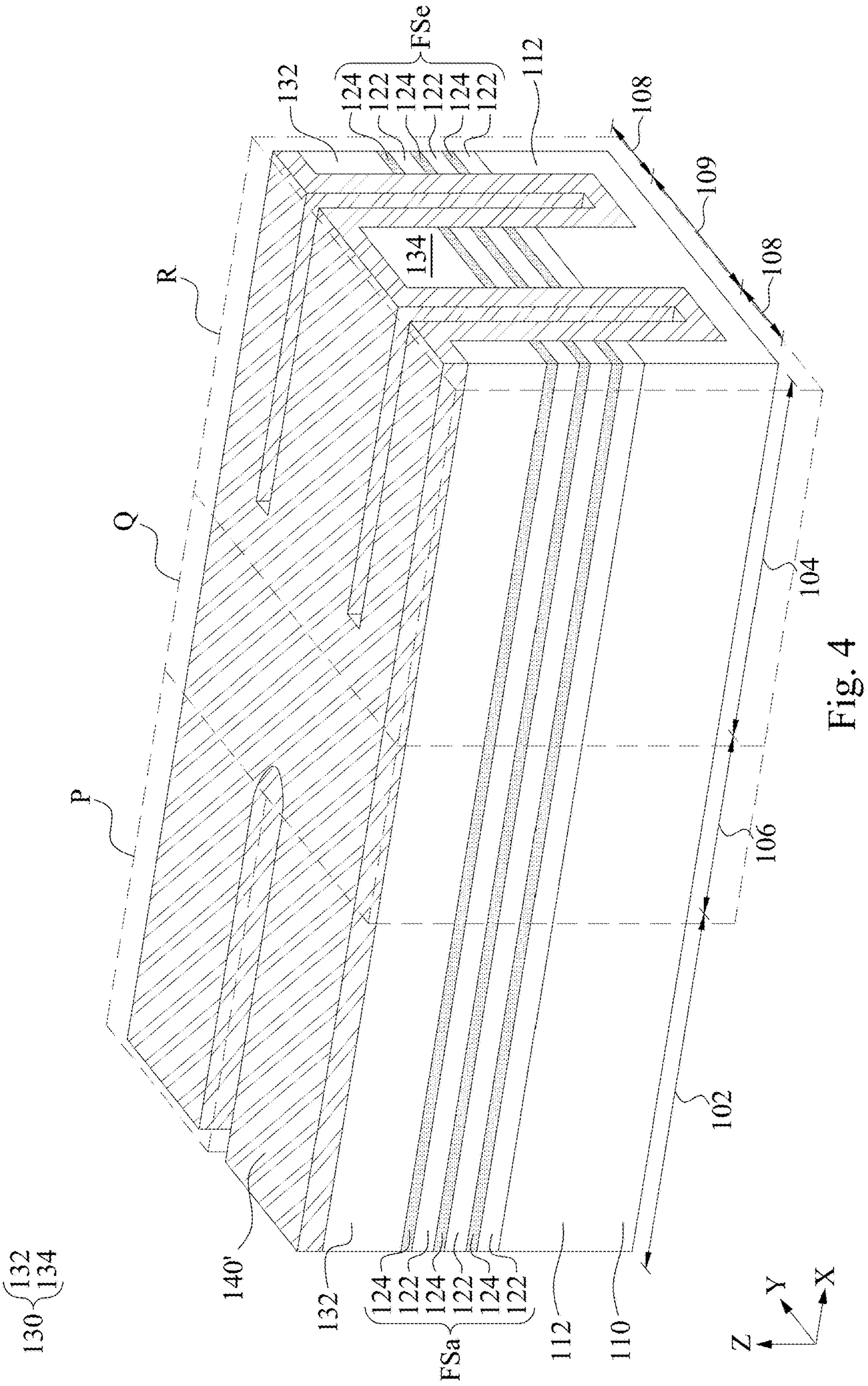

Reference is made to FIGS. 1 and 4. A dielectric film 140' is formed on the fin structures FSa-FSf (see FIGS. 3B-3D) and the patterned hard mask 130. For example, the dielectric film 140' is conformally deposited on the structure illustrated in FIG. 3A using CVD, ALD, or suitable methods. The dielectric film 140' lines sidewalls and bottom surfaces of the trenches Ta-Td (see FIGS. 3B-3D). The dielectric film 140' includes dielectric materials. In some embodiments, the dielectric film 140' includes $SiO_2$, SiN, SiCN, SiCON, SiCO, AlO, HfO, other high-k dielectric materials, combinations thereof, multiple layers thereof, or the like.

Due to width differences among the trenches Ta-Td (see FIGS. 3A-3D), the dielectric film 140' completely fills the trenches Ta and Tc, which are narrower than the trenches Tb and Td, but does not completely fill the trenches Tb and Td. In the example where the formation of the dielectric film 140' is a conformal process, a seam may be formed within the dielectric film 140' by virtue of the conformal process and high aspect ratio of the trenches Ta and Tc. For example, the dielectric film 140' can have lateral growth fronts in the trenches Ta and Tc (e.g., proceeding laterally from sidewalls of respective fin structures FSa-FSd) that merge together. The merging of the lateral growth fronts can create the seam in the dielectric film 140' between neighboring fin structures FSa-FSd.

Figure 5B:
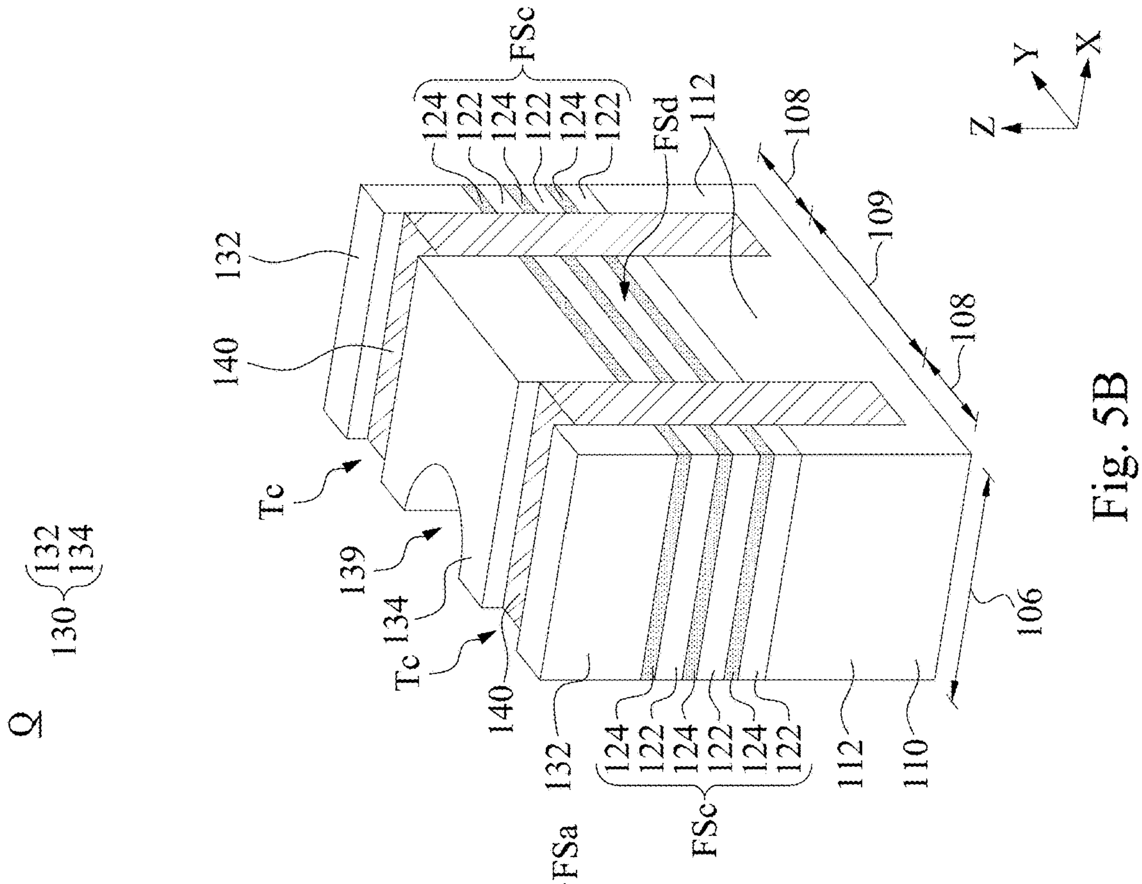
Figure 5A:
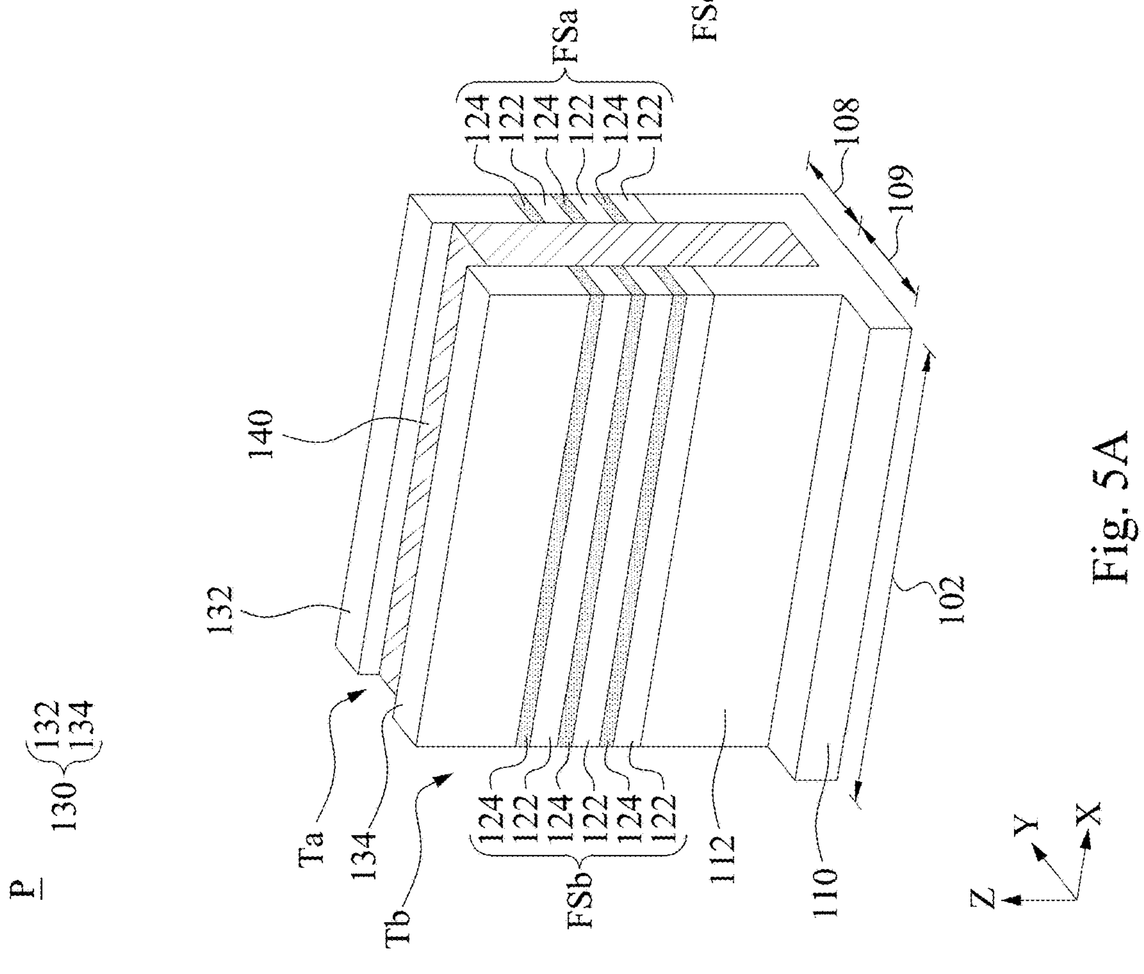
Figure 5C:
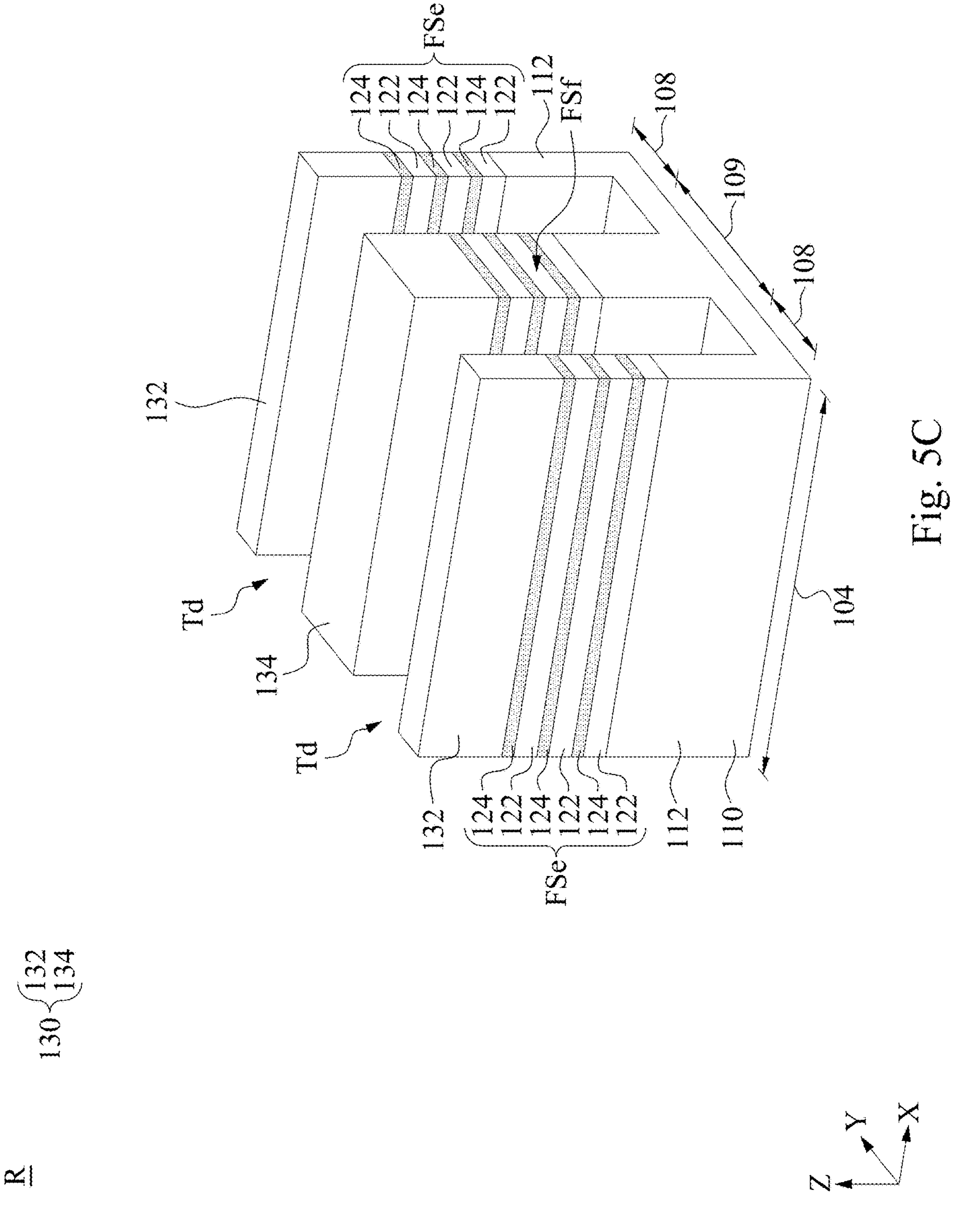
Figure 6B:
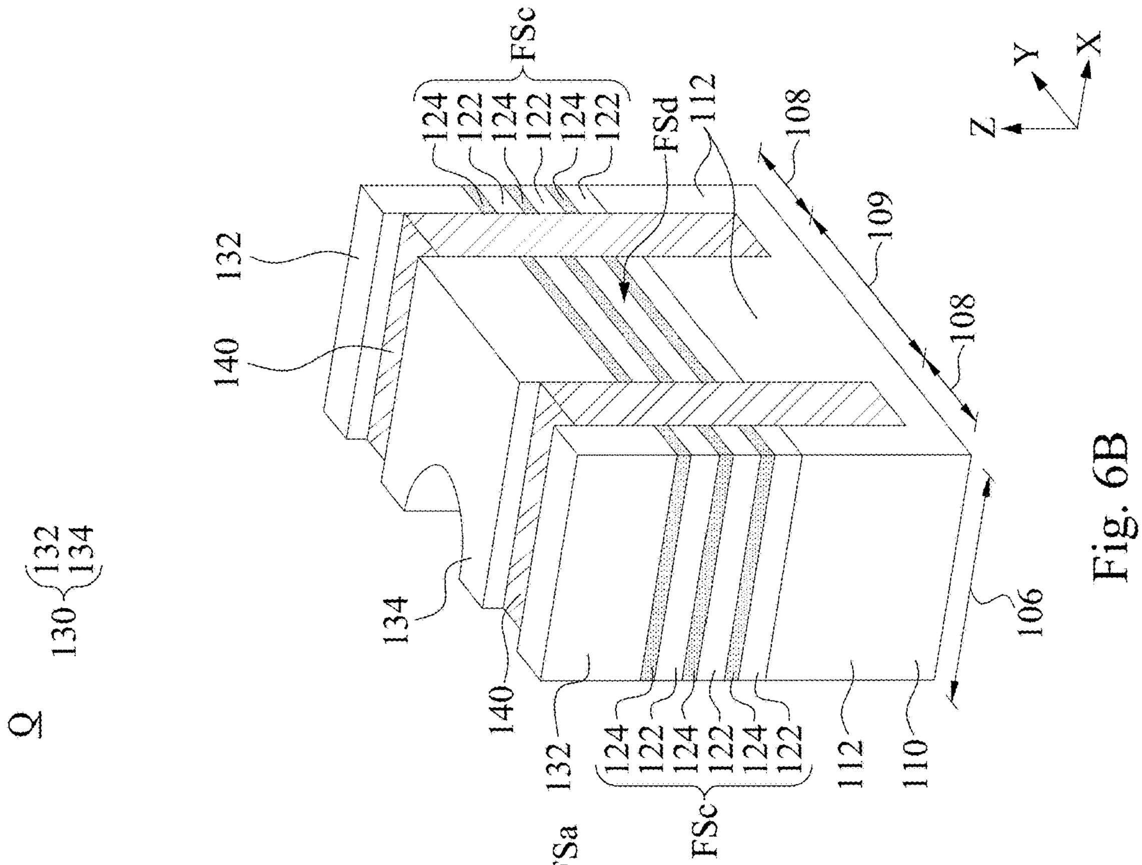
Figure 6A:
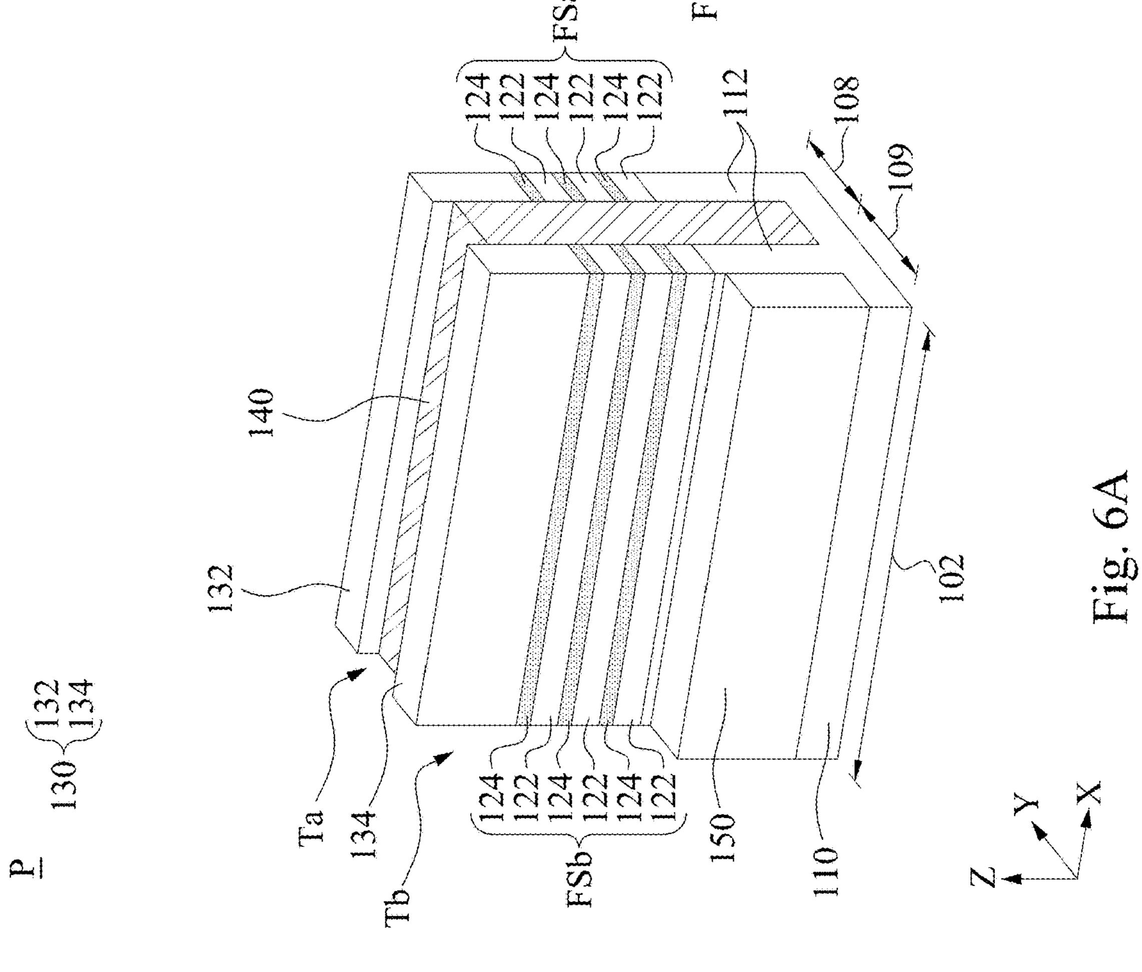
Figure 6C:
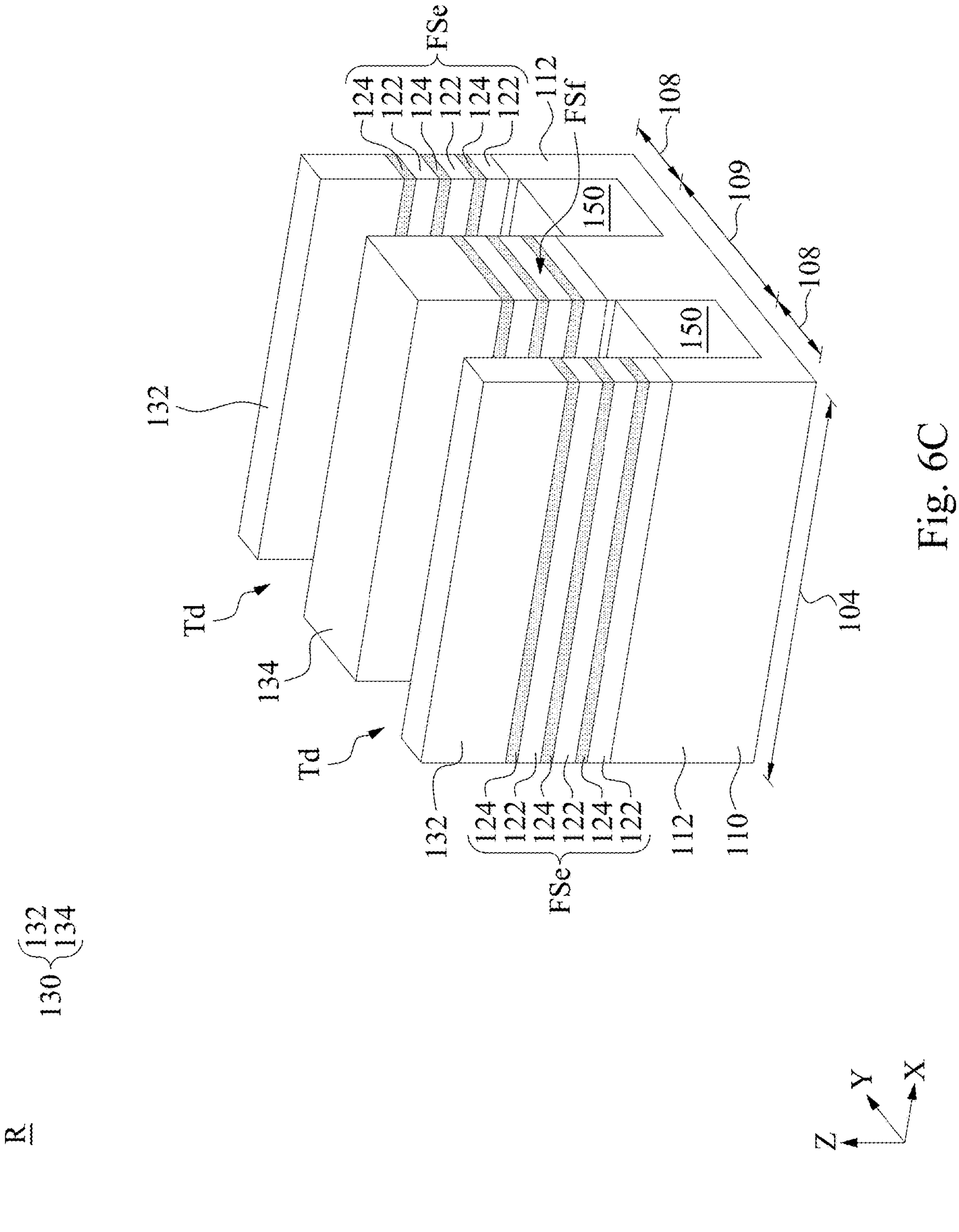

Reference is made to FIGS. 1 and 5A-5C. Subsequently, the example process etches back the dielectric film 140' (FIG. 4) to remove portions of the dielectric film 140' in the trenches Ta and Tc and completely remove the dielectric film 140' from the trenches Tb and Td. In some embodiments, the dielectric film 140' may be etched back in a dry etching process that uses oxygen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. Unlike the narrower trenches Ta and Tc which are entirely filled by the dielectric film 140', the wider trenches Tb and Td allow etchant to etch sidewalls and bottom surfaces of the dielectric film 140' from inside the trenches Tb and Td, such that the dielectric film 140' is removed from the wider trenches Tb and Td in a faster rate than from the narrower trenches Ta and Tc. As shown in FIGS. 5A-5C, the dielectric film 140' is removed from the wider trenches Tb and Td, while the dielectric film 140' collectively define dielectric fins 140 in the narrower trenches Ta and Tc, respectively. The dielectric fin 140 each has a top at a height between a top of the patterned hard mask 130 and a top of the fin structures FSa-FSf. The dielectric fin 140 each is between two neighboring fin structures FSa-FSb or FSc-FSd. For example, the dielectric fin 140 is in contact with the fin structures FSa, FSb, FSc, and FSd but spaced apart from the FSe and FSf.

Reference is made to FIGS. 1 and 6A-6C. Isolation structures 150, such as shallow trench isolations (STI), are disposed in the trenches Tb and Td and over the substrate 110. The isolation structures 150 can be equivalently referred to as an isolation insulating layer in some embodiments. The isolation structures 150 may be made of suitable dielectric materials such as silicon oxide, silicon nitride, silicon oxynitride, fluorine-doped silicate glass (FSG), low-k dielectrics such as carbon doped oxides, extremely low-k dielectrics such as porous carbon doped silicon dioxide, a polymer such as polyimide, combinations of these, or the like. In some embodiments, the isolation structures 150 are formed through a process such as CVD, flowable CVD (FCVD), or a spin-on-glass process, although any acceptable process may be utilized. Subsequently, portions of the isolation structures 150 extending over the top surfaces of the fin structures FSa-FSf, are removed using, for example, an etching back process, chemical mechanical polishing (CMP), or the like.

The isolation structures 150 are then recessed to expose the patterned hard mask 130. In some embodiments, the isolation structures 150 are recessed using a single etch processes, or multiple etch processes. In some embodiments in which the isolation structures 150 is made of silicon oxide, the etch process may be, for example, a dry etch, a chemical etch, or a wet cleaning process. For example, the chemical etch may employ fluorine-containing chemical such as dilute hydrofluoric (dHF) acid.

Reference is made to FIGS. 1 and 7A-7C. The patterned hard mask 130 (see FIGS. 6A-6C) is removed by using one or more etching processes. Dummy gate structures 160*a*, 160*b*, 160*c*, 160*d*, 160*e*, and 160*f* are formed over the substrate 110 and are at least partially disposed over the fin structures FSa-FSf. The portions of the fin structures FSa-FSf underlying the dummy gate structures 160*a*-160*f* may be referred to as the channel regions. The dummy gate structures 160*a*-160*f* may also define source/drain (S/D) regions of the fin structures FSa-FSf, for example, the regions of the fin structures FSa-FSf adjacent and on opposing sides of the channel regions.

The dummy gate structures 160*a* and 160*b* are formed in the first device region 102, the dummy gate structure 160*c* is formed between the first device region 102 and the connecting region 106, the dummy gate structure 160*d* is formed between the connecting region 106 and the second device region 104, and the dummy gate structures 160*e* and 160*f* are formed in the second device region 104. The dummy gate structures 160*a*-160*f* have a constant pitch.

Dummy gate formation operation first forms a dummy gate dielectric layer 162 over the fin structures FSa-FSf. Subsequently, a dummy gate electrode layer (or semiconductive gate layer or a polysilicon gate layer) 164 and a hard mask 166 are formed over the dummy gate dielectric layer 162. The dummy gate electrode layer 164 is patterned by using the patterned hard mask 166 as an etch mask. In some embodiments, after patterning the dummy gate electrode layer 164, the dummy gate dielectric layer 162 is removed from the S/D regions of the fin structures FSa-FSf. The etch process may include a wet etch, a dry etch, and/or combinations thereof. The etch process is chosen to selectively etch the dummy gate dielectric layer 162 without substantially etching the fin structures FSa-FSf, the dummy gate electrode layer 164, and the hard mask 166. Therefore, each of the dummy gate structures (or semiconductive gate structures or a polysilicon gate structures) 160*a*-160*f* includes the dummy gate dielectric layer 162, the dummy gate electrode layer 164, and the hard mask 166.

Figure 7B:
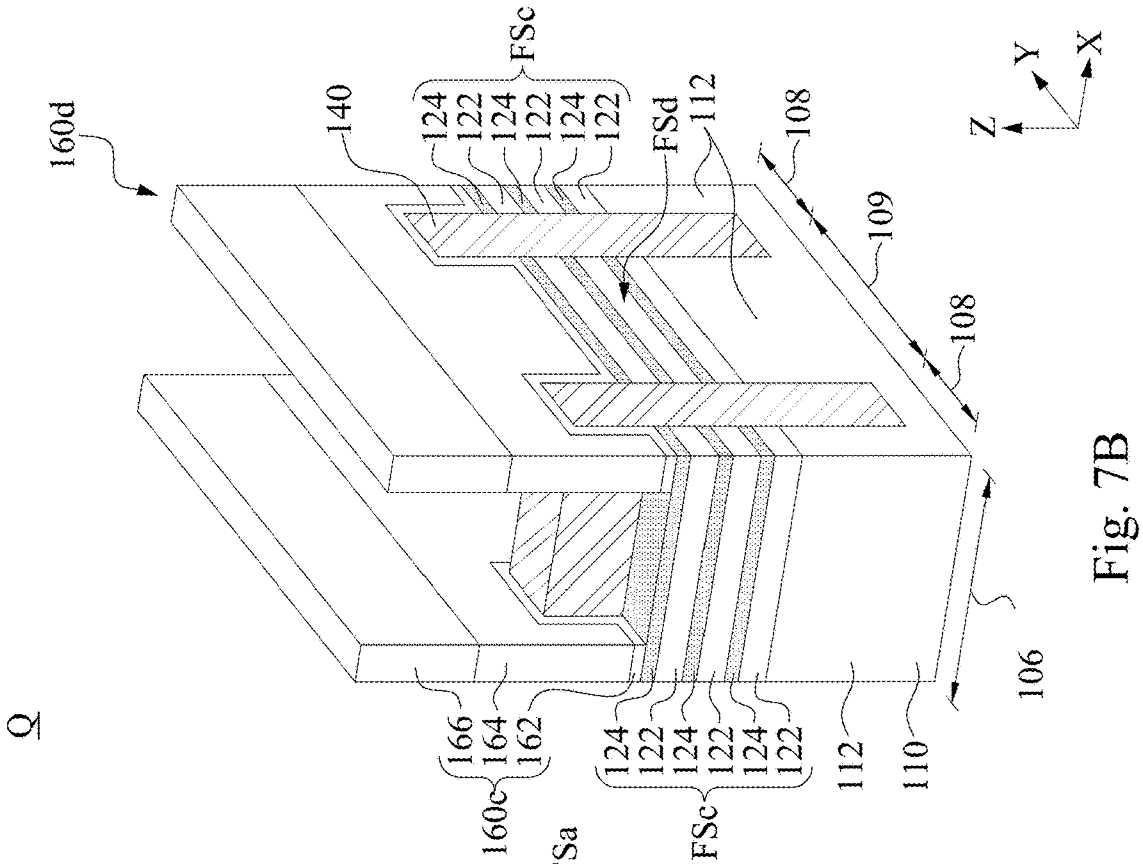
Figure 7A:
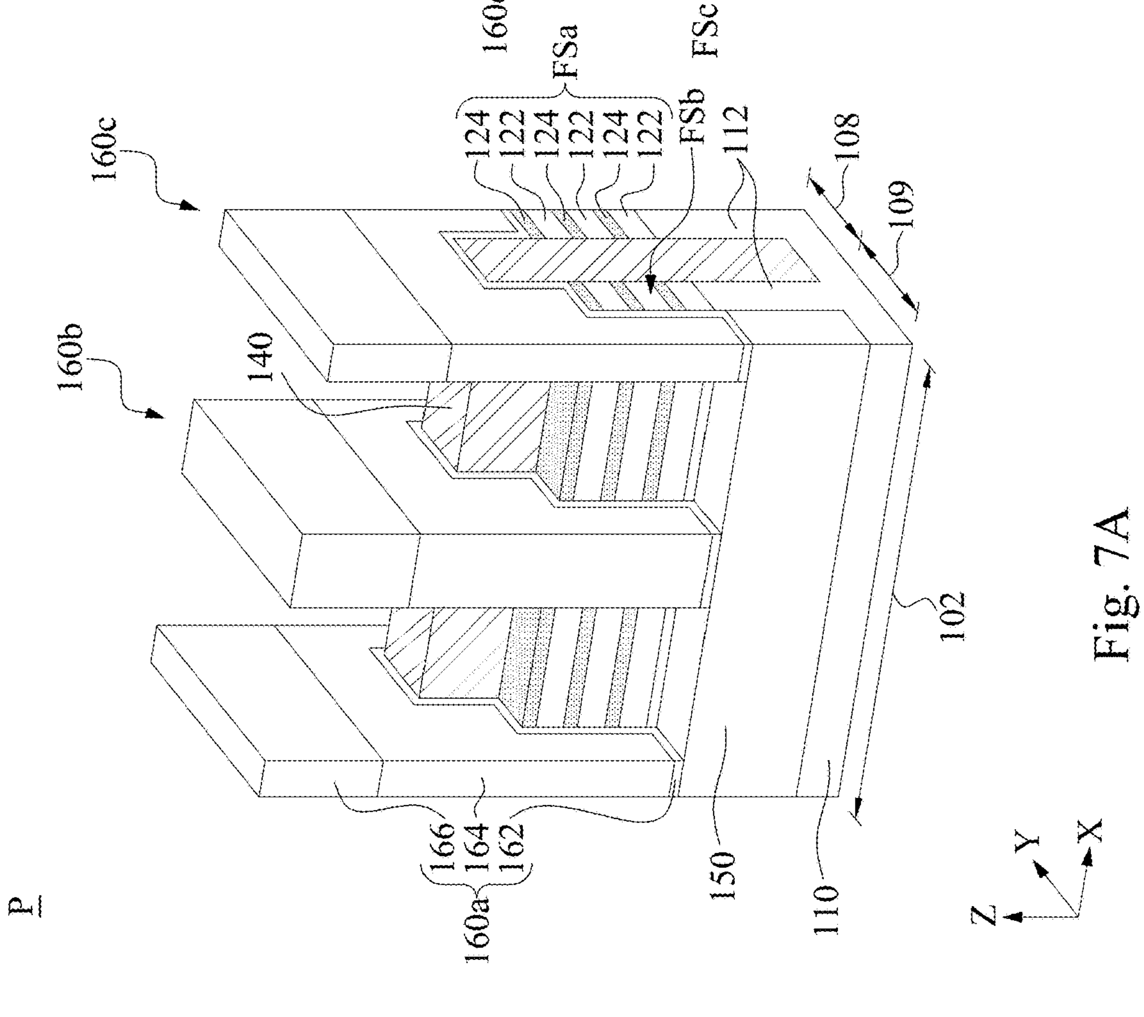
Figure 7C:
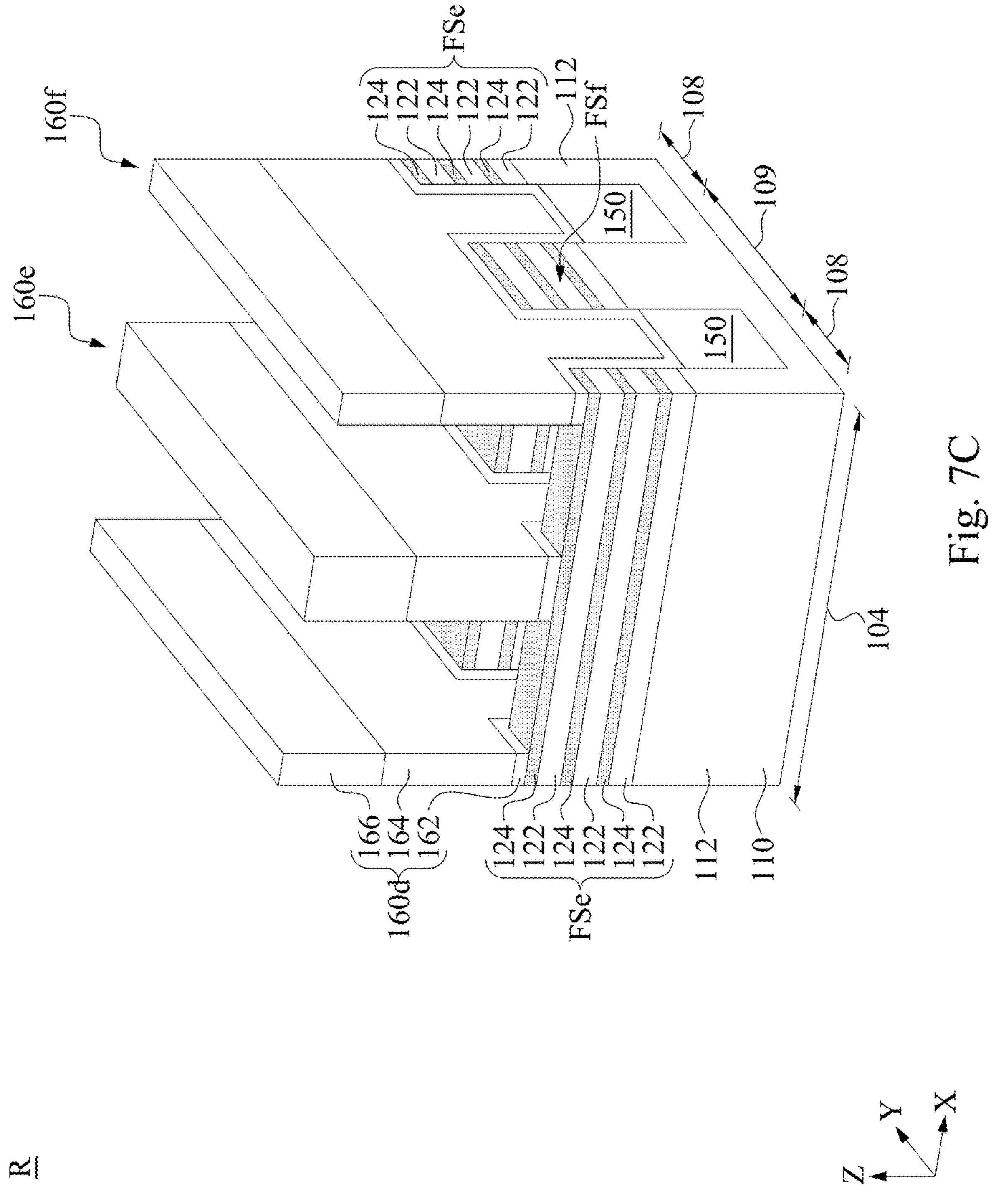
Figure 8B:
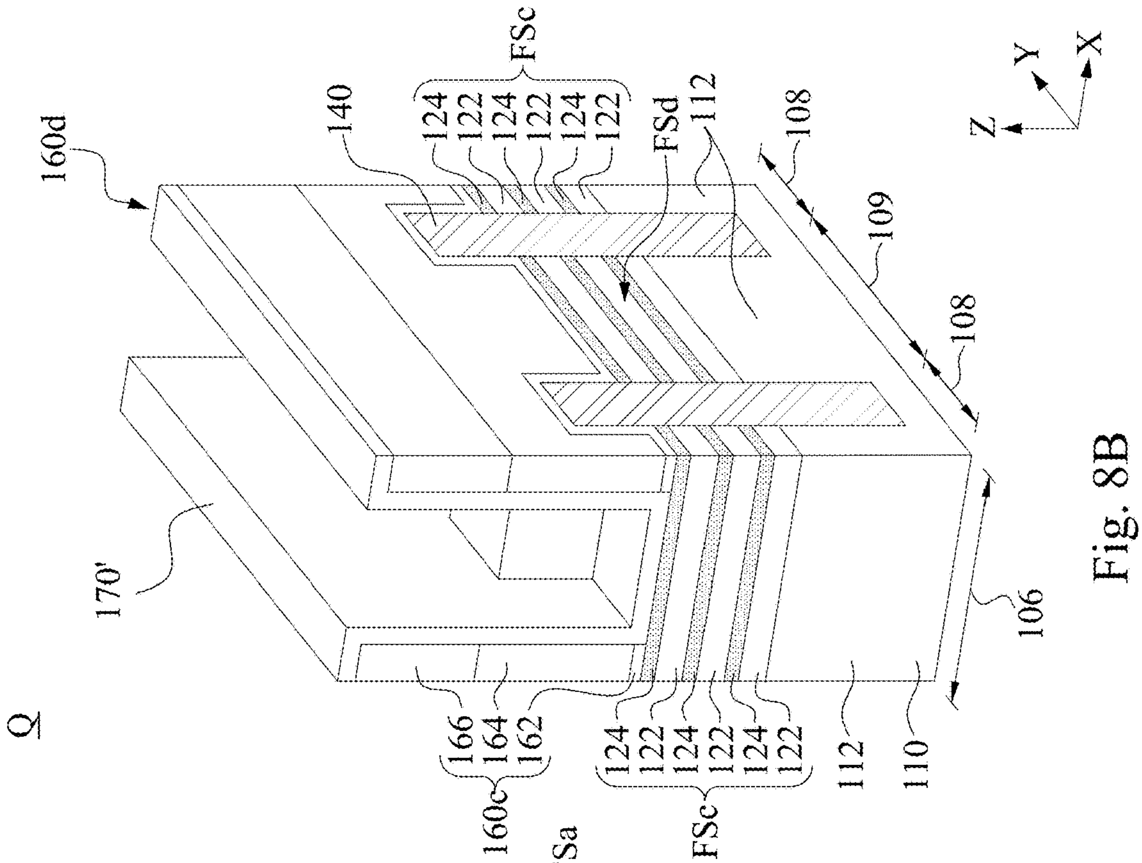
Figure 8A:
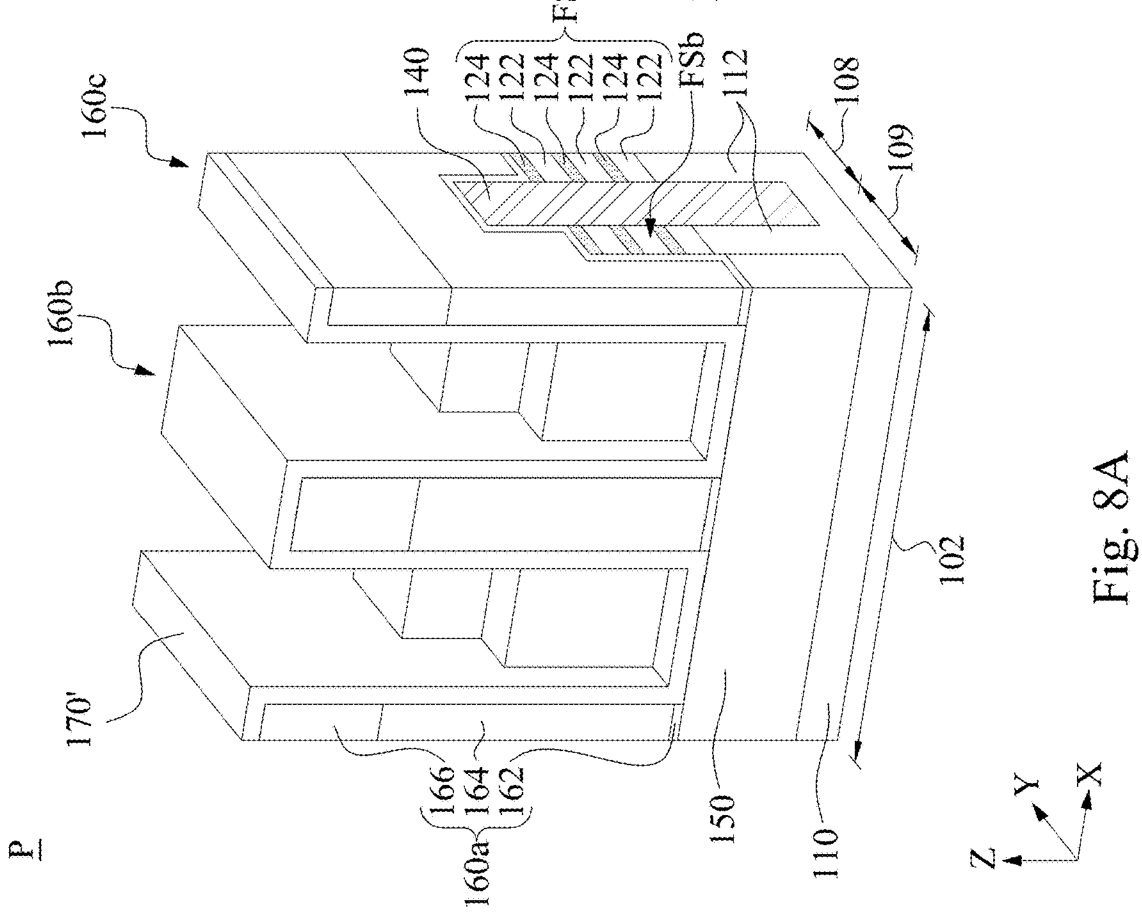
Figure 8C:
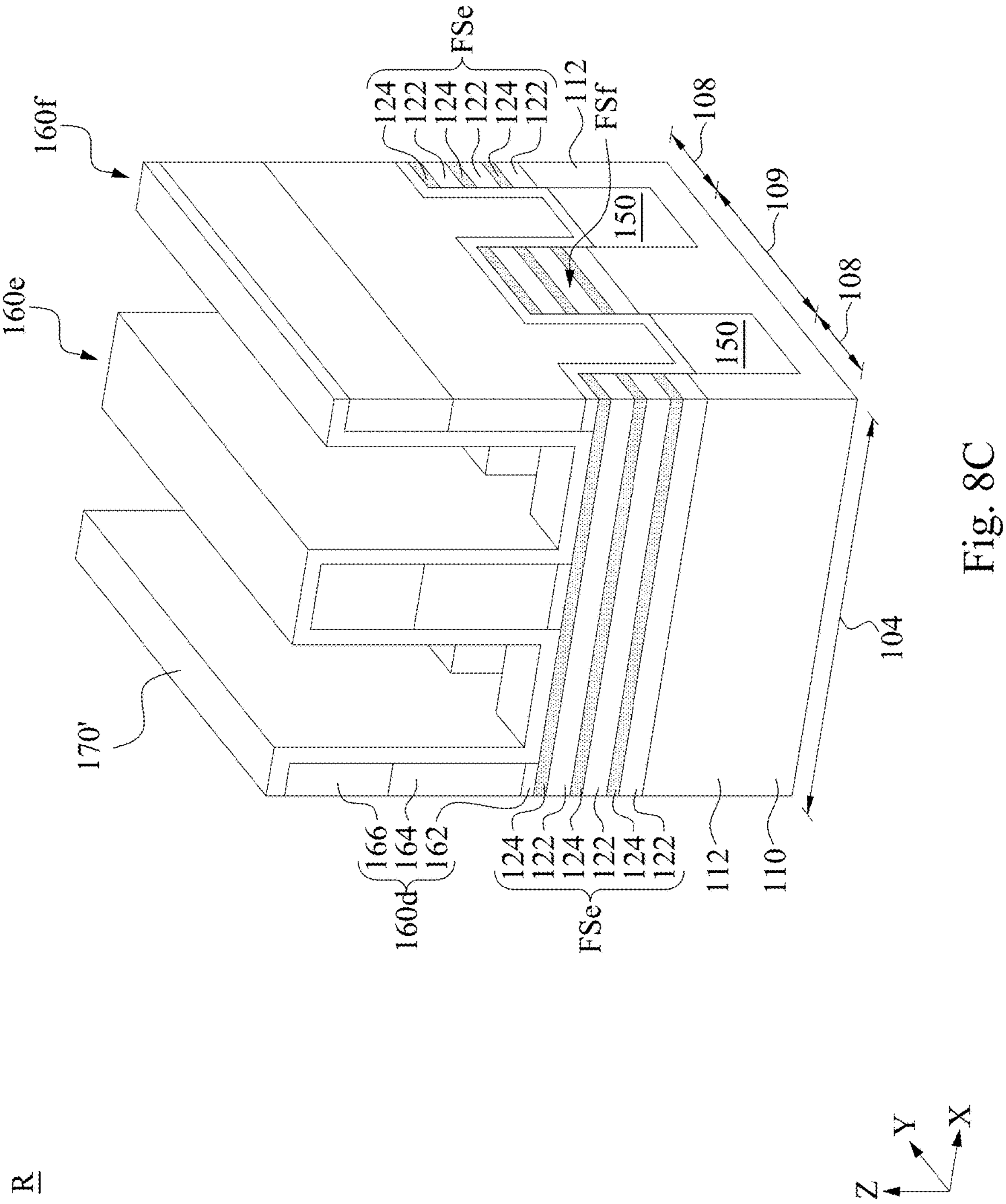

Reference is made to FIGS. 1 and 8A-8C. After formation of the dummy gate structures 160*a*-160*f* is completed, gate spacers 172 (see FIGS. 9A, 9C, and 9E) are formed on sidewalls of the dummy gate structures 160*a*-160*f*. Specifically, as shown in FIGS. 8A-8C, a dielectric film 170' is deposited on the structure as illustrated in FIGS. 7A-7C. The dielectric film 170' may be silicon nitride (SiN), silicon carbonoxide (SiCO), silicon carbonitride (SiCN), silicon oxycarbonitride (SiOCN), or the like. The dielectric film 170' is conformally formed on the substrate 110, the dummy gate structures 160*a*-160*f*, and the fin structures FSa-FSf. In some embodiments, the dielectric film 170' may be a single layer or multiple layers.

Reference is made to FIGS. 1 and 9A-9F. An anisotropic etching process is then performed on the deposited dielectric film 170' (see FIGS. 8A-8C) to expose portions of the fin structures FSa-FSf not covered by the dummy gate structure 160*a*-160*f* (e.g., in source/drain regions of the fin structures FSa-FSf). Portions of the dielectric materials directly above the dummy gate structures 160*a*-160*f* may be completely removed by this anisotropic etching process. Portions of the dielectric materials on sidewalls of the dummy gate structures 160*a*-160*f* may remain, forming gate sidewall spacers, which are denoted as the gate spacers 172, for the sake of simplicity.

Figure 9B:
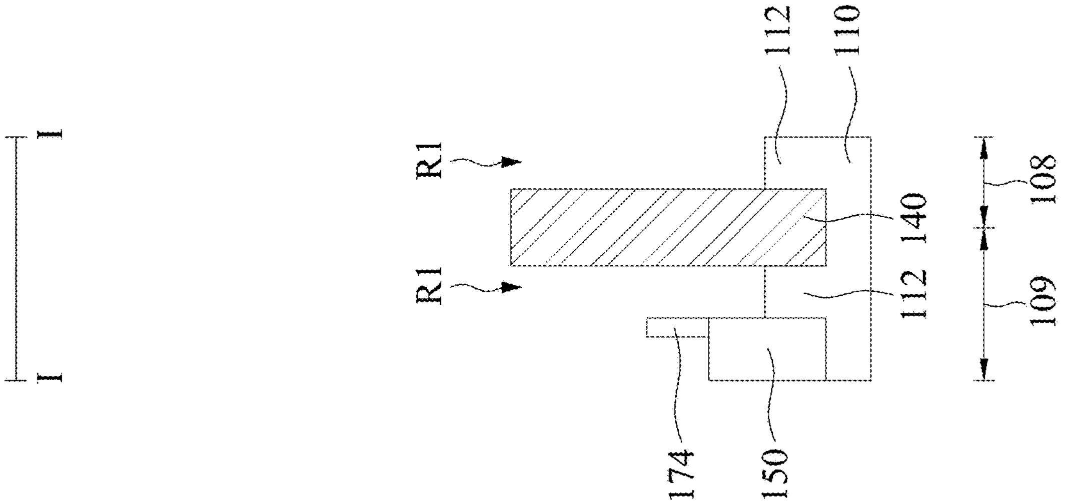
Figure 9A:
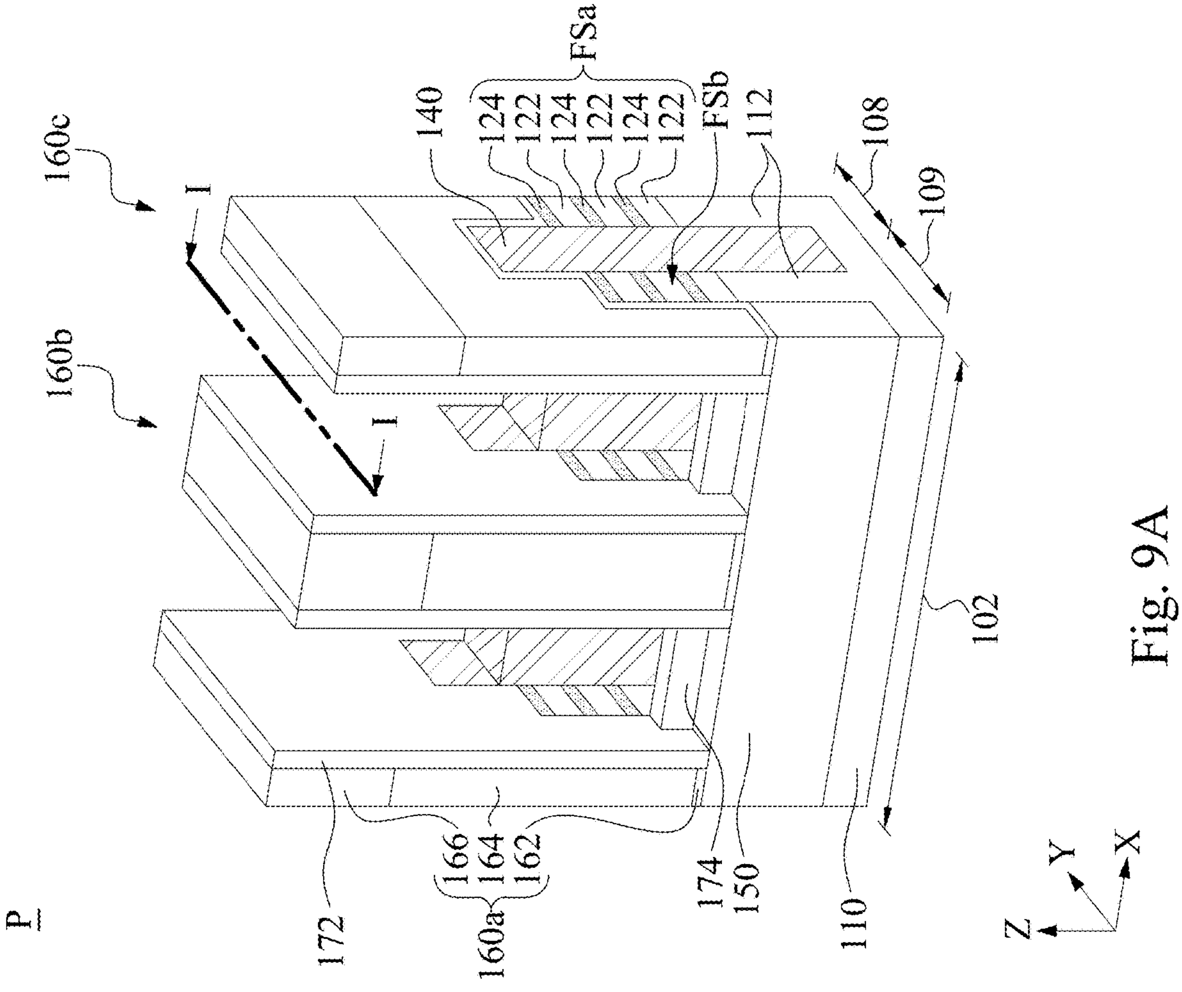
Figure 9D:
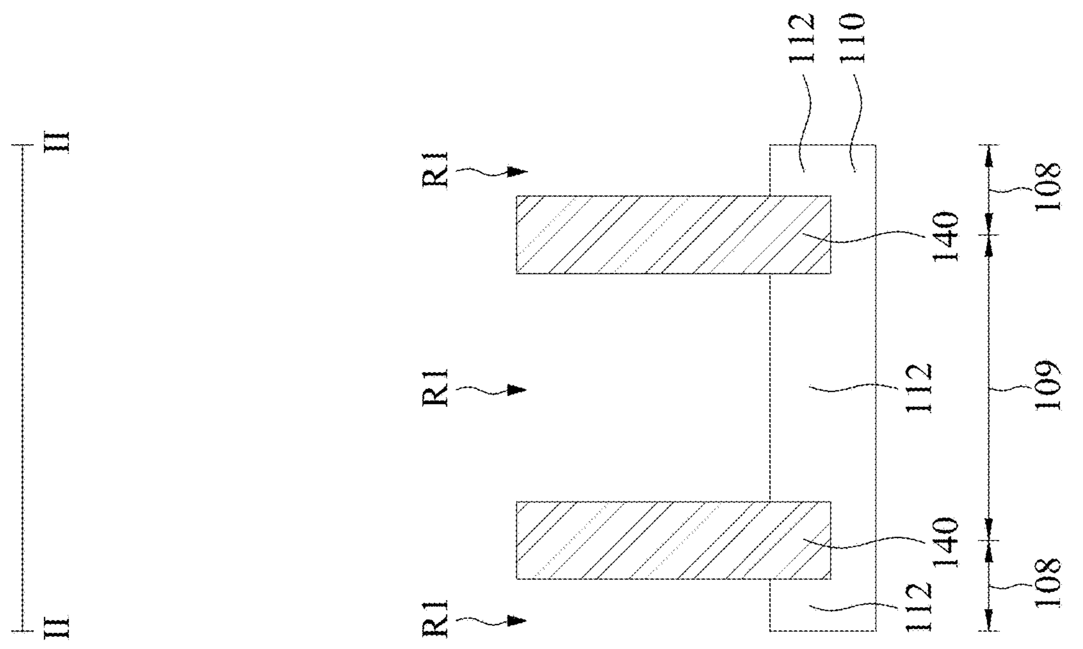
Figure 9C:
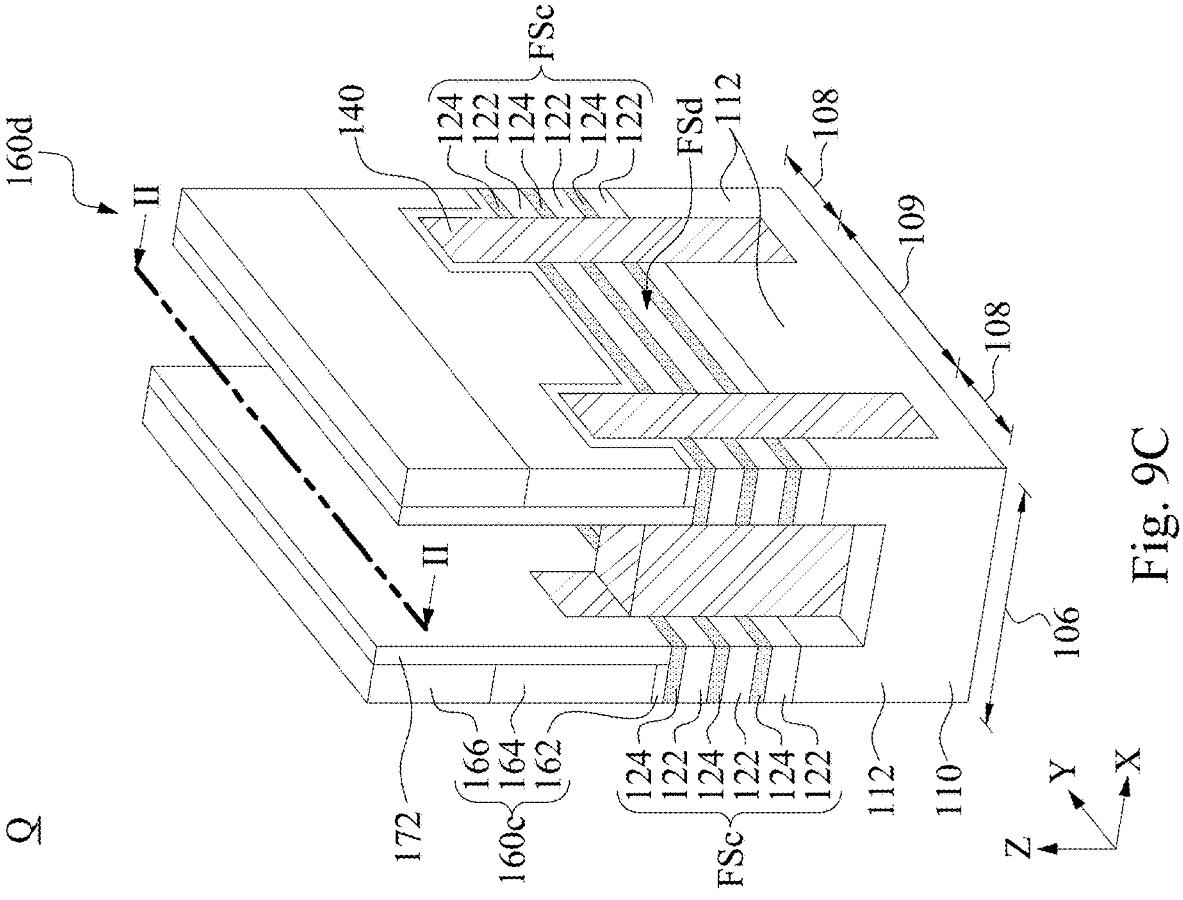
Figure 9E:
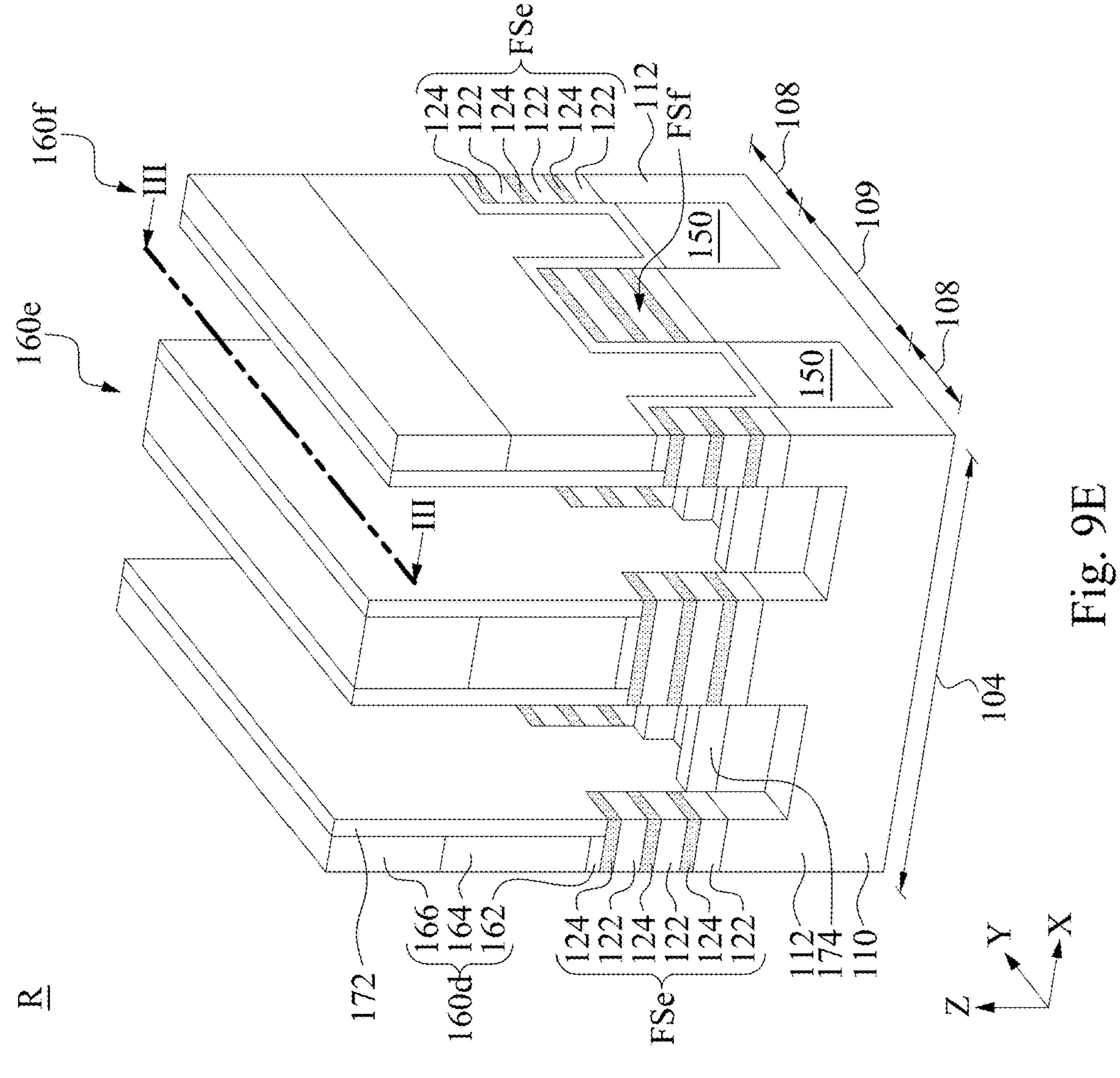
Figure 9F:
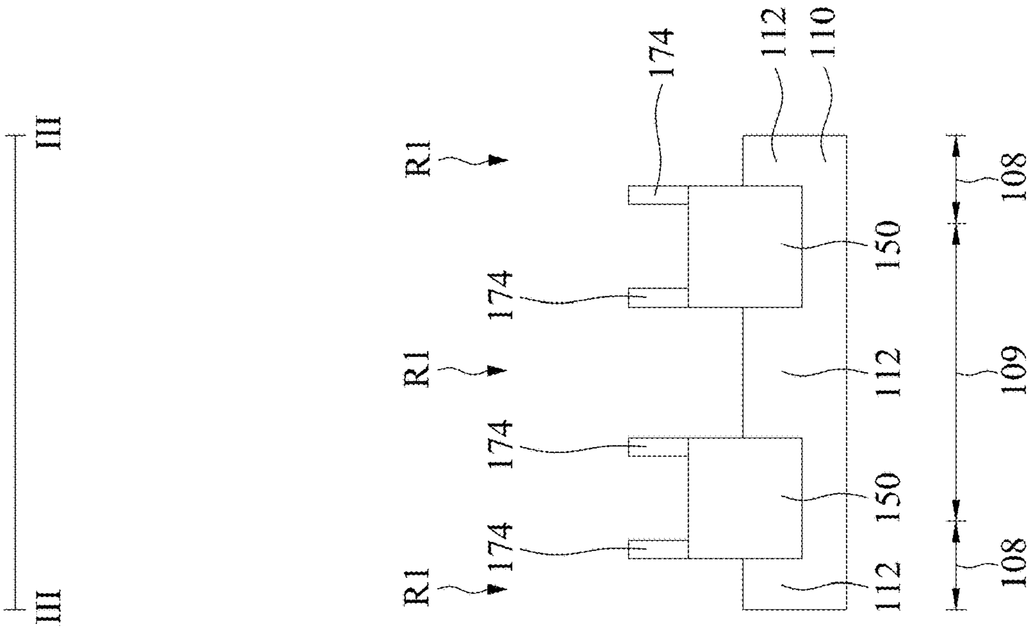

The anisotropic etching process further etches exposed portions of the fin structures FSa-FSf that extend laterally beyond the gate spacers 172 (e.g., in the source/drain regions of the fin structures FSa-FSf), resulting in recesses R1 into the fin structures FSa-FSf and between corresponding dummy gate structures 160*a*-160*f*. After the anisotropic etching, end surfaces of the semiconductor layers 122 and 124 are aligned with respective outermost sidewalls of the gate spacers 172, due to the anisotropic etching. In some embodiments, the protrusion structures 112 are also recessed as shown in FIGS. 9A-9F. In still some embodiments, the dielectric fins 140 are also recessed as shown in FIGS. 9A and 9C.

In some embodiments, the anisotropic etching may be performed by a dry chemical etch with a plasma source and a reaction gas. The plasma source may be an inductively coupled plasma (ICP) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Further, sidewall spacers 174, which are remaining parts of the dielectric film 170' that are not removed in the operation of the anisotropic etching process, exist. Specifically, when the dielectric film 170' is etched to form the gate spacers 172, portions of the dielectric film 170' on sidewalls of the fin structures FSa, FSb, FSe, and FSf are pullback-etched. Portions of the dielectric film 170' thus remain at corners between the isolation structure 150 and the fin structures FSa, FSb, FSe, and FSf after the etching and form the sidewall spacers 174. On the other hand, due to the presence of the dielectric fins 140, sidewall spacers 174 may not be formed over the connecting region 106.

Reference is made to FIGS. 1 and 10A-10C. The semiconductor layers 122 are laterally or horizontally recessed by using suitable etch techniques, resulting in lateral recesses each vertically between corresponding semiconductor layers 124. This operation may be performed by using a selective etching process. By way of example and not limitation, the semiconductor layers 122 are SiGe and the semiconductor layers 124 are silicon allowing for the selective etching of the semiconductor layers 122. In some embodiments, the selective wet etching includes an APM etch (e.g., ammonia hydroxide-hydrogen peroxide-water mixture) that etches SiGe at a faster etch rate than it etches Si. As a result, the semiconductor layers 124 laterally extend past opposite end surfaces of the semiconductor layers 122.

Figure 10B:
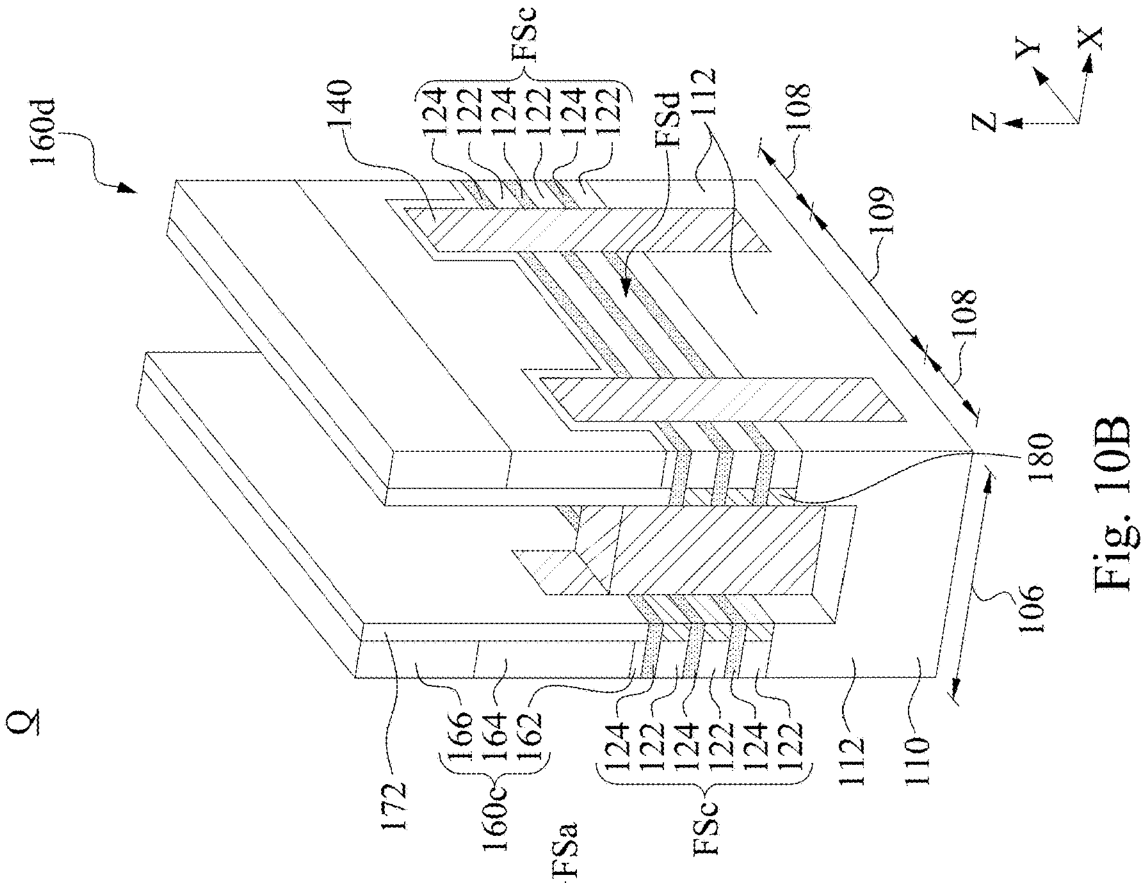
Figure 10A:
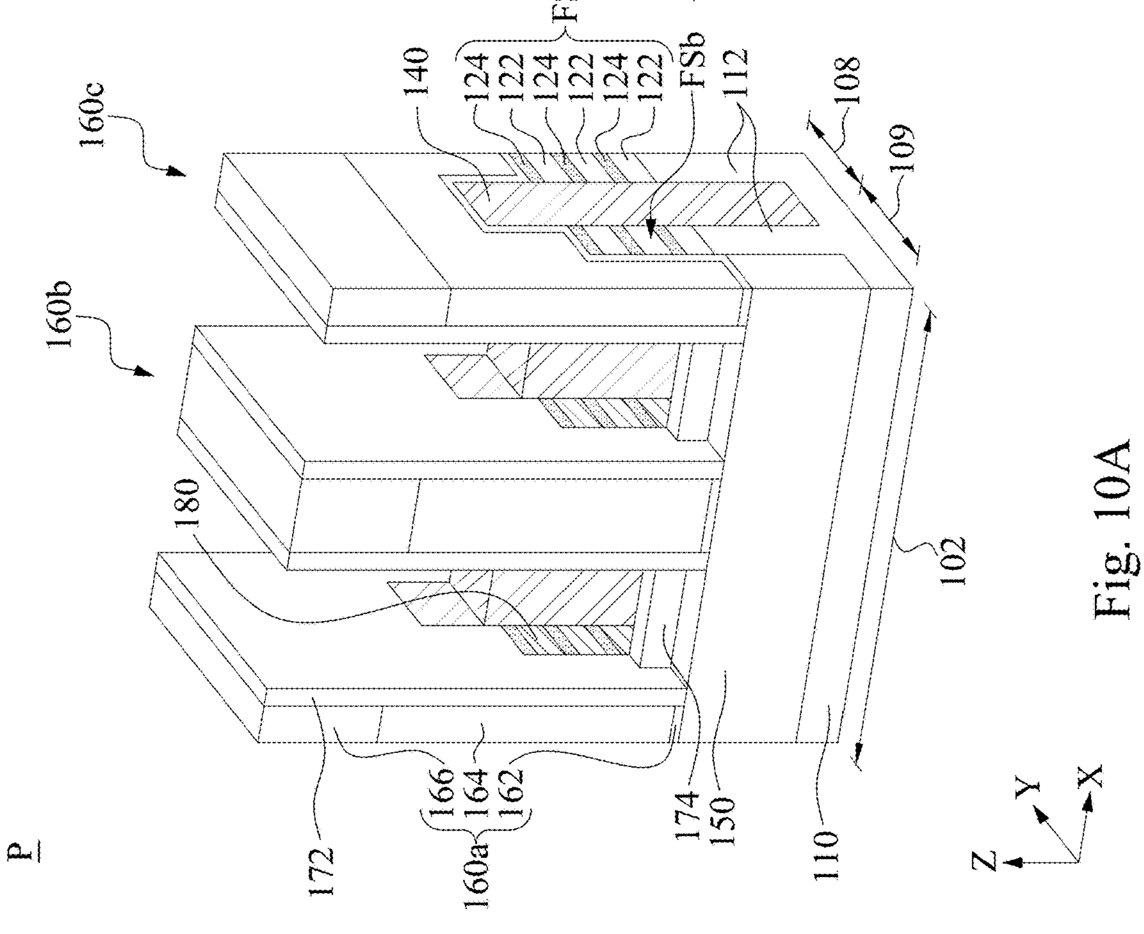
Figure 10C:
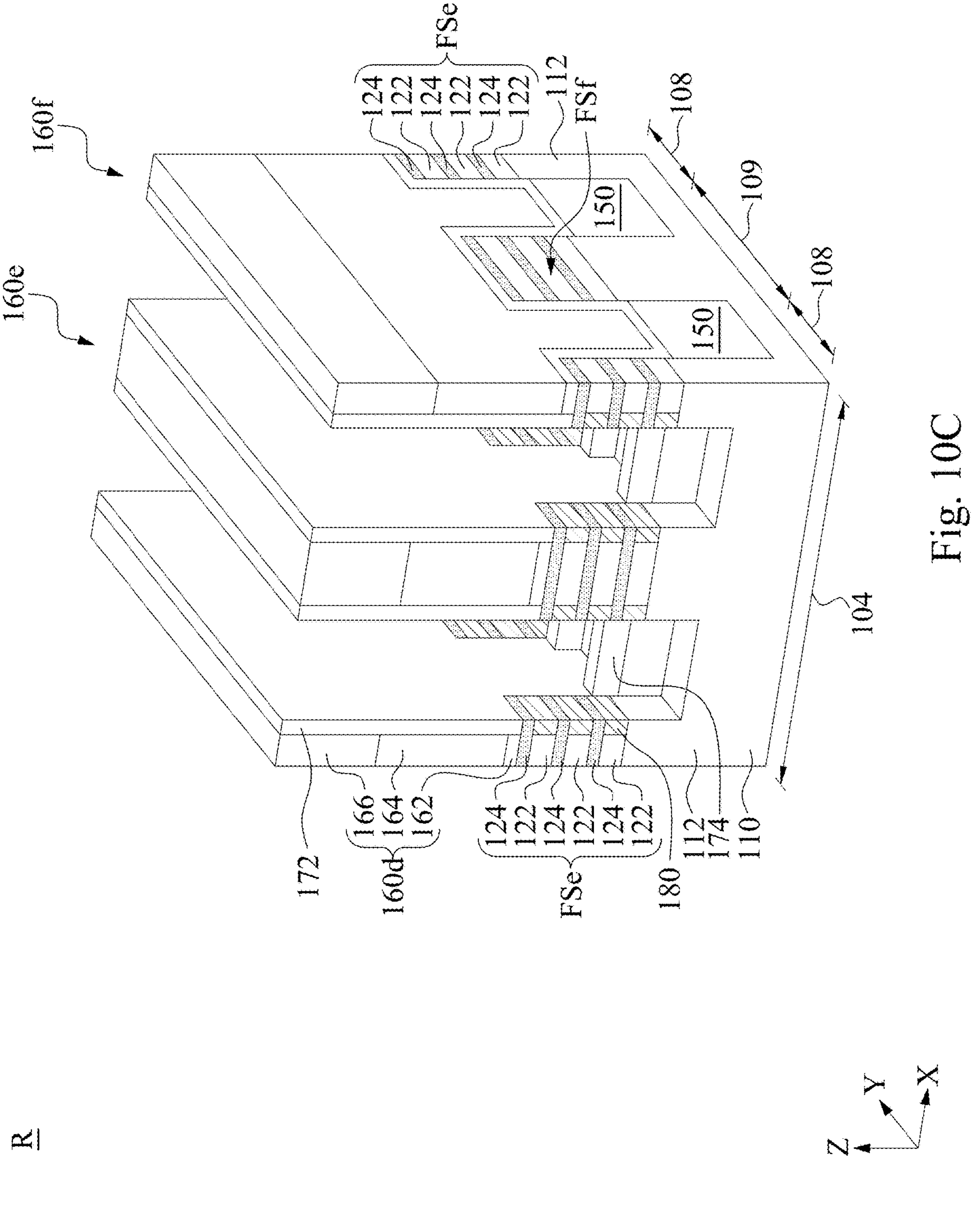
Figure 11B:
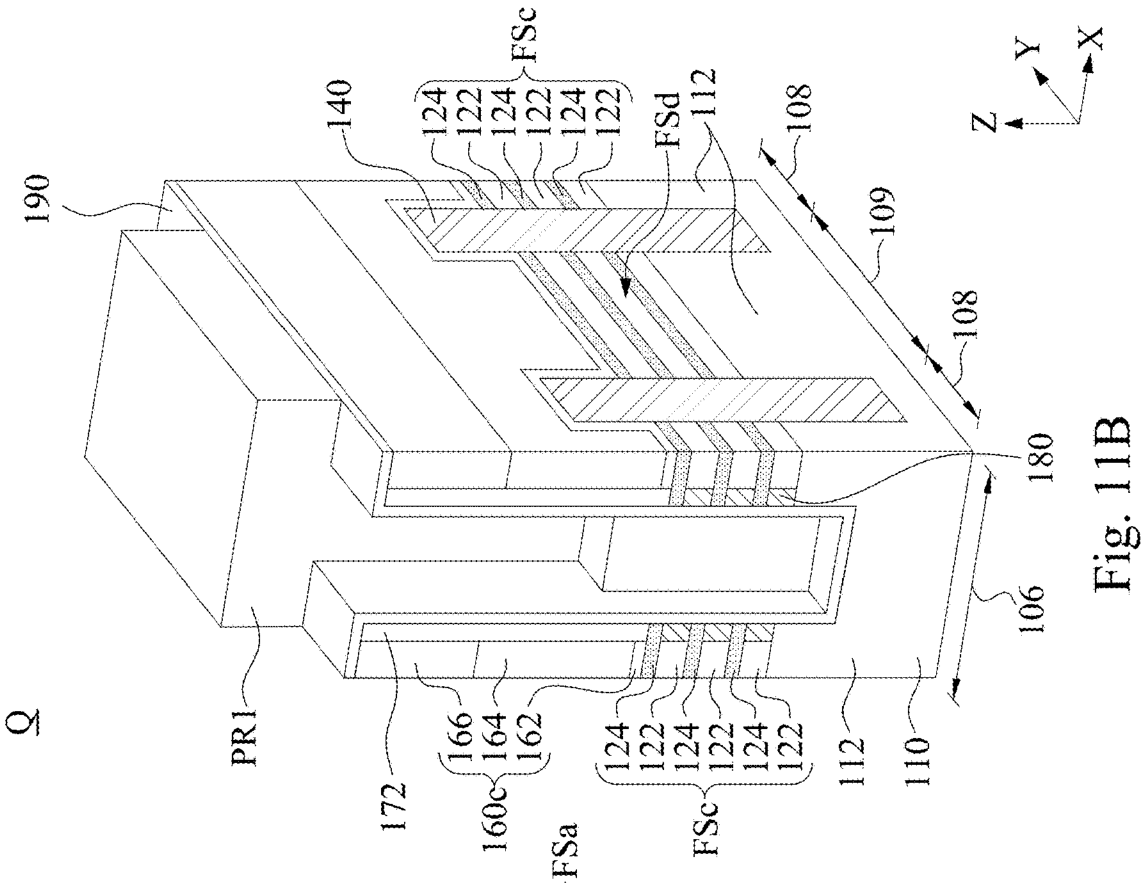
Figure 11A:
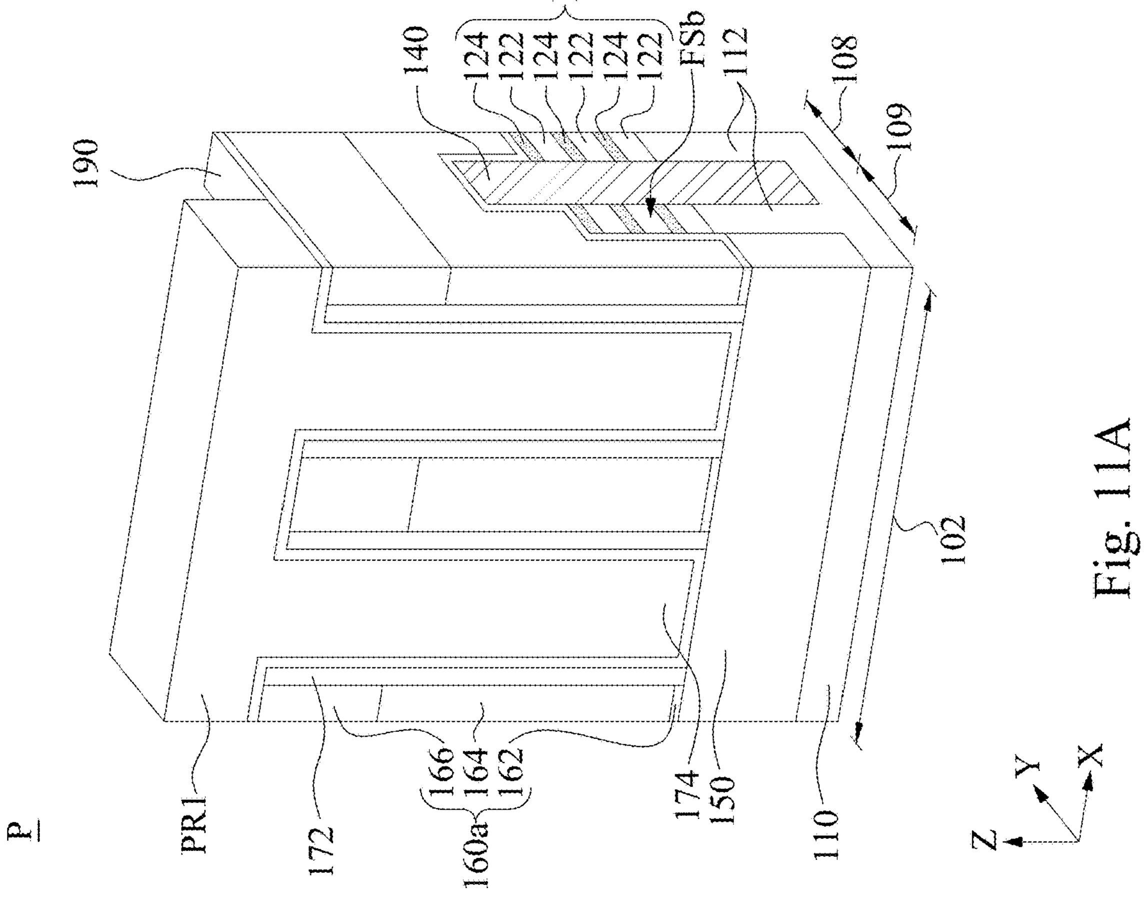
Figure 12B:
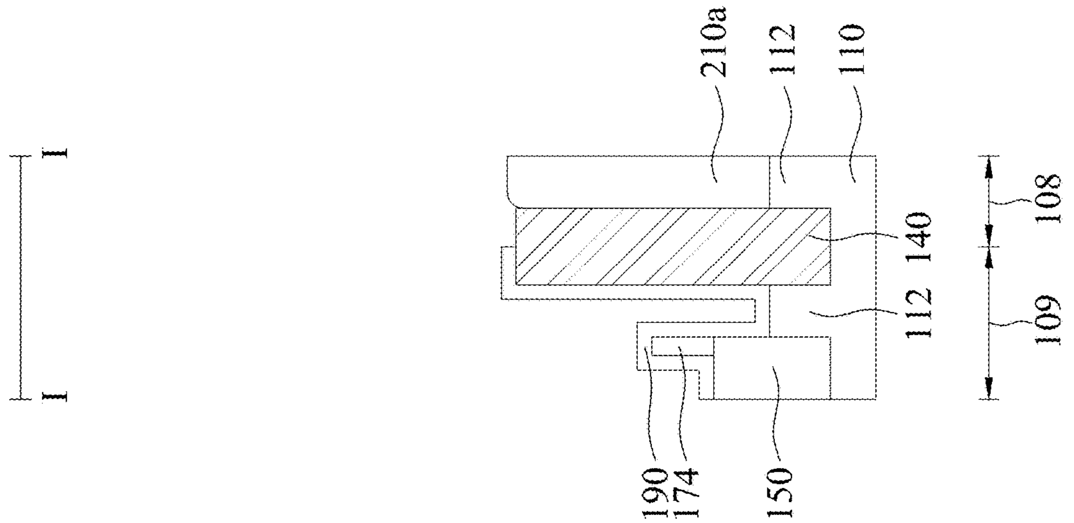
Figure 12A:
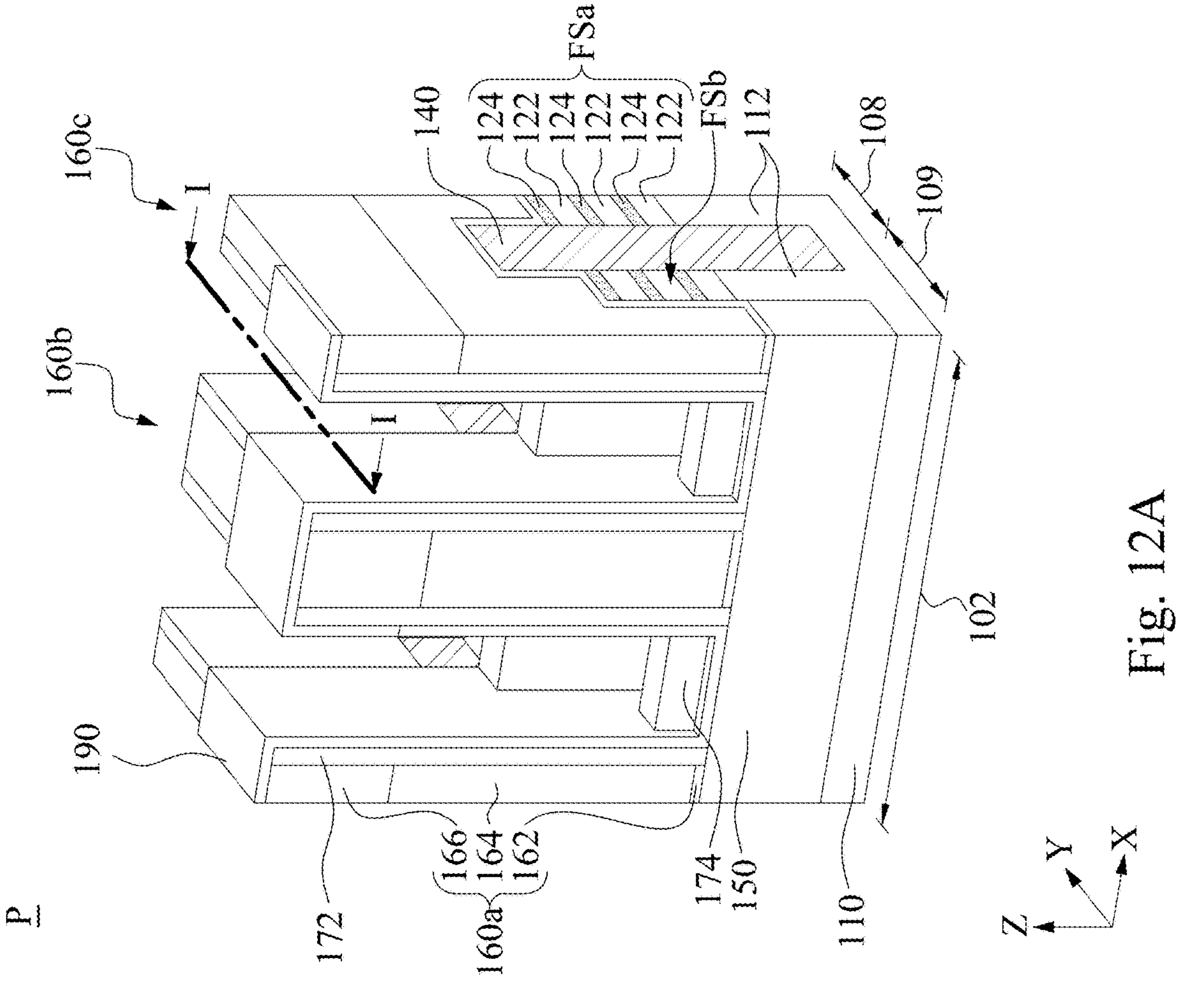
Figure 12D:
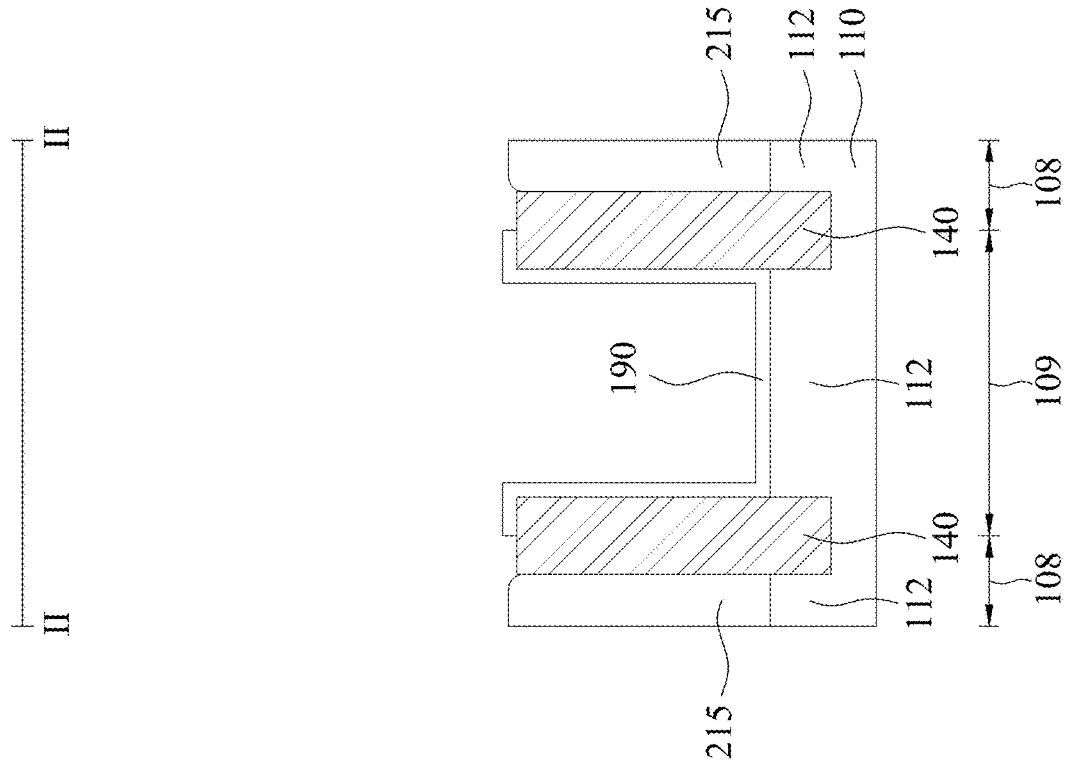
Figure 12C:
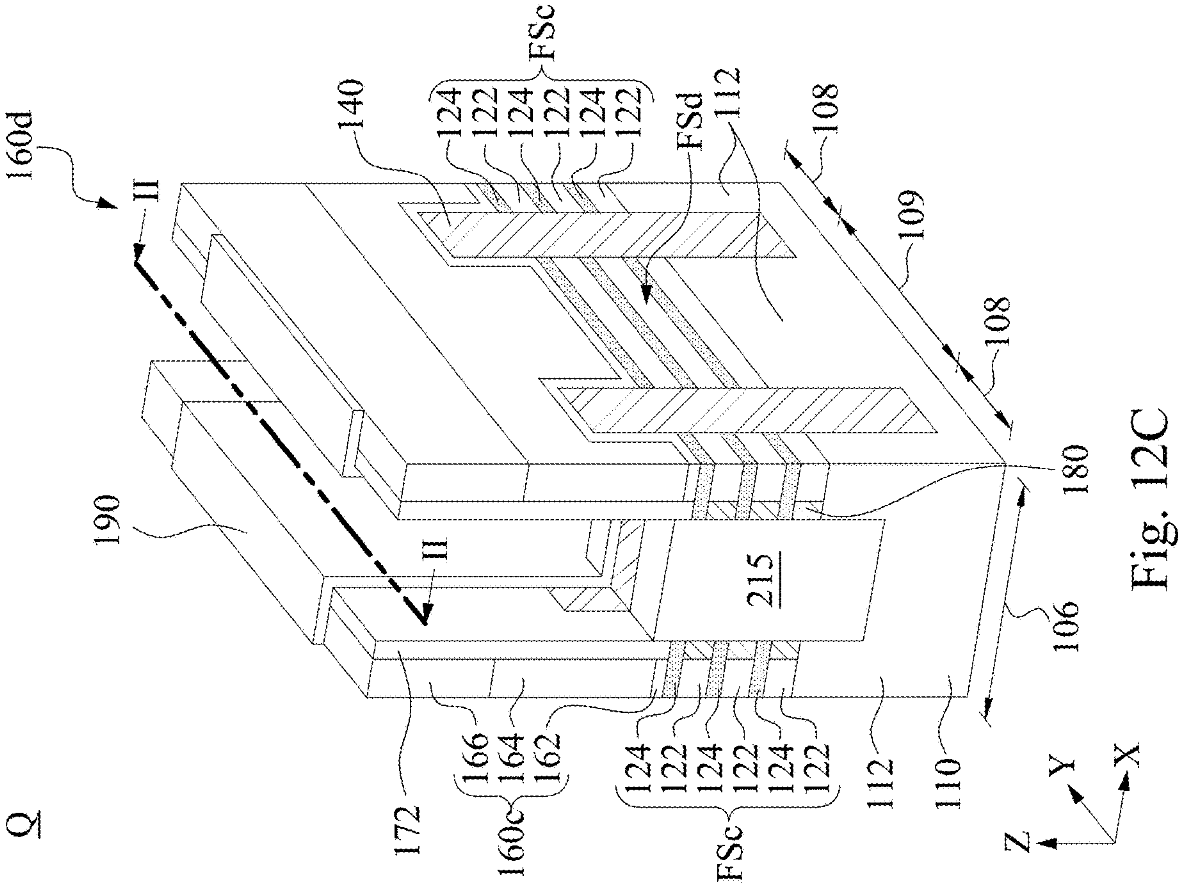
Figure 12F:
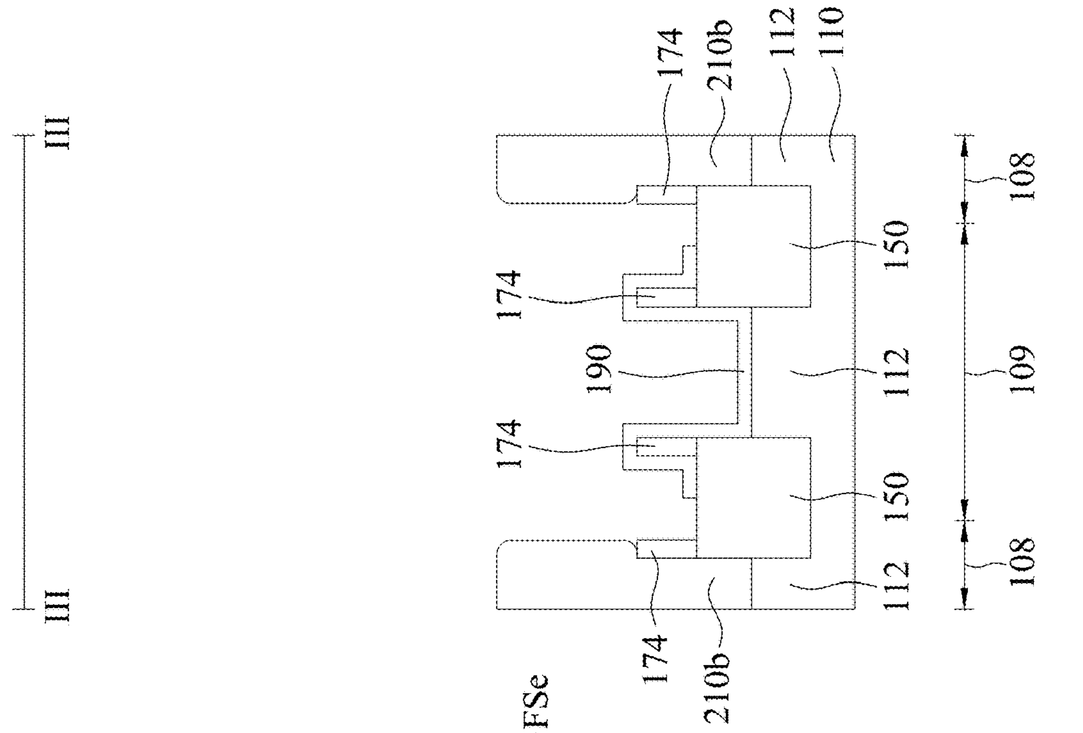
Figure 12E:
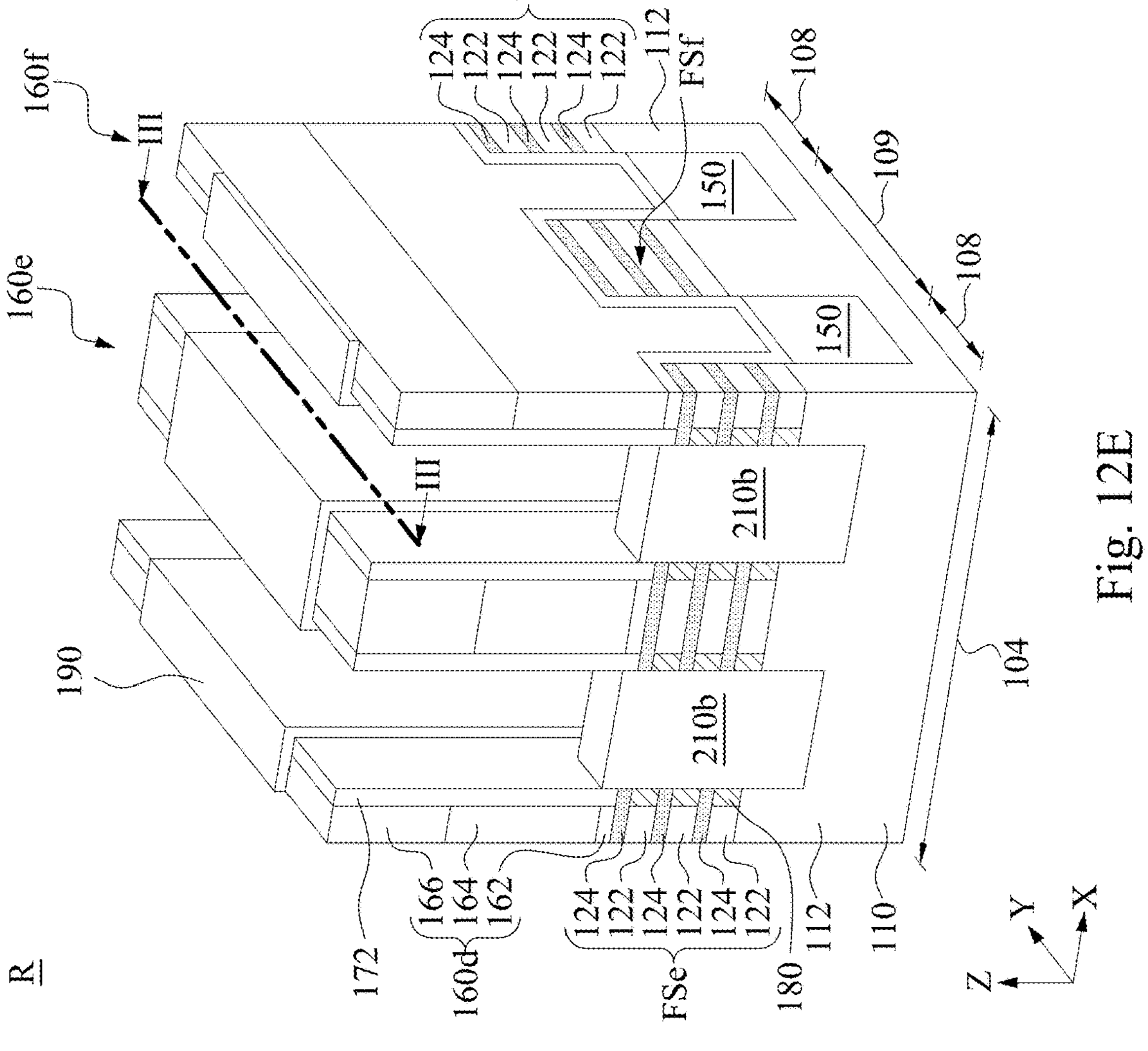
Figure 13B:
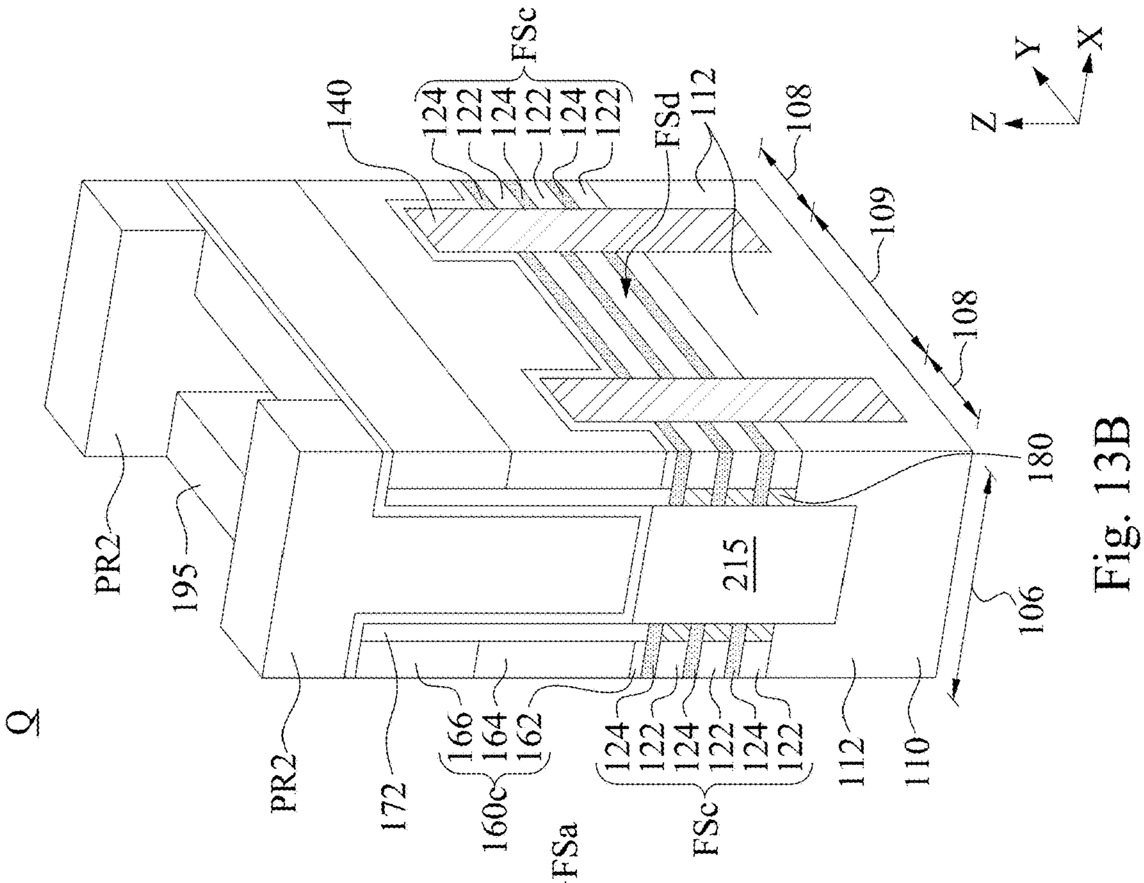
Figure 13A:
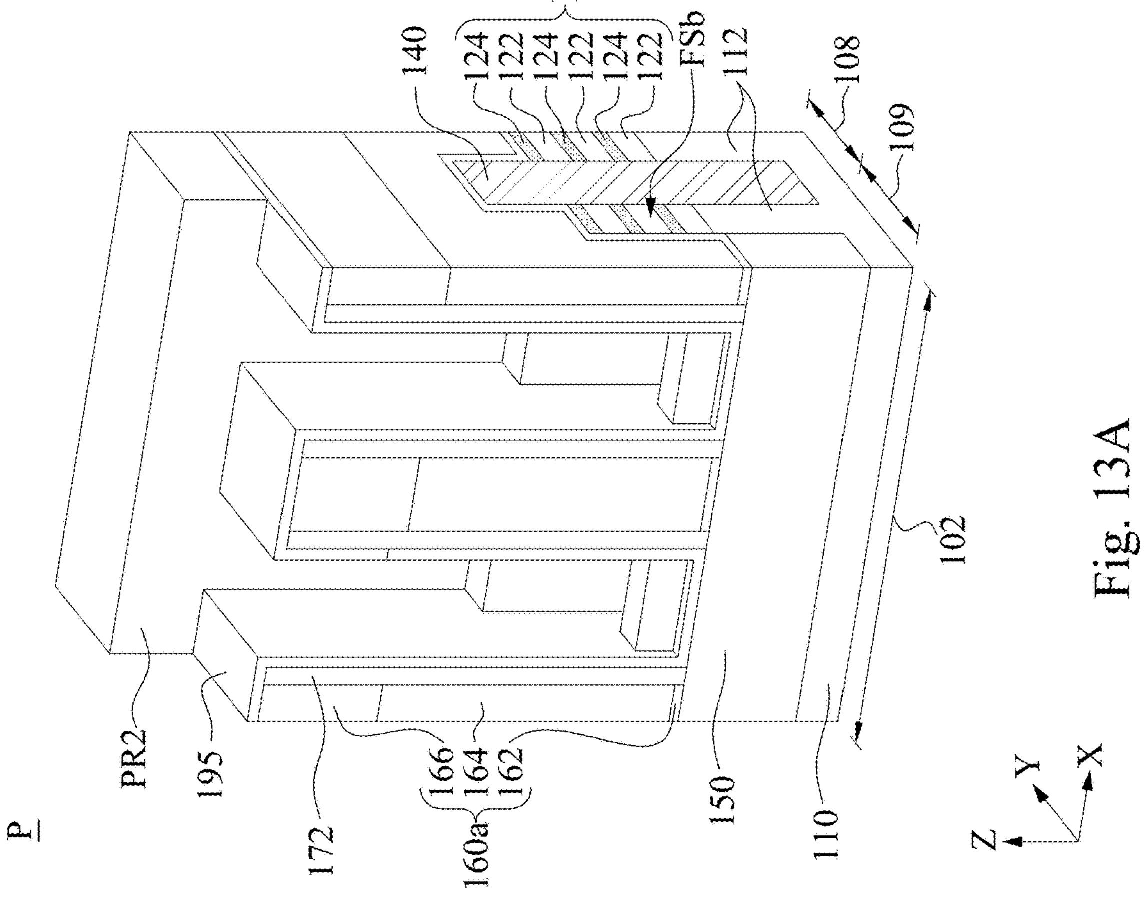
Figure 13C:
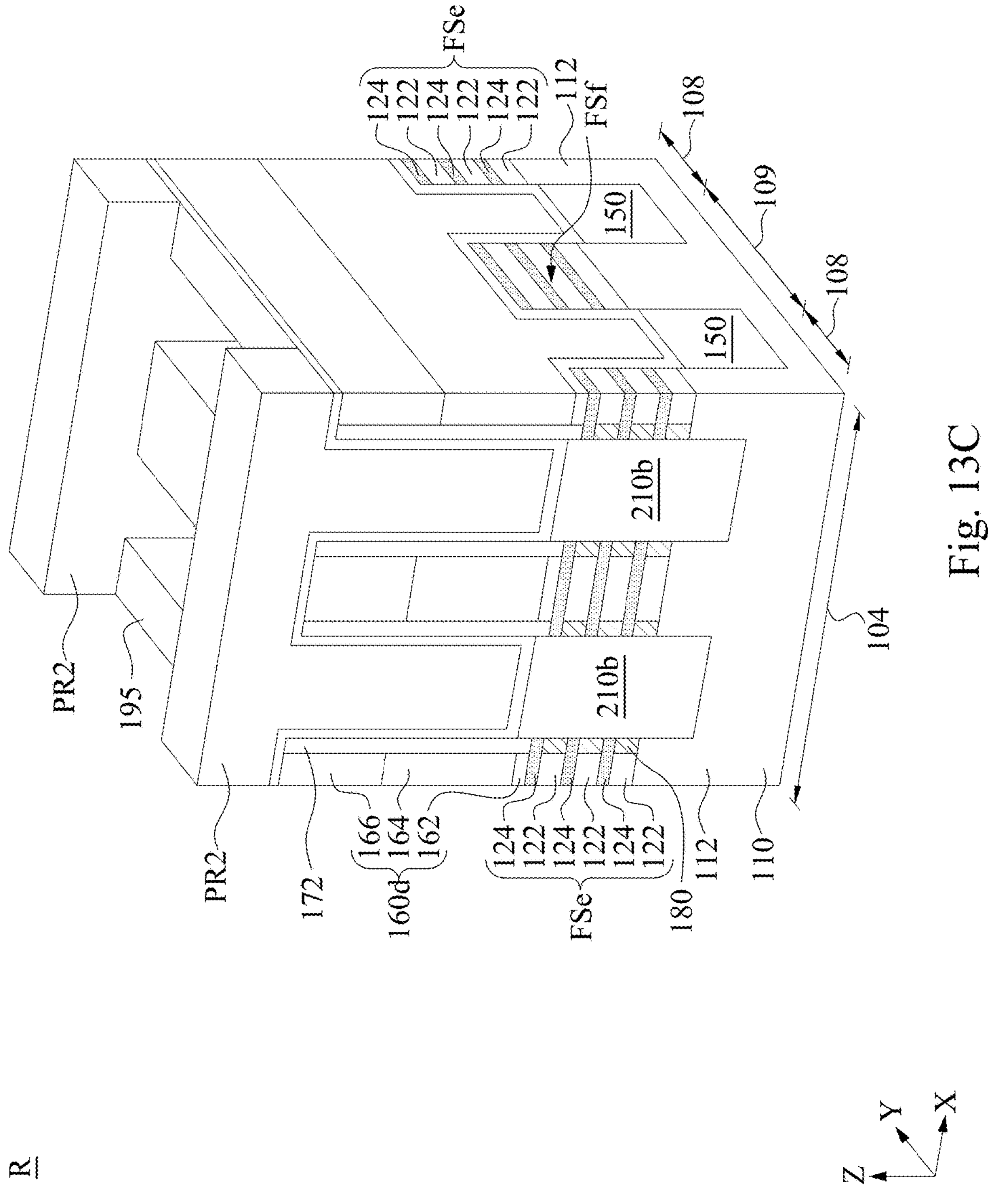
Figure 14B:
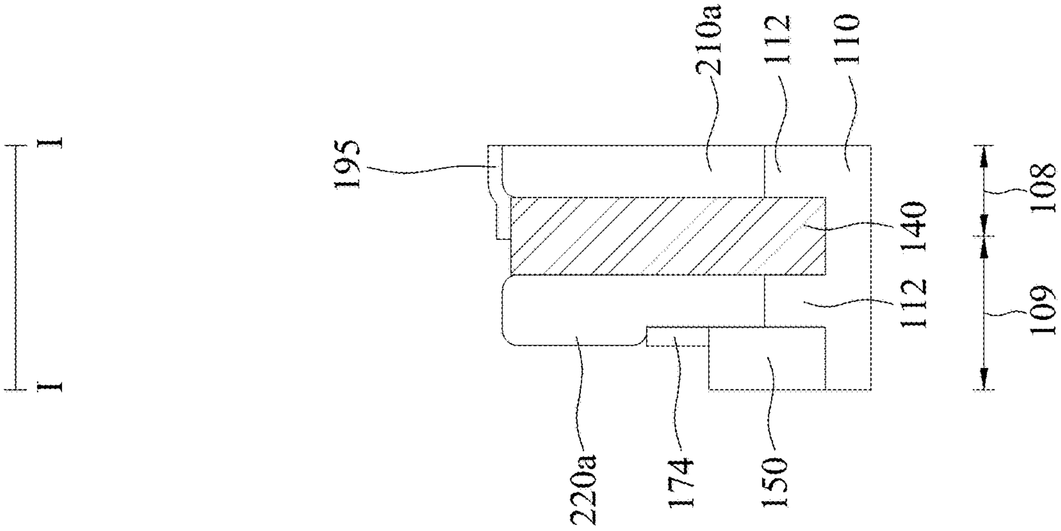
Figure 14A:
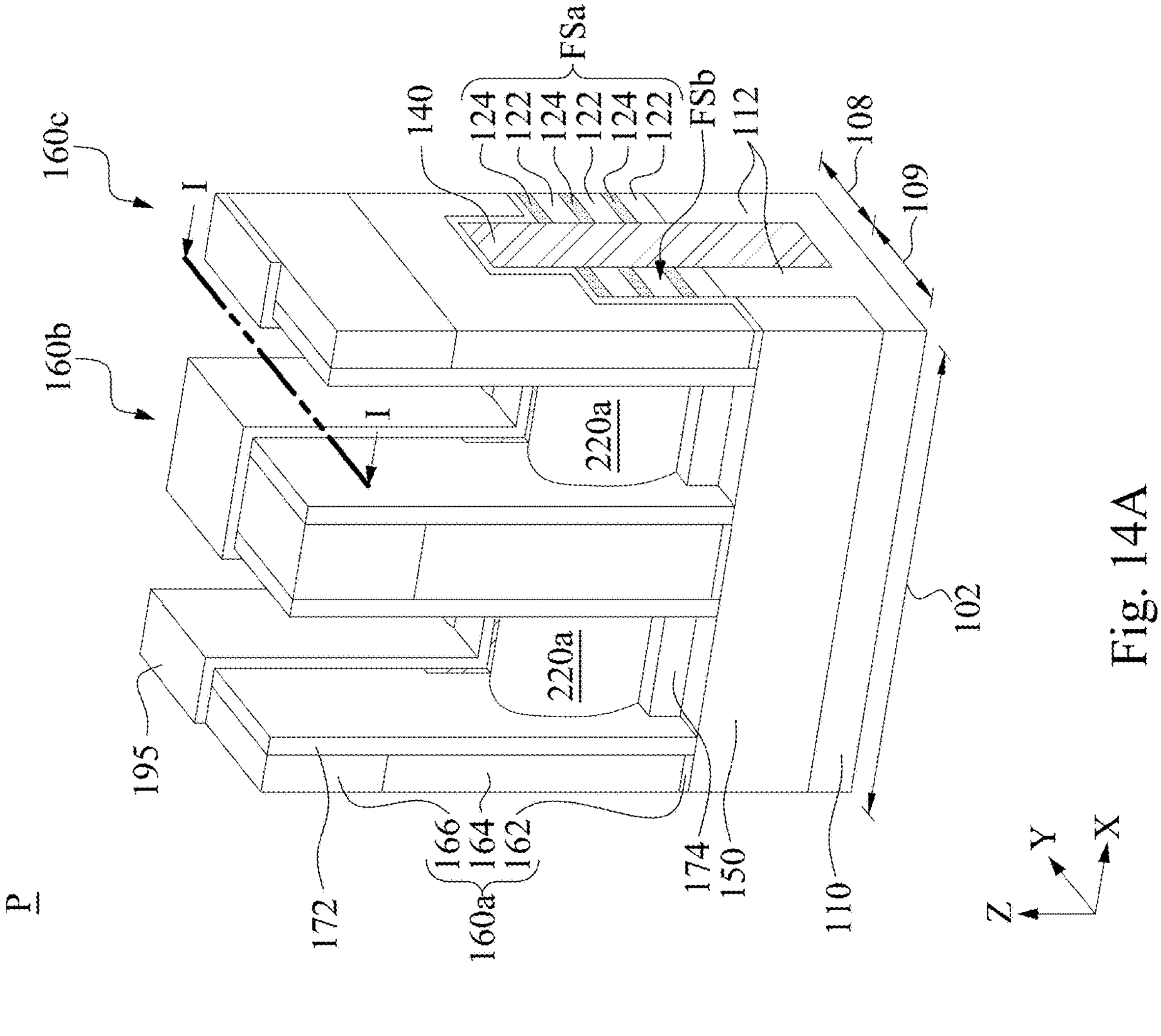
Figure 14D:
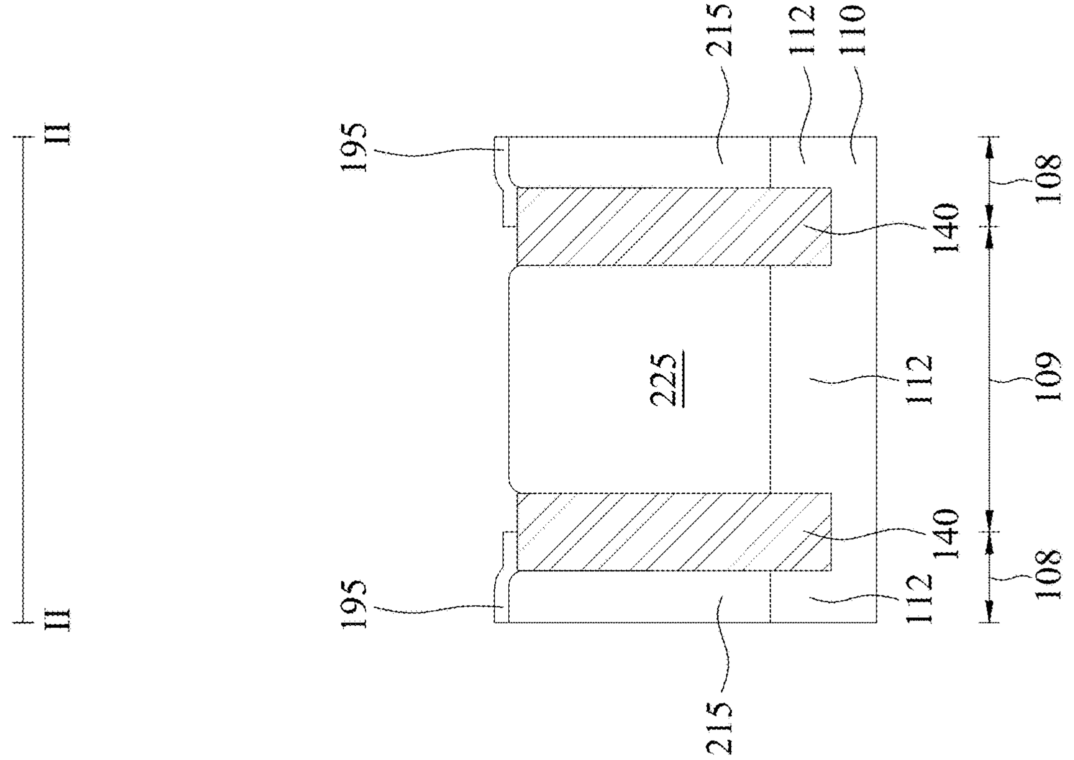
Figure 14C:
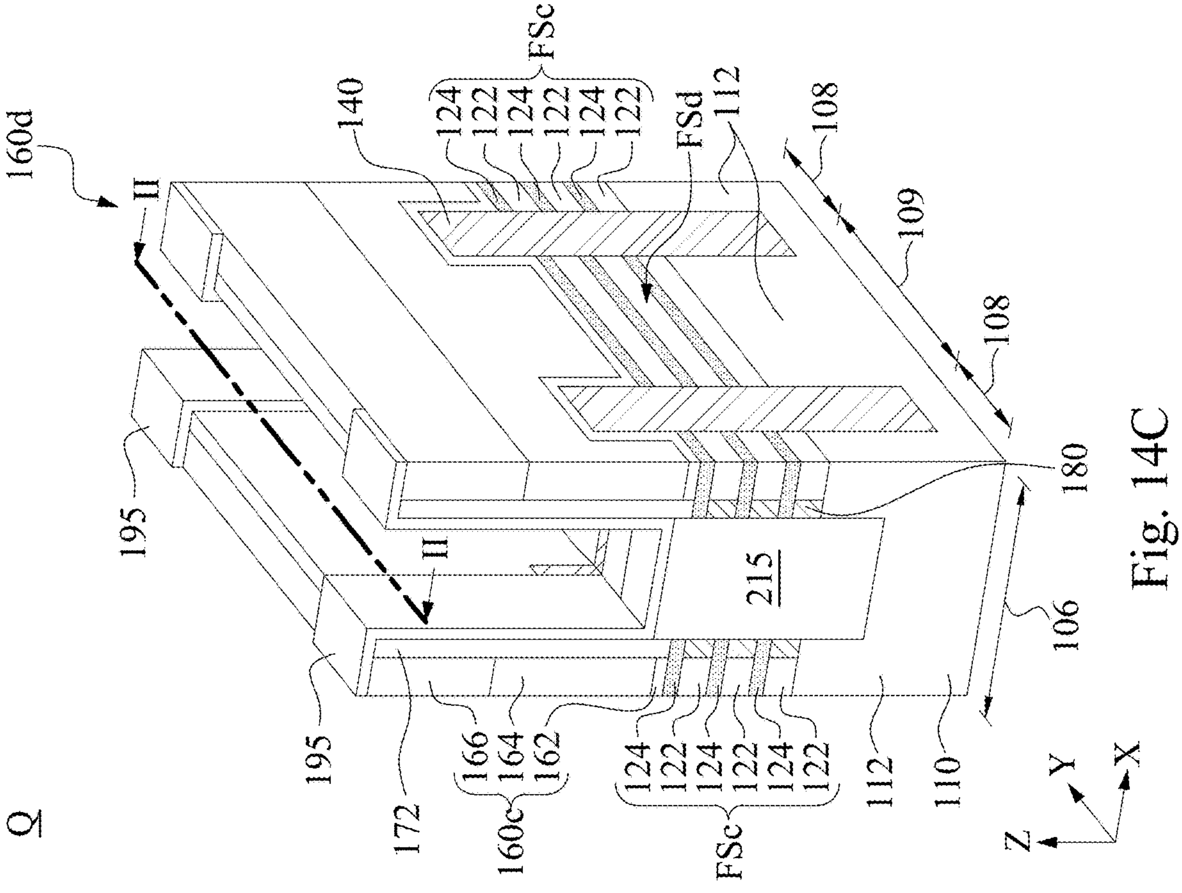
Figure 14F:
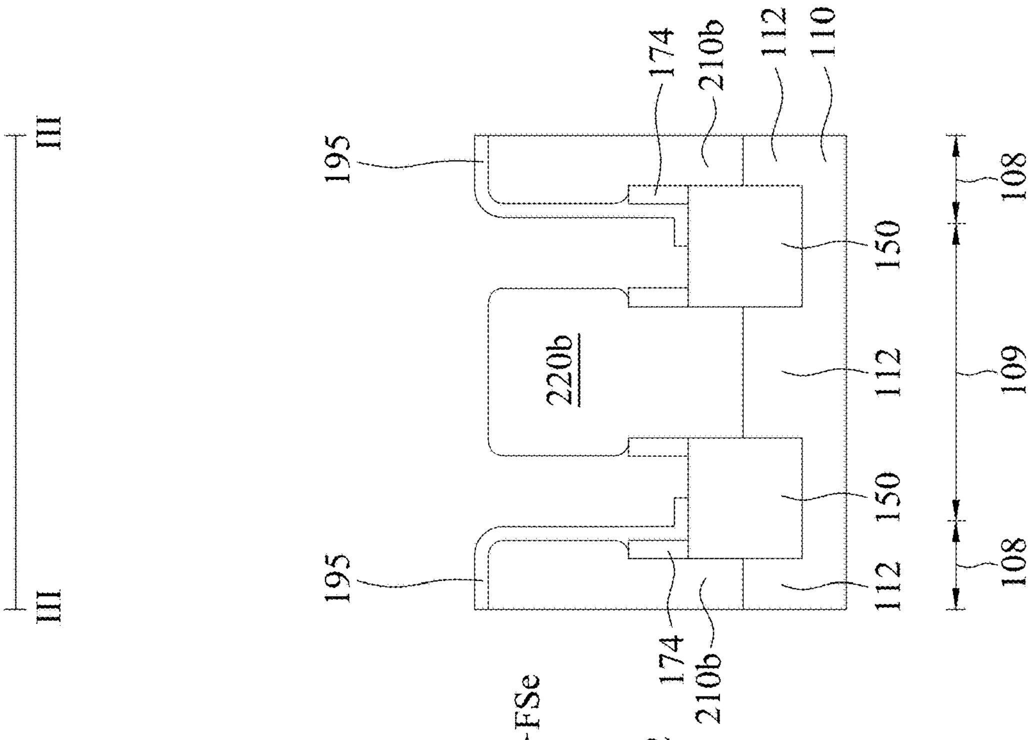
Figure 14E:
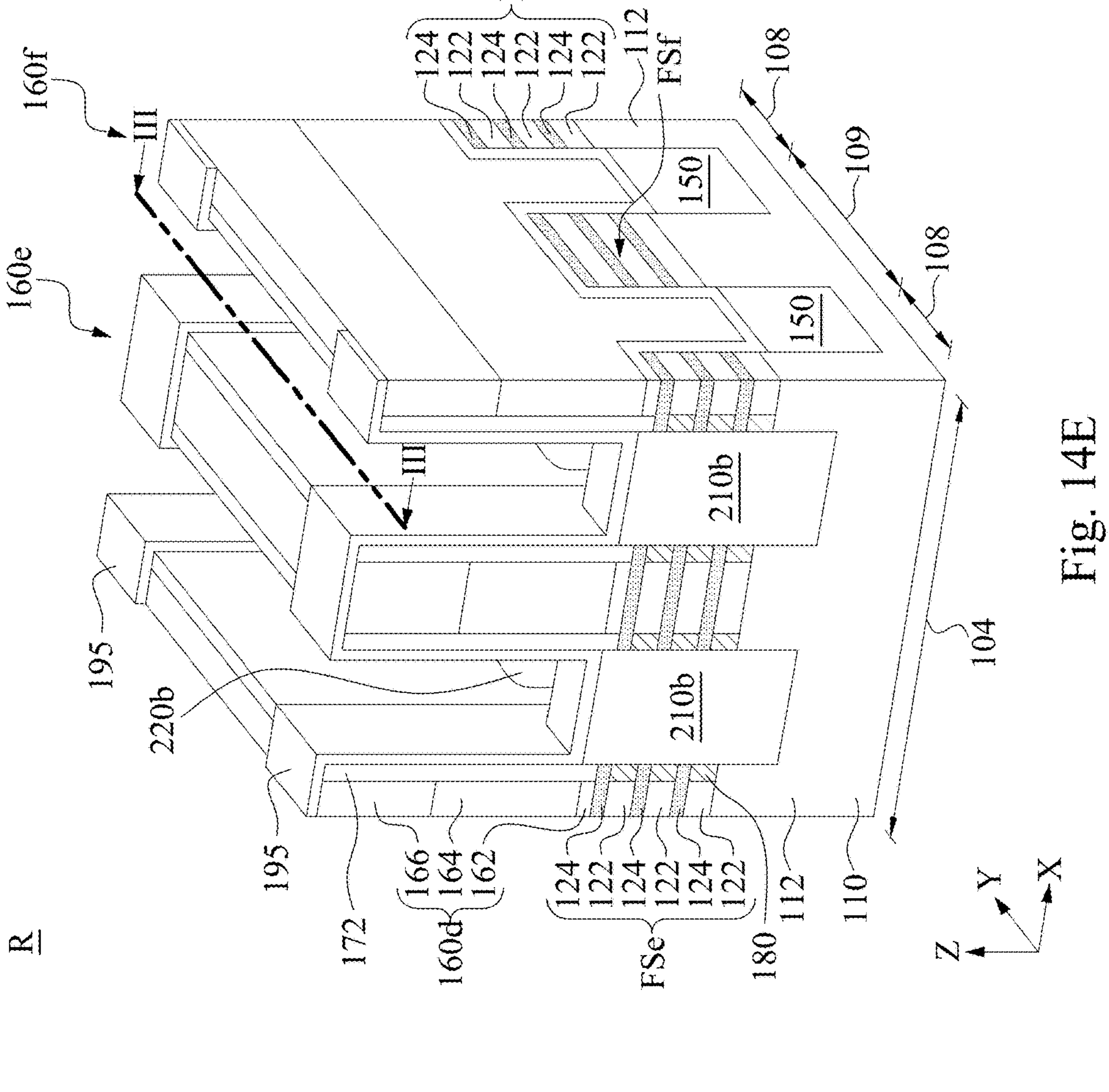
Figure 15B:
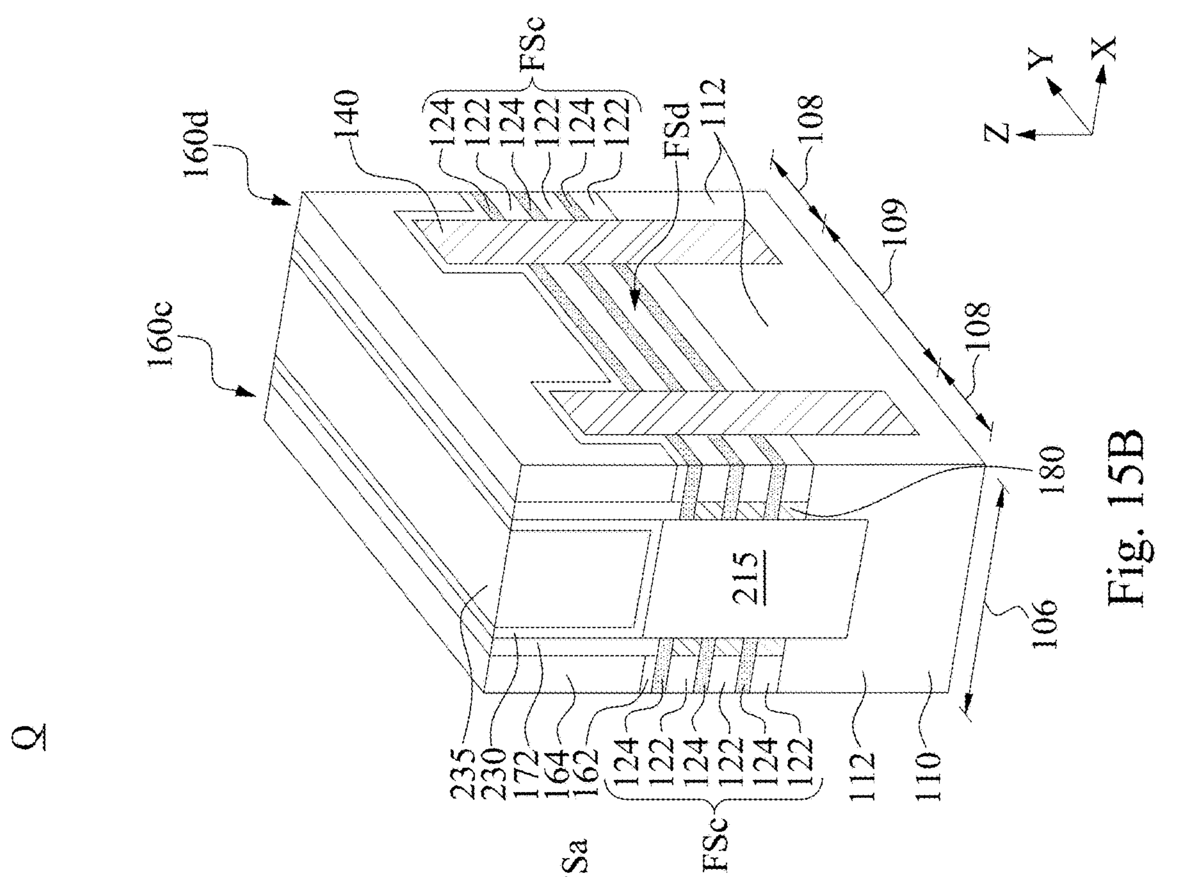
Figure 15A:
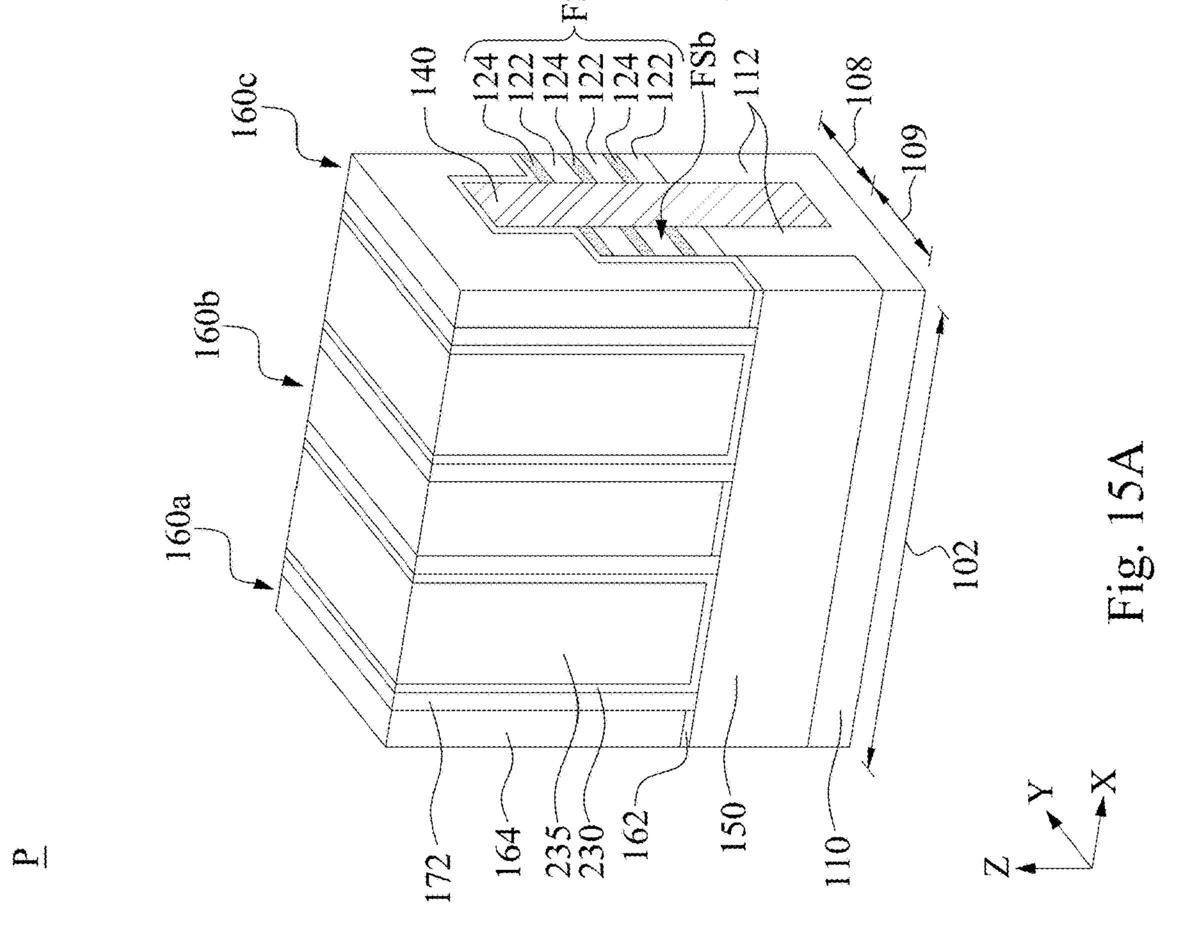
Figure 15C:
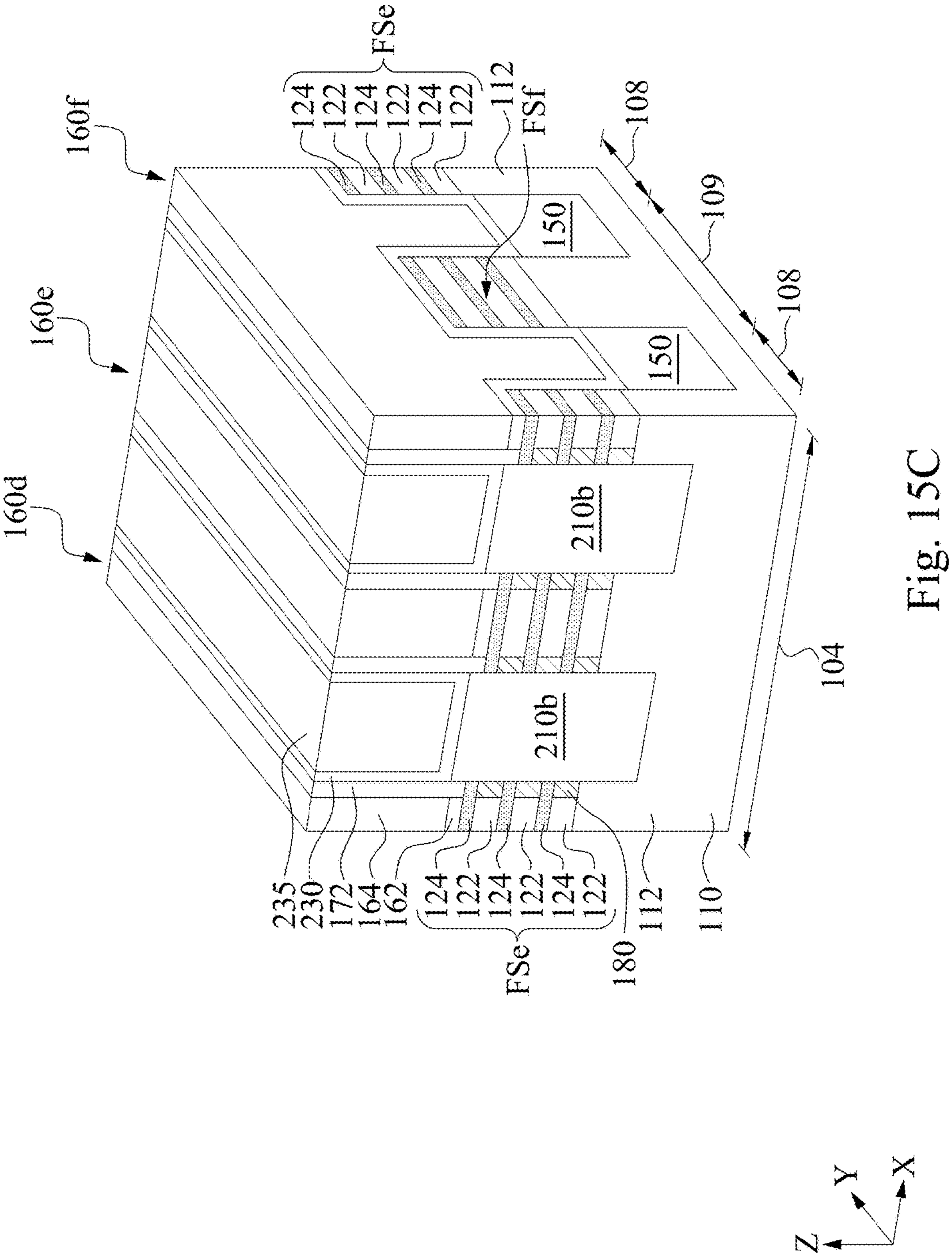
Figure 16B:
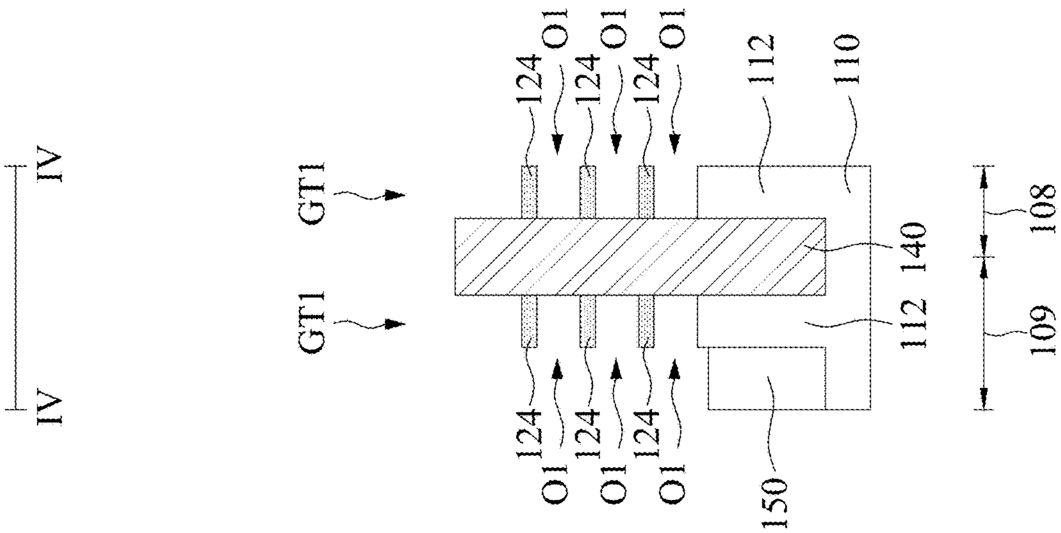
Figure 16A:
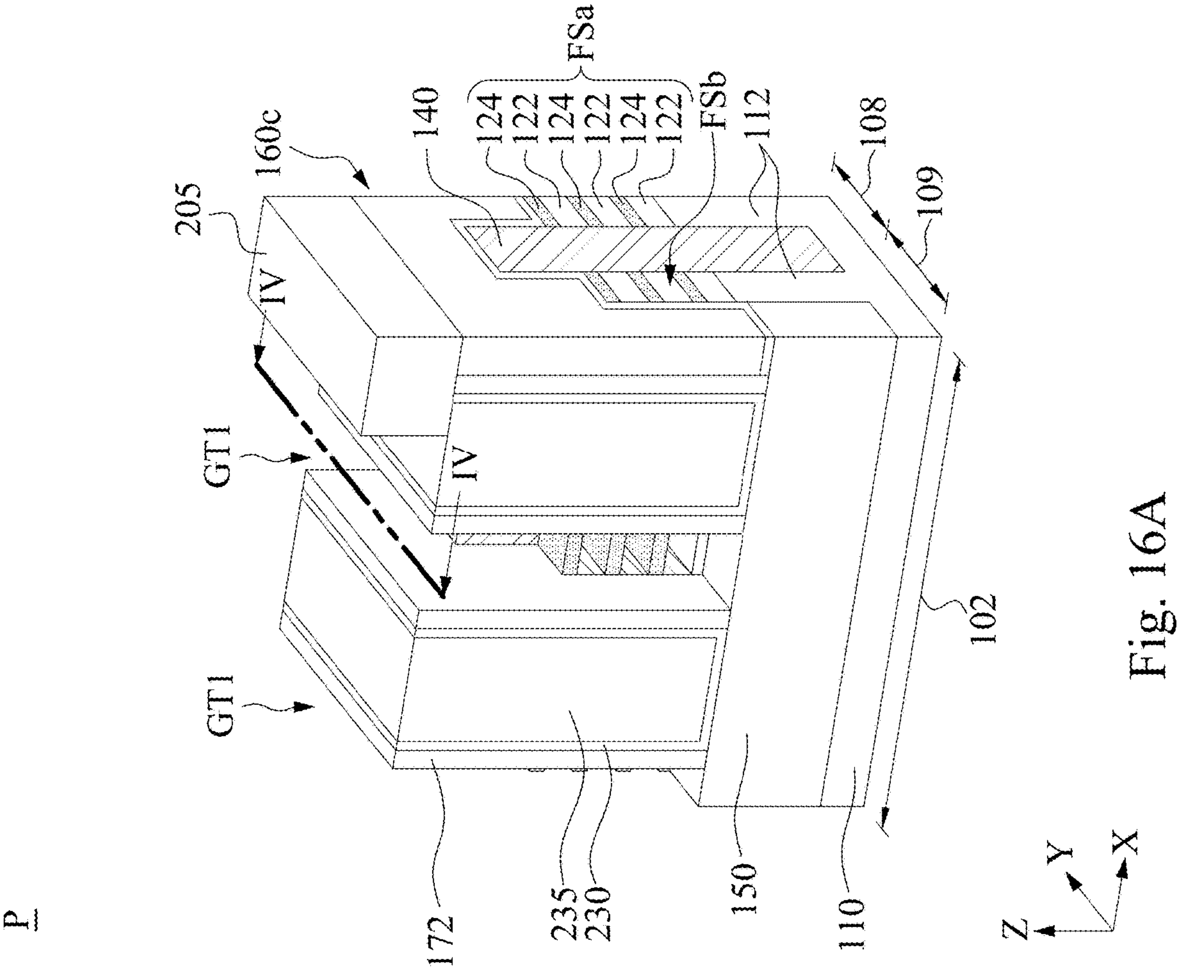
Figure 16D:
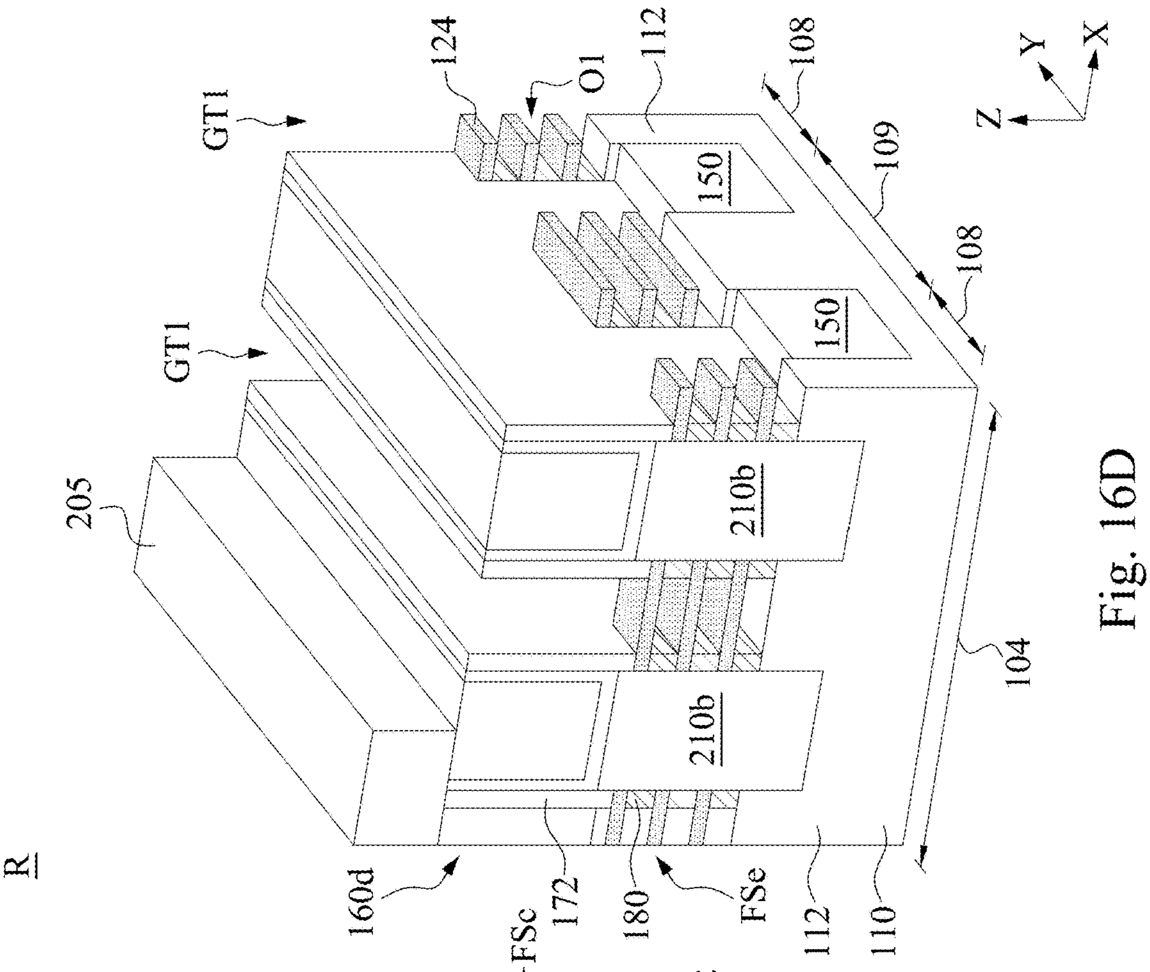
Figure 16C:
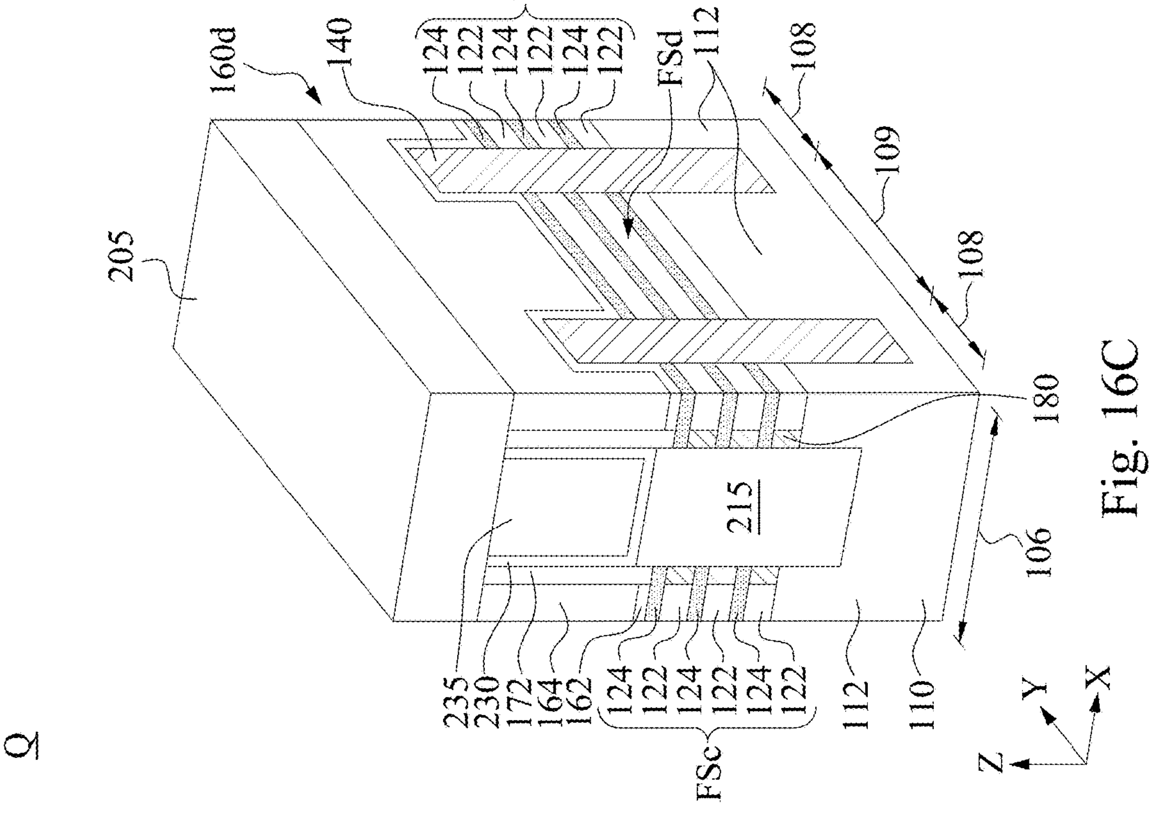
Figure 17A:
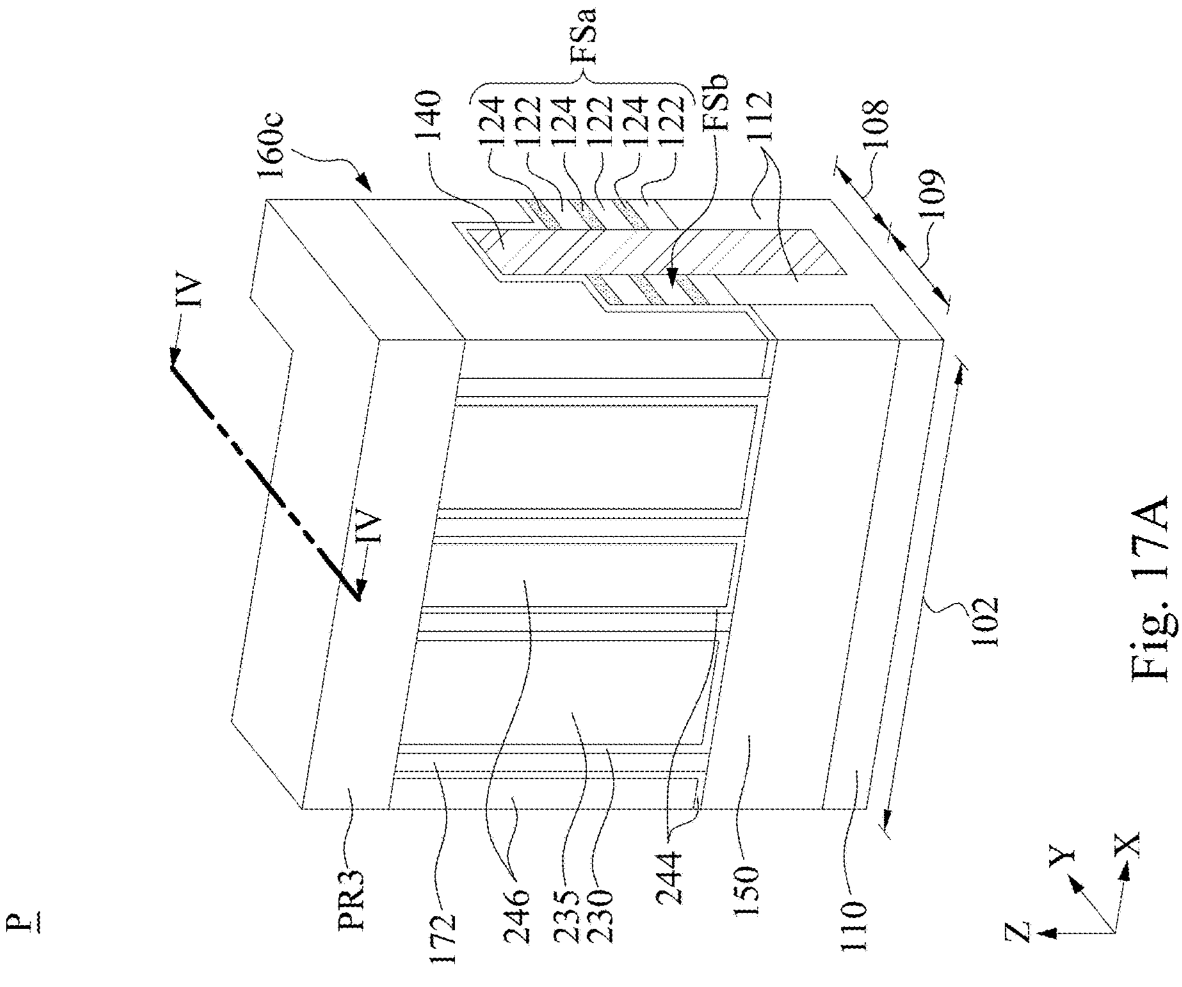
Figure 17B:
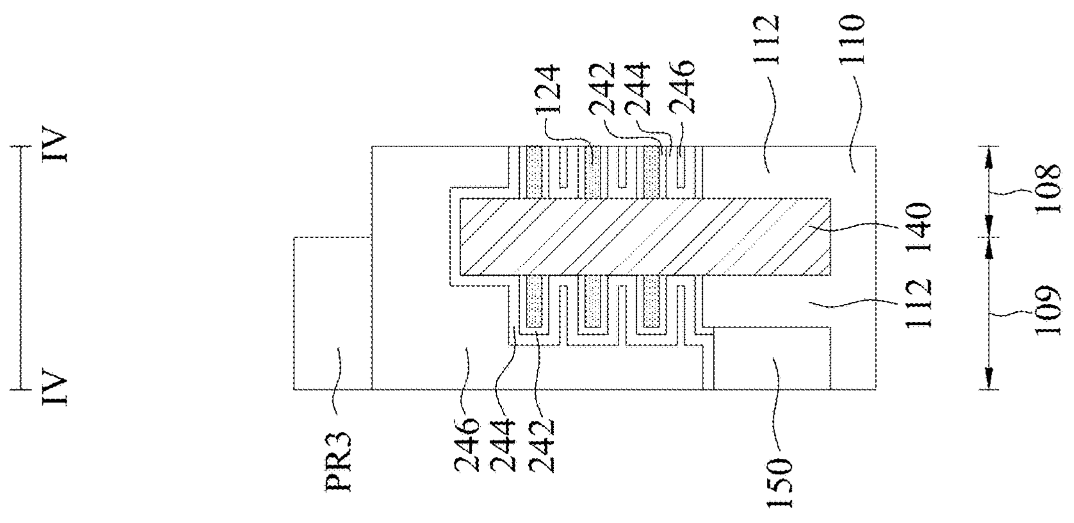
Figure 17C:
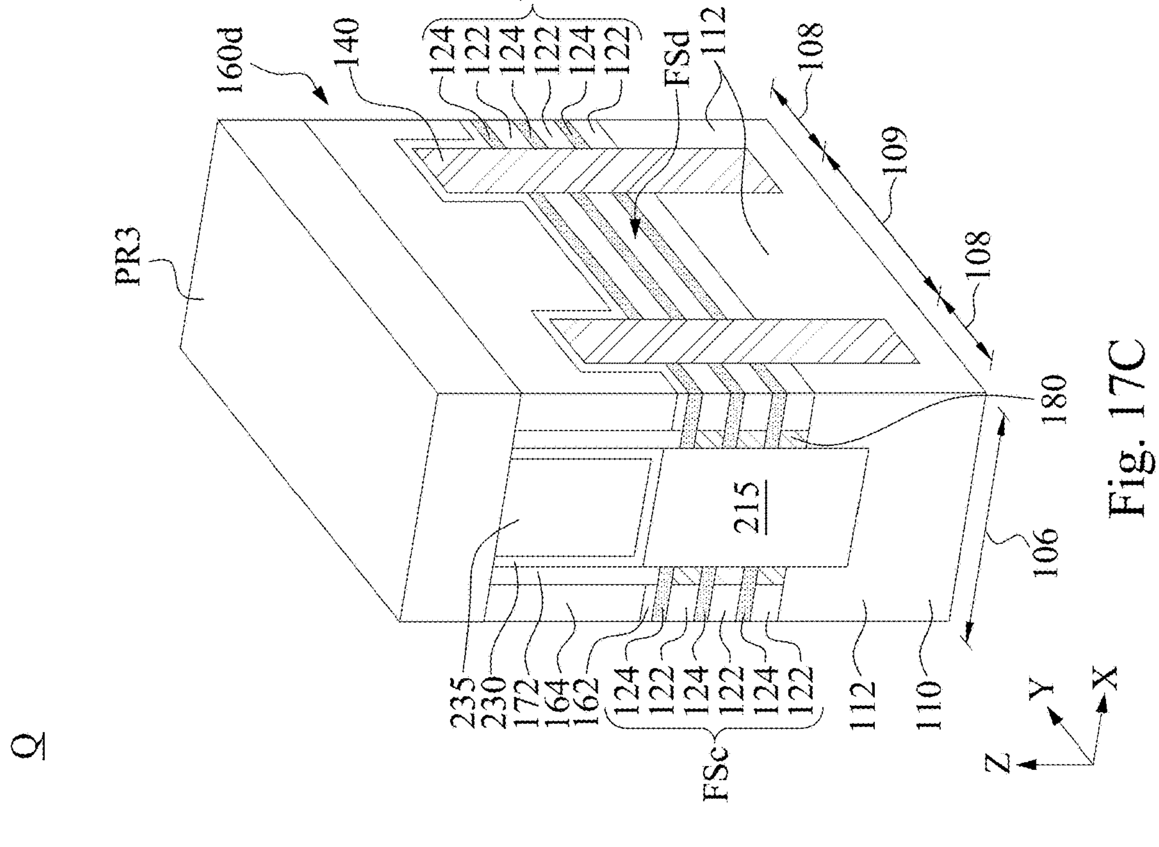
Figure 17D:
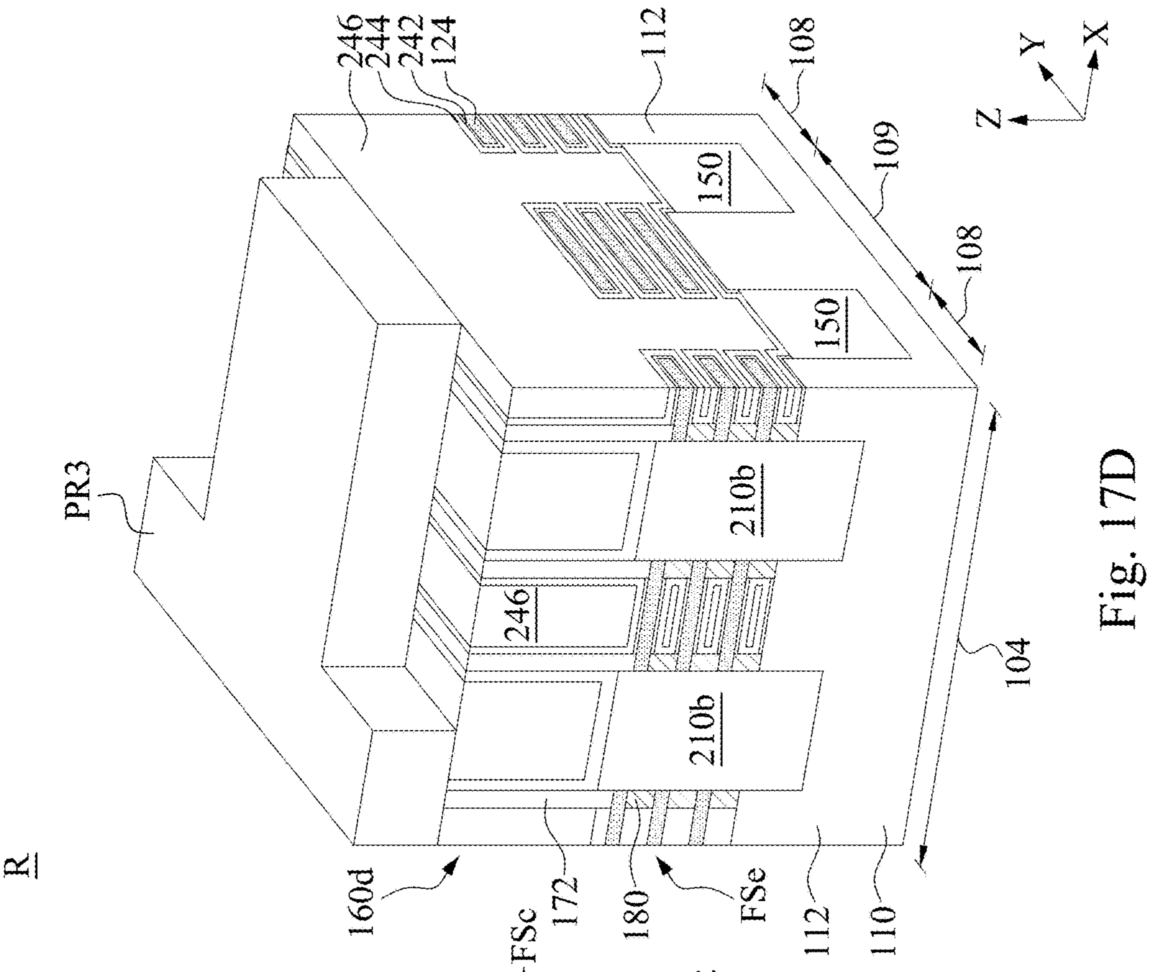

Inner spacers 180 are then formed in the recesses. For example, an inner spacer material layer is formed to fill the recesses left by the lateral etching of the semiconductor layers 122. The inner spacer material layer may be a low-k dielectric material, such as $SiO_2$, silicon nitride (SiN), silicon carbonoxide (SiCO), silicon carbonitride (SiCN), silicon oxycarbonitride (SiOCN). The inner spacer material layer can be formed using CVD, including LPCVD and PECVD, PVD, ALD, or other suitable processes. After the deposition of the inner spacer material layer, an anisotropic etching process is performed to trim the deposited inner spacer material layer, such that portions of the deposited inner spacer material layer that fill the recesses left by the lateral etching of the semiconductor layers 122 are left. After the trimming process, the remaining portions of the deposited inner spacer material are denoted as the inner spacers 180 for the sake of simplicity. The inner spacers 180 serve to isolate metal gates from source/drain epitaxial structures formed in subsequent processing. In the example of FIGS. 10A-10C, sidewalls of the inner spacers 180 are substantially aligned with sidewalls of the channel layers 124.

Reference is made to FIGS. 1 and 11A-11C. A protection layer 190 is conformally deposited on the structure illustrated in FIGS. 10A-10C. In some embodiments, the protection layer 190 is made of a dielectric material, e.g., silicon oxide, silicon nitride, SiCON, high-k dielectric materials, combinations thereof, or the like. Subsequently, a photoresist layer PR1 is deposited over the protection layer 190. The photoresist layer PR1 is then patterned to expose portions of the protection layer 190 directly over the N-type regions 108 of the substrate 110.

Reference is made to FIGS. 1 and 12A-12F. The protection layer 190 is then patterned by using the photoresist layer PR1 (see FIGS. 11A-11C) as an etch mask, such that the protection layer 190 exposes the structure over the N-type regions 108 of the substrate 110. The photoresist layer PR1 is then removed by using, for example, etching or ashing process.

Source/drain epitaxial structures 210*a*, 210*b* and dummy epitaxial structures 215 are formed at the source/drain regions of the fin structures FSa, FSc, and FSe. The source/drain epitaxial structures 210*a*, 210*b* and dummy epitaxial structures 215 are connected to the semiconductor layers 124. The source/drain epitaxial structures 210*a* and 210*b* are formed over the first device region 102 and the second device region 104, respectively, and the dummy epitaxial structures 215 are formed over the connecting region 106. The source/drain epitaxial structures 210*a*, 210*b* and dummy epitaxial structures 215 may be formed by performing an epitaxial growth process that provides an epitaxial material connected to the fin structures FSa, FSc, and FSe. During the epitaxial growth process, the dummy gate structures 160*a*-160*f*, the gate spacers 172, the sidewall spacers 174, and the protection layer 190 limit the source/drain epitaxial structures 210*a*, 210*b* and the dummy epitaxial structures 215 to the source/drain regions. In some embodiments, the lattice constants of the source/drain epitaxial structures 210*a*, 210*b* (and the dummy epitaxial structures 215) are different from the lattice constant of the semiconductor layers 124, so that the semiconductor layers 124 can be strained or stressed by the source/drain epitaxial structures 210*a*, 210*b* to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor layers 124.

In some embodiments, the source/drain epitaxial structures 210*a*, 210*b* and the dummy epitaxial structures 215 may include Ge, Si, GaAs, AlGaAs, SiGe, GaAsP, SiP, or other suitable material. The source/drain epitaxial structures 210*a*, 210*b* and the dummy epitaxial structures 215 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 210*a*, 210*b* and the dummy epitaxial structures 215 are not in-situ doped, an implantation process (i.e., a junction implant process) is performed to dope the source/drain epitaxial structures 210*a*, 210*b* and the dummy epitaxial structures 215. In some exemplary embodiments, the source/drain epitaxial structures 210*a*, 210*b* and the dummy epitaxial structures 215 in an n-type include Si:P.

Reference is made to FIGS. 1 and 13A-13C. The protection layer 190 (see FIGS. 12A-12F) is then removed by using, for example, etching process. Subsequently, another protection layer 195 is conformally deposited over the substrate 110, and another photoresist layer PR2 is deposited on the protection layer 195. The protection layer 195 is made of a material similar to or the same as the protection layer 190. The photoresist layer PR2 is then patterned to expose portions of the protection layer 195 directly over the P-type regions 109 of the substrate 110.

Reference is made to FIGS. 1 and 14A-14F. Similarly, the protection layer 195 is patterned by using the photoresist layer PR2 (see FIGS. 13A-13C) as an etch mask, such that the protection layer 195 exposes the structure over the P-type regions 109 of the substrate 110. The photoresist layer PR2 is then removed by using, for example, etching or ashing process.

Source/drain epitaxial structures 220*a*, 220*b* and a dummy epitaxial structure 225 are formed over the source/drain regions of the fin structures FSb, FSd, and FSf. The source/drain epitaxial structures 220*a*, 220*b* and the dummy epitaxial structure 225 are connected to the semiconductor layers 124. The source/drain epitaxial structures 220*a* and 220*b* are formed over the first device region 102 and the second device region 104, respectively, and the dummy epitaxial structure 225 is formed over the connecting region 106. The source/drain epitaxial structures 220*a*, 220*b* and the dummy epitaxial structure 225 may be formed by performing an epitaxial growth process that provides an epitaxial material on the fin structures FSb, FSd, and FSf. During the epitaxial growth process, the dummy gate structures 160*a*-160*f*, the gate spacers 172, the sidewall spacers 174, and the protection layer 195 limit the source/drain epitaxial structures 220*a*, 220*b* and the dummy epitaxial structure 225 to the source/drain regions. In some embodiments, the lattice constants of the source/drain epitaxial structures 220*a*, 220*b* (and the dummy epitaxial structure 225) are different from the lattice constant of the semiconductor layers 124, so that the semiconductor layers 124 can be strained or stressed by the source/drain epitaxial structures 220*a*, 220*b* to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor layers 124.

In some embodiments, the source/drain epitaxial structures 220*a*, 220*b* and the dummy epitaxial structure 225 may include Ge, Si, GaAs, AlGaAs, SiGe, GaAsP, SiP, or other suitable material. The source/drain epitaxial structures 220*a*, 220*b* and the dummy epitaxial structure 225 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 220*a*, 220*b* and the dummy epitaxial structure 225 are not in-situ doped, an implantation process (i.e., a junction implant process) is performed to dope the source/drain epitaxial structures 220*a*, 220*b*. In some exemplary embodiments, the source/drain epitaxial structures 220*a*, 220*b* and the dummy epitaxial structure 225 in a p-type include SiGeB and/or GeSnB.

Reference is made to FIGS. 1 and 15A-15C. The protection layer 195 (see FIGS. 14A-14F) is then removed by using, for example, etching process. A contact etch stop layer (CESL) 230 is conformally formed over the substrate 110. In some embodiments, the CESL 230 can be a stressed layer or layers. In some embodiments, the CESL 230 has a tensile stress and is formed of SiN, SiCN, combinations thereof, of the like. In some other embodiments, the CESL 230 includes materials such as oxynitrides. In yet some other embodiments, the CESL 230 may have a composite structure including a plurality of layers, such as a silicon nitride layer overlying a silicon oxide layer. The CESL 230 can be formed using plasma enhanced CVD (PECVD), however, other suitable methods, such as low-pressure CVD (LPCVD), atomic layer deposition (ALD), and the like, can also be used.

An interlayer dielectric (ILD) layer 235 is then formed on the CESL 230. The ILD layer 235 may be formed by chemical vapor deposition (CVD), high-density plasma CVD, spin-on, sputtering, or other suitable methods. In some embodiments, the ILD layer 235 includes silicon oxide. In some other embodiments, the ILD layer 235 may include silicon oxy-nitride, silicon nitride, SiOCN, compounds including Si, O, C and/or H (e.g., silicon oxide, SiCOH and SiOC), a low-k material, or organic materials (e.g., polymers). After the ILD layer 235 is formed, a planarization operation, such as CMP, is performed, so that the patterned hard masks 166 (see FIGS. 14A, 14C, and 14E) are removed and the dummy gate electrode layers 164 are exposed.

Reference is made to FIGS. 1 and 16A-16D. A mask layer 205 is formed over the substrate 110 and covers the dummy gate structures 160*c* and 160*d*. The dummy gate electrode layers 164 and the dummy gate dielectric layers 162 of the dummy gate structures 160*a*, 160*b*, 160*e*, and 160*f* (see FIGS. 15A-15C) are then removed, thereby exposing the semiconductor layers 122 and 124. The ILD layer 235 protects the source/drain epitaxial structures 210*a*, 210*b* and 220*a*, 220*b* during the removal of the dummy gate electrode layers 164 and the dummy gate dielectric layers 162. In some embodiments, the dummy gate electrode layers 164 and the dummy gate dielectric layers 162 are removed by using a selective etching process (e.g., selective dry etching, selective wet etching, or combinations thereof) that etches the materials in dummy gate electrode layers 164 and the dummy gate dielectric layers 162 at a faster etch rate than it etches other materials (e.g., the gate spacers 172 and/or the ILD layer 235), thus resulting in gate trenches GT1 between corresponding gate spacers 172, with the semiconductor layers 122 and 124 exposed in the gate trenches GT1. Subsequently, the semiconductor layers 122 in the gate trenches GT1 are removed by using another selective etching process that etches the semiconductor layers 122 at a faster etch rate than it etches the semiconductor layers 124, thus forming openings O1 between neighboring semiconductor layers (i.e., channel layers) 124. In this way, the semiconductor layers 124 become nanosheets suspended over the substrate 110 and between the source/drain epitaxial structures 210*a*, 210*b* and 220*a*, 220*b*. This operation is also called a channel release process. In some embodiments, the semiconductor layers 124 can be interchangeably referred to as nanostructure (fork-sheets, nanowires, nanoslabs and nanorings, nanosheet, etc., depending on their geometry). For example, in some other embodiments the semiconductor layers 124 may be trimmed to have a substantial rounded shape (i.e., cylindrical) due to the selective etching process for completely removing the semiconductor layers 122. In that case, the resultant semiconductor layers 124 can be called nanowires.

Reference is made to FIGS. 1 and 17A-17D. A gate dielectric layer is formed in the gate trenches GT1 and the openings O1 (see FIGS. 16A-16D) and around the semiconductor layers 124. The gate dielectric layer includes an interfacial layer (e.g., silicon oxide layer) 242 and a high-k gate dielectric layer 244 over the interfacial layer 242. High-k gate dielectrics include dielectric materials having a high dielectric constant, for example, greater than that of thermal silicon oxide (~3.9). In some embodiments, the interfacial layer 242 of the gate dielectric layer may include a dielectric material such as silicon oxide ($SiO_2$), HfSiO, or silicon oxynitride (SiON). The interfacial layer 242 may be formed by chemical oxidation, thermal oxidation, atomic layer deposition (ALD), chemical vapor deposition (CVD), and/or other suitable method. The high-k dielectric layer 244 of the gate dielectric layer may include hafnium oxide ($HfO_2$). Alternatively, the high-k dielectric layer 244 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

A P-type work function metal layer 246 is formed around the high-k gate dielectric layer 244 and fills the gate trenches GT1 and the openings O1. In some embodiments, the P-type work function metal layer 246 may include a single layer or multi layers. In various embodiments, the P-type work function metal layer 246 may include a work function that is greater than about 4.8 eV. The P-type work function metal layer 246 may include Ti, TiAl, TiAlN, TaC, TaCN, TaSiN, Mn, Zr, TiN, TaN, Ru, Mo, WN, Co, Al, or any suitable materials. The P-type work function metal layer 246 may be formed by ALD, PVD, CVD, or other suitable process.

After the formation of the P-type work function metal layer 246, a photoresist layer PR3 is formed over the substrate 110. The photoresist layer PR3 covers portions of the P-type work function metal layer 246 over the P-type regions 109 but exposes other portions of the P-type work function metal layer 246 over the N-type regions 108. The photoresist layers PR3 further covers the dummy gate structures 160*c* and 160*d*.

Reference is made to FIGS. 1 and 18A-18D. The portions of the P-type work function metal layer 246 over the N-type regions are then removed by using one or more etching processes to form openings, and portions of the high-k gate dielectric layer 244 are exposed by the openings. The photoresist layer PR3 (see FIGS. 17A-17D) is then removed by using, for example, etching or ashing process.

Subsequently, an N-type work function metal layer 248 is formed on the portions of the high-k gate dielectric layer 244 and fills the openings. The N-type work function metal layer 248 may include various metals that have a work function that is less than about 4.33 eV. In some embodiment, the N-type work function metal layer 248 may include Ta. Alternatively, some other examples of N-metals may include (but are not limited to) Zn, Ti, Nb, Al, Ag, Mn, Zr, Hf, and La. The N-type work function metal layer 248 may be formed by various deposition techniques such as physical vapor deposition (PVD or sputtering), CVD, ALD, plating, or other suitable technique. After the deposition process, a planarization process (e.g., CMP process) may be performed to remove portions of the N-type work function metal layer 248 outside the openings.

Figure 18B:
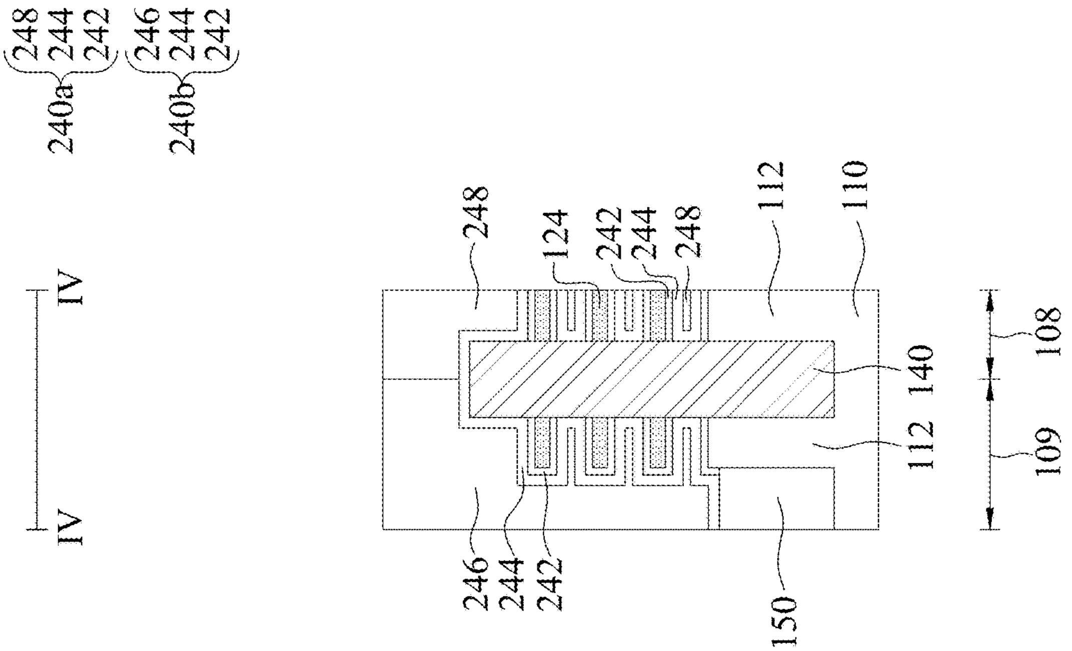
Figure 18A:
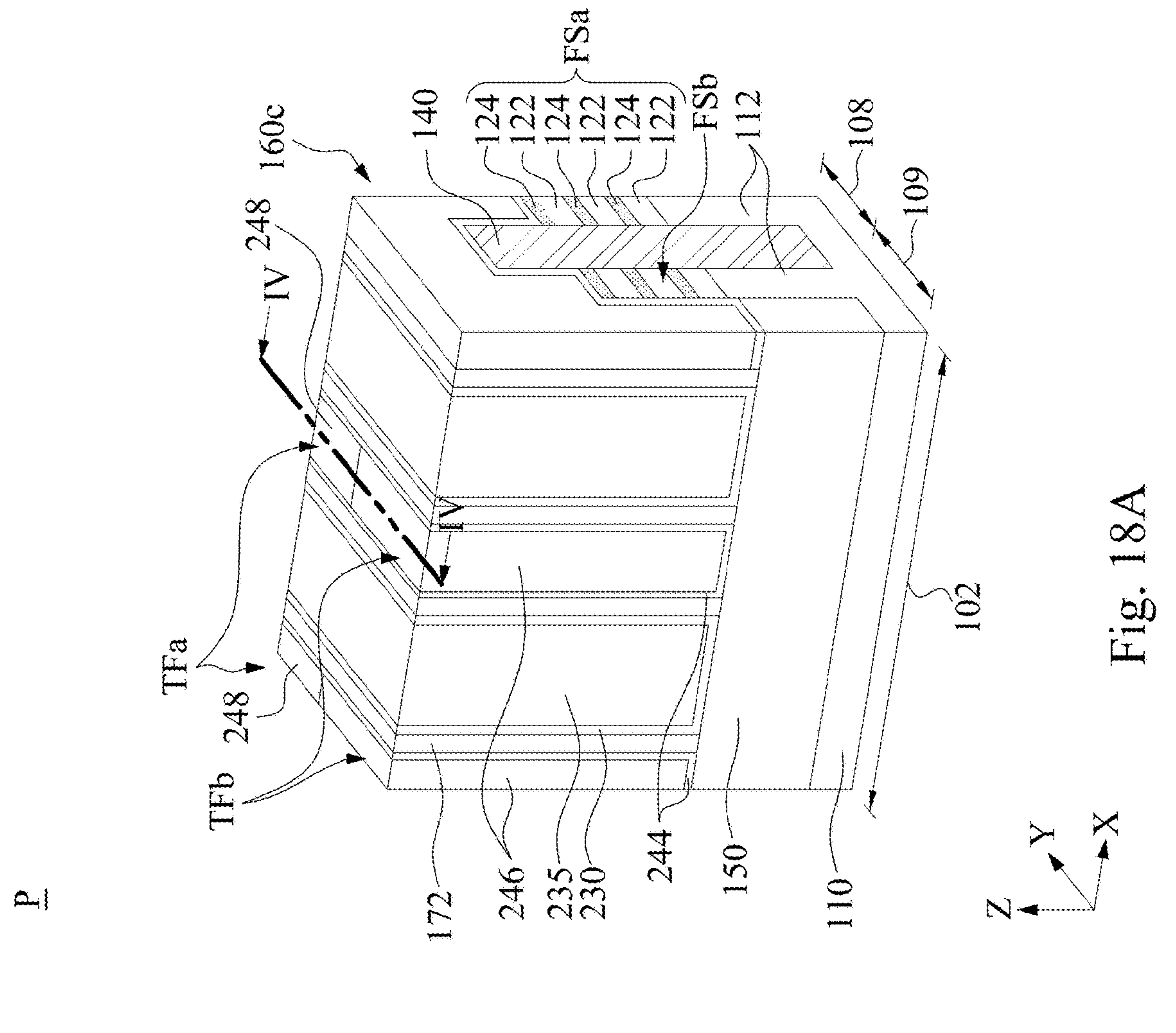
Figure 18D:
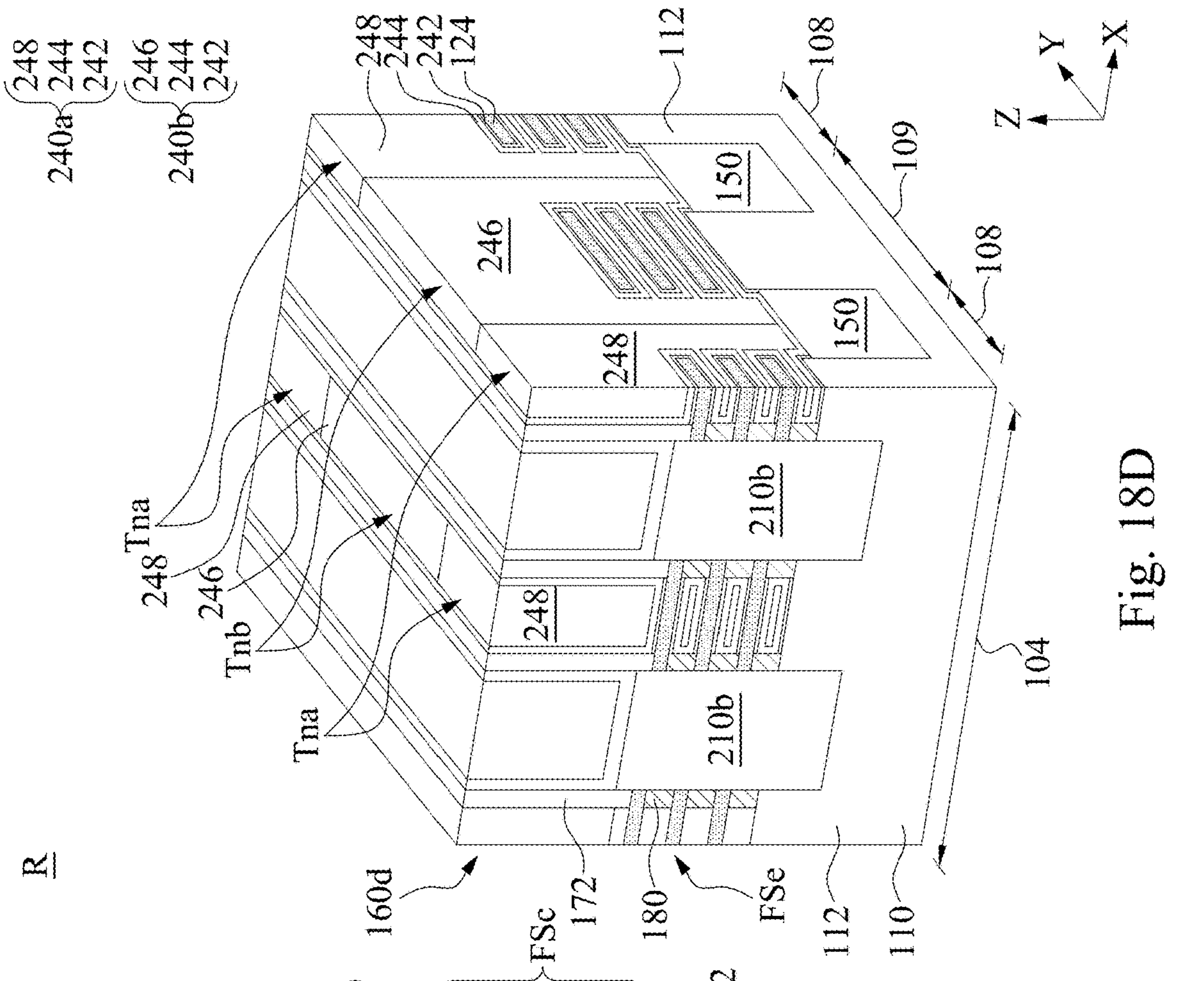
Figure 18C:
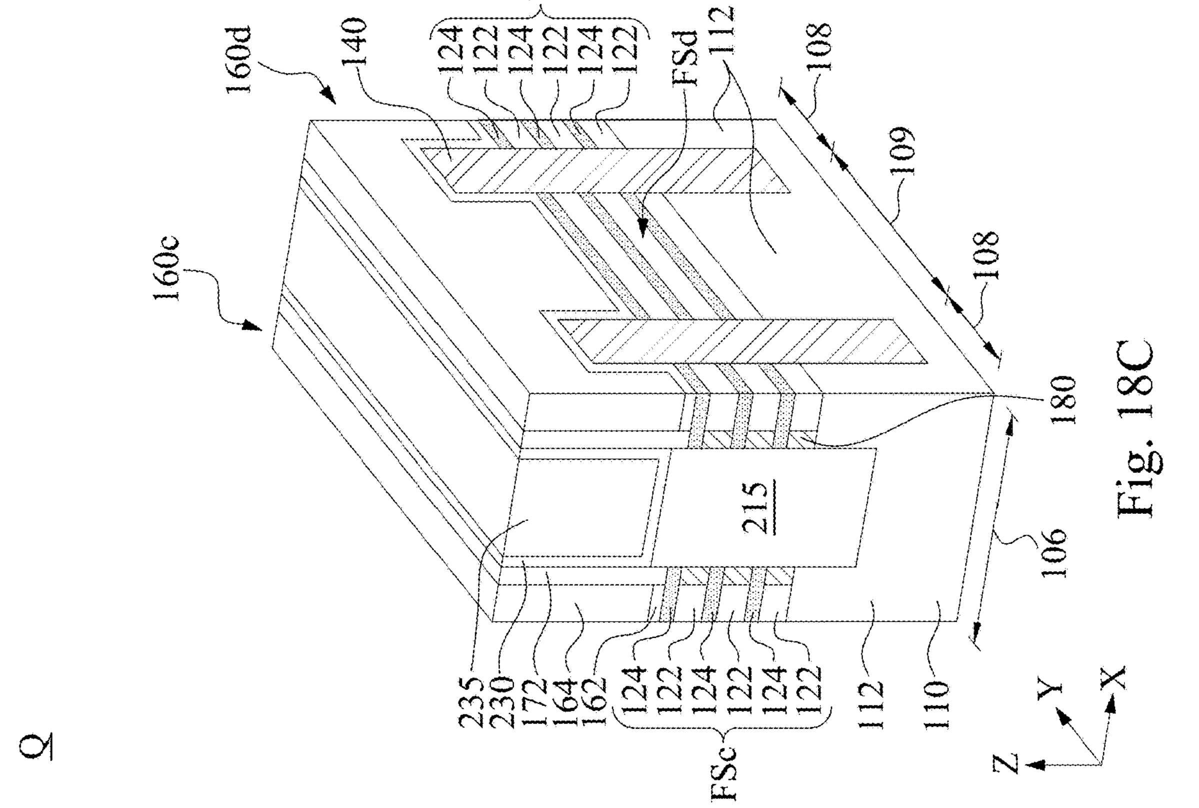

In FIGS. 18A, 18B, and 18D, gate structures 240*a* are formed over the N-type regions 108, and gate structures 240*b* are formed over the P-type region 109. Each of the gate structures 240*a* includes interfacial layer 242, the high-k gate dielectric layer 244, and the N-type work function metal layer 248, and each of the gate structures 240*b* includes interfacial layer 242, the high-k gate dielectric layer 244, and the P-type work function metal layer 246. The gate structures 240*a* and 240*b* may both be referred to as gate structures 240 (see FIG. 1).

In FIG. 18A, transistors (or nanostructure devices) Tfa and Tfb are formed over the first device region 102. The transistors Tfa are N-type fork-sheet transistors, and the transistors Tfb are P-type fork-sheet transistors. In FIG. 18D, transistors (or nanostructure devices) Tna and Tnb are formed over the second device region 104. The transistors Tna are N-type nanosheet transistors, and the transistors Tnb are P-type nanosheet transistors. As shown in FIGS. 18B and 18D, the gate structures 240*a*/240*b* of the fork-sheet transistors Tfa and Tfb surround three sides of the semiconductor layers (channel layers) 124 and in contact with the dielectric fin 140, while the gate structures 240*a*/240*b* of the nanosheet transistors Tna and Tnb surround all sides of the semiconductor layers (channel layers) 124 and in contact with the isolation structures 150.

Figure 19B:
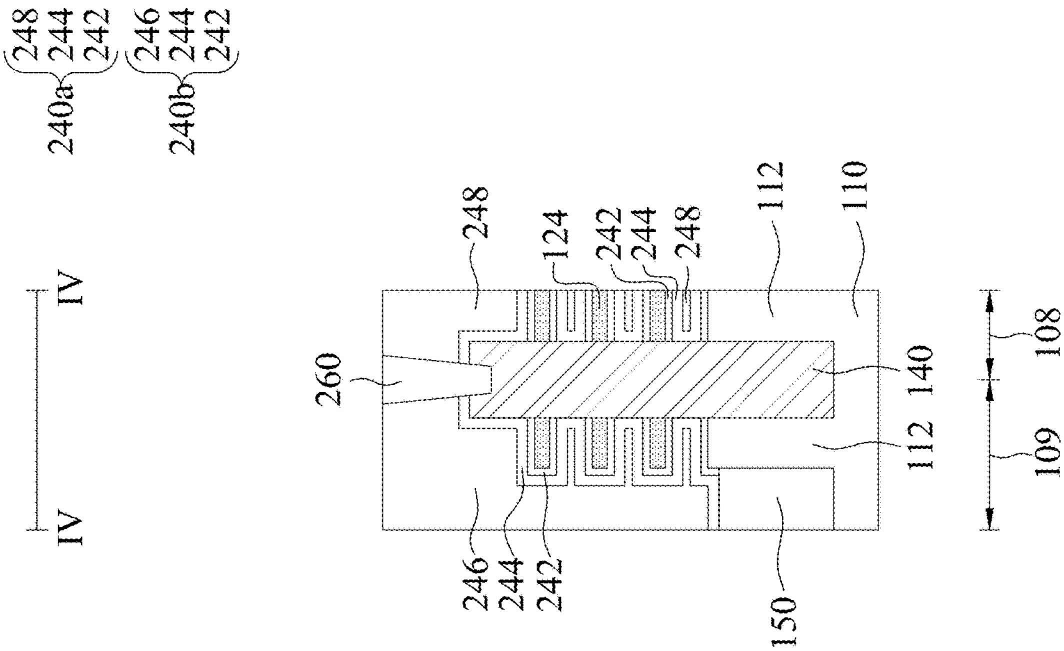
Figure 19A:
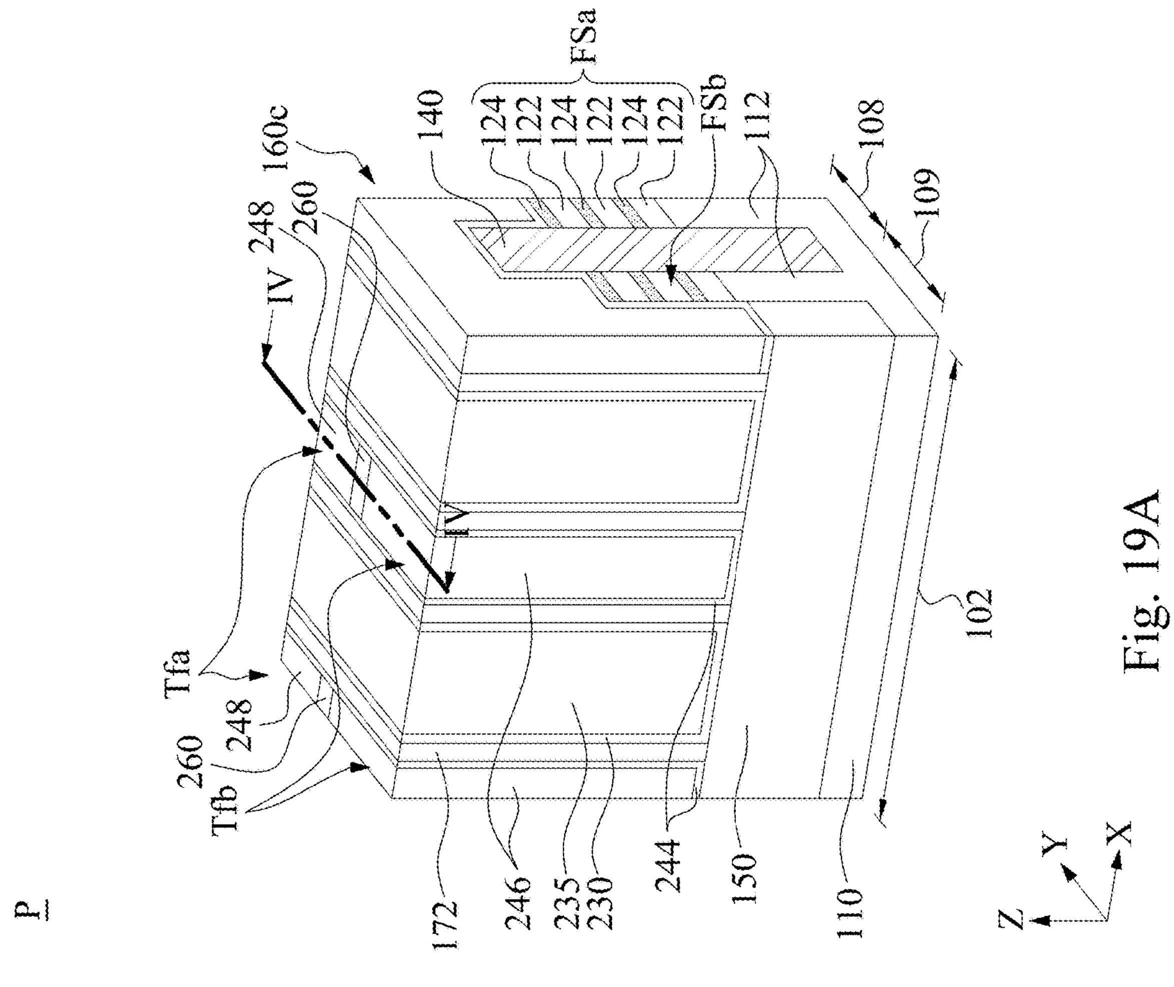
Figure 19D:
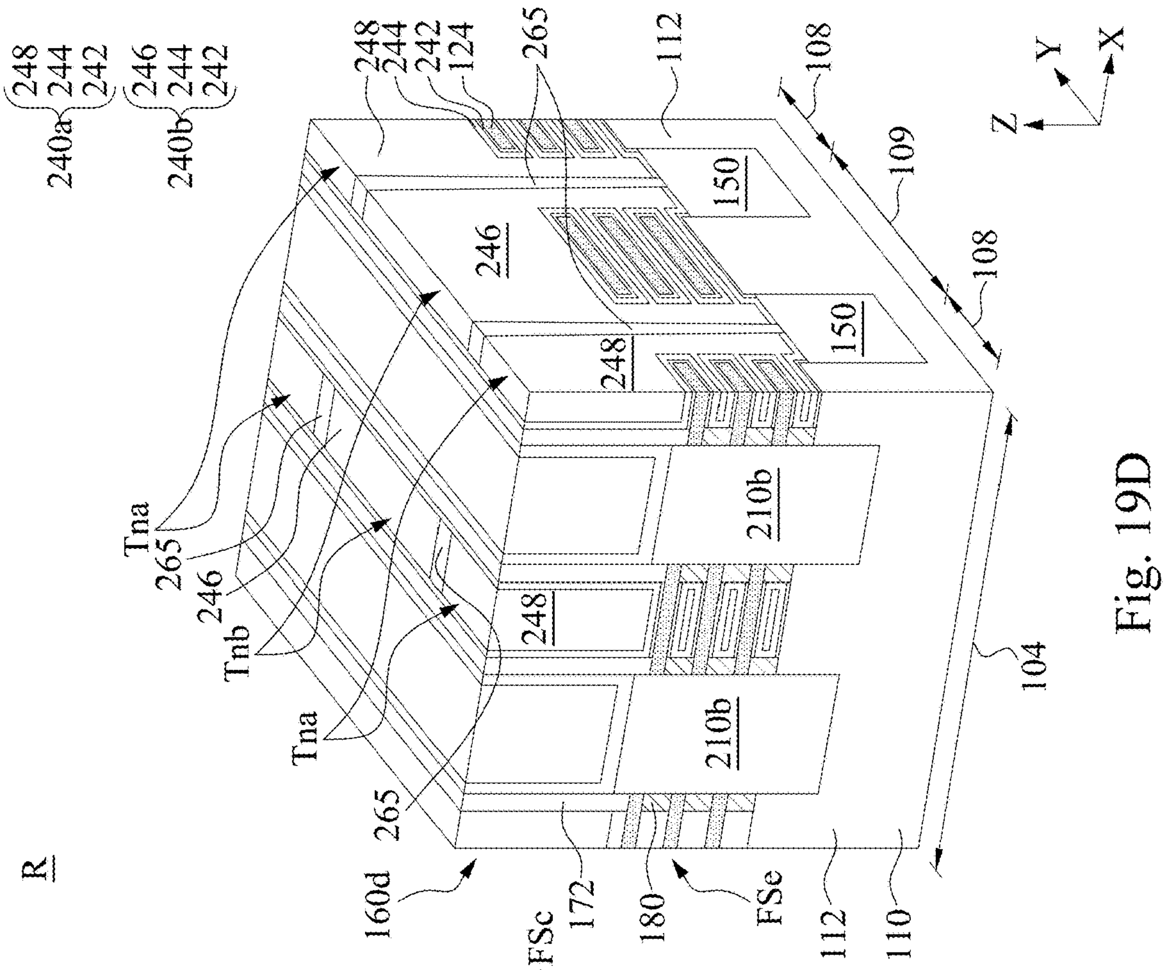
Figure 19C:
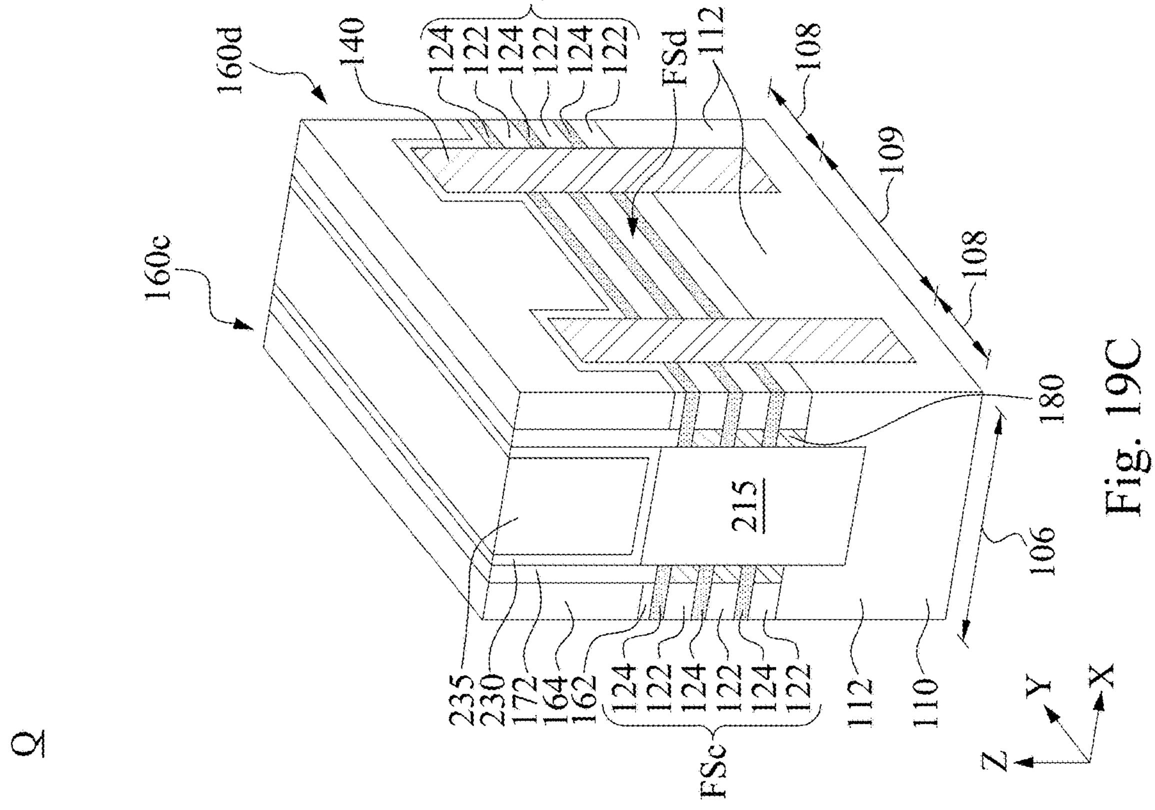
Figure 20B:
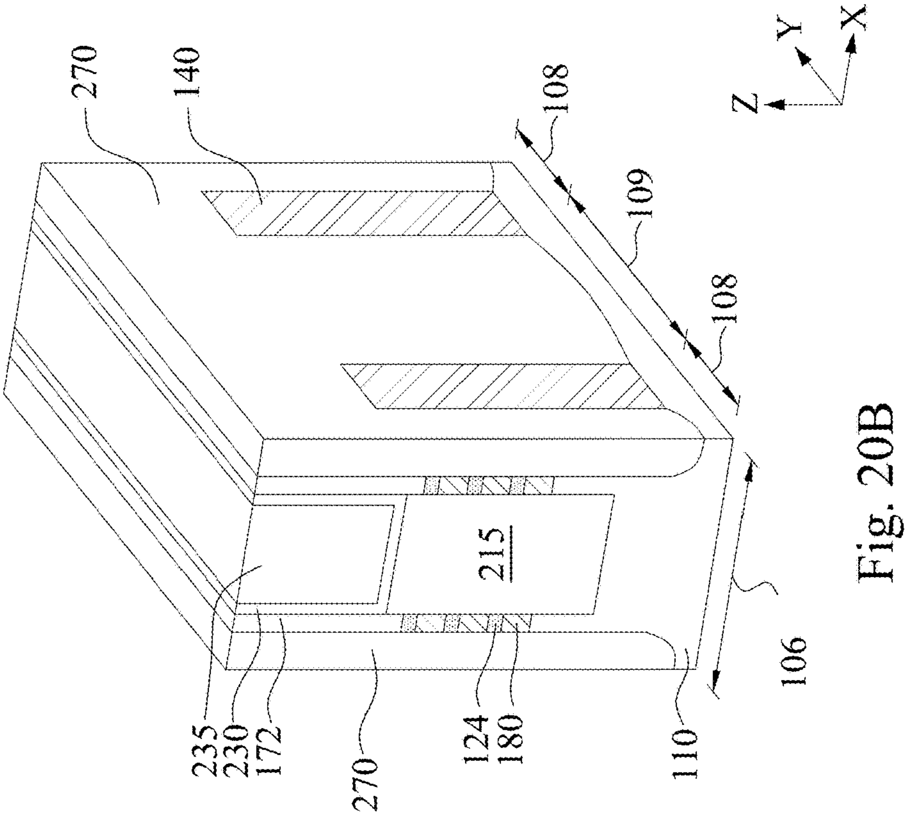
Figure 20A:
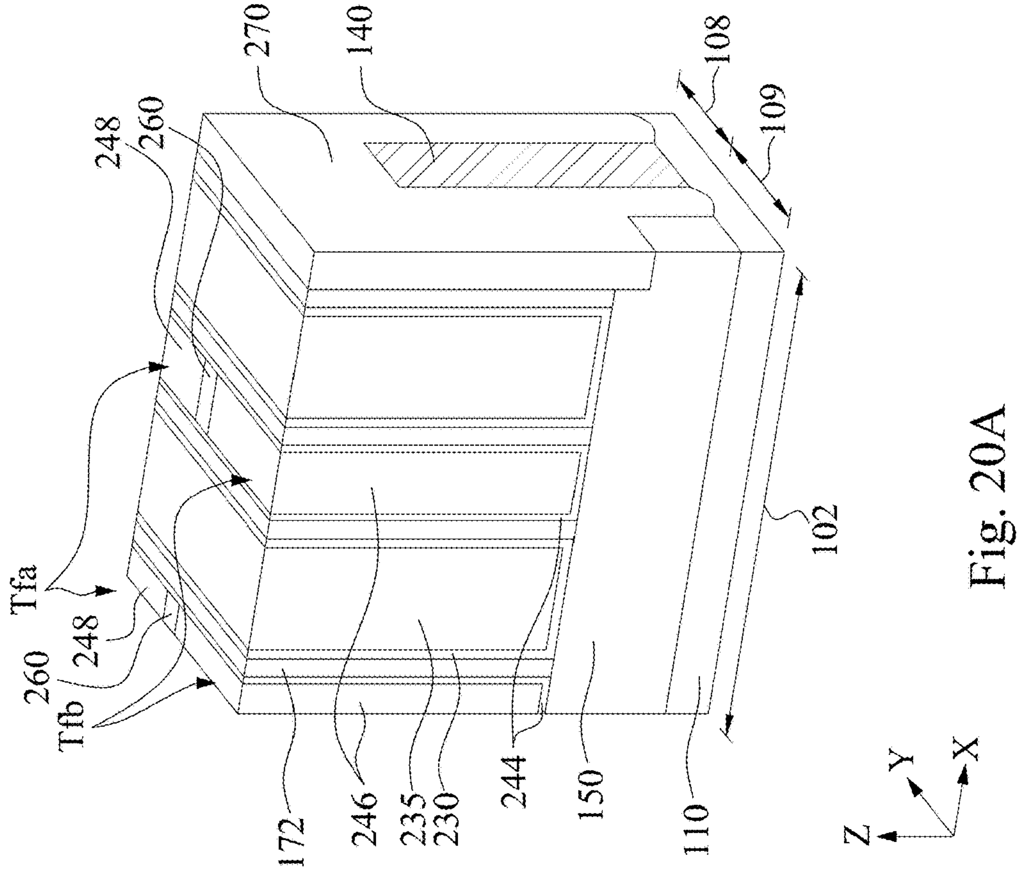
Figure 20C:
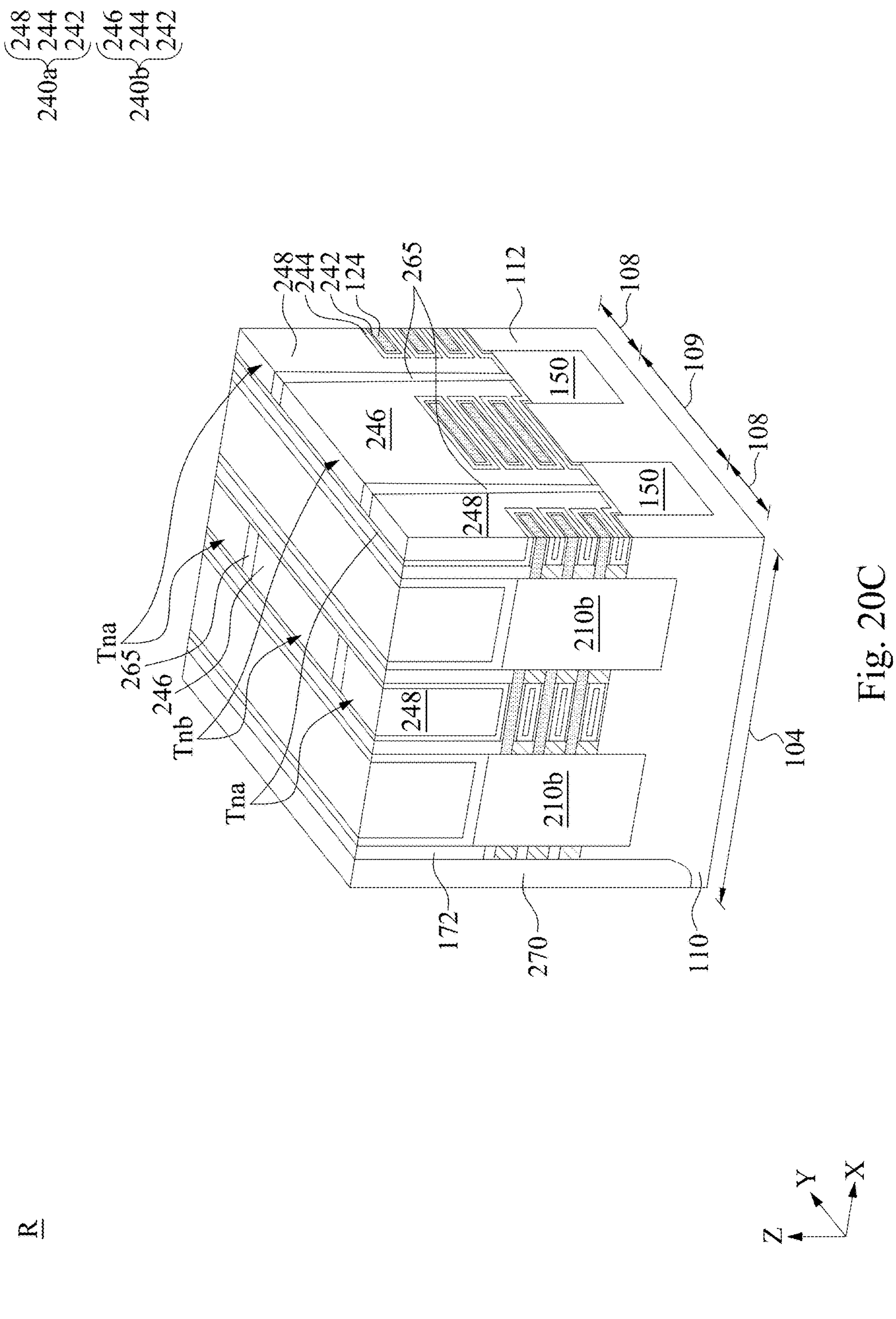

Reference is made to FIGS. 1 and 19A-19D. In some embodiments, first openings are formed between the gate structures 240*a* and 240*b* over the first device region 102. The first openings expose the dielectric fins 140 as shown in FIG. 19B. Further, second openings are formed between the gate structures 240*a* and 240*b* over the second device region 104. Subsequently, a dielectric material fills in the first and second openings and then a planarization process (e.g., CMP process) is performed to remove portions of the dielectric material outside the openings to form dielectric plugs 260 and 265. The dielectric plugs 260 and the dielectric film 140 together separate the gate structure 240*a* from the gate structure 240*b* over the first device region 102. On the other hand, the dielectric plugs 265 separate the gate structure 240*a* from the gate structure 240*b* over the second device region 104. In some other embodiments, the formation of one or some of the dielectric plugs 260 and 265 can be omitted when the corresponding gate structure 240*a* is electrically connected to the gate structure 240*b*. In some embodiments, the dielectric plugs 260 and 265 include low-k materials such as SiOCN, tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

Reference is made to FIGS. 1 and 20A-20C. A Cut-Poly on OD Edge (CPODE) process is performed. Specifically, the dummy gate structures 160*c* and 160*d* (see FIGS. 19A and 19C-19D) are replaced with dielectric gate structures 270, respectively. In some embodiments, the formation of dielectric gate structures 270 includes forming an etching mask covering the gate structures 240*a* and 240*b*, and using the etching mask to etch the dummy gate structures 160*c* and 160*d*. In the etching process, dummy gate structures 160*c* and 160*d* are first etched anisotropically, until the underlying fin structures FSa-FSf (see FIGS. 19A and 19C-19D) are exposed. The fin structures FSa-FSf are then etched, and the etching continues down into the underlying protrusion structures 112. In some embodiments, the isolation structures 150 and the dielectric fins 140 are also recessed during the CPODE process. Next, a dielectric material is deposited into the resulting openings formed by the etching process, followed by a planarization process to remove excess portions of the dielectric material. The remaining dielectric material forms dielectric gate structures 270.

In accordance with some embodiments, the deposition of the dielectric material of dielectric gate structures 270 is performed using a conformal deposition process such as ALD, which may be PEALD, thermal ALD, or the like. The dielectric material may be formed of or include SiN, $SiO_2$, SiOC, SiOCN, or the like, or combinations thereof. The dielectric gate structures 270 may be formed of a homogenous material, or may have a composite structure including more than one layer. In some embodiments, the dielectric material of dielectric gate structures 270 includes SiN.

Reference is made to FIGS. 1 and 21A-21F. Another ILD layer 280 is formed over the structure illustrated in FIGS. 20A-20C. In some embodiments, the ILD layer 280 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and the like. In certain embodiments, the ILD layer 280 is formed of silicon oxide ($SiO_x$). The ILD layer 280 may be deposited by a PECVD process or other suitable deposition technique.

The ILD layers 235 and 280 are then patterned to form contact trenches on the source/drain epitaxial structures 210*a*, 210*b* and 220*a*, 220*b*, and then the CESL 230 is patterned to expose the source/drain epitaxial structures 210*a*, 210*b* and 220*a*, 220*b*. In some embodiments, multiple etching processes are performed to pattern the ILD layers 235 and 280 and the CESL 230. The etching processes include dry etching process, wet etching process, or combinations thereof.

Source/drain contacts 290 are then formed in the contact trenches. As such, the source/drain contacts 290 are electrically connected to the source/drain epitaxial structures 210*a*, 210*b* and/or 220*a*, 220*b*. In some embodiments, the source/drain contacts 290 may be made of metal, such as W, Co, Ru, Mo, Al, Cu, or other suitable materials. After the deposition of the source/drain contacts 290, a planarization process, such as a chemical mechanical planarization (CMP) process, may be then performed. In some embodiments, barrier layers may be formed in the contact trenches before the formation of the source/drain contacts 290. The barrier layers may be made of Ti, TiN, Ta, TaN, Ru, Co, or combinations thereof.

Figure 21B:
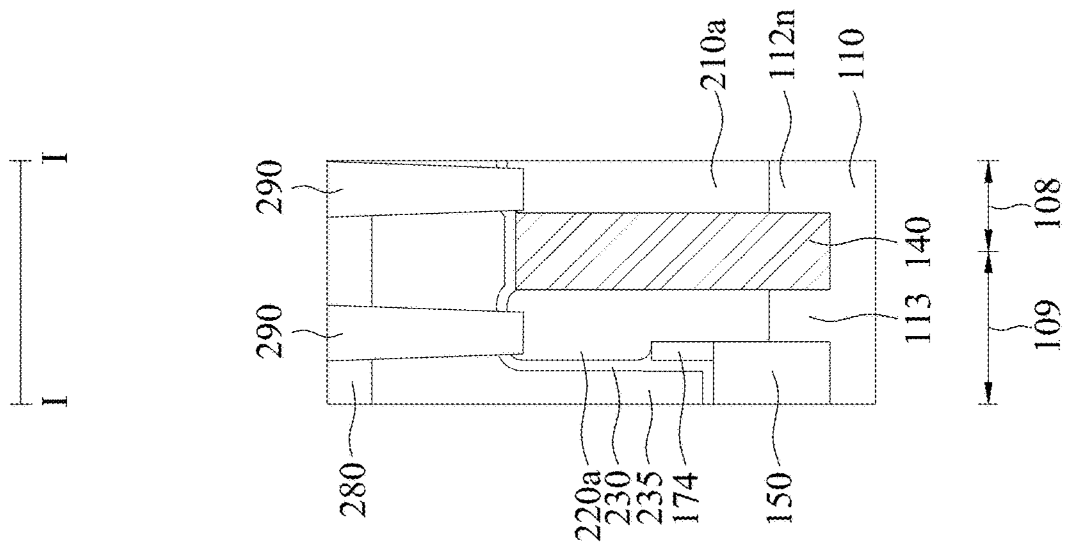
FIG. 21G is a top view of the integrated circuit structure taken along line A-B of FIG. 21A, line B-C of FIG. 21C, and line C-D of FIG. 21E.
Figure 21A:
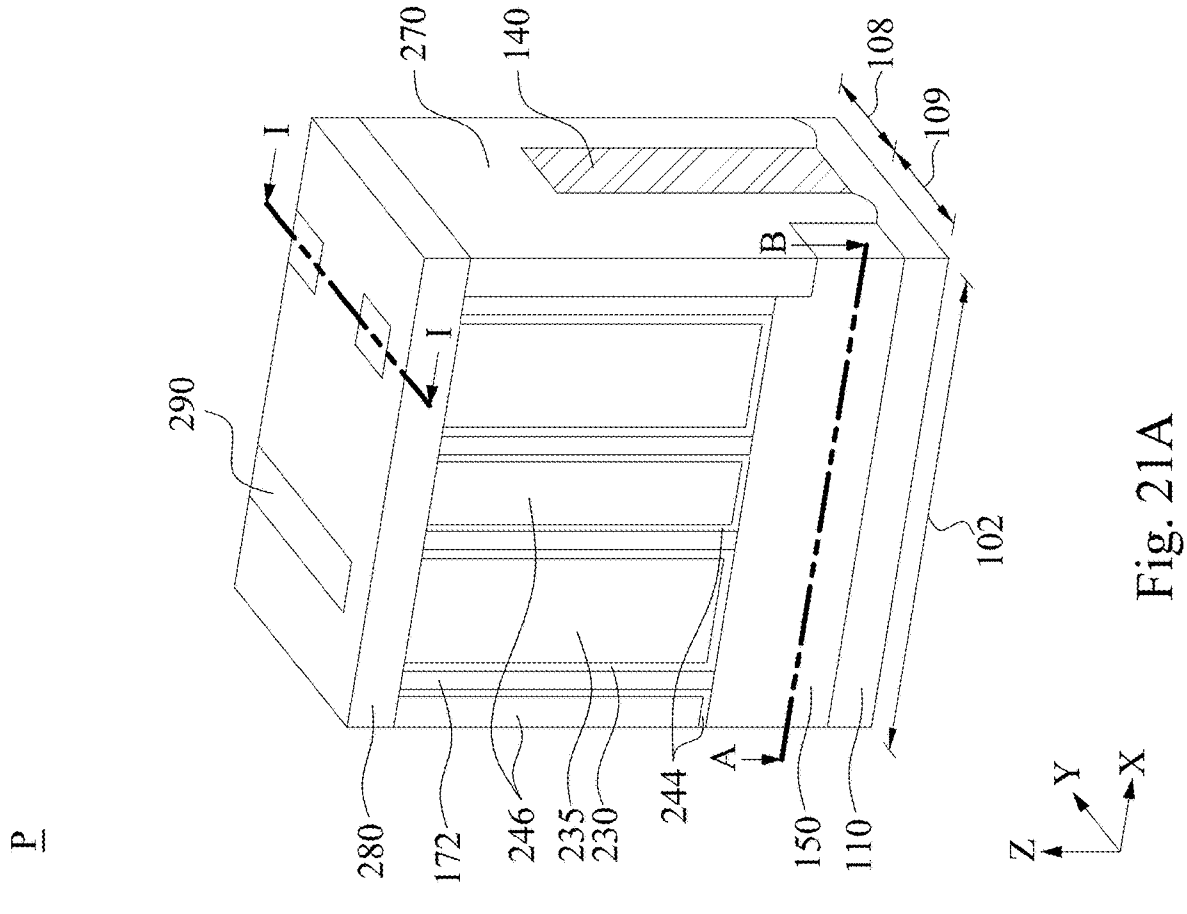
Figure 21D:
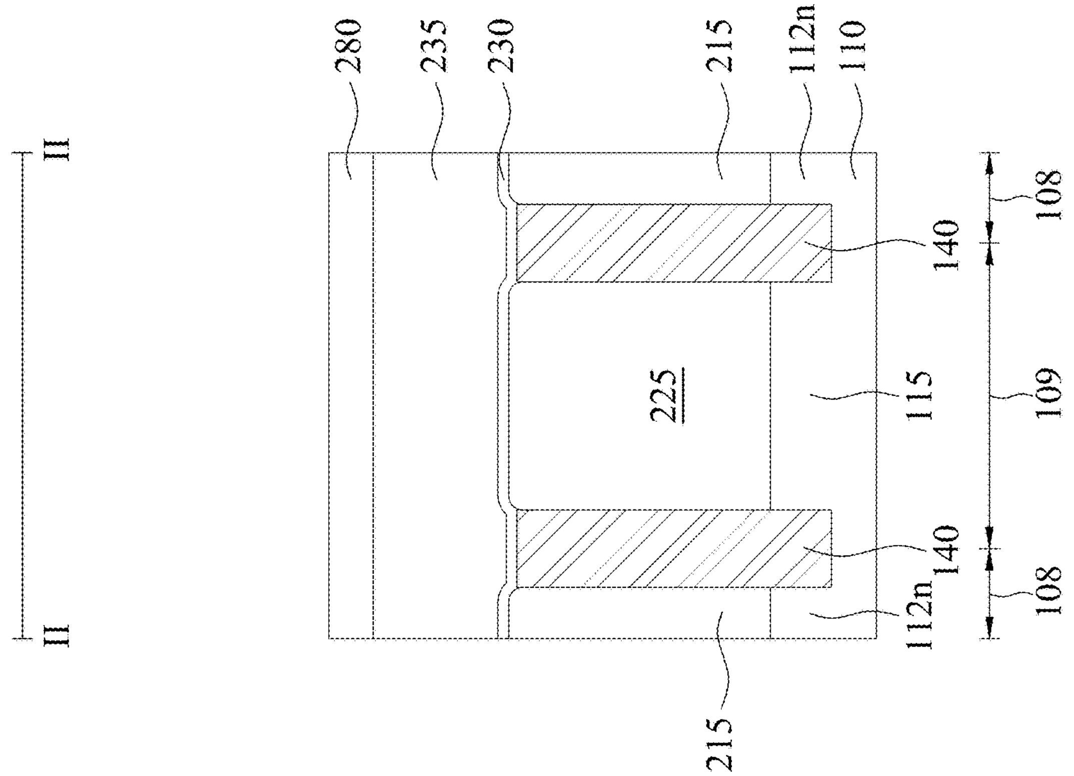
Figure 21C:
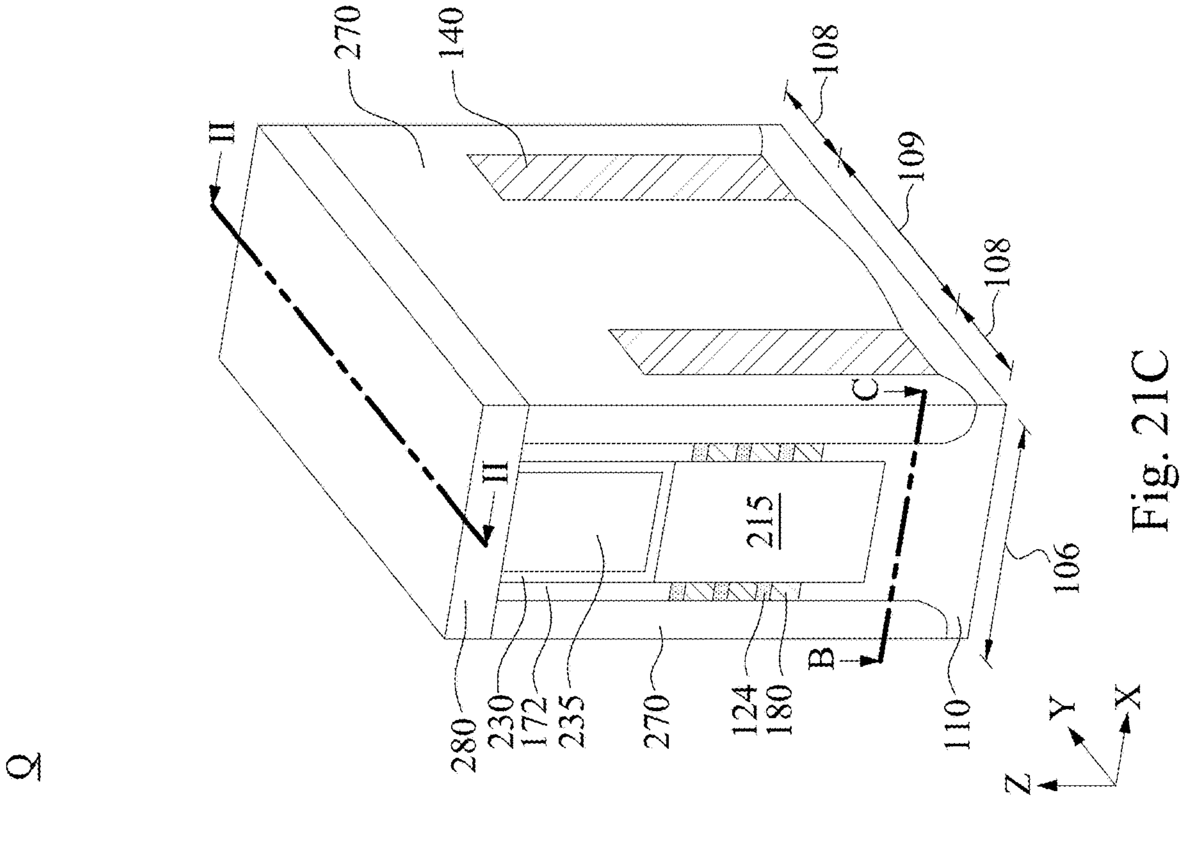
Figure 21F:
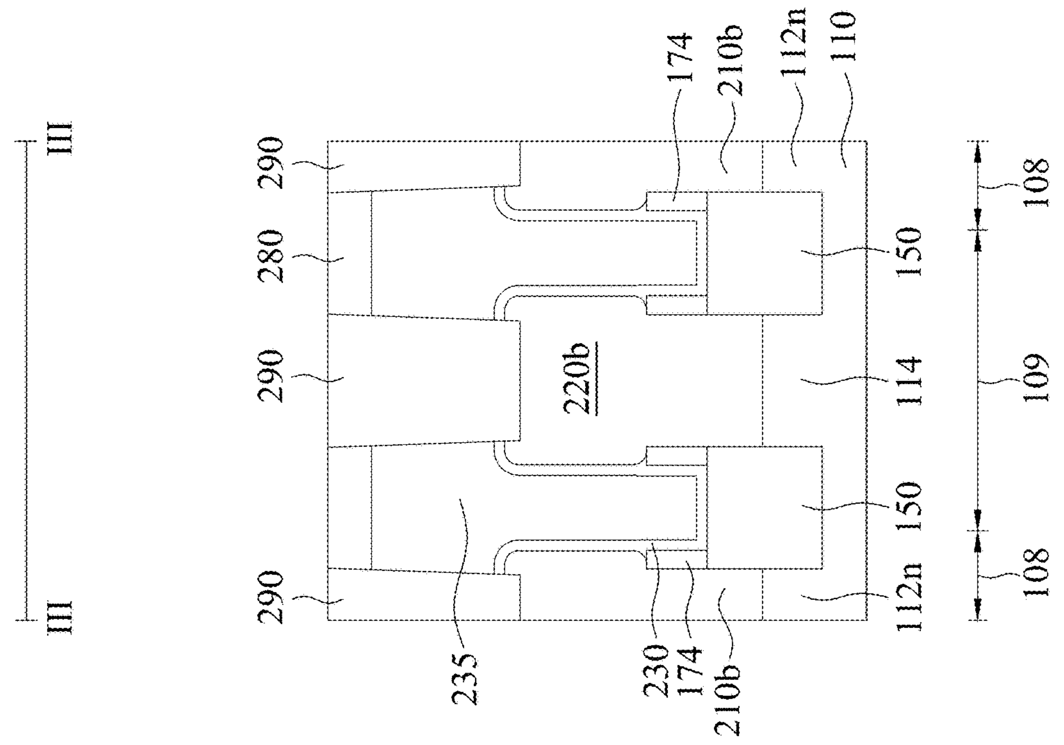
Figure 21E:
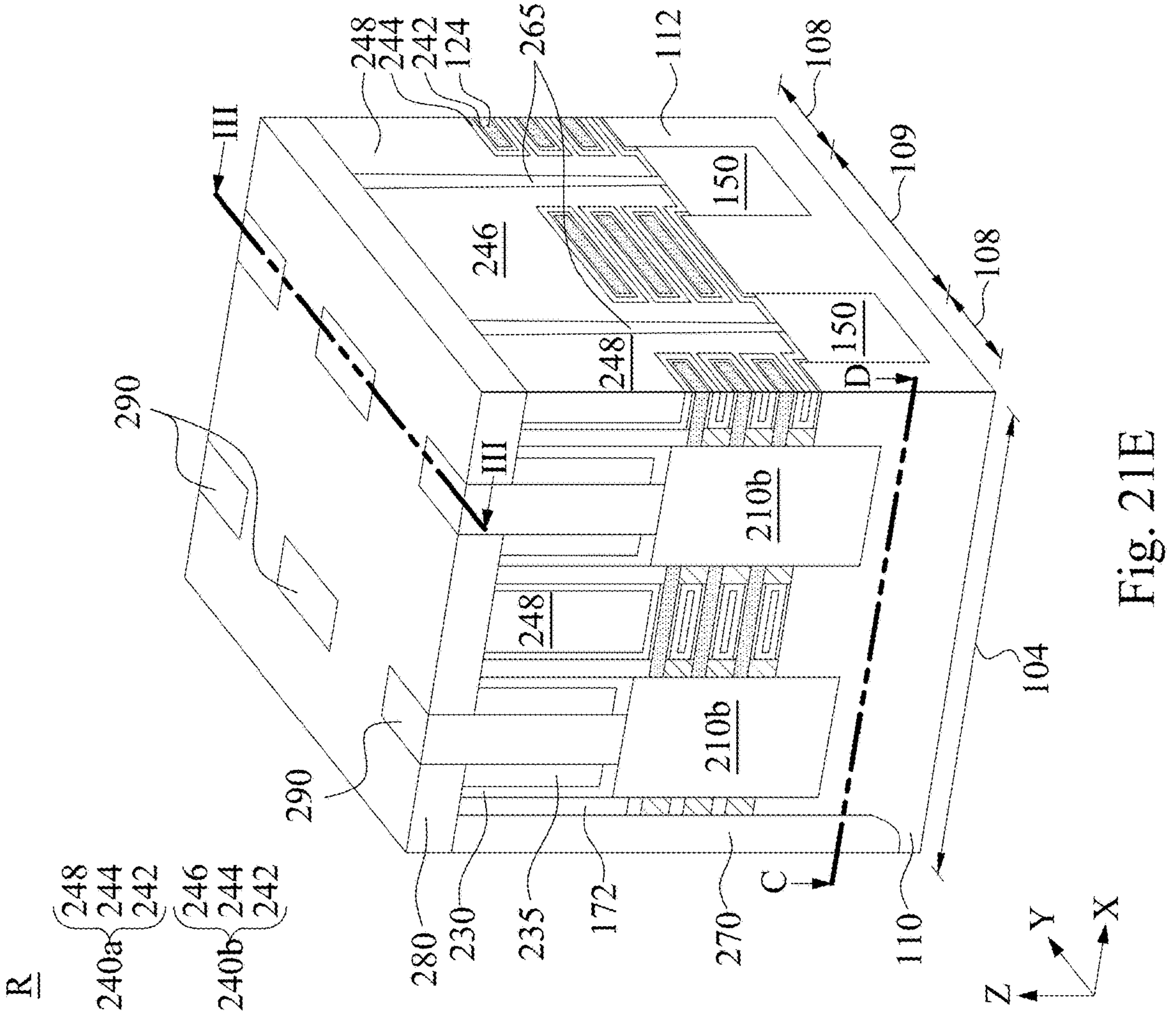

As shown in FIGS. 21A and 21E, for a single source/drain contact 290 (which is connected to a single source/drain epitaxial structure 210*a*, 210*b*, 220*a*, or 220*b*), the length of the single source/drain contact 290 over the second device region 104 can be greater than the length of the single source/drain contact 290 over the first device region 102 by about 1.3 times to about 3 times due to the large fin pitch in the Y-direction. Therefore, source/drain vias formed over the single source/drain contacts have different sizes over the first device region 102 and the second device region 104. For example, the source/drain vias formed over the second device region 104 have sizes is about 1.1 times to about 2.5 times the sizes of the source/drain vias formed over the first device region 102.

The structure in FIGS. 21A-21F may further undergo the manufacturing processes such as the formation of gate vias, which may be formed in the ILD layer 280 and connected to the gate structures 240*a* and/or 240*b*. In some embodiments, there is no gate via formed over the dielectric gate structures 270, such that the ILD layer 280 may completely covers the dielectric gate structures 270.

Figure 21G:
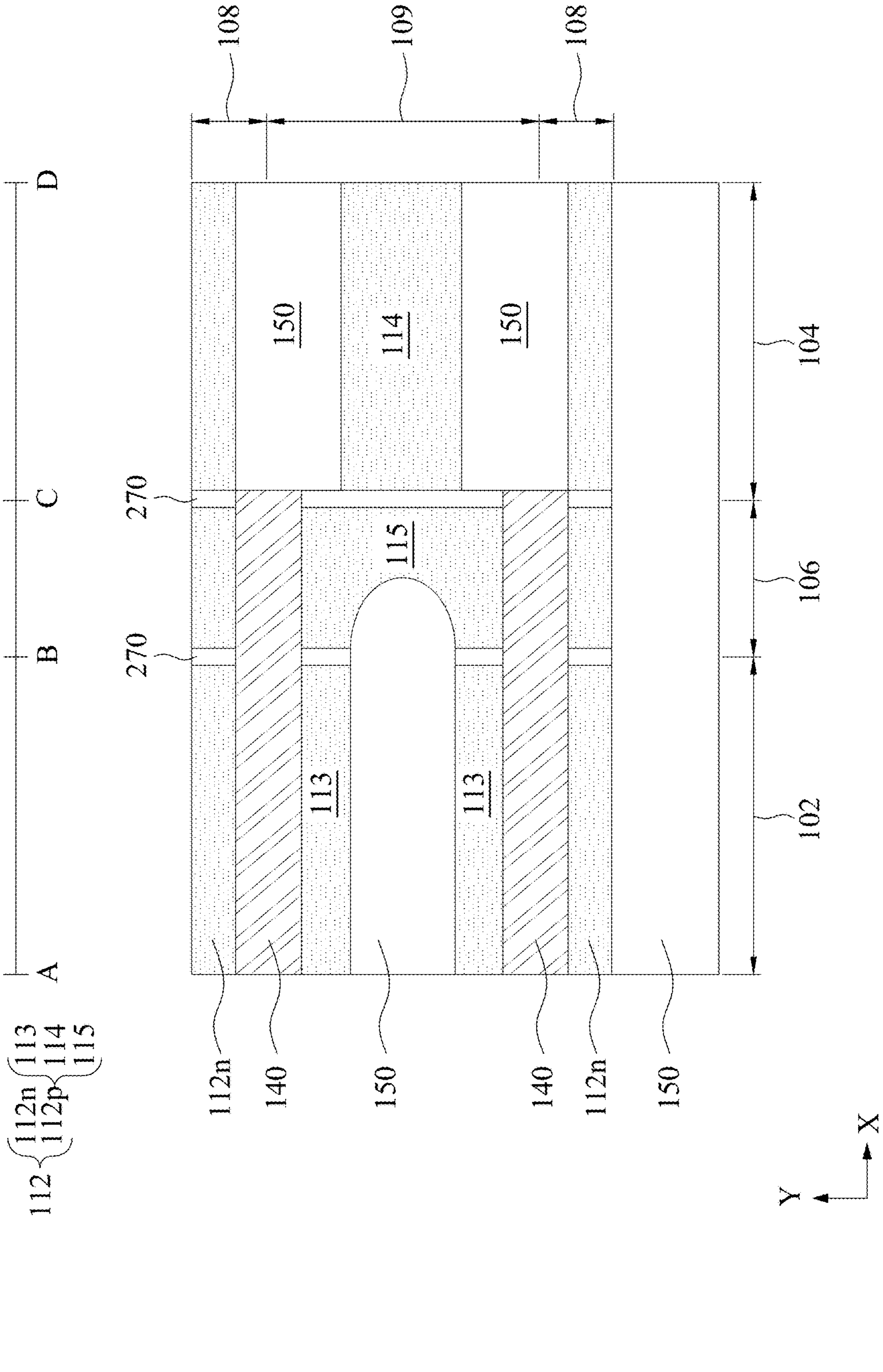

FIG. 21G is a top view of the integrated circuit structure 100*a* taken along line A-B of FIG. 21A, line B-C of FIG. 21C, and line C-D of FIG. 21E. Reference is made to FIGS. 1 and 21G. The substrate 110 includes the protrusion structures 112. The protrusion structures 112 include N-type structures 112*n* over the N-type regions 108 and a P-type structure 112*p* over the P-type region 109. The P-type structure 112*p* includes two first portions 113 over the first device region 102, a second portion 114 over the second device region 104, and a third portion 115 over the connecting region 106. The first portions 113 are under the source/drain epitaxial structures 220*a* as shown in FIG. 21B, the second portion 114 is under the source/drain epitaxial structure 220*b* as shown in FIG. 21F, and the third portion 115 is under the dummy epitaxial structure 225 as shown in FIG. 21D.

Each of the dielectric fins 140 is between the N-type structure 112*n* and the first portion 113. The dielectric fin 140 further extends between the N-type structure 112*n* and the third portion 115. However, the dielectric fins 140 are spaced apart from the second portion 114. The isolation structures 150 fill in the trenches not filled by the dielectric fins 140. For example, some of the isolation structures 150 are in contact with the second portion 114 and the N-type structures 112*n* and the dielectric fins 140. Further, one of the isolation structures 150, which is wider than the dielectric fins 140, is between the first portions 113 and in contact with the third portion 115.

In FIGS. 1 and 21G, the source/drain epitaxial structures 210*a*/210*b* are formed over the N-type structures 112*n* and the first device region 102/second device region 104, and the dummy epitaxial structures 215 are formed over the N-type structures 112*n* and the connecting region 106. The source/drain epitaxial structures 220*a*/220*b* are formed over the P-type structure 112*p* and the first device region 102/second device region 104, and the dummy epitaxial structure 225 is formed over the P-type structure 112*p* and the connecting region 106.

As shown in FIGS. 1 and 21D, the dummy epitaxial structure 225 is in contact with the dielectric fins 140. That is, the dummy epitaxial structure 225 is between and confined by the dielectric fins 140. Further, one of the dielectric gate structures 270 is directly between the dummy epitaxial structure 225 and the source/drain epitaxial structures 220*a*, and another one of the dielectric gate structures 270 is directly between the dummy epitaxial structure 225 and the source/drain epitaxial structures 220*b*.

In some embodiments, a circuit design, e.g., the integrated circuit structure 100*a*, includes transistors with different sizes adjacent to each other for providing different functions, e.g., different powers and/or different computing speeds. The connection between these transistors may be a challenge when the layout-dependent effects (LDEs), which include oxide diffusion (OD) layer (in this case, the fin structures FSa-FSf) stress, well stress, and polysilicon stress and impact device characteristics, such as carrier mobility, output impedance, trans-conductance, and/or threshold voltage of a transistor device, are considered. With the layout over the connecting region 106, a long OD effect (or OD length layout effect, LOD effect) can be formed to improve such LDEs. LOD effect refers the improved performance and reduced process variation as a result of a long, continuous OD region. Therefore, the transistors formed over the first device region 102 and near the connecting region 106 have electrical performances similar to that formed over the first device region 102 and far from the connecting region 106. The electrical performances of the transistors formed over the first device region 102 and near the connecting region 106 are not degraded. Similarly, the electrical performances of the transistors formed over the second device region 104 and near the connecting region 106 are not degraded.

Figure 22A:
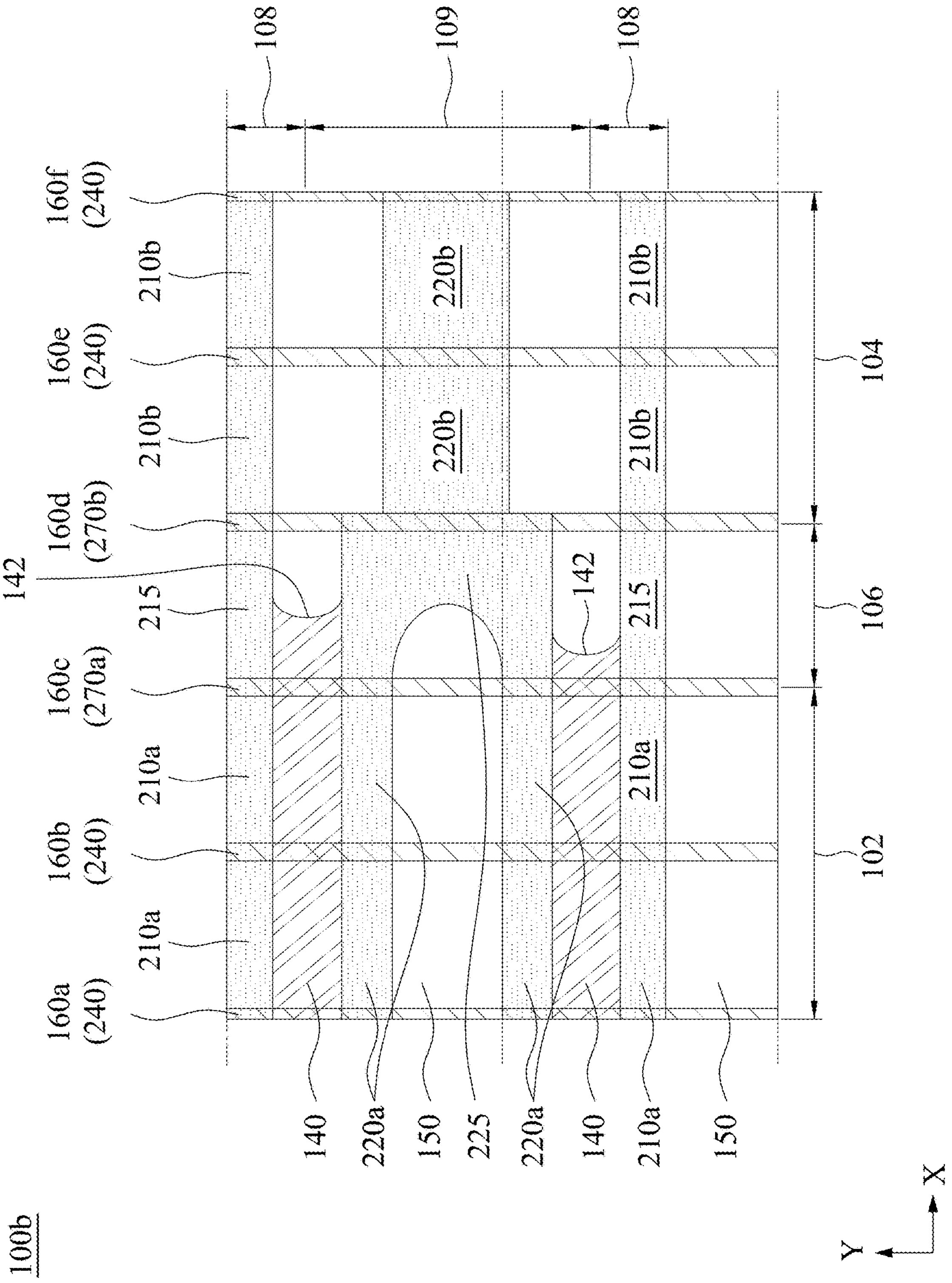
FIG. 22A is a layout diagram of an integrated circuit structure (or semiconductor device) in accordance with some embodiments of the present disclosure.
Figure 22B:
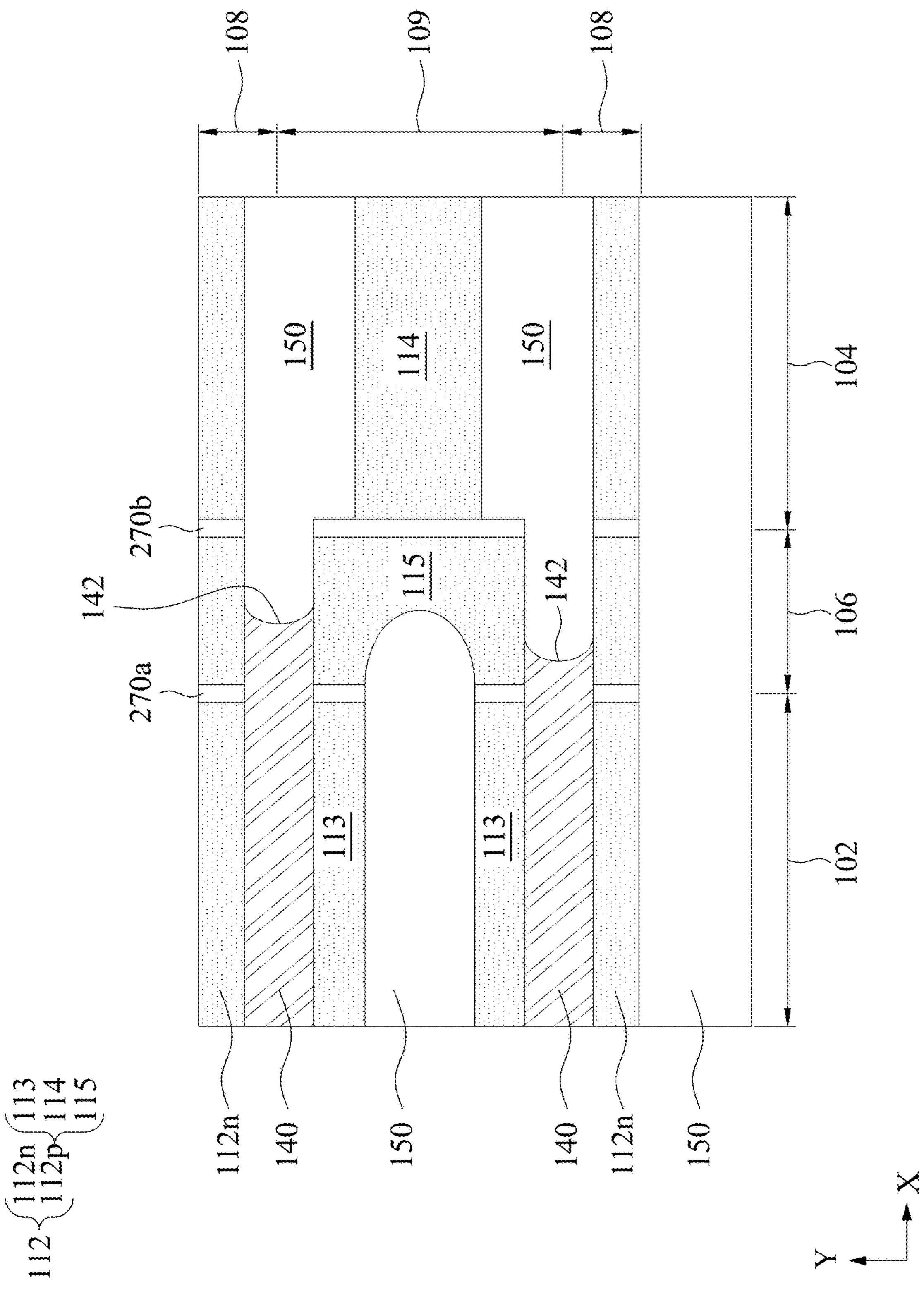
FIG. 22B is a top view of the protrusion structure, the dielectric fins, the isolation structures, and the dielectric gate structures of the integrated circuit structure.
Figure 22D:
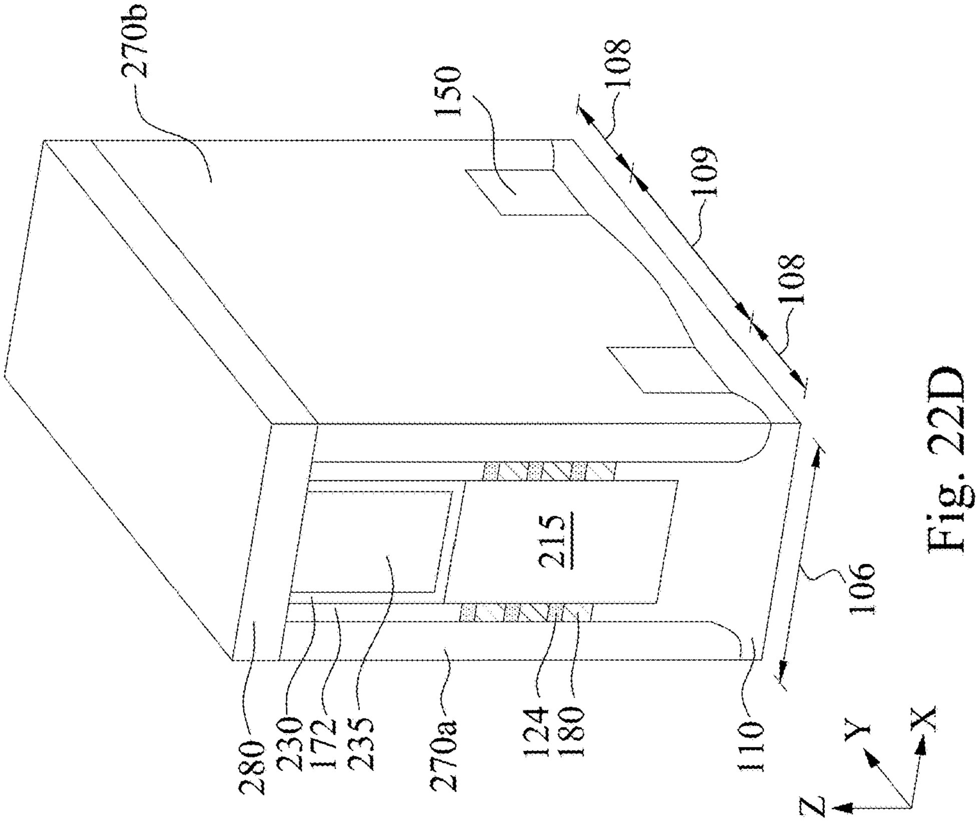
FIG. 22D is a perspective view of the integrated circuit structure over the connecting region.
Figure 22C:
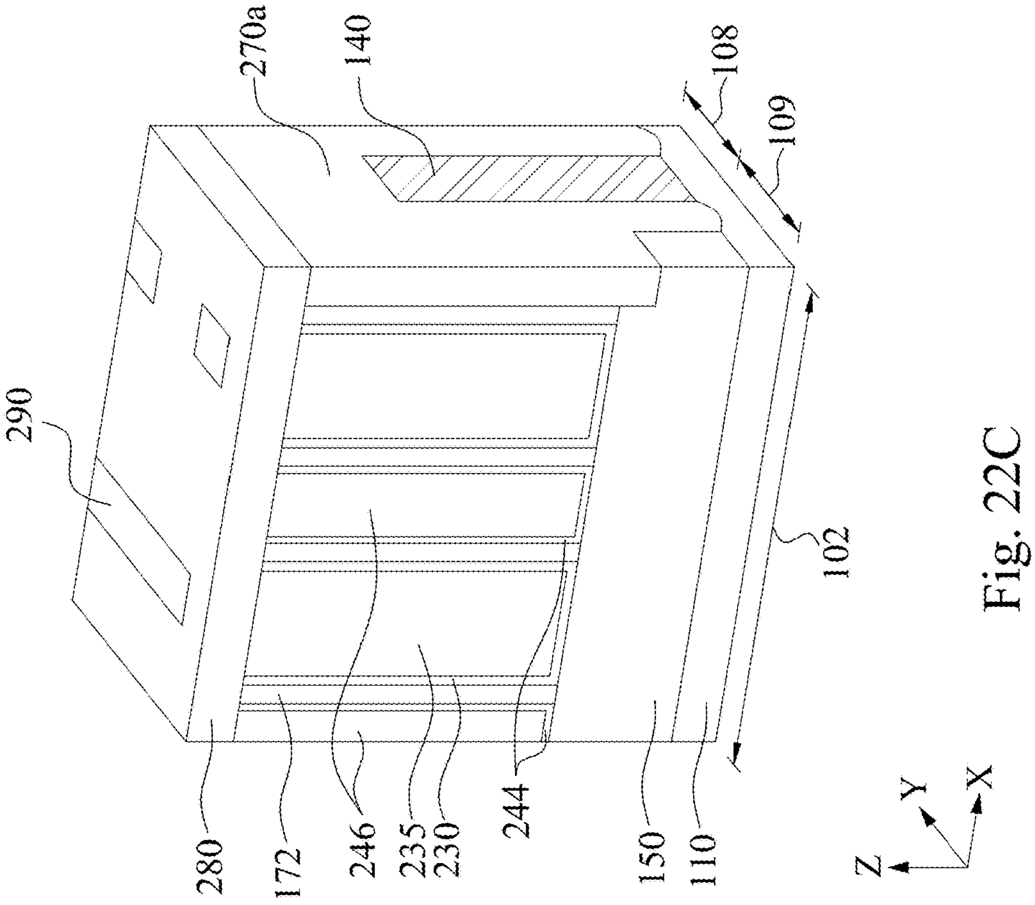
FIG. 22C is a perspective view of the integrated circuit structure over a portion of the first device region.

FIG. 22A is a layout diagram of an integrated circuit structure (or semiconductor device) 100*b* in accordance with some embodiments of the present disclosure, FIG. 22B is a top view of the protrusion structure 112, the dielectric fins 140, the isolation structures 150, and the dielectric gate structures 270*a*, 270*b* of the integrated circuit structure 100*b*, FIG. 22C is a perspective view of the integrated circuit structure 100*b* over a portion of the first device region 102, and FIG. 22D is a perspective view of the integrated circuit structure 100*b* over the connecting region 106. The difference between the integrated circuit structure 100*b* and 100*a* pertains to the profile of the dielectric fins 140. In some embodiments, during the etching of the dielectric film 140' as shown in FIGS. 4-5C, the dielectric fins 140 may be laterally over-etched, such that end surfaces 142 of the dielectric fins 140 are located between the two dielectric gate structures 270*a* and 270*b*. Even the dielectric fins 140 are over-etched, the dielectric fins 140 still fills the trenches Ta (see FIG. 3A) over the first device region 102, such that the over-etching does not create defects in the dielectric fins 140 over the first device region 102. Further, portions of the isolation structures 150 extend into the connecting region 106 as shown in FIG. 22B. The dummy epitaxial structure 225, however, is still in contact with the dielectric fins 140 and is further in contact with the isolation structures 150. Further, the end surfaces 142 of the dielectric fins 140 may be misaligned with each other. Moreover, as shown in FIGS. 22C and 22D, the dielectric structure 270*a* covers the dielectric fins 140 while the dielectric structure 270*b* is spaced apart from the dielectric fins 140. Instead, the dielectric structure 270*b* covers the isolation structures 150. The structure of the integrated circuit structure 100*b* over the second device region 104 is similar to or the same as the structure illustrated in FIG. 21E. Other features of the integrated circuit structure 100*b* are similar to or the same as those of the integrated circuit structure 100*a* shown in FIGS. 1 and 21A-21F, and therefore, a description in this regard will not be provided hereinafter.

Figure 23A:
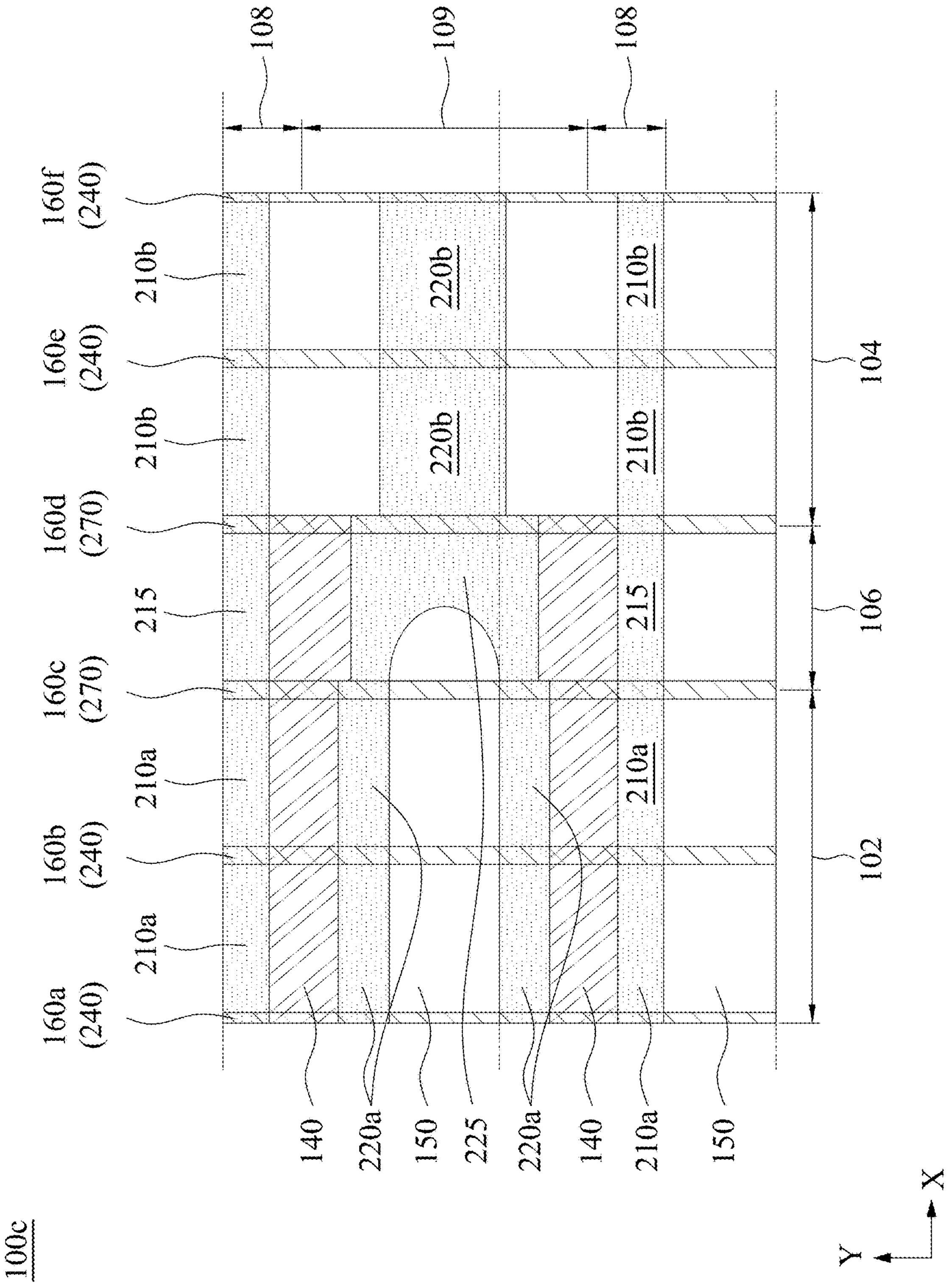
FIG. 23A is a layout diagram of an integrated circuit structure (or semiconductor device) in accordance with some embodiments of the present disclosure.
Figure 23B:
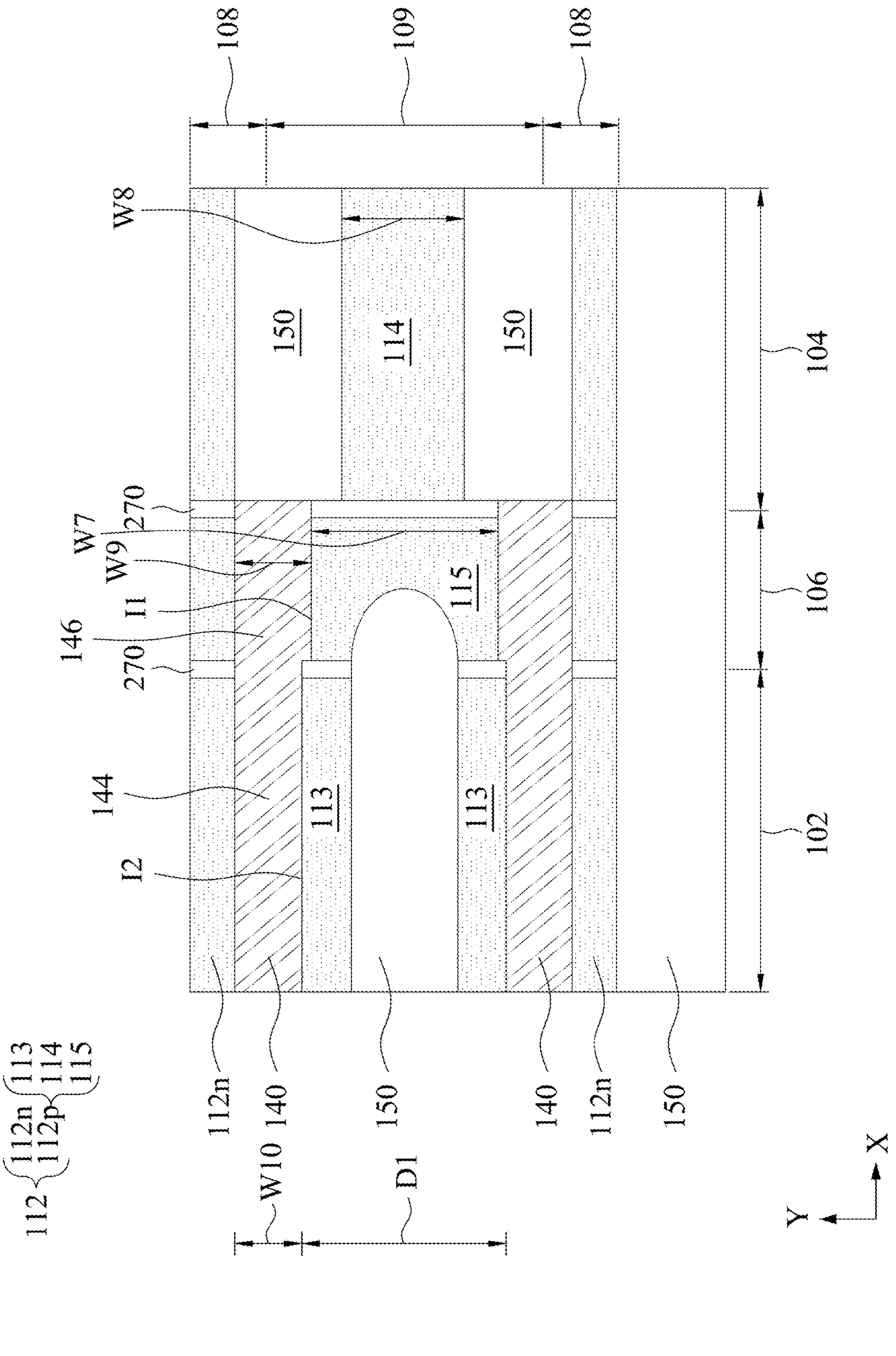
FIG. 23B is a top view of the protrusion structure, the dielectric fins, the isolation structures, and the dielectric gate structures of the integrated circuit structure.
Figure 23C:
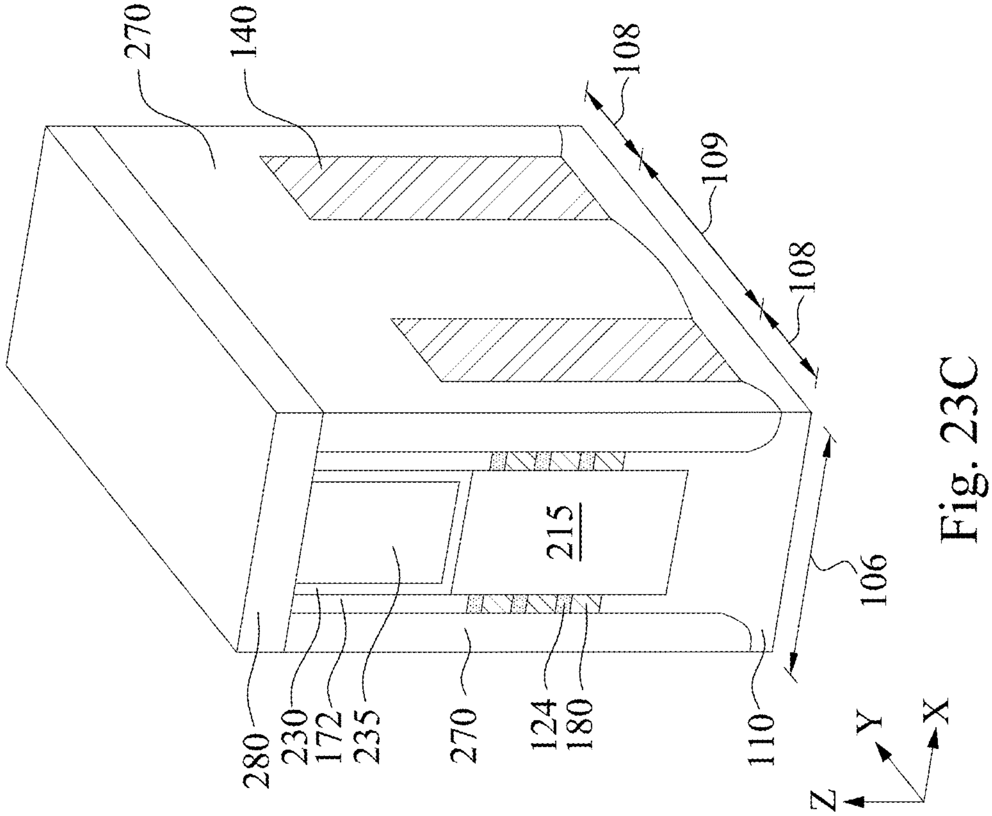
FIG. 23C is a perspective view of the integrated circuit structure over the connecting region.

FIG. 23A is a layout diagram of an integrated circuit structure (or semiconductor device) 100*c* in accordance with some embodiments of the present disclosure, FIG. 23B is a top view of the protrusion structure 112, the dielectric fins 140, the isolation structures 150, and the dielectric gate structures 270 of the integrated circuit structure 100*c*, and FIG. 23C is a perspective view of the integrated circuit structure 100*c* over the connecting region 106. The difference between the integrated circuit structure 100*c* and 100*a* pertains to the profile of the dielectric fins 140 and the P-type structure 112*p* over the connecting region 106. In FIG. 23B, an interface I1 between the dielectric fin 140 and the third portion 115 is offset from an interface I2 between the dielectric fin 140 and the first portion 113. Stated differently, the distance D1 between the two interfaces I2 is greater than a width W7 of the third portion 115 in the Y-direction. However, the width W7 of the third portion 115 is still greater than a width W8 of the second portion 114 in the Y-direction. Therefore, the dielectric fins 140 have different widths over the first device region 102 and the connecting region 106. As shown in FIGS. 23B and 23C, the dielectric fin 140 includes a first portion 144 over the first device region 102 and a second portion 146 over the connecting region 106, and a width W9 of the second portion 146 in the Y-direction is greater than a width W10 of the first portion 144 in the Y-direction by, for example, about 2 nm to about 50 nm. The structure of the integrated circuit structure 100*c* over the first device region 102 and the second device region 104 are similar to or the same as the structure illustrated in FIGS. 21A and 21E, respectively. Other features of the integrated circuit structure 100*c* are similar to or the same as those of the integrated circuit structure 100*a* shown in FIGS. 1 and 21A-21F, and therefore, a description in this regard will not be provided hereinafter.

Figure 24A:
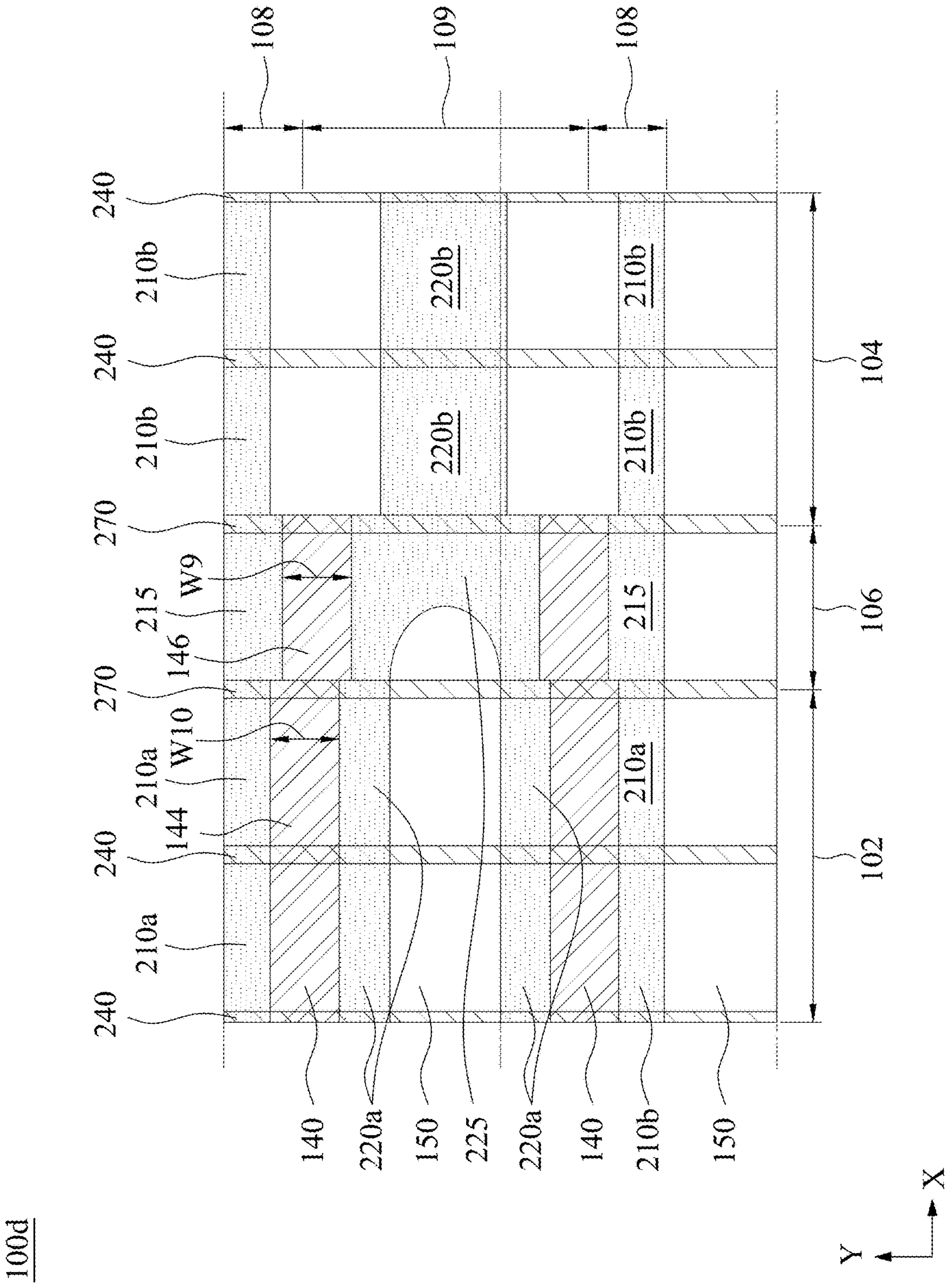
FIG. 24A is a layout diagram of an integrated circuit structure (or semiconductor device) in accordance with some embodiments of the present disclosure.
Figure 24B:
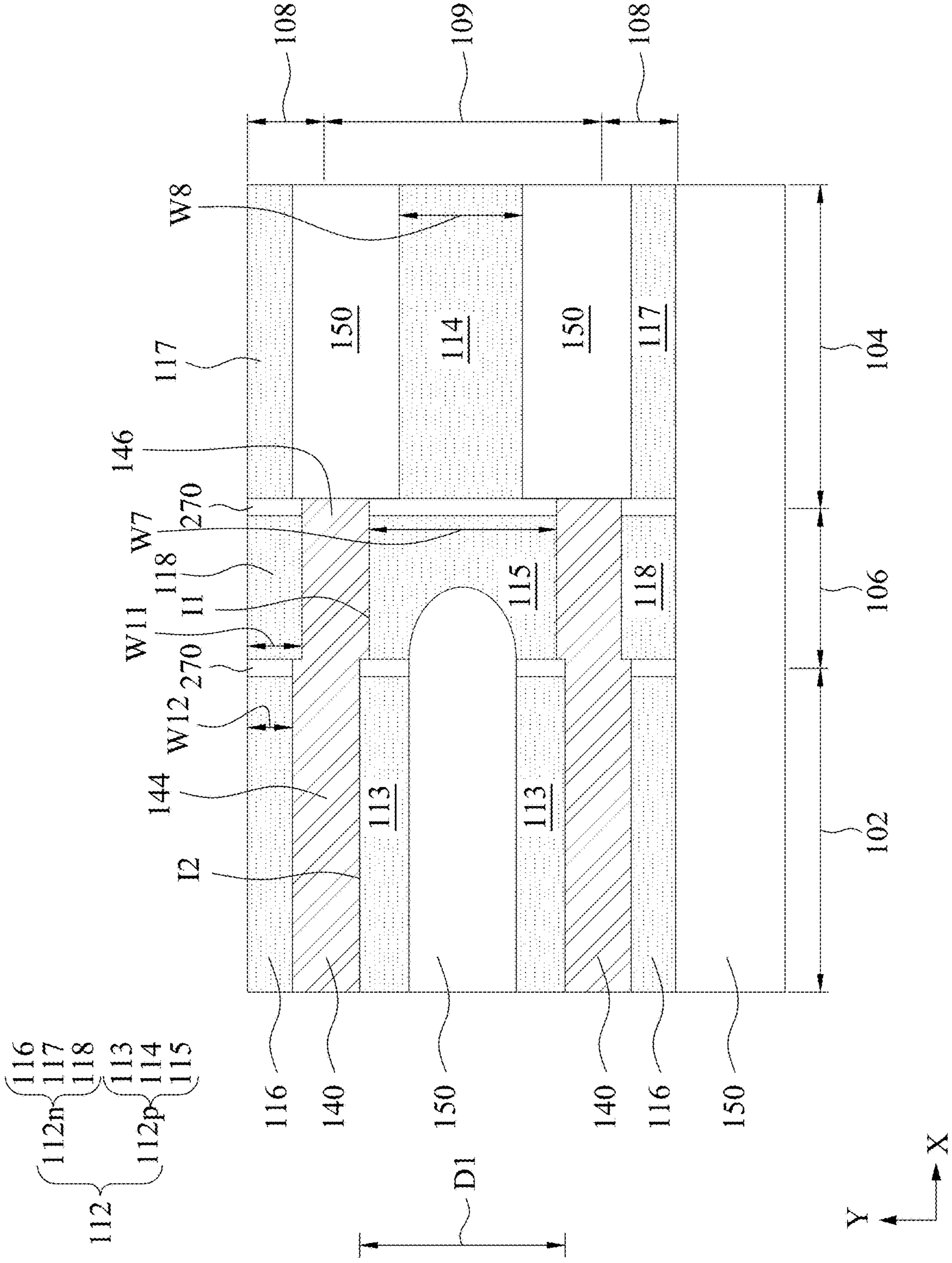
FIG. 24B is a top view of the protrusion structure, the dielectric fins, the isolation structures, and the dielectric gate structures of the integrated circuit structure.
Figure 24C:
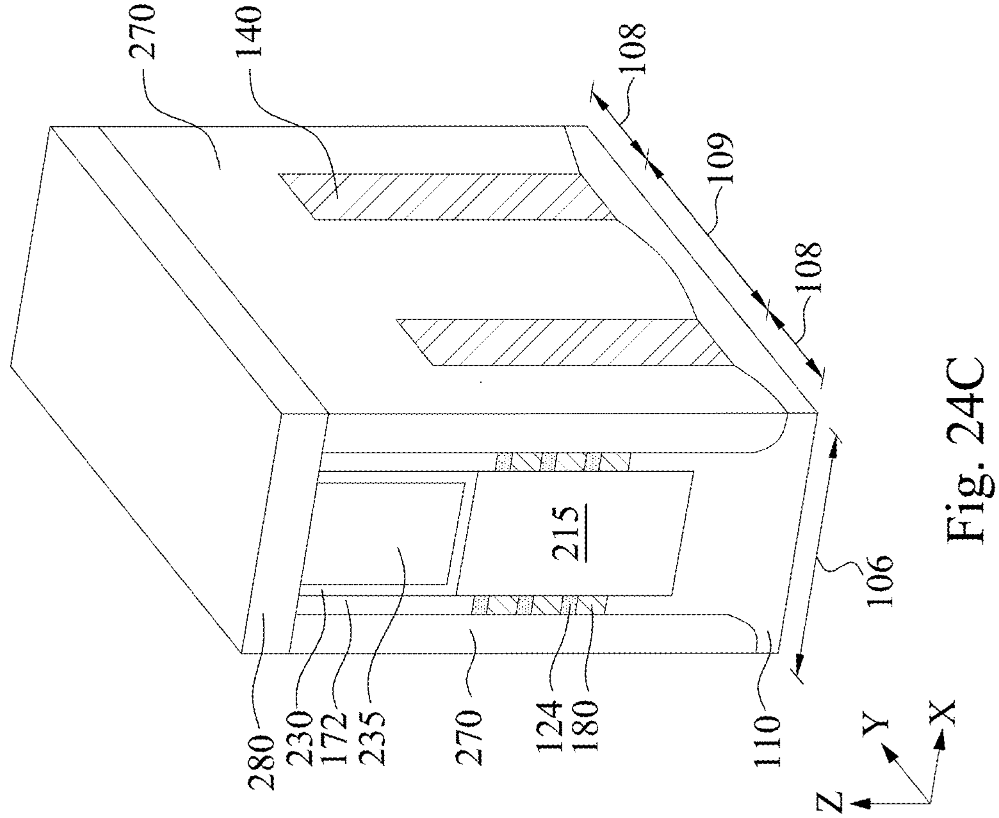
FIG. 24C is a perspective view of the integrated circuit structure over the connecting region.

FIG. 24A is a layout diagram of an integrated circuit structure (or semiconductor device) 100*d* in accordance with some embodiments of the present disclosure, FIG. 24B is a top view of the protrusion structure 112, the dielectric fins 140, the isolation structures 150, and the dielectric gate structures 270 of the integrated circuit structure 100*d*, and FIG. 24C is a perspective view of the integrated circuit structure 100*d* over the connecting region 106. The difference between the integrated circuit structure 100*d* and 100*a* pertains to the profile of the dielectric fins 140, the N-type structure 112*n*, and the P-type structure 112*p* over the connecting region 106. In FIG. 24B, the interface I1 between the dielectric fin 140 and the third portion 115 is offset from the interface I2 between the dielectric fin 140 and the first portion 113. Stated differently, the distance D1 between the two interfaces I2 is greater than the width W7 of the third portion 115 in the Y-direction. However, the width W7 of the third portion 115 is still greater than a width W8 of the second portion 114 in the Y-direction.

Further, each of the N-type structures 112*n* includes a first portion 116 over the first device region 102, a second portion 117 over the second device region 104, and a third portion 118 over the connecting region 106. The first portions 116 are under the source/drain epitaxial structures 210*a*, the second portions 117 are under the source/drain epitaxial structures 210*b*, and the third portions 118 are under the dummy epitaxial structures 215. The third portion 118 has a width W11 greater than a width W12 of the first portion 116. As such, the second portion 146 of the dielectric fin 140 is offset from the first portion 144 of the dielectric fin 140 in the top view (as shown in FIGS. 24A and 24B). The width W9 of the second portion 146 in the Y-direction may be greater than, substantially the same as, or less than the width W10 of the first portion 144 in the Y-direction. The structure of the integrated circuit structure 100*d* over the first device region 102 and the second device region 104 are similar to or the same as the structure illustrated in FIGS. 21A and 21E, respectively. Other features of the integrated circuit structure 100*d* are similar to or the same as those of the integrated circuit structure 100*a* shown in FIGS. 1 and 21A-21F, and therefore, a description in this regard will not be provided hereinafter.

Figure 25A:
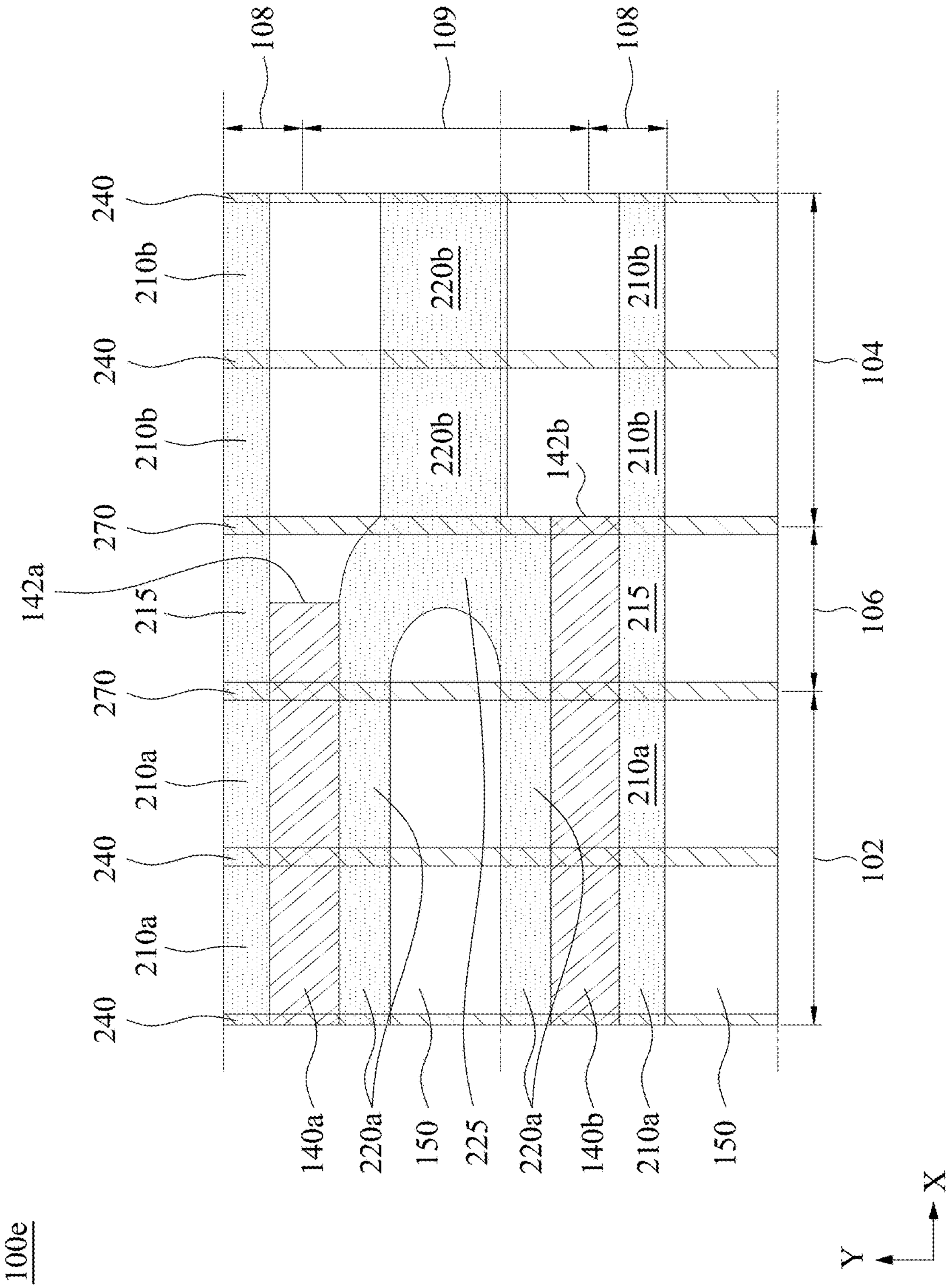
FIG. 25A is a layout diagram of an integrated circuit structure (or semiconductor device) in accordance with some embodiments of the present disclosure.
Figure 25B:
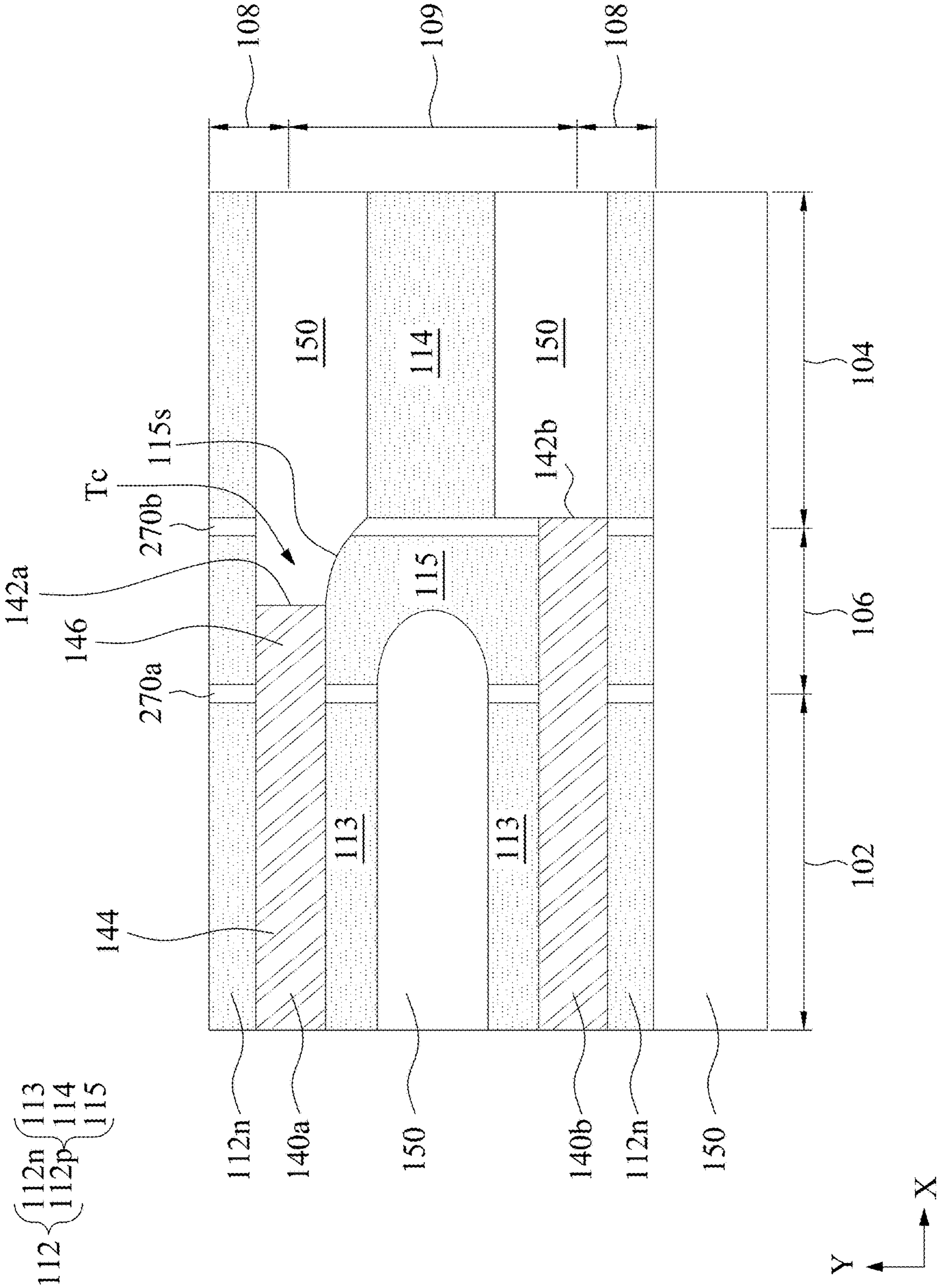
FIG. 25B is a top view of the protrusion structure, the dielectric fins, the isolation structures, and the dielectric gate structures of the integrated circuit structure.
Figure 25C:
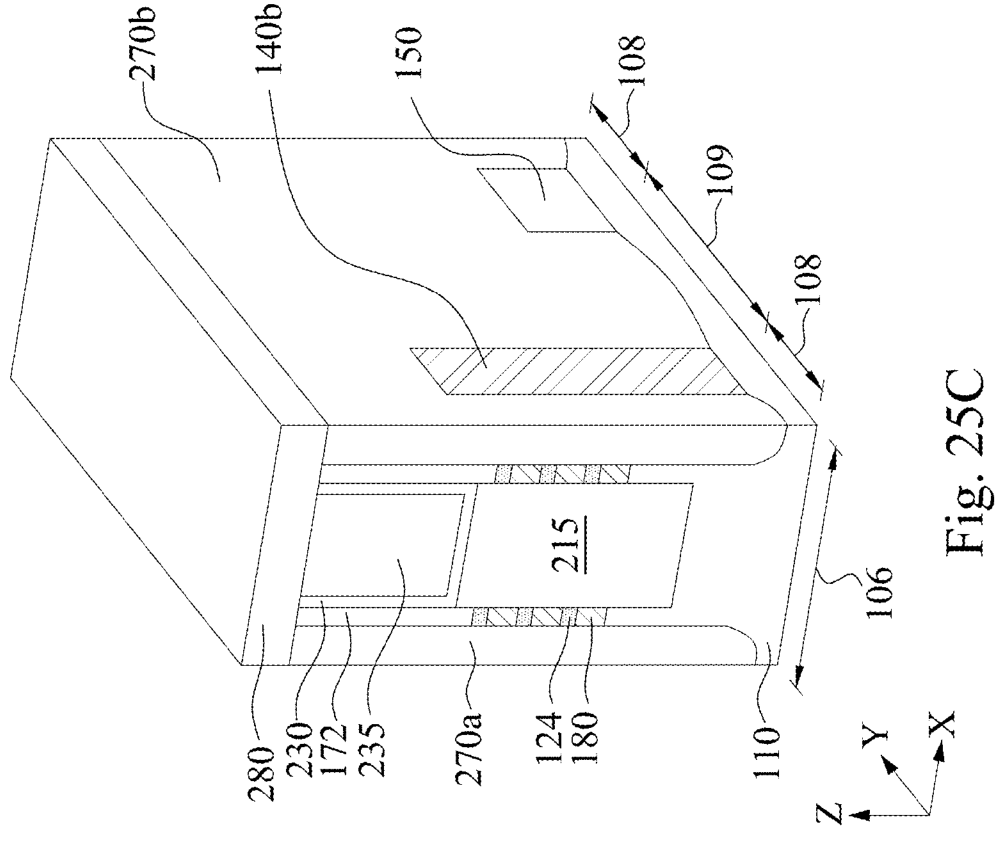
FIG. 25C is a perspective view of the integrated circuit structure over the connecting region.

FIG. 25A is a layout diagram of an integrated circuit structure (or semiconductor device) 100*e* in accordance with some embodiments of the present disclosure, FIG. 25B is a top view of the protrusion structure 112, the dielectric fins 140*a*, 140*b*, the isolation structures 150, and the dielectric gate structures 270*a*, 270*b* of the integrated circuit structure 100*e*, and FIG. 25C is a perspective view of the integrated circuit structure 100*e* over the connecting region 106. The difference between the integrated circuit structure 100*e* and 100*a* pertains to the profile of the dielectric fins 140 (140*a*) and the P-type structure 112*p* over the connecting region 106. In FIG. 25B, the sidewall 115*s* of the third portion 115 of the P-type structure 112*p* is curved (convex). Therefore, the third portion 115 tapers toward the second portion 114. Further, since the third portion 115 tapers toward the second portion 114, the trench Tc gets wider toward the second device region 104, and the dielectric film 140' (see FIG. 4) may not fill the trench Tc near the interface between the connecting region 106 and the second device region 104, such that the end surface 142*a* of the dielectric fin 140*a* may be misaligned with the end surface 142*b* of the dielectric fin 140*b*. Therefore, as shown in FIGS. 25A and 25C, the dielectric structure 270*a* covers both the dielectric fins 140*a* and 140*b* while the dielectric structure 270*a* only covers the dielectric fin 140*b* but is spaced apart from the dielectric fin 140*a*. The structure of the integrated circuit structure 100*e* over the first device region 102 and the second device region 104 are similar to or the same as the structure illustrated in FIGS. 21A and 21E, respectively. Other features of the integrated circuit structure 100*e* are similar to or the same as those of the integrated circuit structure 100*a* shown in FIGS. 1 and 21A-21F, and therefore, a description in this regard will not be provided hereinafter.

Figure 26A:
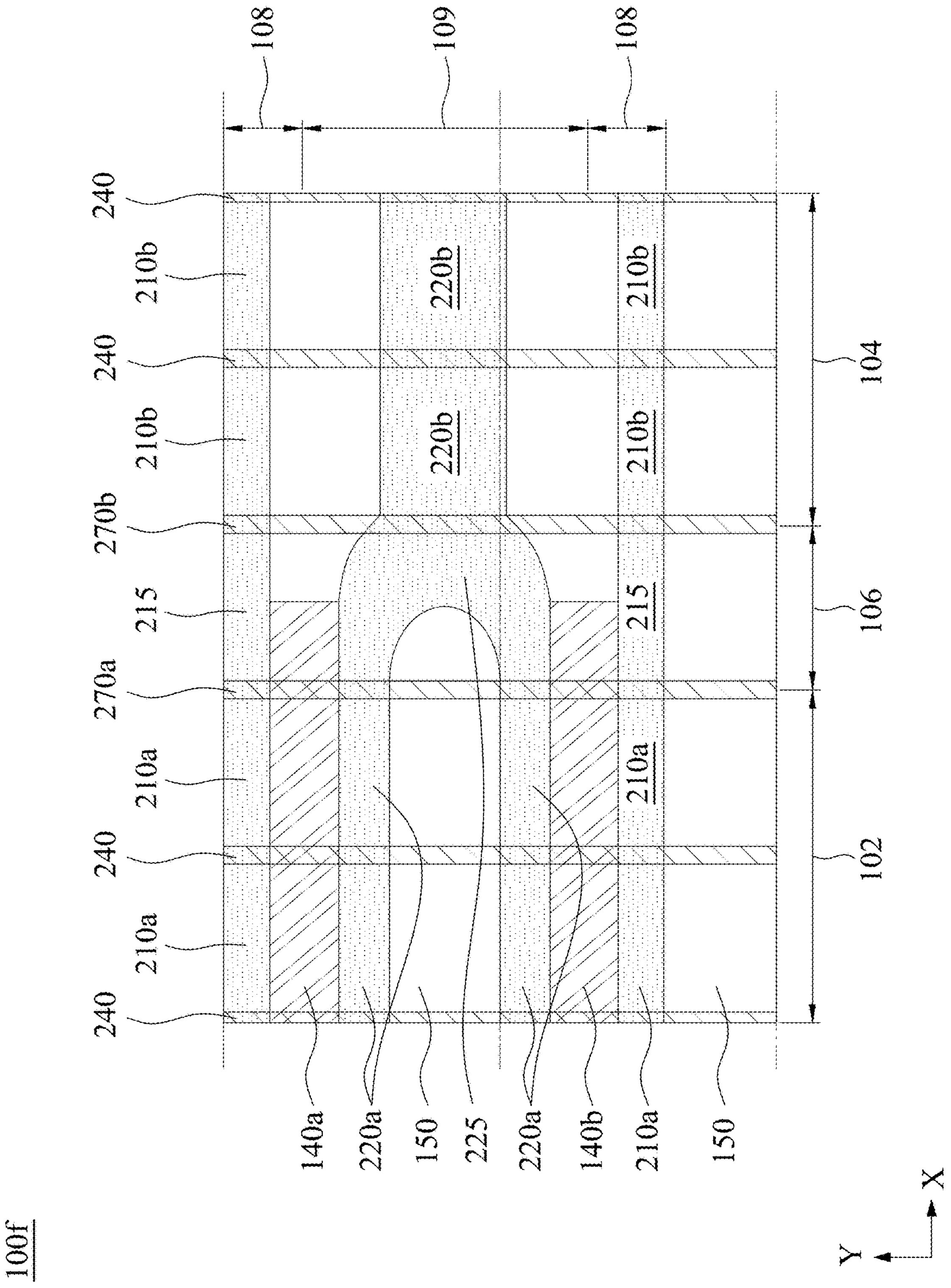
FIG. 26A is a layout diagram of an integrated circuit structure (or semiconductor device) in accordance with some embodiments of the present disclosure.
Figure 26B:
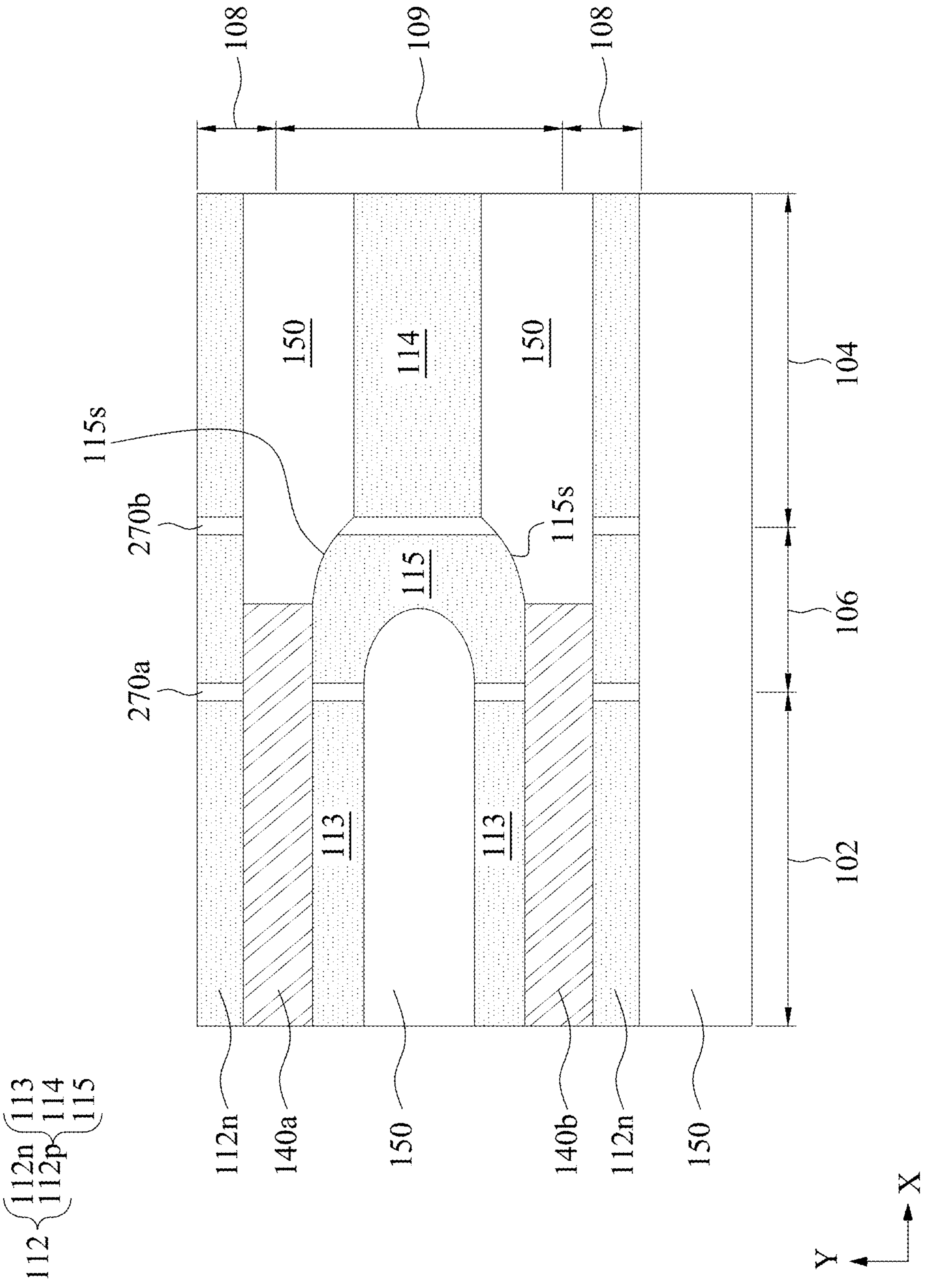
FIG. 26B is a top view of the protrusion structure, the dielectric fins, the isolation structures, and the dielectric gate structures of the integrated circuit structure.
Figure 26C:
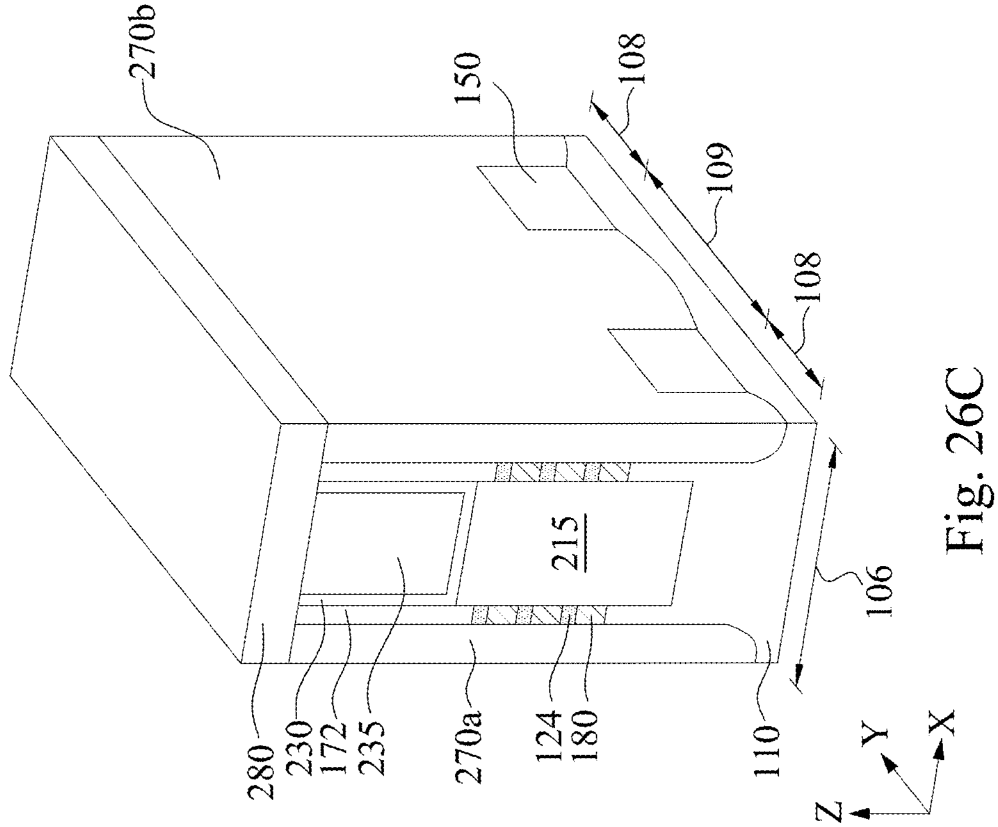
FIG. 26C is a perspective view of the integrated circuit structure over the connecting region.

FIG. 26A is a layout diagram of an integrated circuit structure (or semiconductor device) 100*f* in accordance with some embodiments of the present disclosure, FIG. 26B is a top view of the protrusion structure 112, the dielectric fins 140*a*, 140*b*, the isolation structures 150, and the dielectric gate structures 270*a*, 270*b* of the integrated circuit structure 100*f*, and FIG. 26C is a perspective view of the integrated circuit structure 100*f* over the connecting region 106. The difference between the integrated circuit structure 100*f* and 100*e* pertains to the profile of the dielectric fin 140*b* and the P-type structure 112*p* over the connecting region 106. In FIG. 26B, the opposite sidewalls 115*s* of the third portion 115 of the P-type structure 112*p* are curved (convex), such that the third portion 115 has a reversed capital "C" shape in the top view. As such, the dielectric fins 140*a* and 140*b* have substantially the same profile, which is described in FIGS. 25A-25C, in the top view. Therefore, as shown in FIGS. 26A and 26C, the dielectric structure 270*a* covers both the dielectric fins 140*a* and 140*b* while the dielectric structure 270*b* is spaced apart from the dielectric fins 140*a* and 140*b*. The dielectric structure 270*b* covers the isolation structure 150, instead. The structure of the integrated circuit structure 100*f* over the first device region 102 and the second device region 104 are similar to or the same as the structure illustrated in FIGS. 21A and 21E, respectively. Other features of the integrated circuit structure 100*f* are similar to or the same as those of the integrated circuit structure 100*a* shown in FIGS. 1 and 21A-21F, and therefore, a description in this regard will not be provided hereinafter.

Figure 27A:
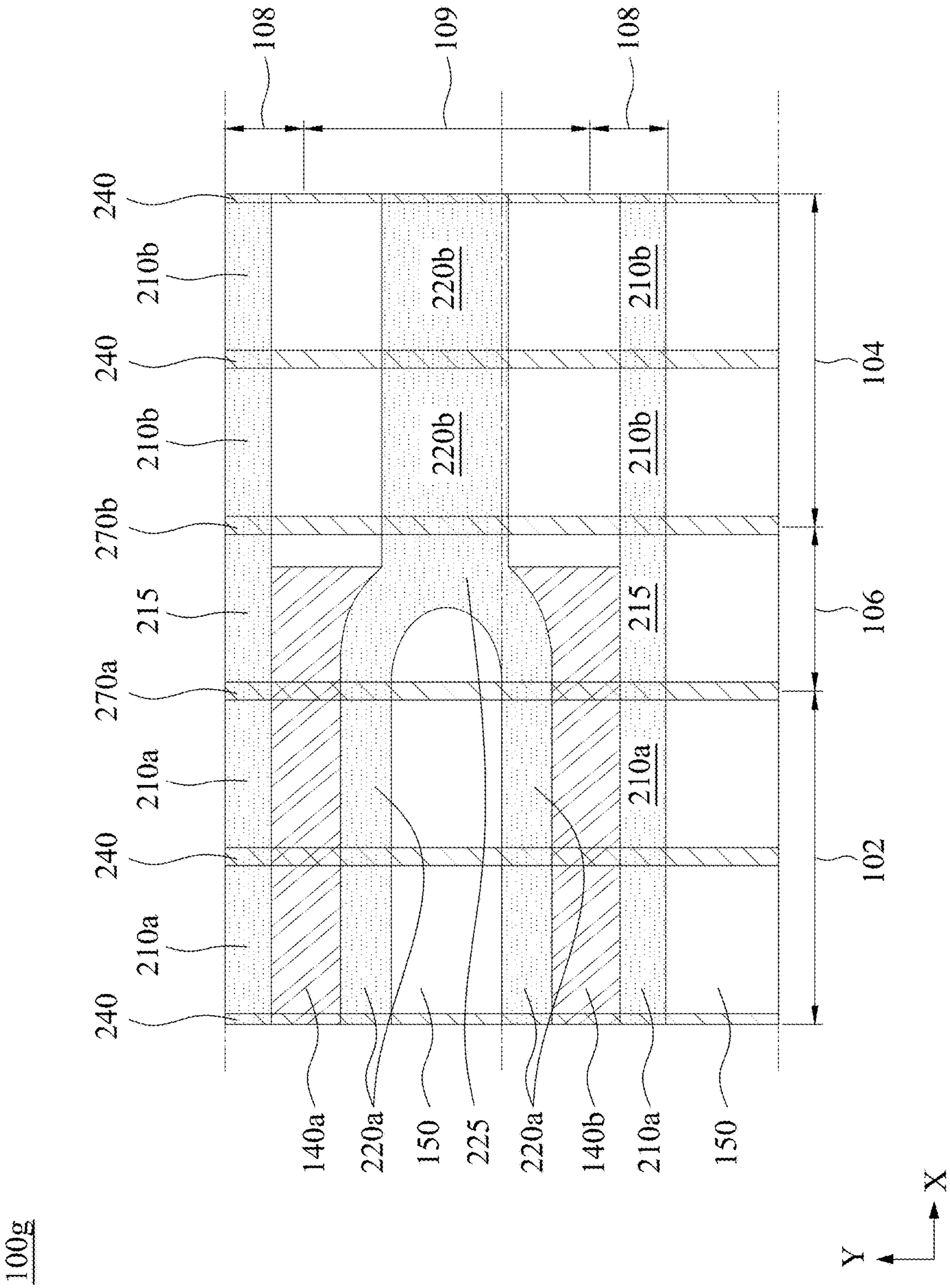
FIG. 27A is a layout diagram of an integrated circuit structure (or semiconductor device) in accordance with some embodiments of the present disclosure.
Figure 27B:
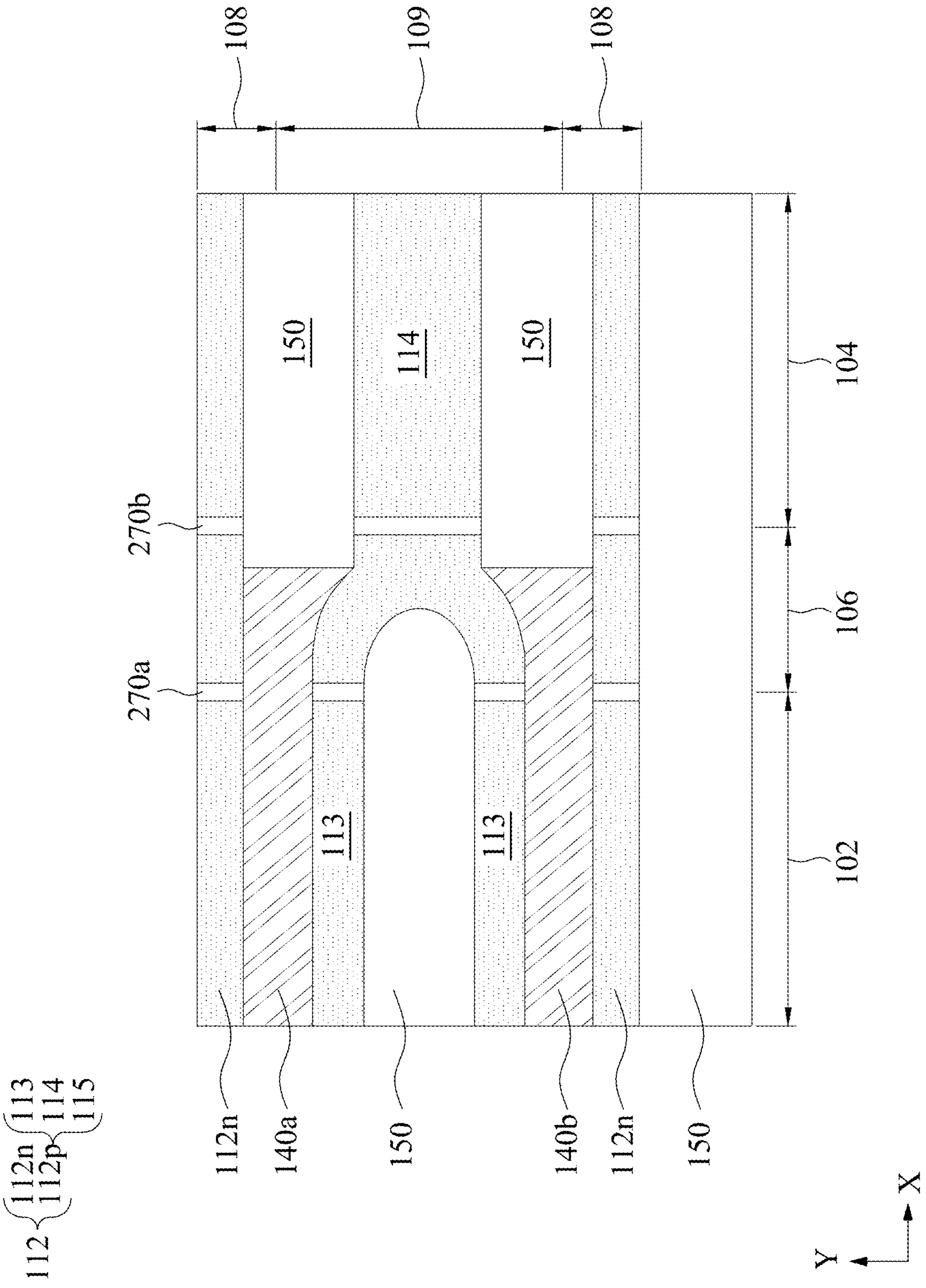
FIG. 27B is a top view of the protrusion structure, the dielectric fins, the isolation structures, and the dielectric gate structures of the integrated circuit structure.
Figure 27C:
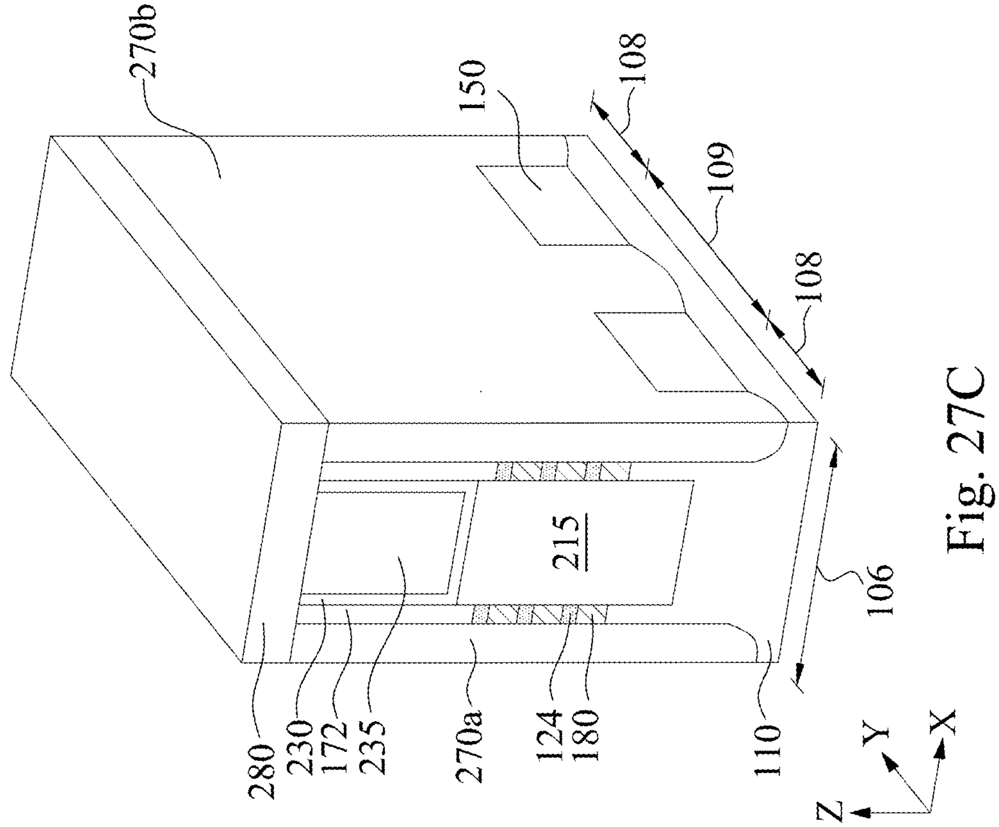
FIG. 27C is a perspective view of the integrated circuit structure over the connecting region.

FIG. 27A is a layout diagram of an integrated circuit structure (or semiconductor device) 100*g* in accordance with some embodiments of the present disclosure, FIG. 27B is a top view of the protrusion structure 112, the dielectric fins 140*a*, 140*b*, the isolation structures 150, and the dielectric gate structures 270*a* and 270*b* of the integrated circuit structure 100*g*, and FIG. 27C is a perspective view of the integrated circuit structure 100*g* over the connecting region 106. The difference between the integrated circuit structure 100*g* and 100*f* pertains to the profile of the P-type structure 112*p* over the connecting region 106. In FIG. 27B, the third portion 115 has a 270-degree-rotated capital "Y" shape in the top view. As such, the dielectric fins 140*a* and 140*b* have substantially the same profile, which is described in FIGS. 25A-25C, in the top view. Therefore, as shown in FIGS. 27A and 27C, the dielectric structure 270*a* covers both the dielectric fins 140*a* and 140*b* while the dielectric structure 270*b* is spaced apart from the dielectric fins 140*a* and 140*b*. Instead, the dielectric structure 270*b* covers the isolation structure 150. The structure of the integrated circuit structure 100*g* over the first device region 102 and the second device region 104 are similar to or the same as the structure illustrated in FIGS. 21A and 21E, respectively. Other features of the integrated circuit structure 100*g* are similar to or the same as those of the integrated circuit structure 100*a* shown in FIGS. 1 and 21A-21F, and therefore, a description in this regard will not be provided hereinafter.

Figure 28A:
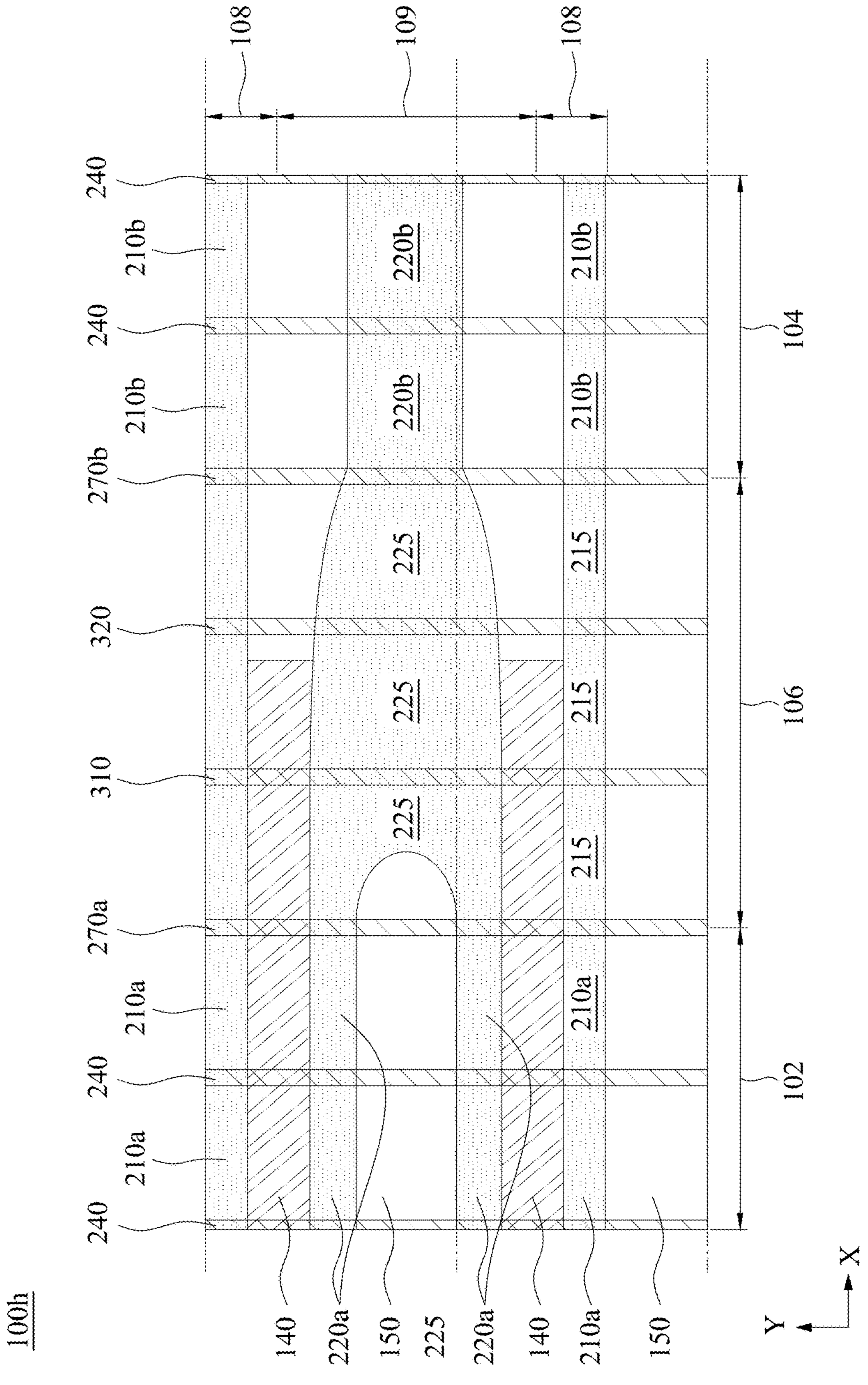
FIG. 28A is a layout diagram of an integrated circuit structure (or semiconductor device) in accordance with some embodiments of the present disclosure.
Figure 28B:
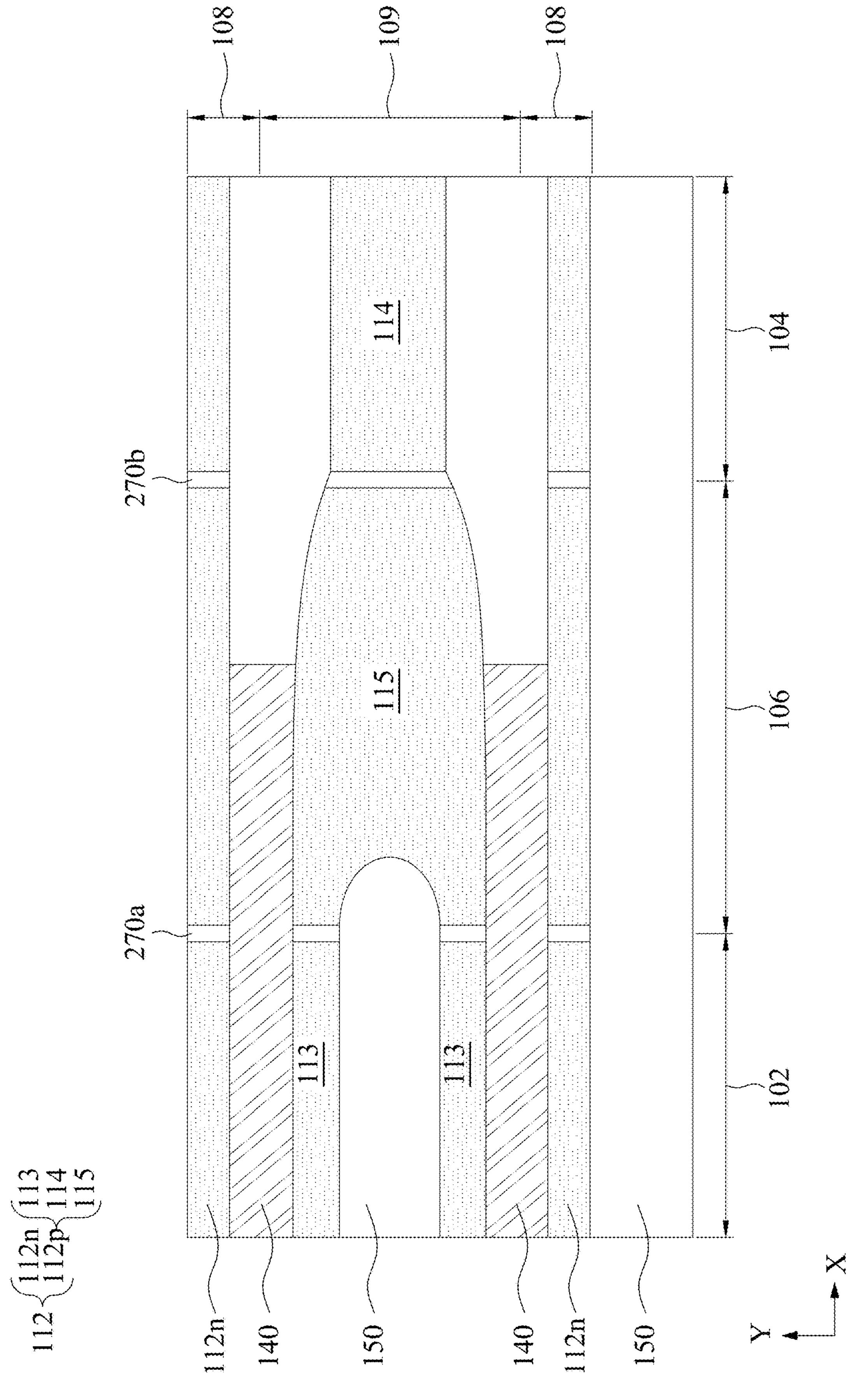
FIG. 28B is a top view of the protrusion structure, the dielectric fins, the isolation structures, and the dielectric gate structures of the integrated circuit structure.
Figure 28C:
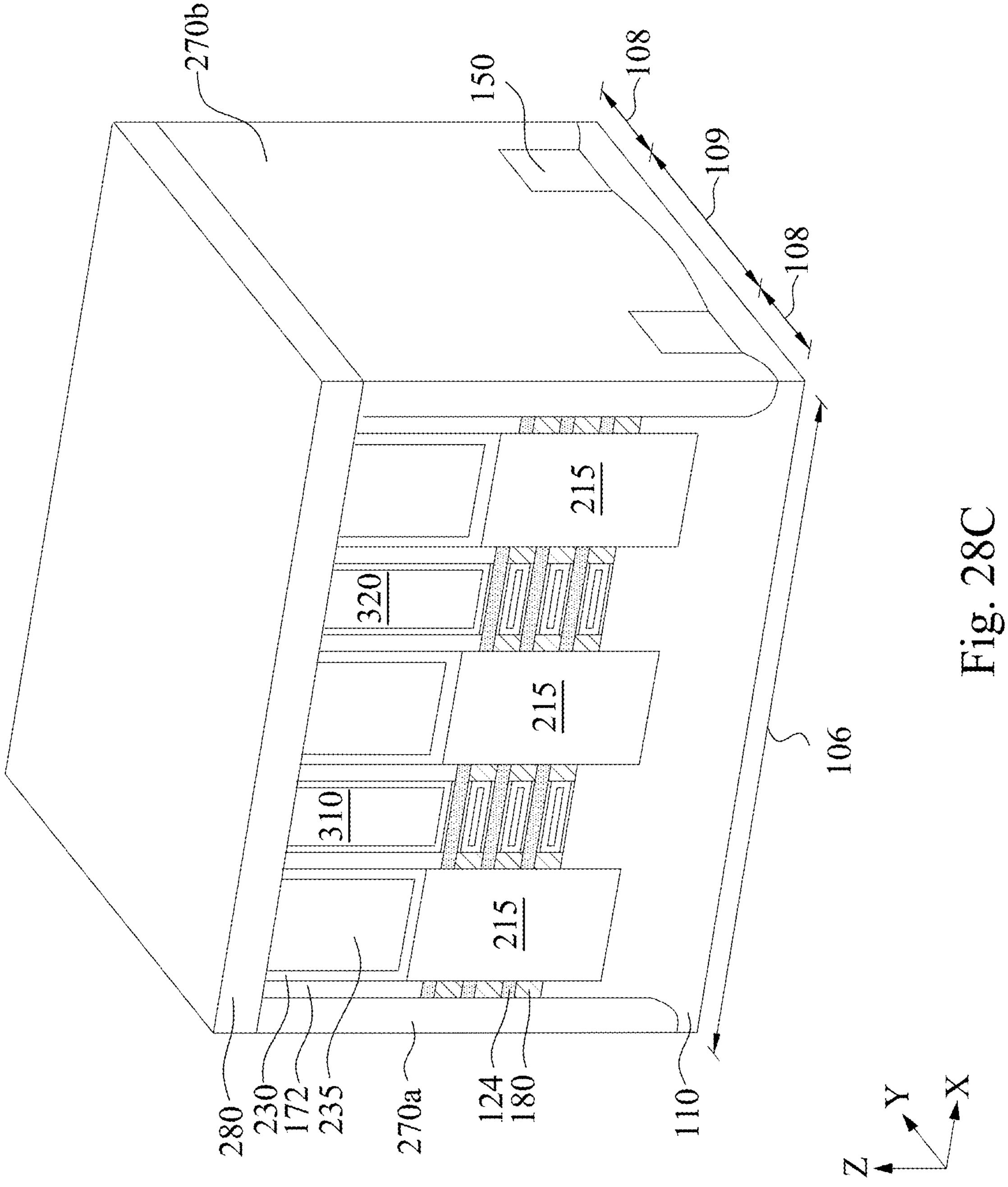
FIG. 28C is a perspective view of the integrated circuit structure over the connecting region.

FIG. 28A is a layout diagram of an integrated circuit structure (or semiconductor device) 100*h* in accordance with some embodiments of the present disclosure, FIG. 28B is a top view of the protrusion structure 112, the dielectric fins 140, the isolation structures 150, and the dielectric gate structures 270*a*, 270*b* of the integrated circuit structure 100*h*, and FIG. 28C is a perspective view of the integrated circuit structure 100*h* over the connecting region 106. Unlike the integrated circuit structures 100*a*-100*g*, whose connecting region 106 is one gate pitch long, the integrated circuit structure 100*h* has the connecting region 106 with more than one gate pitch long (e.g., three gate pitches long in FIGS. 28A-28C). The integrated circuit structure 100*h* includes the dielectric structure 270*a* between the first device region 102 and the connecting region 106 and the dielectric structure 270*b* between the connecting region 106 and the second device region 104. The integrated circuit structure 100*h* further includes dummy gate structures 310 and 320 between the dielectric gate structures 270*a* and 270*b*. The dummy gate structures 310 and 320 and the dielectric gate structures 270*a* and 270*b* have a constant gate pitch. That is, the dummy gate structures 310 and 320 and the dielectric gate structures 270*a* and 270*b* are spaced from each other by a substantially constant distance.

In FIG. 28B, the third portion 115 of the P-type structure 112*p* has a reversed capital "C" shape. The dielectric fins 140 extend from the first device region 102 to the middle of the connecting region 106. The dielectric structure 270*a* and the dummy gate structure 310 cover the dielectric fins 140, and the dielectric structure 270*b* and the dummy gate structure 320 are spaced apart from the dielectric fins 140.

Figure 28D:
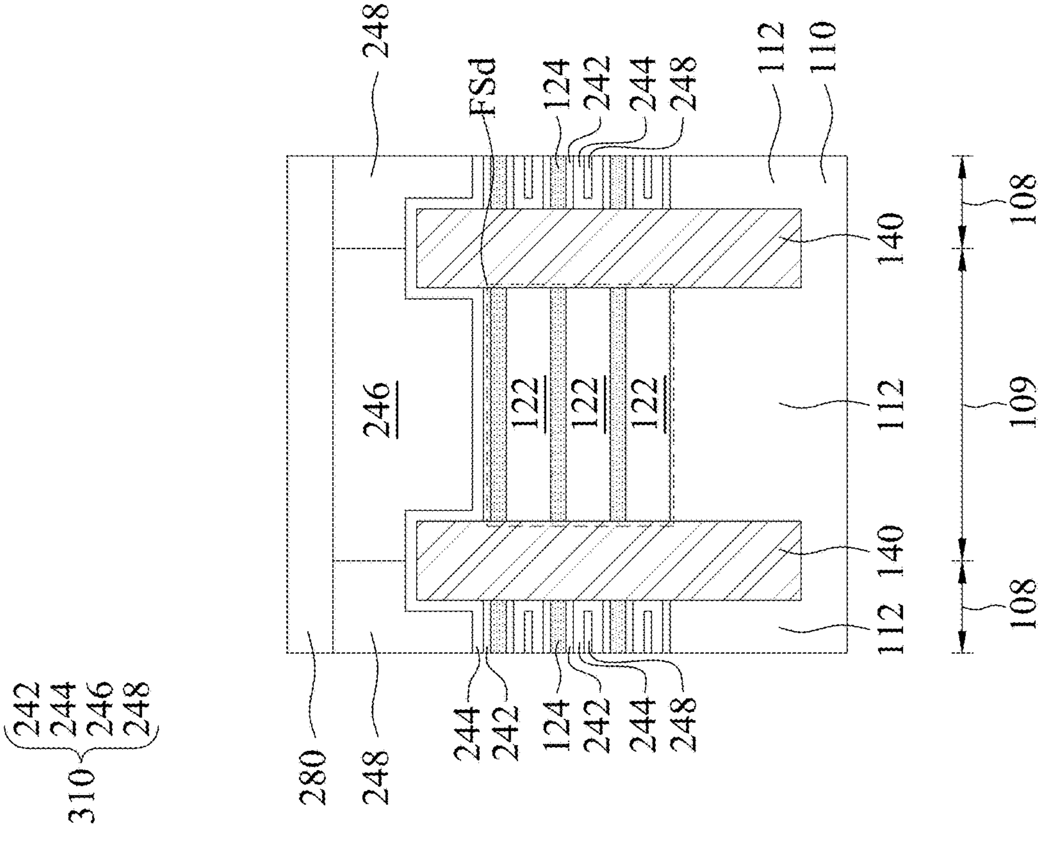
FIGS. 28D and 28E are cross-sectional views of the integrated circuit structure taken along the extension direction of the dummy gate structures.

FIG. 28D is a cross-sectional view of the integrated circuit structure 100*h* taken along the extension direction of the dummy gate structure 310. As shown in FIG. 28D, the fin structure FSd is confined by the dielectric fins 140 (and the inner spacers 180 as shown in FIG. 10B). Therefore, during the removal of the semiconductor layers 122, the semiconductor layers 122 of the fin structure FSc (see FIG. 15B) are removed while the semiconductor layers 122 of the fin structure FSd remains. Therefore, the dummy gate structure 310 is formed over the fin structure FSd and surrounds the semiconductor layers 124 over the N-type regions 108. That is, the P-type work function metal layer 246 covers the semiconductor layers 122 and 124 of the fin structure FSd.

Figure 28E:
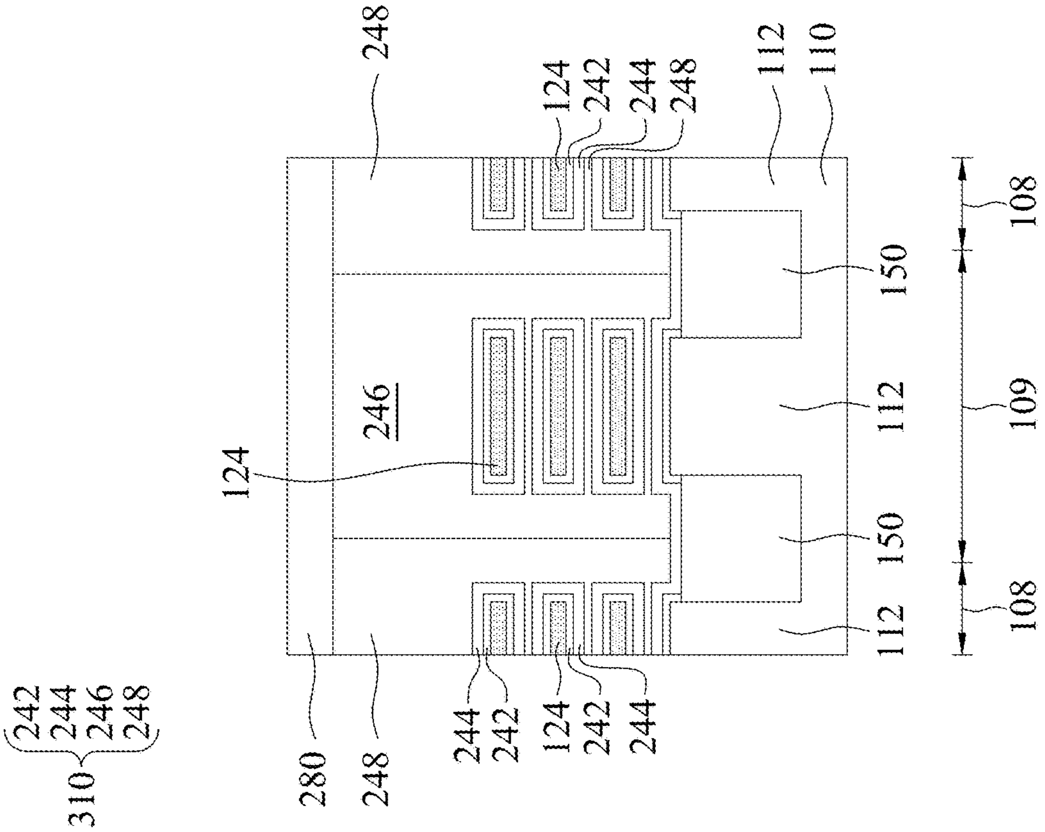

FIG. 28E is a cross-sectional view of the integrated circuit structure 100*h* taken along the extension direction of the dummy gate structure 320. On the contrary, as shown in FIG. 28E, the semiconductor layers 122 of both the fin structures FSc and FSd are exposed in the gate trenches GT1 (see FIG. 16A), such that the semiconductor layers 122 are removed, and the dummy gate structure 320 has a configuration substantially the same as the gate structures 240*a* and 240*b* shown in FIG. 18D. However, the dummy gate structures 310 and 320 are not electrically connected as gates for the integrated circuit structures but are instead "dummy" structures, having no function in the circuit. The structure of the integrated circuit structure 100*h* over the first device region 102 and the second device region 104 are similar to or the same as the structure illustrated in FIGS. 21A and 21E, respectively. Other features of the integrated circuit structure 100*h* are similar to or the same as those of the integrated circuit structure 100*a* shown in FIGS. 1 and 21A-21F, and therefore, a description in this regard will not be provided hereinafter.

Figure 29A:
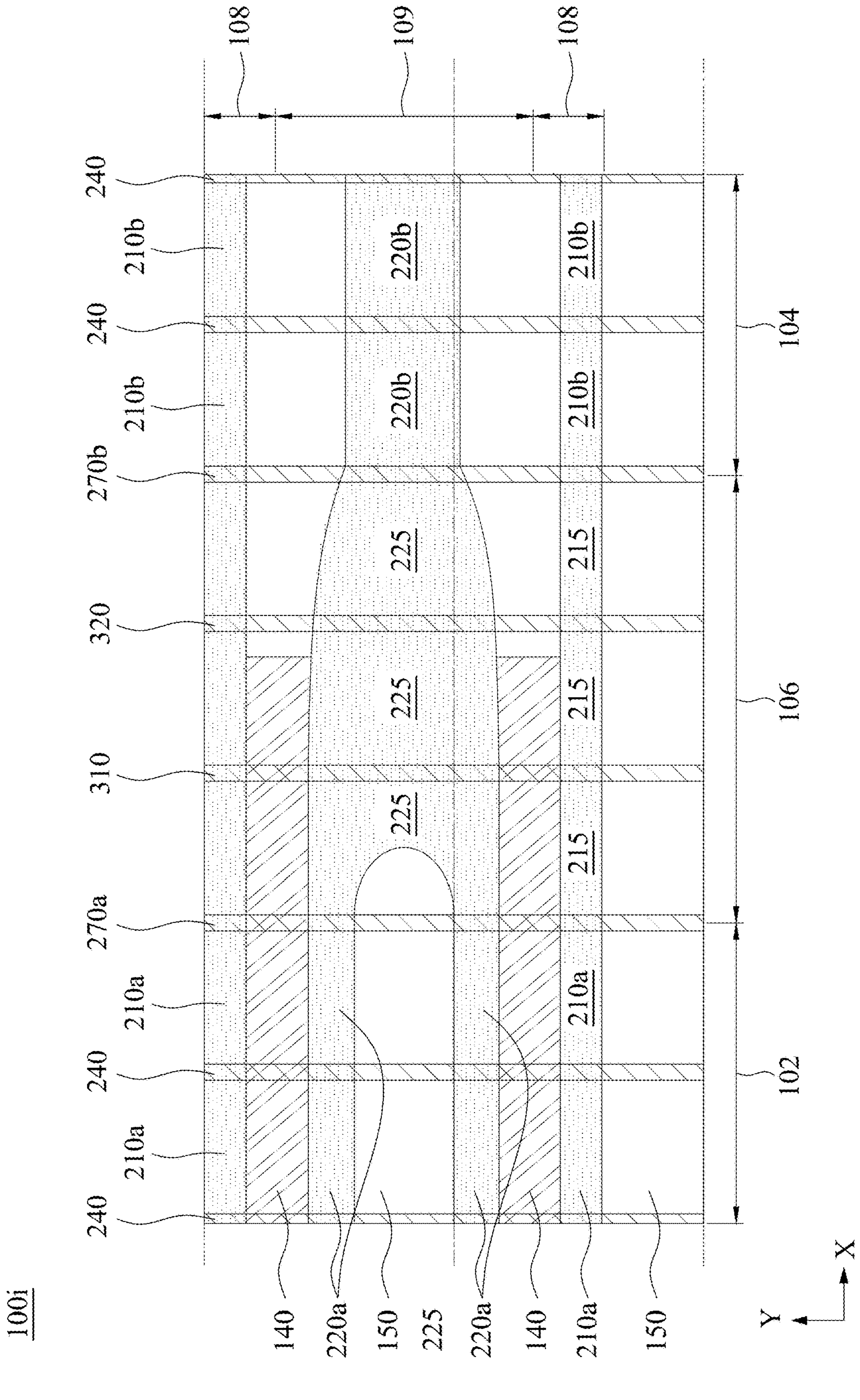
FIG. 29A is a layout diagram of an integrated circuit structure (or semiconductor device) in accordance with some embodiments of the present disclosure.
Figure 29B:
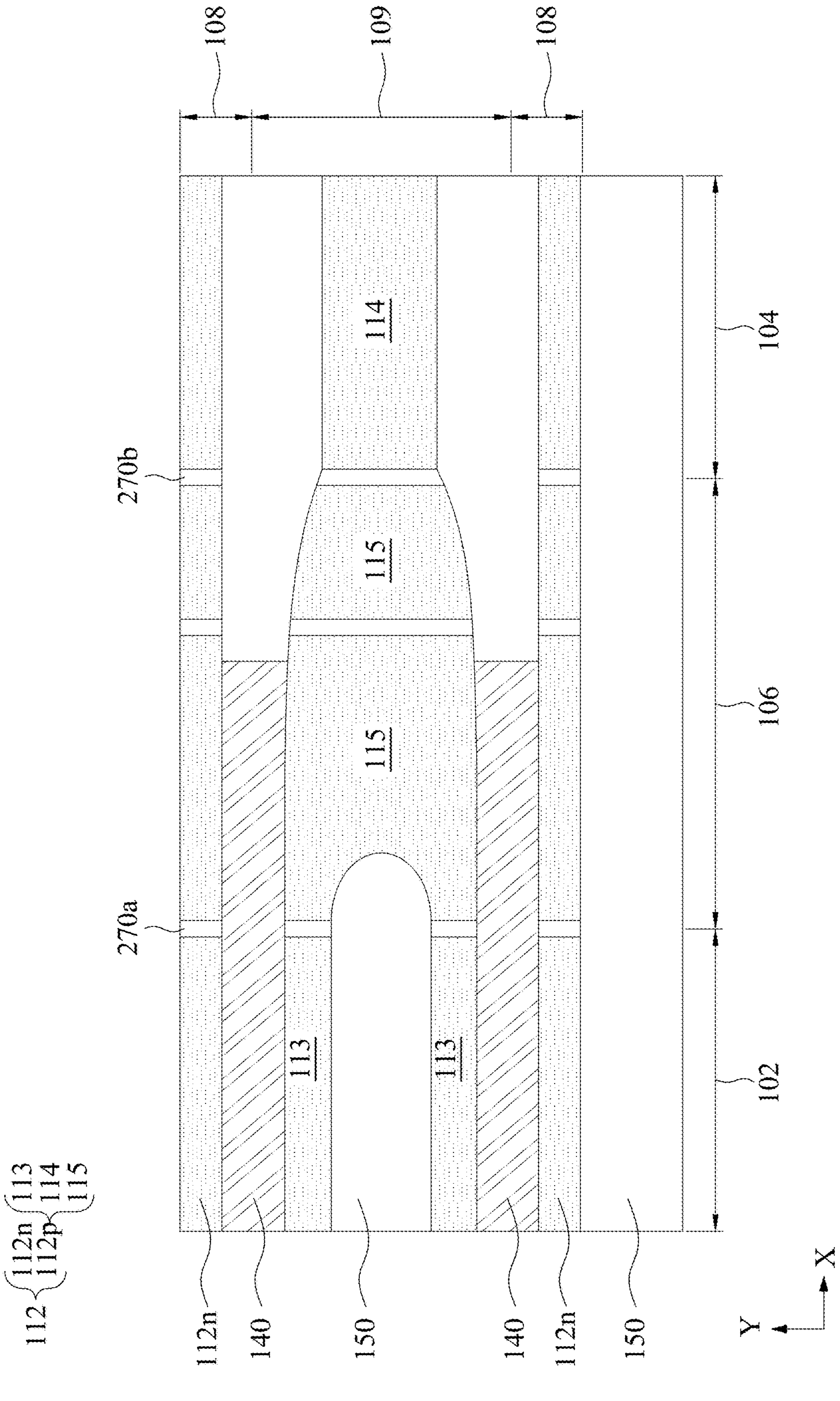
FIG. 29B is a top view of the protrusion structure, the dielectric fins, the isolation structures, and the dielectric gate structures of the integrated circuit structure.
Figure 29C:
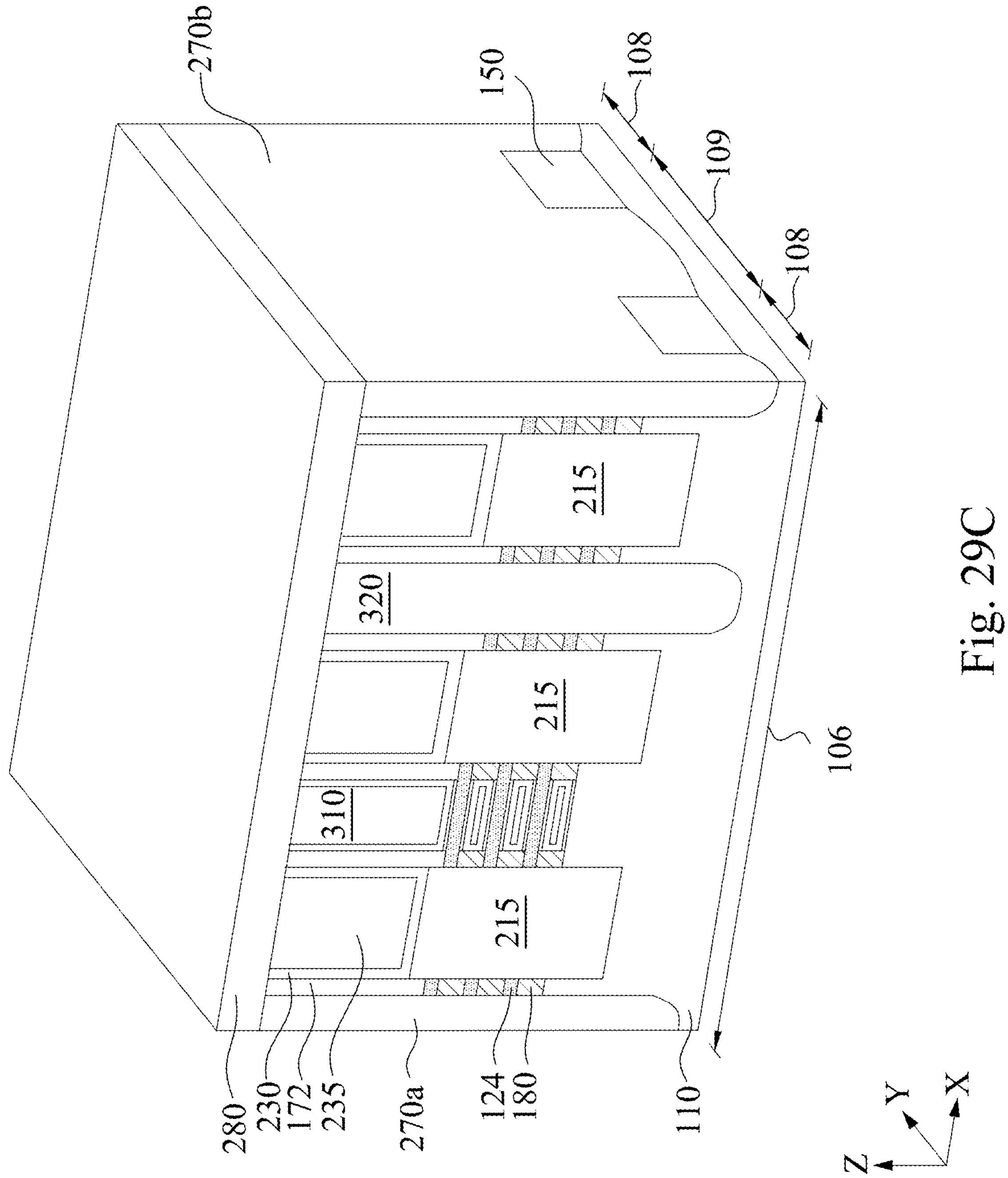
FIG. 29C is a perspective view of the integrated circuit structure over the connecting region.

FIG. 29A is a layout diagram of an integrated circuit structure (or semiconductor device) 100*i* in accordance with some embodiments of the present disclosure, FIG. 29B is a top view of the protrusion structure 112, the dielectric fins 140, the isolation structures 150, and the dielectric gate structures 270*a*, 270*b*, 320 of the integrated circuit structure 100*i*, and FIG. 29C is a perspective view of the integrated circuit structure 100*i* over the connecting region 106. The difference between the integrated circuit structure 100*i* and 100*h* pertains to the configuration of the dummy gate structure 320. In FIG. 29C, the dummy gate structure 320 is filled with dielectric materials. That is, the dummy gate structure 320 has a configuration/profile similar to that of the dielectric structure 270*b*. Alternatively or additionally, the dummy gate structure 310 is filled with dielectric materials. That is, the dummy gate structure 310 has a configuration/profile similar to that of the dielectric structure 270 shown in FIG. 21C. The structure of the integrated circuit structure 100*i* over the first device region 102 and the second device region 104 are similar to or the same as the structure illustrated in FIGS. 21A and 21E, respectively. Other features of the integrated circuit structure 100*i* are similar to or the same as those of the integrated circuit structure 100*a* shown in FIGS. 1 and 21A-21F, and therefore, a description in this regard will not be provided hereinafter.

In some embodiments, when the connecting region 106 has a length greater than one gate pitch, e.g., the integrated circuit structures 100*h* and 100*i*, each of the dummy epitaxial structures 225 may be in contact with both the dielectric fins 140, one of the dielectric fins 140, or none of the dielectric fins 140. Further, at least one of the dummy epitaxial structures 225 (e.g., the dummy epitaxial structure 225 between the dummy gate structures 310 and 320) and the underlying portion of the third portion 115 can be removed. Therefore, the isolation structure 150 may extend to the space between the dummy gate structures 310 and 320.

Figure 30A:
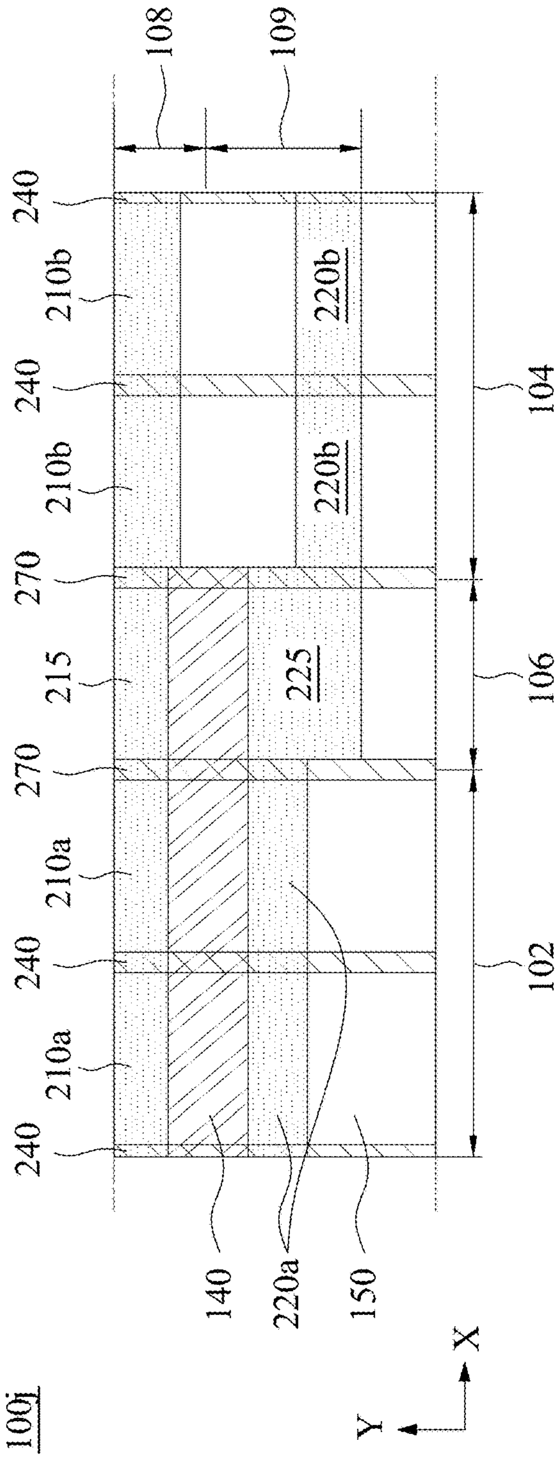
FIG. 30A is a layout diagram of an integrated circuit structure (or semiconductor device) in accordance with some embodiments of the present disclosure.
Figure 30B:
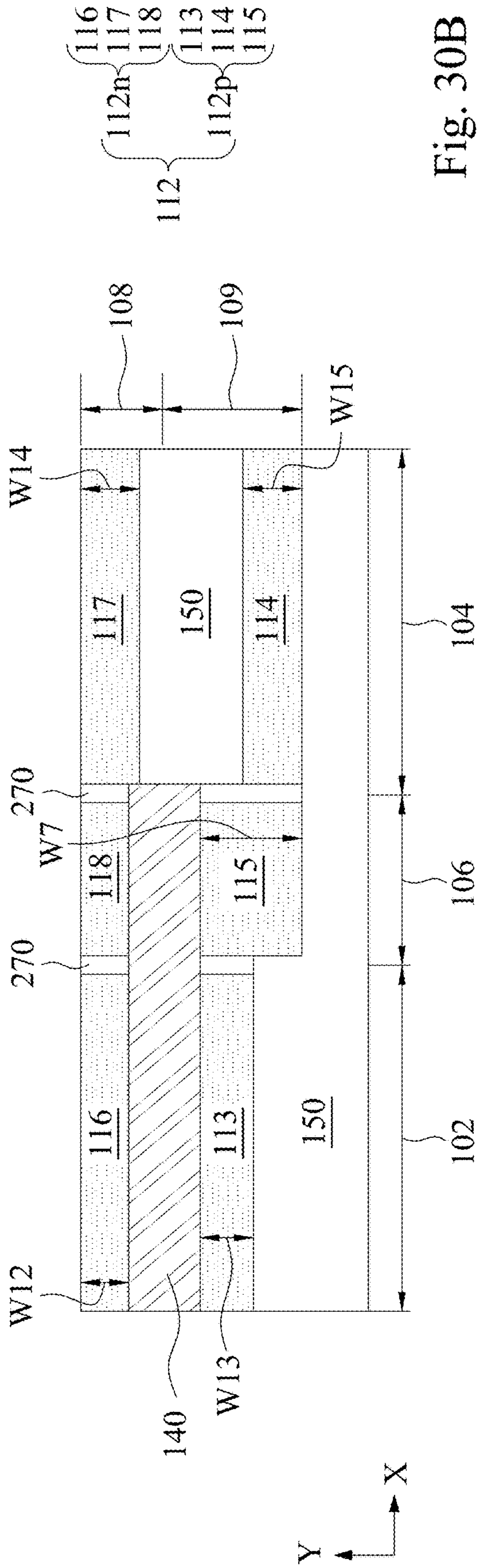
FIG. 30B is a top view of the protrusion structure, the dielectric fin, the isolation structures, and the dielectric gate structures of the integrated circuit structure.

FIG. 30A is a layout diagram of an integrated circuit structure (or semiconductor device) 100*j* in accordance with some embodiments of the present disclosure, and FIG. 30B is a top view of the protrusion structure 112, the dielectric fin 140, the isolation structures 150, and the dielectric gate structures 270 of the integrated circuit structure 100*j*. As shown in FIG. 30B, the protrusion structures 112 of the integrated circuit structure 100*j* includes the N-type structure 112*n* and the P-type structure 112*p*. The first portion 116 of the N-type structure 112*n* has a width W12 substantially the same as a width W13 of the first portion 113 of the P-type structure 112*p*. The second portion 117 of the N-type structure 112*n* has a width W14 substantially the same as a width W15 of the second portion 114 of the P-type structure 112*p*. The width W14(W15) is greater than the width W12(W13). Further, the third portion 115 of the P-type structure 112*p* has the width W7 greater than the widths W13 and W15.

Figure 30D:
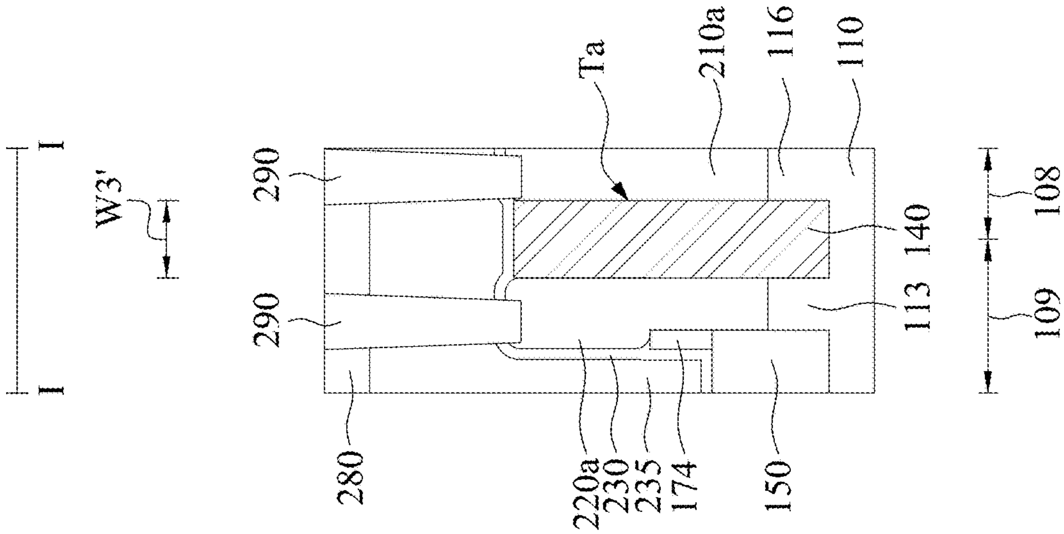
FIG. 30D is a cross-sectional view taken along the cut I-I in FIG. 30C.
Figure 30C:
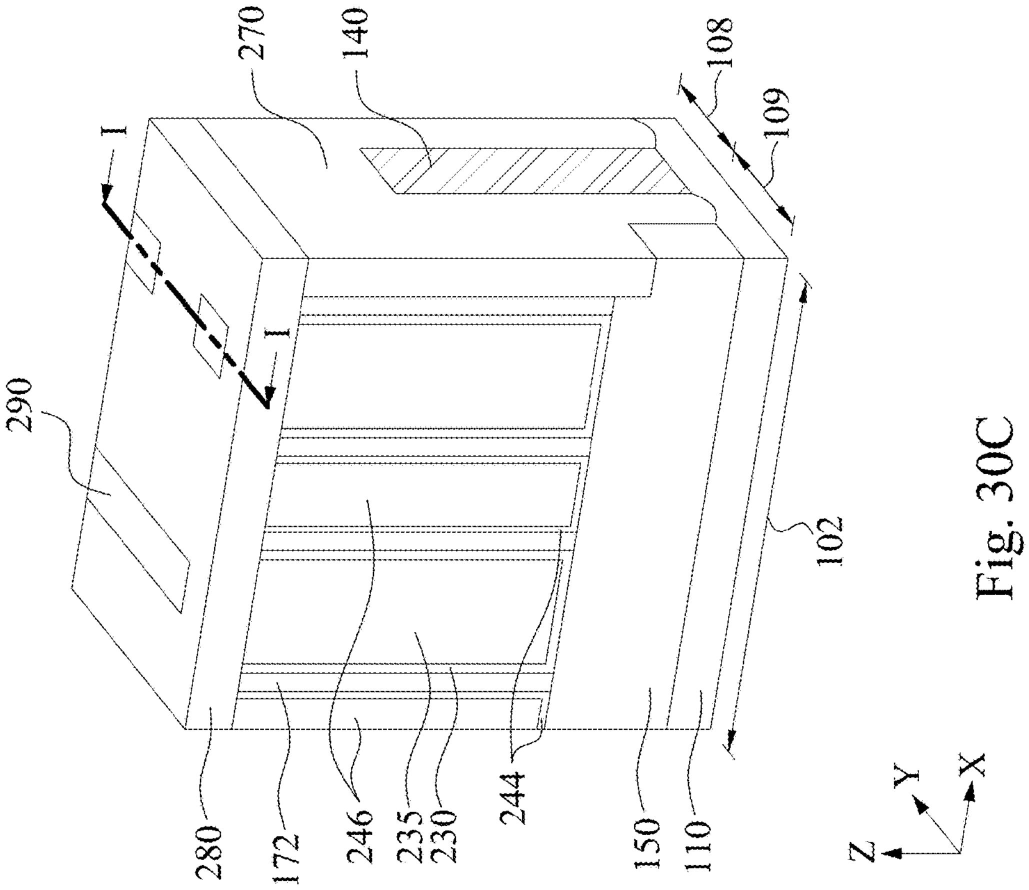
FIG. 30C is a perspective view of the integrated circuit structure over the first device region.
Figure 30F:
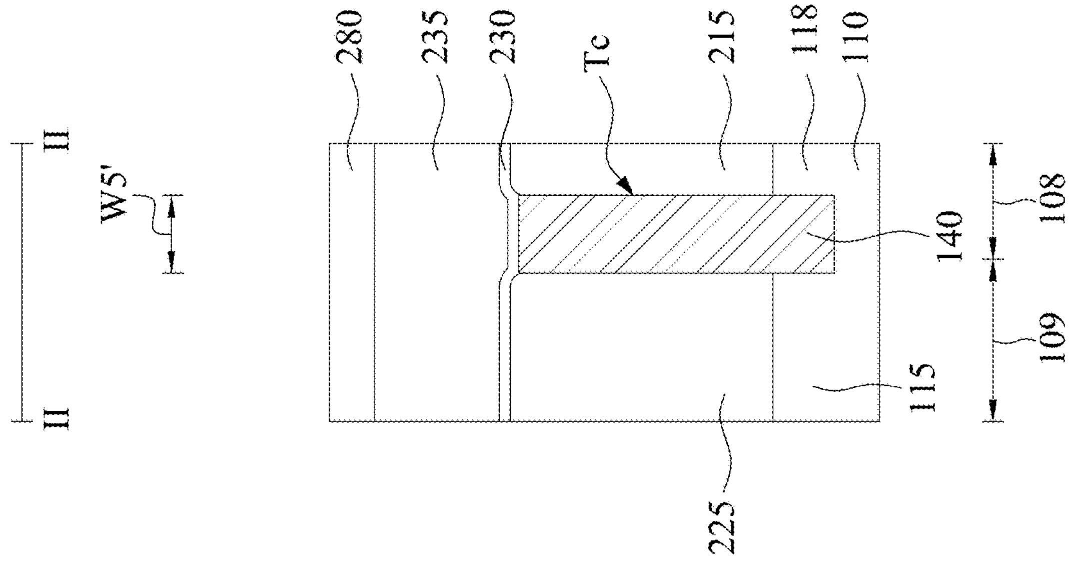
FIG. 30F is a cross-sectional view taken along the cut II-II in FIG. 30E.
Figure 30E:
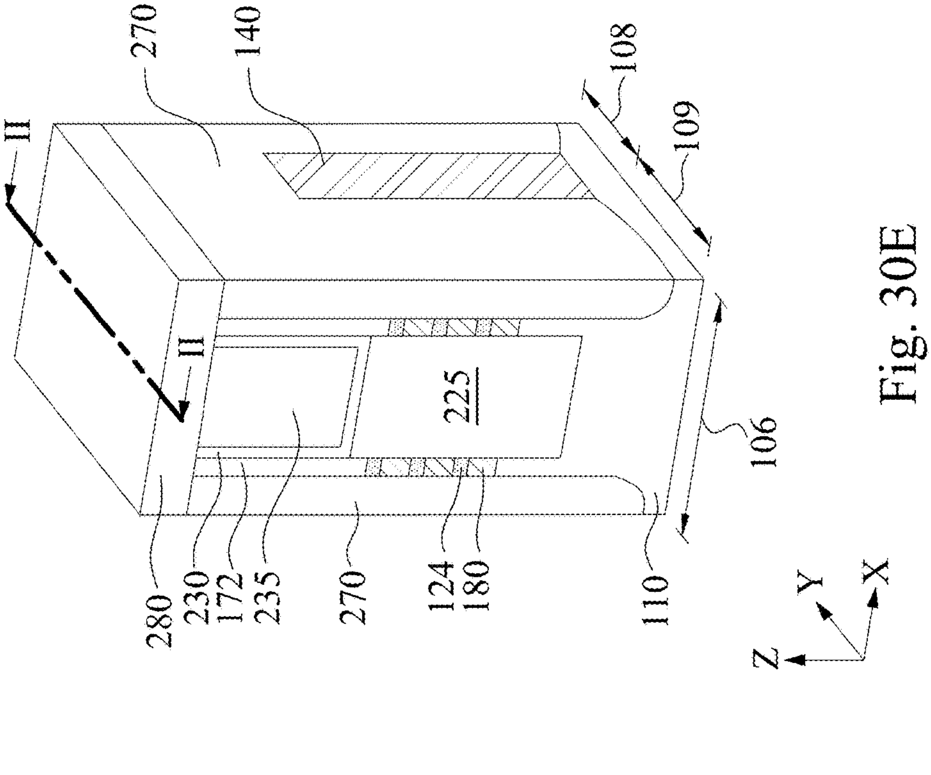
FIG. 30E is a perspective view of the integrated circuit structure over the connecting region.
Figure 30H:
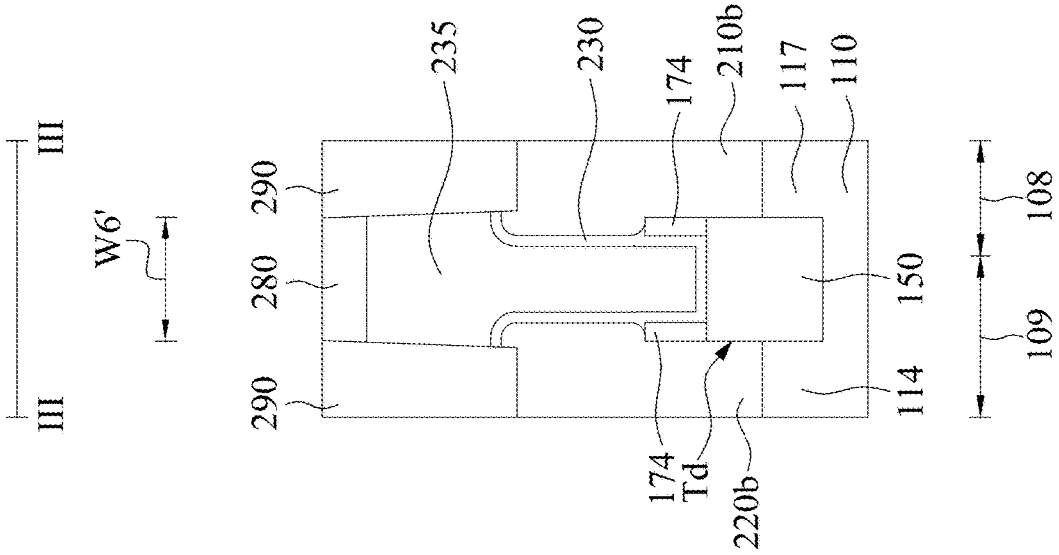
FIG. 30H is a cross-sectional view taken along the cut III-III in FIG. 30G.
Figure 30G:
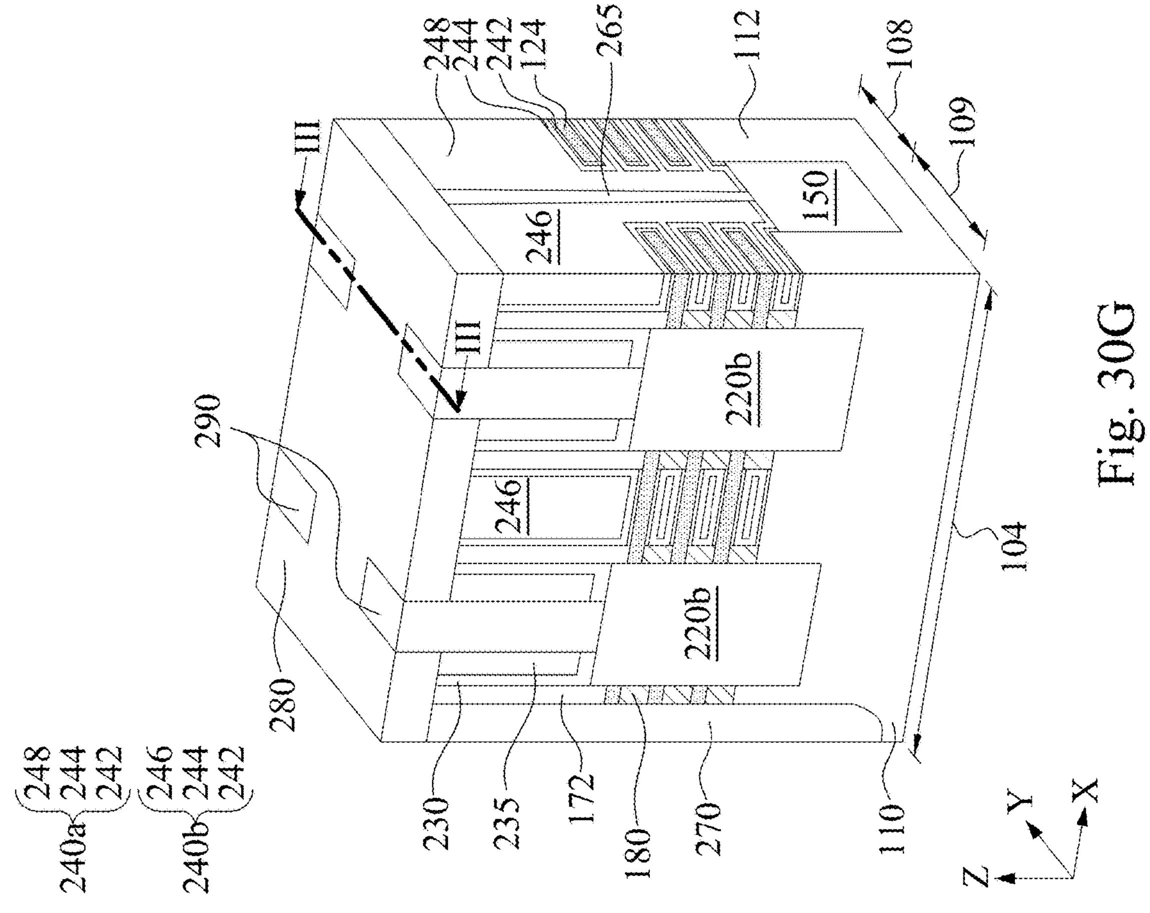
FIG. 30G is a perspective view of the integrated circuit structure over the second device region.

FIG. 30C is a perspective view of the integrated circuit structure 100*j* over the first device region 102, FIG. 30D is a cross-sectional view taken along the cut I-I in FIG. 30C, FIG. 30E is a perspective view of the integrated circuit structure 100*j* over the connecting region 106, FIG. 30F is a cross-sectional view taken along the cut II-II in FIG. 30E, FIG. 30G is a perspective view of the integrated circuit structure 100*j* over the second device region 104, and FIG. 30H is a cross-sectional view taken along the cut III-III in FIG. 30G. The trench Ta is between the first portions 113 and 116 and has a width W3', the trench Tc is between the third portions 115 and 118 and has a width W5', and the trench Td is between the second portions 114 and 117 and has a width W6'. The width W6' is greater than the width W3', which may be substantially the same as the width W5'. The dielectric fin 140 fills in the trenches Ta and Tc but not in the trench Td. Further, the dielectric gate structures 270 cover the dielectric fin 140. Other features of the integrated circuit structure 100*j* are similar to or the same as those of the integrated circuit structure 100*a* shown in FIGS. 1 and 21A-21F, and therefore, a description in this regard will not be provided hereinafter.

Figure 31A:
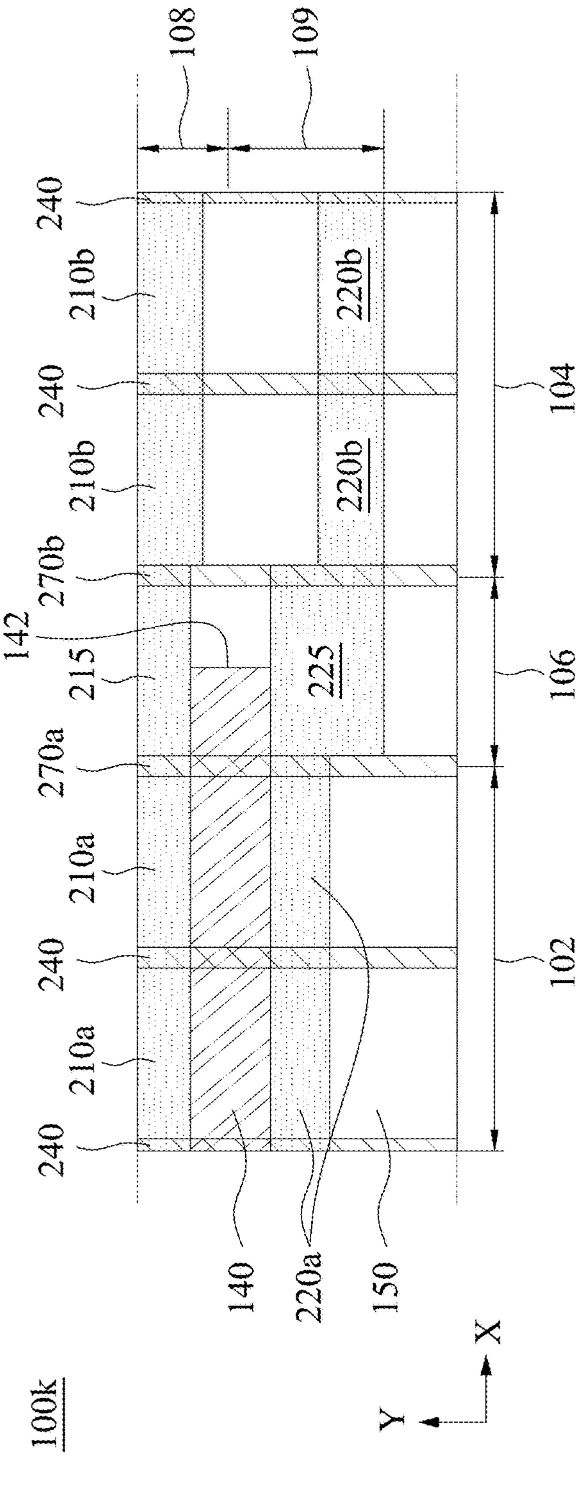
FIG. 31A is a layout diagram of an integrated circuit structure (or semiconductor device) in accordance with some embodiments of the present disclosure.
Figure 31B:
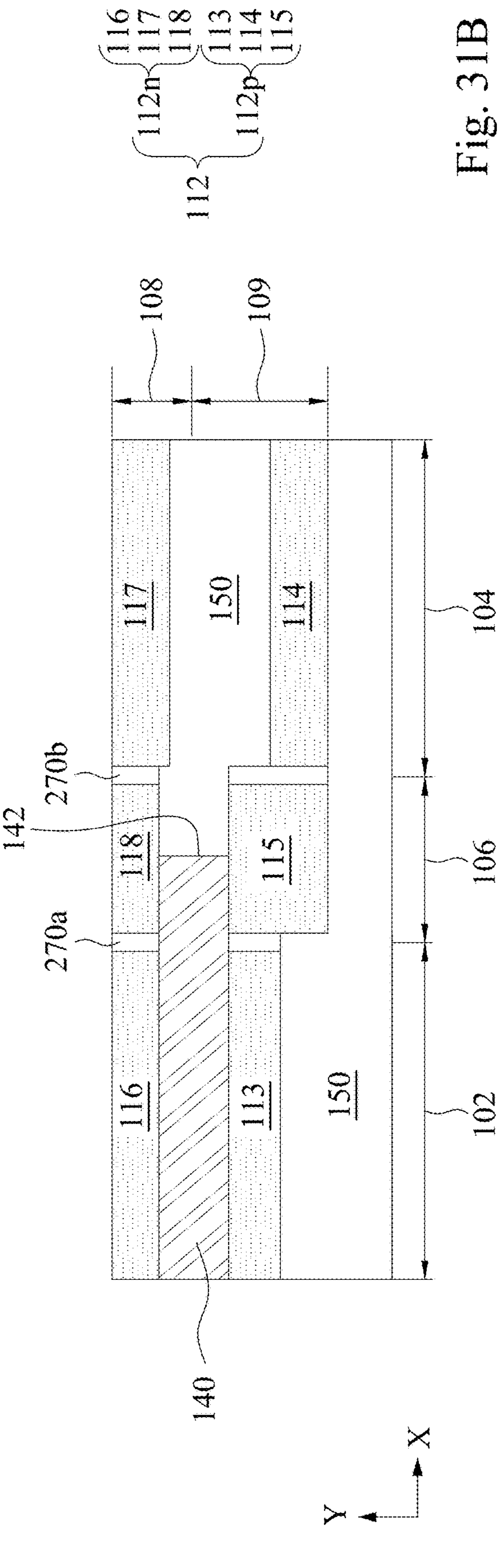
FIG. 31B is a top view of the protrusion structure, the dielectric fin, the isolation structures, and the dielectric gate structures of the integrated circuit structure.
Figure 31D:
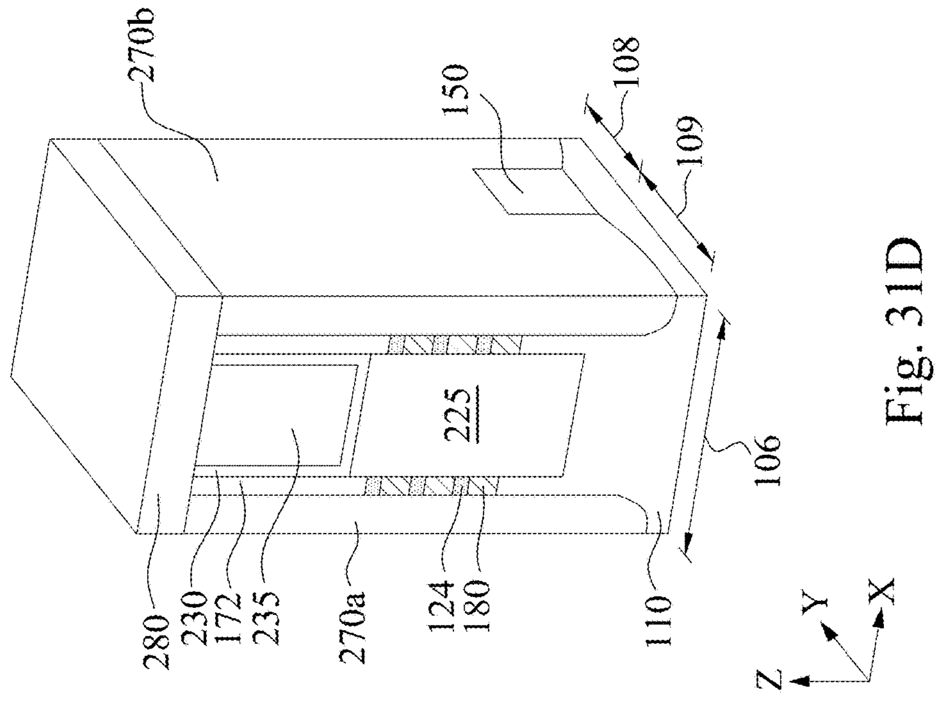
FIG. 31D is a perspective view of the integrated circuit structure over the connecting region.
Figure 31C:
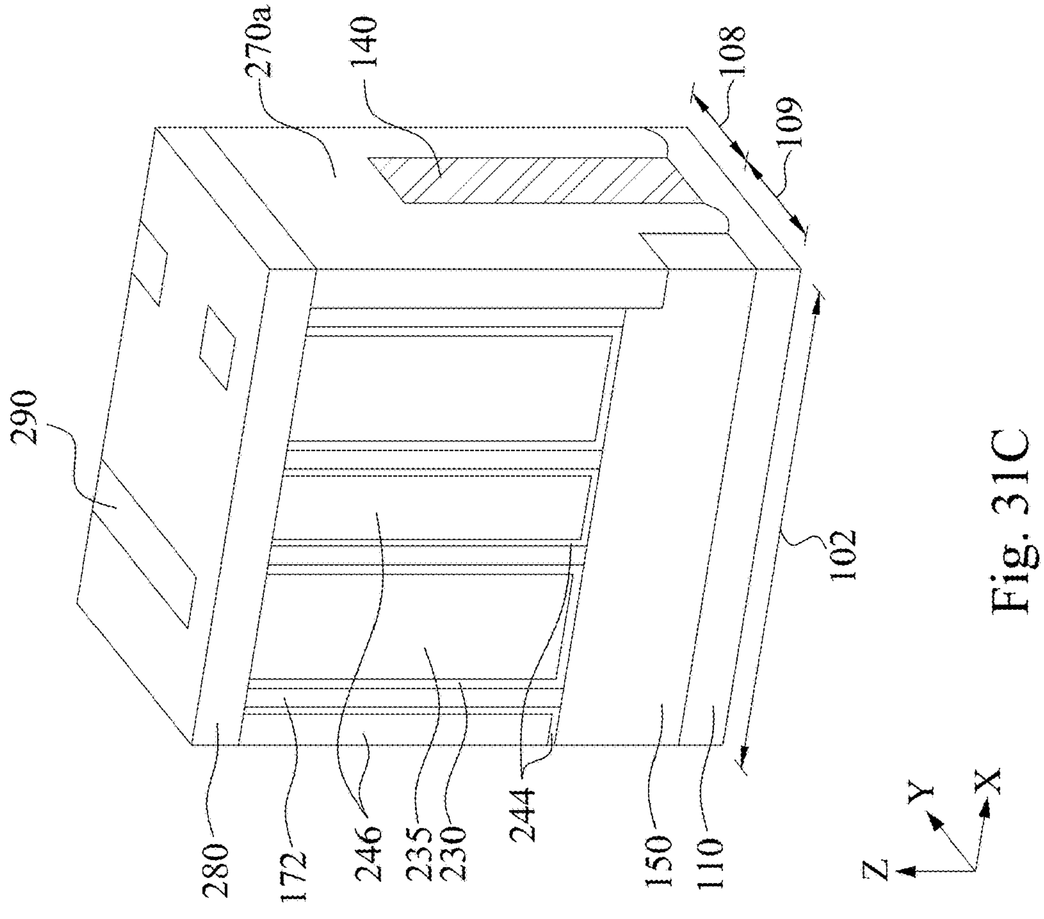
FIG. 31C is a perspective view of the integrated circuit structure over the first device region.

FIG. 31A is a layout diagram of an integrated circuit structure (or semiconductor device) 100*k* in accordance with some embodiments of the present disclosure, FIG. 31B is a top view of the protrusion structure 112, the dielectric fin 140, the isolation structures 150, and the dielectric gate structures 270*a* and 270*b* of the integrated circuit structure 100*k*, FIG. 31C is a perspective view of the integrated circuit structure 100*k* over the first device region 102, and FIG. 31D is a perspective view of the integrated circuit structure 100*k* over the connecting region 106. The difference between the integrated circuit structure 100*k* and 100*j* pertains to the profile of the dielectric fin 140. In some embodiments, during the etching of the dielectric film 140' as shown in FIGS. 4-5C, the dielectric fin 140 may be laterally over-etched, such that the end surface 142 of the dielectric fin 140 is located between the two dielectric gate structures 270*a* and 270*b*. Therefore, a portion of the isolation structure 150 extends into the connecting region 106 and in contact with the third portions 115 and 118 as shown in FIG. 31B. Moreover, as shown in FIGS. 31C and 31D, the dielectric structure 270*a* covers the dielectric fin 140 while the dielectric structure 270*b* is spaced apart from the dielectric fin 140. Instead, the dielectric structure 270*b* covers the isolation structure 150. The structure of the integrated circuit structure 100*k* over the second device region 104 is similar to or the same as the structure illustrated in FIG. 30G. Other features of the integrated circuit structure 100*k* are similar to or the same as those of the integrated circuit structure 100*j* shown in FIGS. 30A-30H, and therefore, a description in this regard will not be provided hereinafter.

Figure 32A:
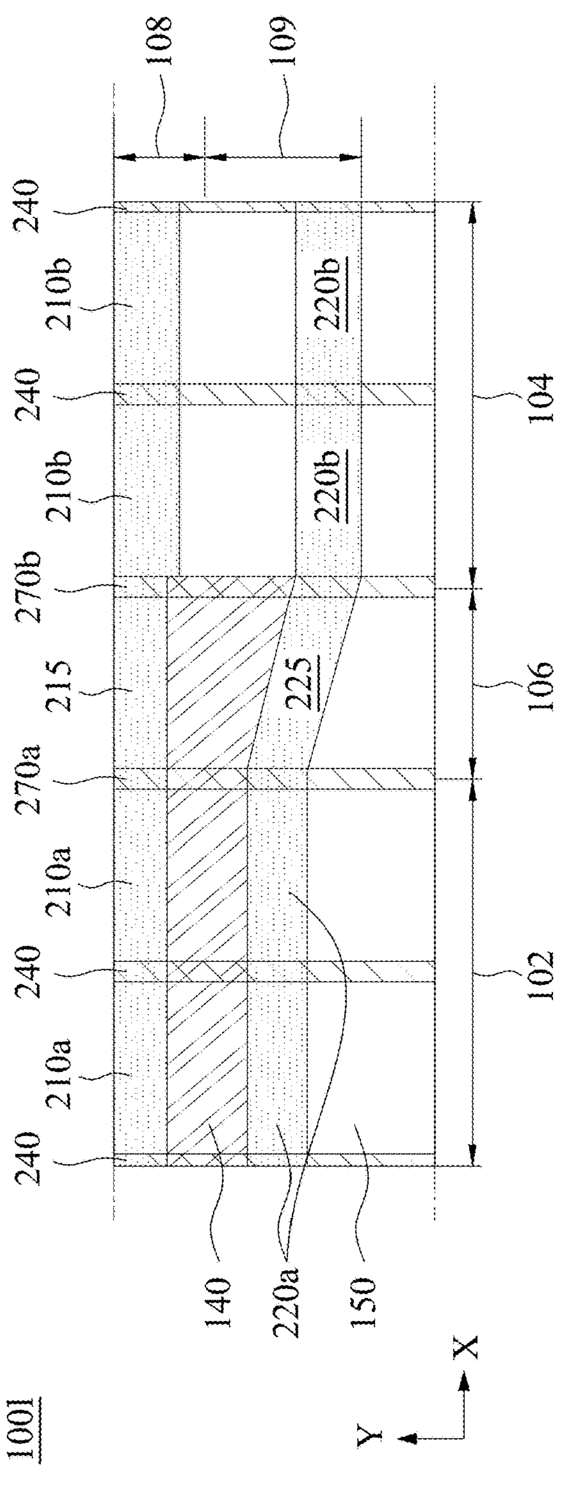
FIG. 32A is a layout diagram of an integrated circuit structure (or semiconductor device) in accordance with some embodiments of the present disclosure.
Figure 32B:
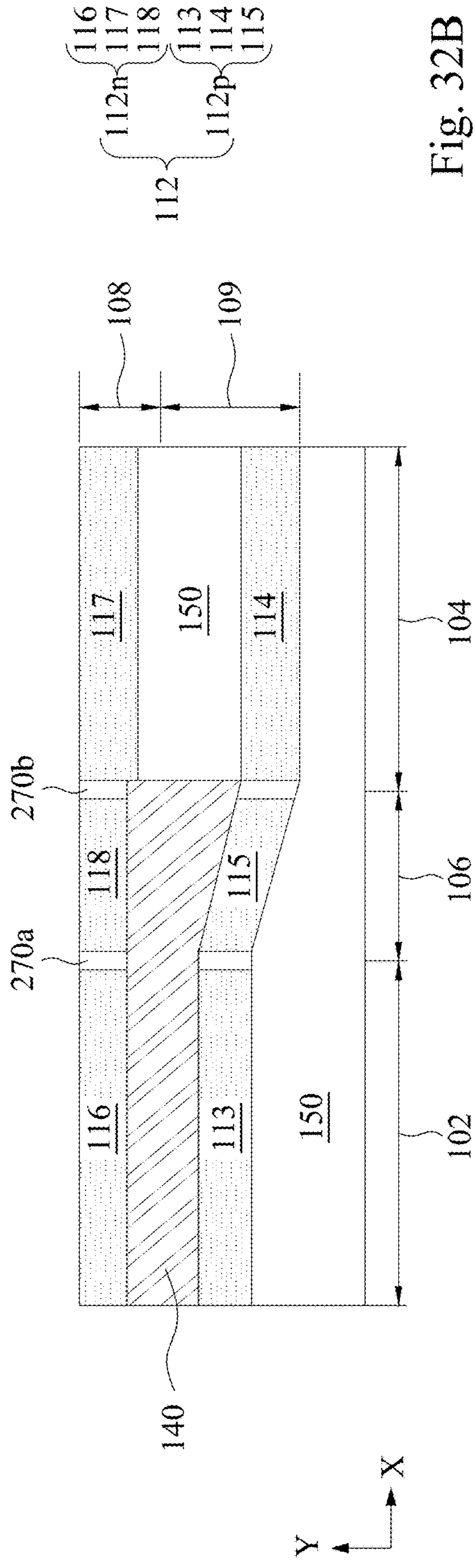
FIG. 32B is a top view of the protrusion structure, the dielectric fin, the isolation structures, and the dielectric gate structures of the integrated circuit structure.
Figure 32C:
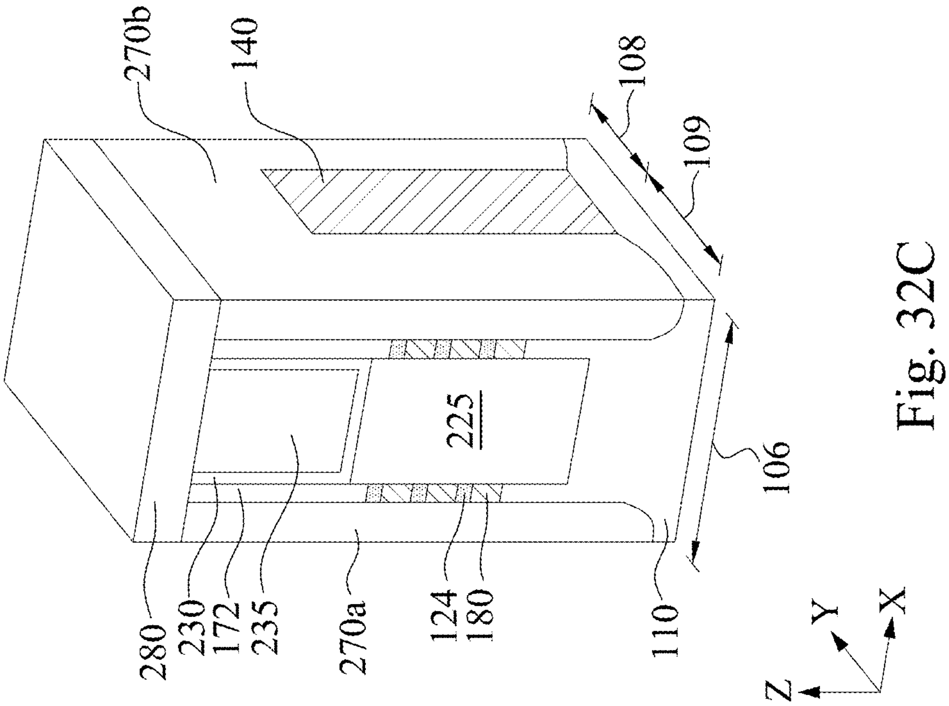
FIG. 32C is a perspective view of the integrated circuit structure over the connecting region.

FIG. 32A is a layout diagram of an integrated circuit structure (or semiconductor device) 1001 in accordance with some embodiments of the present disclosure, FIG. 32B is a top view of the protrusion structure 112, the dielectric fin 140, the isolation structures 150, and the dielectric gate structures 270*a* and 270*b* of the integrated circuit structure 100*l*, and FIG. 32C is a perspective view of the integrated circuit structure 100*l* over the connecting region 106. The difference between the integrated circuit structure 100*l* and 100*j* pertains to the profile of the dielectric fin 140 and the third portion 115 of the P-type structure 112*p*. In FIG. 32A-32C, the third portion 115 has opposite sidewalls not parallel to each other. One sidewall of the third portion 115 extends from an edge of a sidewall of the first portion 113 to an edge of a sidewall of the second portion 114; another sidewall of the third portion 115 extends from an edge of another sidewall of the first portion 113 to an edge of another sidewall of the second portion 114. Therefore, the second portion 146 of the dielectric fin 140 gets wider toward the second device region 104. The structure of the integrated circuit structure 100*l* over the first device region 102 and the second device region 104 are similar to or the same as the structure illustrated in FIGS. 30C and 30G, respectively. Other features of the integrated circuit structure 100*l* are similar to or the same as those of the integrated circuit structure 100*j* shown in FIGS. 30A-30H, and therefore, a description in this regard will not be provided hereinafter.

Figure 33A:
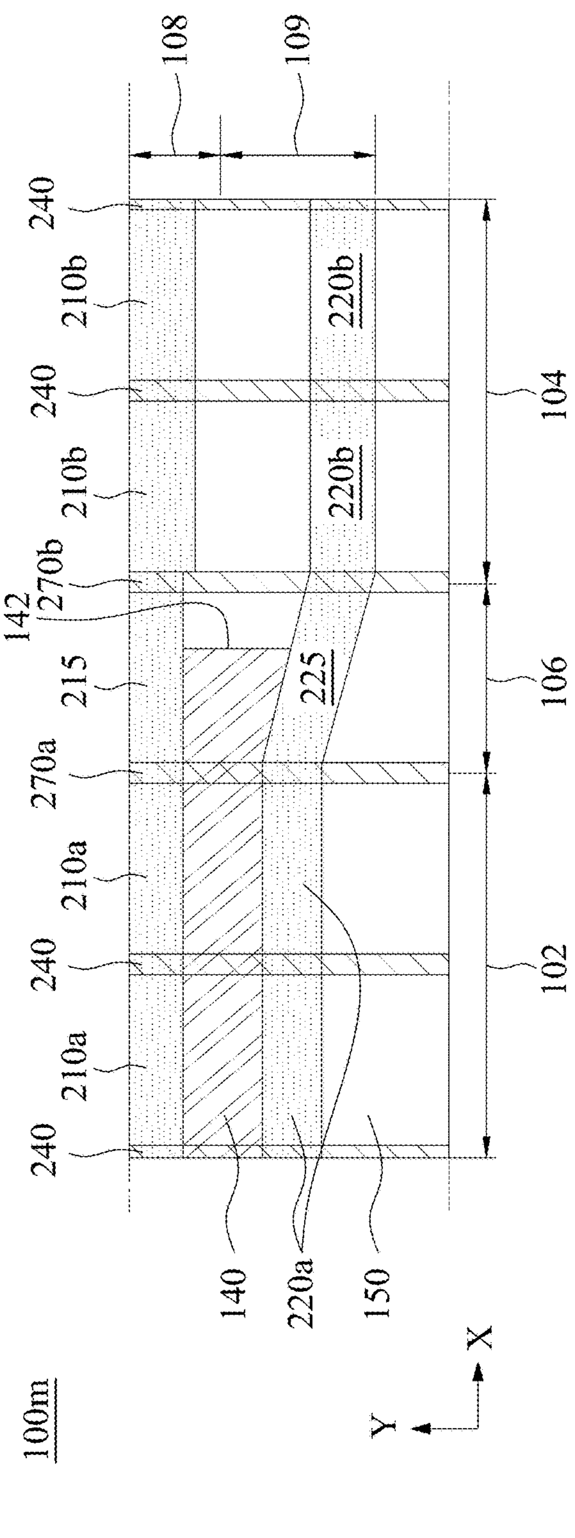
FIG. 33A is a layout diagram of an integrated circuit structure (or semiconductor device) in accordance with some embodiments of the present disclosure.
Figure 33B:
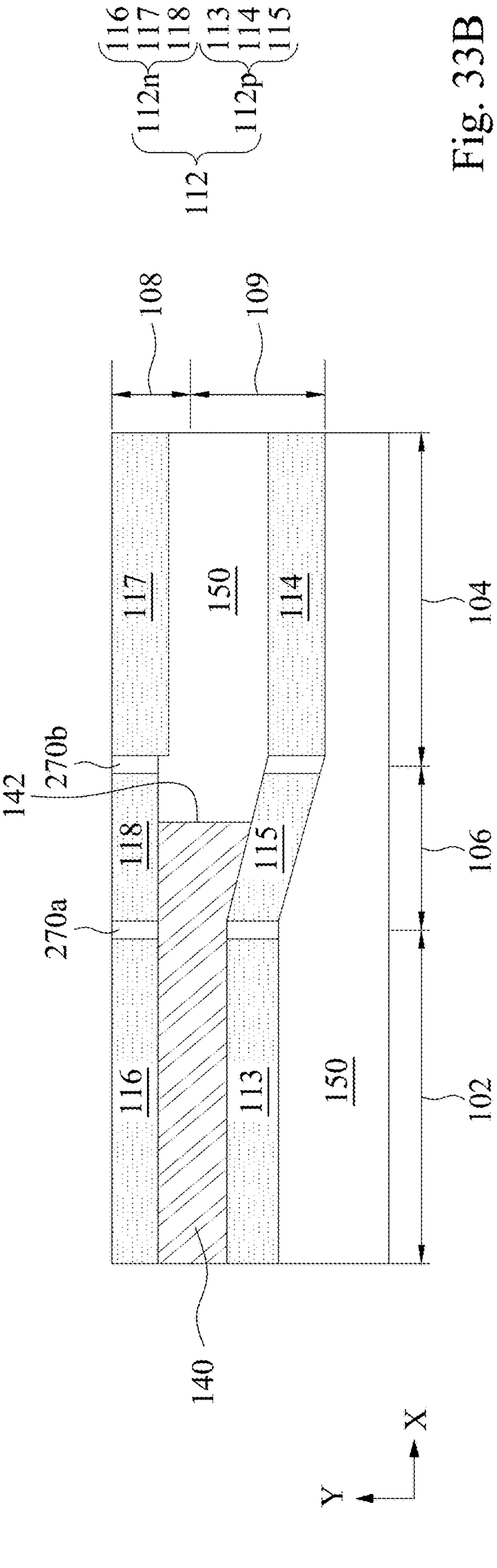
FIG. 33B is a top view of the protrusion structure, the dielectric fin, the isolation structures, and the dielectric gate structures of the integrated circuit structure.
Figure 33C:
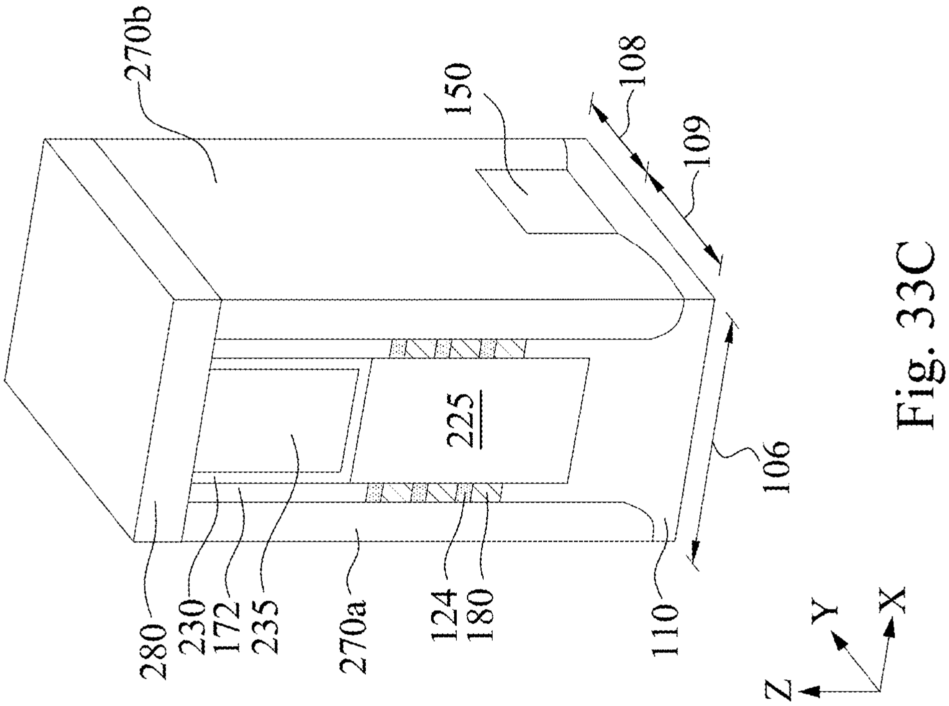
FIG. 33C is a perspective view of the integrated circuit structure over the connecting region.

FIG. 33A is a layout diagram of an integrated circuit structure (or semiconductor device) 100*m* in accordance with some embodiments of the present disclosure, FIG. 33B is a top view of the protrusion structure 112, the dielectric fin 140, the isolation structures 150, and the dielectric gate structures 270*a* and 270*b* of the integrated circuit structure 100*m*, and FIG. 33C is a perspective view of the integrated circuit structure 100*m* over the connecting region 106. The difference between the integrated circuit structure 100*m* and 100*l* pertains to the profile of the dielectric fin 140. In FIG. 33A, the end surface 142 of the dielectric fin 140 is located between the two dielectric gate structures 270*a* and 270*b*. Therefore, a portion of the isolation structure 150 extends into the connecting region 106 and in contact with the third portions 115 and 118 as shown in FIGS. 33A and 33B. Moreover, as shown in FIGS. 33A and 33C, the dielectric structure 270*a* covers the dielectric fin 140 while the dielectric structure 270*b* is spaced apart from the dielectric fin 140. Instead, the dielectric structure 270*b* covers the isolation structures 150. The structure of the integrated circuit structure 100*m* over the first device region 102 and the second device region 104 are similar to or the same as the structure illustrated in FIGS. 30C and 30G, respectively. Other features of the integrated circuit structure 100*m* are similar to or the same as those of the integrated circuit structure 100*j* shown in FIGS. 30A-30H, and therefore, a description in this regard will not be provided hereinafter.

Figure 34A:
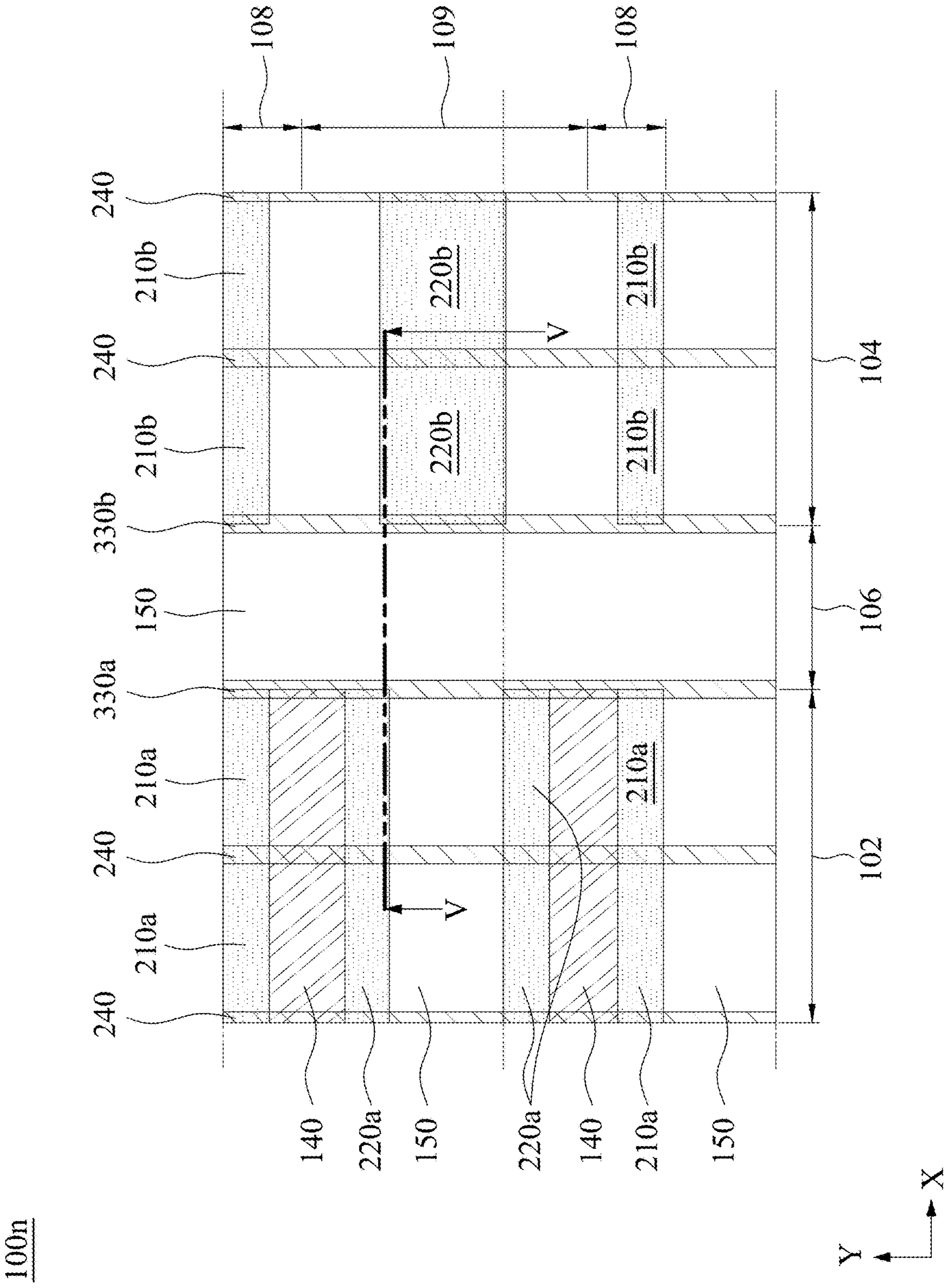
FIG. 34A is a layout diagram of an integrated circuit structure (or semiconductor device) in accordance with some embodiments of the present disclosure.
Figure 34B:
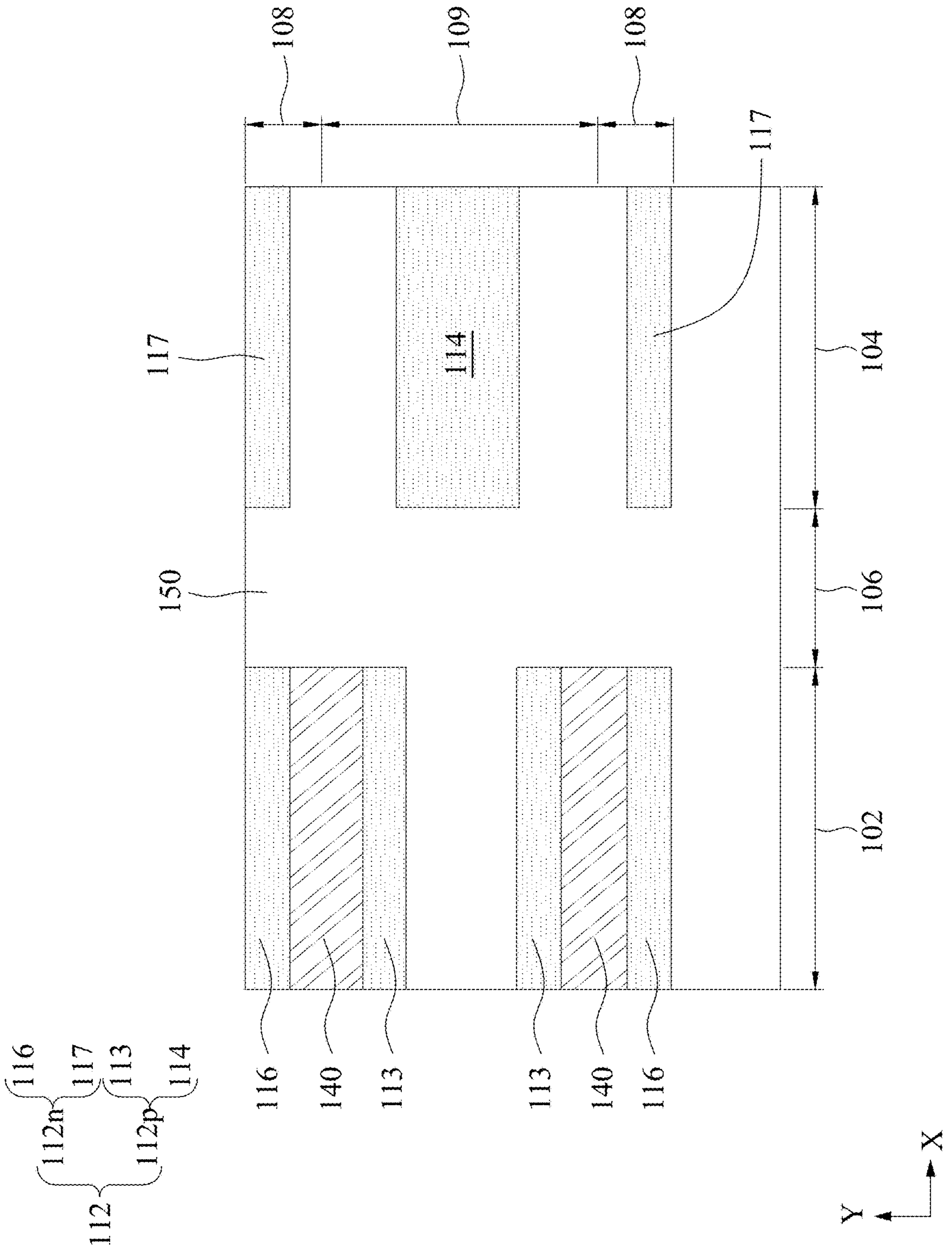
FIG. 34B is a top view of the protrusion structure, the dielectric fins, the isolation structures, and dummy gate structures of the integrated circuit structure.
Figure 34C:
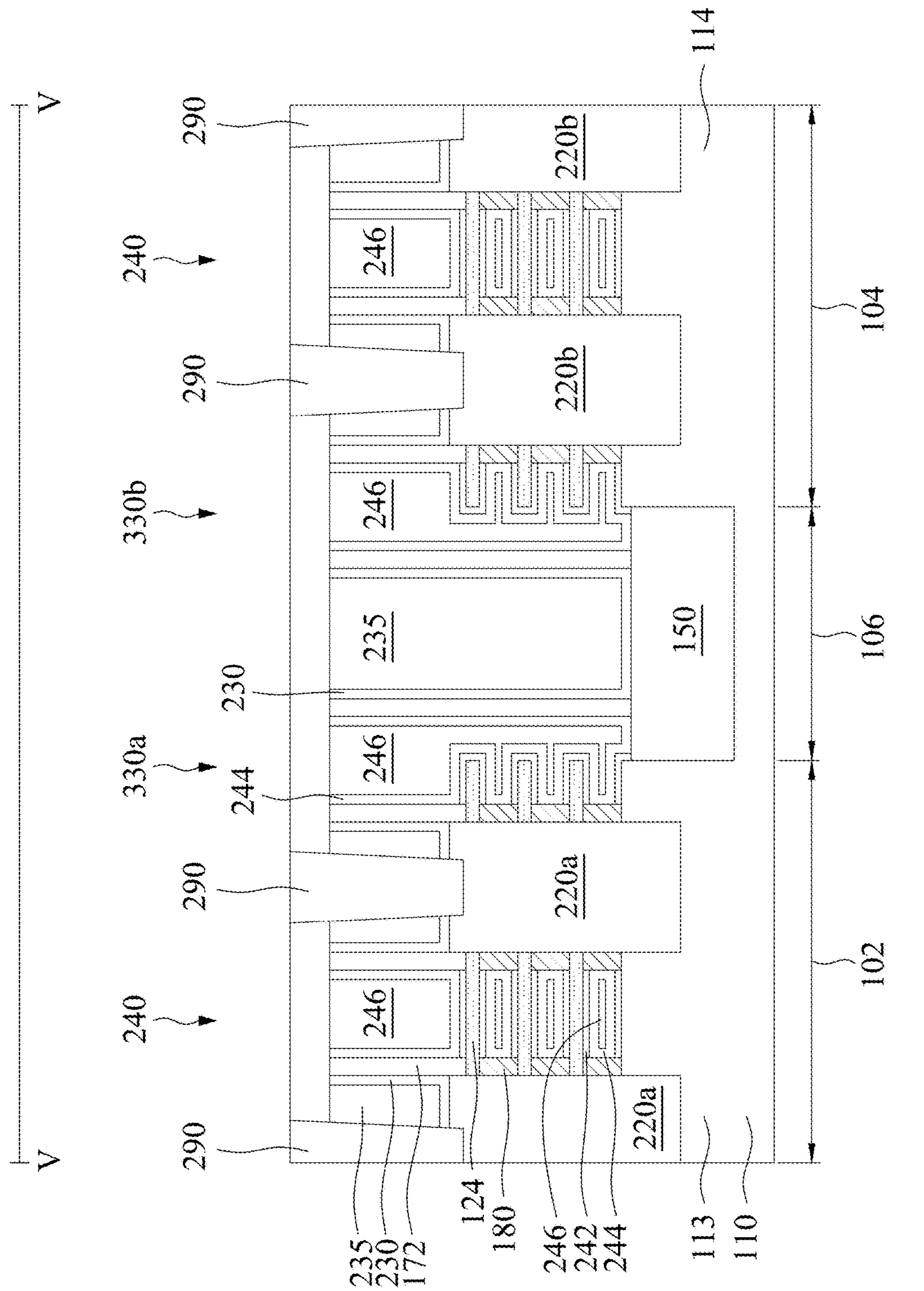
FIG. 34C is a cross-sectional view of the integrated circuit structure taken along the cut V-V in FIG. 34A.

FIG. 34A is a layout diagram of an integrated circuit structure (or semiconductor device) 100*n* in accordance with some embodiments of the present disclosure, FIG. 34B is a top view of the protrusion structure 112, the dielectric fins 140, the isolation structures 150, and dummy gate structures 330*a* and 330*b* of the integrated circuit structure 100*n*, and FIG. 34C is a cross-sectional view of the integrated circuit structure 100*n* taken along the cut V-V in FIG. 34A. The difference between the integrated circuit structure 100*n* and 100*a* pertains to the structure formed over the connecting region 106. In FIGS. 34A and 34B, the isolation structure 150 is formed over the whole connecting region 106. That is, there is no protruding portion 112 (and the dummy epitaxial structure 225 as shown in FIG. 21D) formed over the connecting region 106. As such, the first portions 113 are separated from the second portion 114 by the isolation structure 150. Stated another way, the isolation structure 150 is in contact with the first portions 113 and the second portion 114. Also, the first portions 116 are separated from the second portion 117 by the isolation structure 150. Stated another way, the isolation structure 150 is in contact with the first portions 116 and the second portion 117. Further, the dielectric fins 140 are formed over the first device region 102 and not over the connecting region 106. As shown in FIG. 34A, the dummy gate structure 330*a* covers the dielectric fins 140 but the dummy gate structure 330*b* is spaced apart from the dielectric fins 140. The profile of the protruding structure 112 can be defined during the manufacturing process shown in FIG. 2. That is, the patterned hard mask 130 for patterning the protruding portion 112 of the integrated circuit structure 100*n* omits the third portion 137 (see FIG. 2) and the portions of the first hard masks 132 (see FIG. 2) over the connecting region 106. As shown in FIG. 34C, the isolation structure 150 is in contact with the first portion 113 and the second portion 114 of the protruding structure 112. Moreover, the dummy gate structures 330*a* and 330*b* are formed on the edge of the fin structures. These polysilicon on OD edge ("PODE") structures are used to protect the ends of the fin structures during processing. That is, the PODE gate structures 330*a* and 330*b* are not electrically connected as gates for the integrated circuit structures but are instead "dummy" structures, having no function in the circuit. The PODE structures cover and protect the ends of the fin structures, providing additional reliability during processing. As shown in FIG. 34C, each of the dummy gate structures 330*a* and 330*b* is a metal gate structure including the interfacial layer 242, the high-k gate dielectric layer 244, and the work function metal layer 246 and/or 248. The structure of the integrated circuit structure 100*n* over the first device region 102 and the second device region 104 are similar to or the same as the structure illustrated in FIGS. 21A and 21E, respectively. Other features of the integrated circuit structure 100*n* are similar to or the same as those of the integrated circuit structure 100*a* shown in FIGS. 1 and 21A-21F, and therefore, a description in this regard will not be provided hereinafter.

Figure 35A:
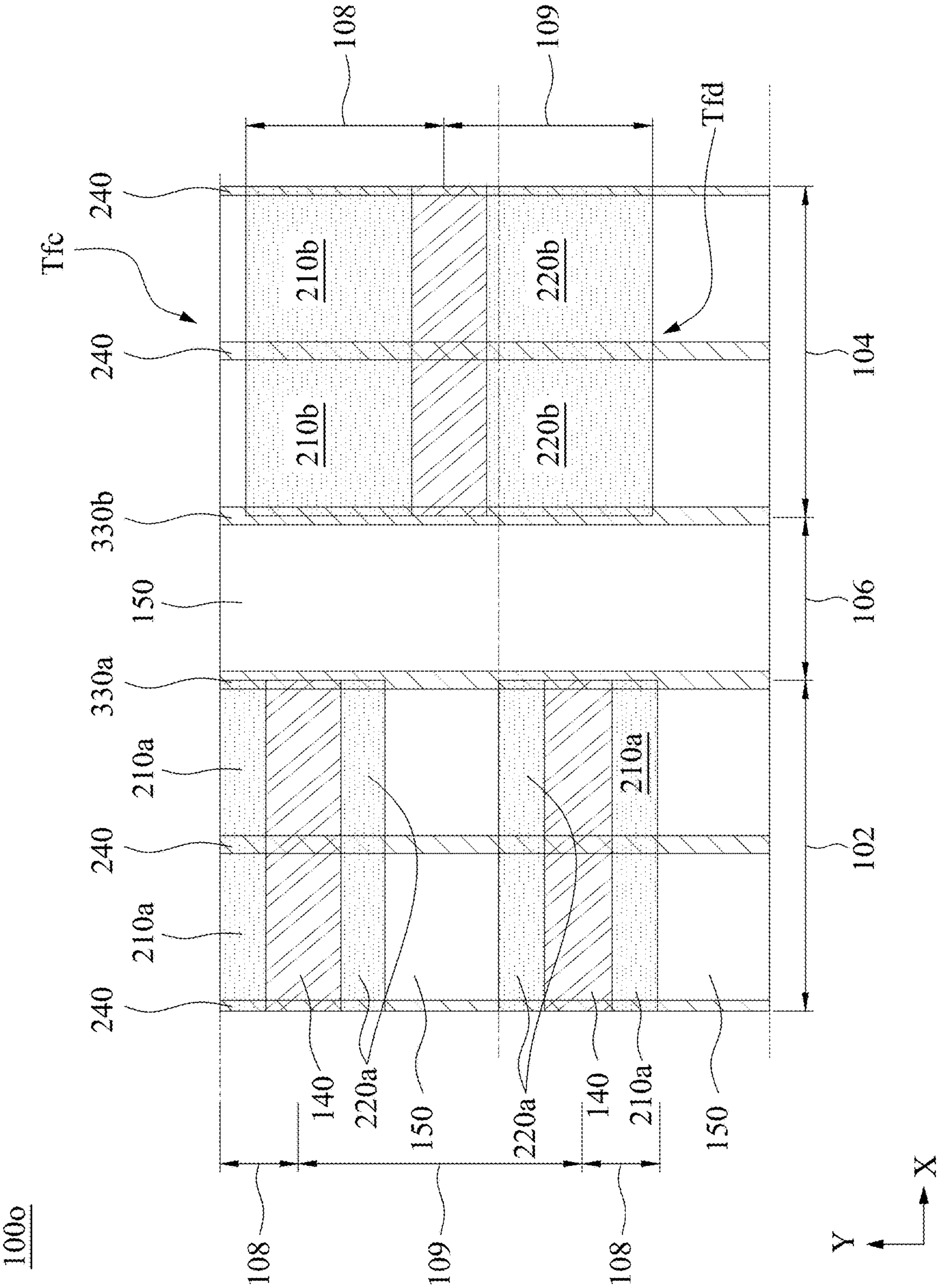
FIG. 35A is a layout diagram of an integrated circuit structure (or semiconductor device) in accordance with some embodiments of the present disclosure.
Figure 35B:
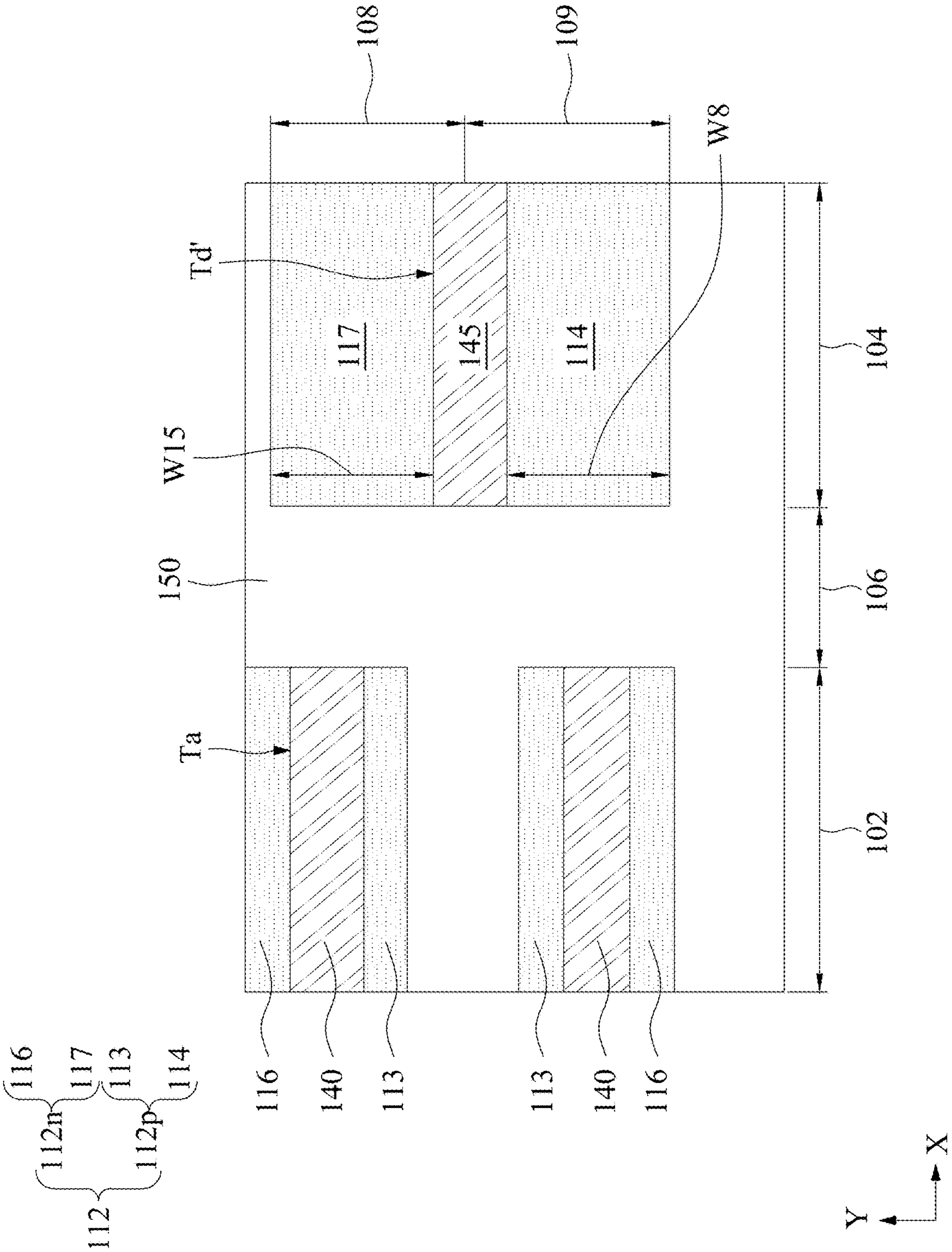
FIG. 35B is a top view of the protrusion structure, the dielectric fins, the isolation structures, and the dummy gate structures of the integrated circuit structure.

FIG. 35A is a layout diagram of an integrated circuit structure (or semiconductor device) 100*o* in accordance with some embodiments of the present disclosure, and FIG. 35B is a top view of the protrusion structure 112, the dielectric fins 140 and 145, the isolation structures 150, and the dummy gate structures 330*a* and 330*b* of the integrated circuit structure 100*o*. The difference between the integrated circuit structure 100*o* and 100*n* pertains to the structure formed over the second device region 104. Specifically, the second portion 117 of the N-type structure 112*n* and the second portion 114 of the P-type structure 112*p* are formed over the second device region 104. The width W8 of the second portion 114 is substantially equal to the width W15 of the first portion 117. A trench Td' therebetween is narrower than the trenches Td shown in FIGS. 3A and 3D. For example, the trench Td' may be as wide as the trench Ta, such that a dielectric fin 145 is formed between the second portions 114 and 117. Therefore, transistors (or nanostructure devices) Tfc and Tfd are formed over the second device region 104. For example, the transistors Tfc and Tfd are fork-sheet devices. Moreover, the dummy gate structure 330*a* covers the dielectric fins 140, and the dummy gate structure 330*b* covers the dielectric fin 145. The structure of the integrated circuit structure 100*o* over the first device region 102 and the connecting region 106 are similar to or the same as the structure illustrated in FIG. 34C. Other features of the integrated circuit structure 100*o* are similar to or the same as those of the integrated circuit structure 100*a* and 100*n* shown in FIGS. 1, 21A-21F, and 34A-34C, and therefore, a description in this regard will not be provided hereinafter.

Figure 36A:
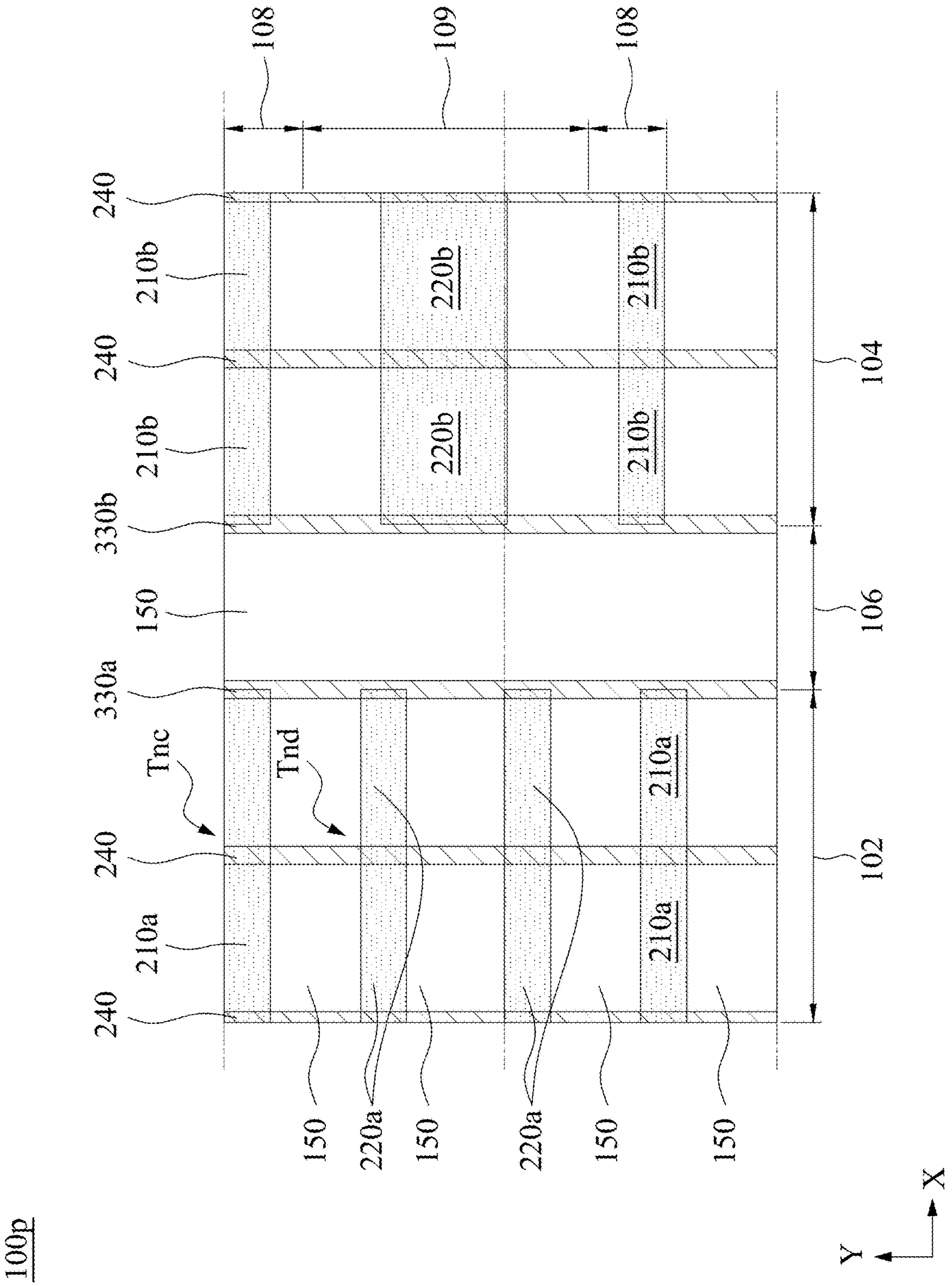
FIG. 36A is a layout diagram of an integrated circuit structure (or semiconductor device) in accordance with some embodiments of the present disclosure.
Figure 36B:
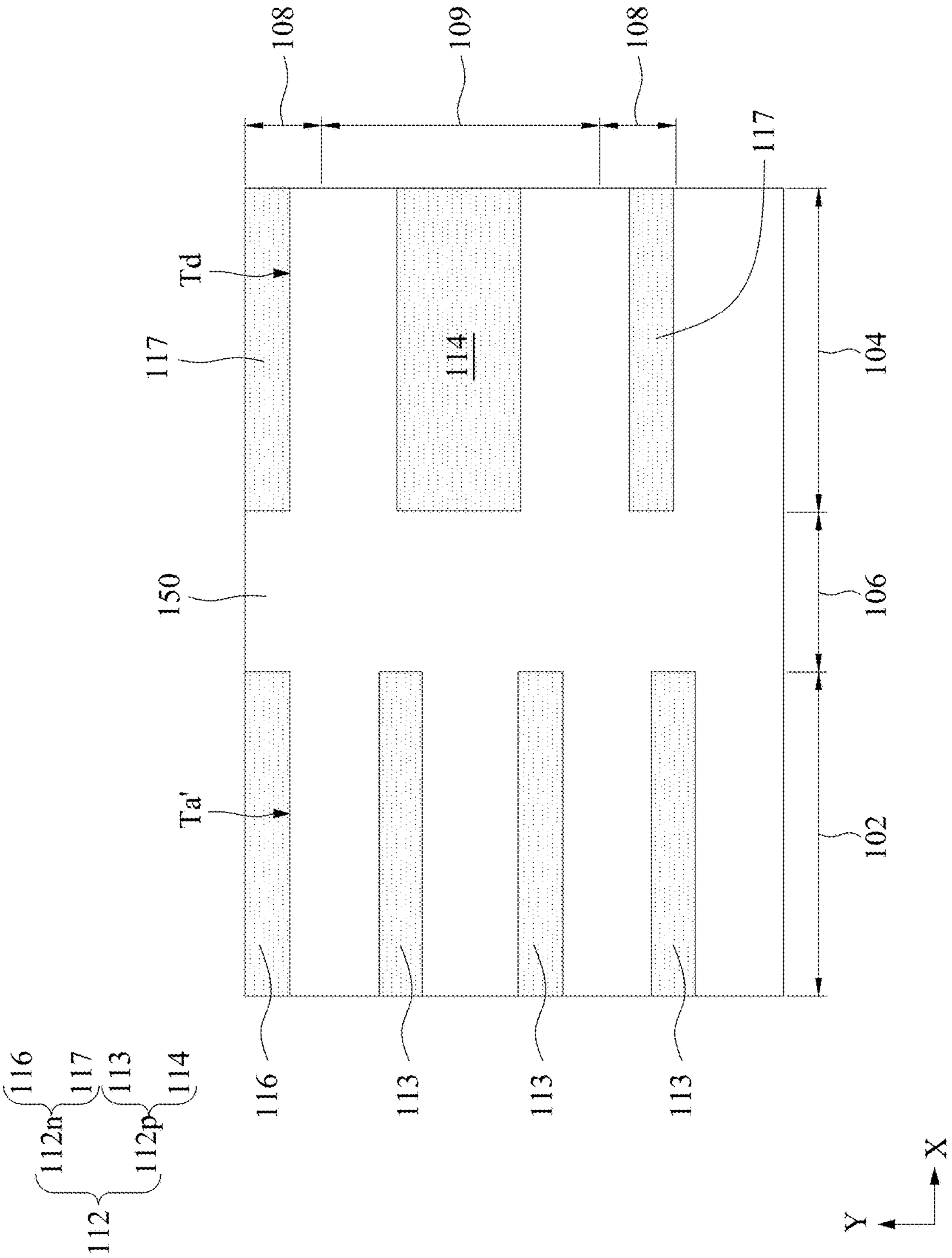
FIG. 36B is a top view of the protrusion structure, the isolation structures, and the dummy gate structures of the integrated circuit structure.

FIG. 36A is a layout diagram of an integrated circuit structure (or semiconductor device) 100*p* in accordance with some embodiments of the present disclosure, and FIG. 36B is a top view of the protrusion structure 112, the isolation structures 150, and the dummy gate structures 330*a* and 330*b* of the integrated circuit structure 100*p*. The difference between the integrated circuit structure 100*p* and 100*n* pertains to the structure formed over the first device region 102. Specifically, the trenches Ta' between the first portions 113 and 116 are wider than the trenches Ta shown in FIGS. 3A and 3B. For example, the trenches Ta' may be as wide as the trench Td. Therefore, transistors (or nanostructure devices) Tnc and Tnd are formed over the first device region 102. For example, the transistors Tnc and Tnd are nanosheet devices. Stated another way, the manufacturing process shown in FIGS. 4-5C (i.e., the formation of the dielectric fins 140/145) can be omitted. The structure of the integrated circuit structure 100*p* over the second device region 104 and the connecting region 106 are similar to or the same as the structure illustrated in FIG. 34C. Other features of the integrated circuit structure 100*p* are similar to or the same as those of the integrated circuit structures 100*a* and 100*n* shown in FIGS. 1, 21A-21F, and 34A-34C, and therefore, a description in this regard will not be provided hereinafter.

Returning to FIG. 1, horizontal dashed lines are shown in the layout diagram. A cell height of the first transistors (i.e., the transistors Tfa and Tfb) formed over the first device region 102 is defined by the adjacent two dashed lines, and a cell height of the second transistors (i.e., the transistors Tna and Tnb) formed over the second device region 104 is defined by the topmost and bottommost dashed lines. Therefore, for the integrated circuit structure 100*a*, the cell height of the second transistors over the second device region 104 is about twice the cell height of the first transistors over the first device region 102.

However, the cell heights of the devices over the first device region 102 and the second device region 104 may be varied. For example, for the integrated circuit structures 100*a*-100*i* and 100*n*-100*p*, the cell height of the second transistors over the second device region 104 is about twice the cell height of the first transistors over the first device region 102. Further, for the integrated circuit structures 100*j*-100*m*, the cell height of the second transistors over the second device region 104 is substantially the same as the cell height of the first transistors over the first device region 102. Still, in some other embodiments, the cell height of the second transistors over the second device region 104 is integer multiple times of the cell height of the first transistors over the first device region 102. Alternatively, the cell height of the second transistors over the second device region 104 is about 1.3 times to about 5 times the cell height of the first transistors over the first device region 102.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the structures formed over the connecting region improve the layout-dependent effects of the integrated circuit structures. The improved OD designs of the integrated circuit structures can be patterned by using a single lithography process, such that additional masks and lithography process can be omitted. Also, the improved OD designs can be applied to various devices (e.g., fork-sheet transistors and/or nanosheet transistors with different sizes).

According to some embodiments, a device includes a substrate, a first nanostructure device, a second nanostructure device, a dielectric fin, an isolation structure, a first dielectric gate structure, and a second dielectric gate structure. The substrate has a first device region, a second device region, and a connecting region directly between the first device region and the second device region. The first nanostructure device is over the first device region. The second nanostructure device is over the second device region. The dielectric fin is over the first device region and the connecting region and is in contact with a gate structure of the first nanostructure device. The isolation structure is over the second device region and is in contact with the second nanostructure device and the dielectric fin. The first dielectric gate structure is over the substrate and between the first device region and the connecting region. The second dielectric gate structure is over the substrate and between the second device region and the connecting region.

According to some embodiments, a method includes depositing an epitaxial stack over a substrate, wherein the epitaxial stack includes first semiconductor layers and second semiconductor layers stacked alternately; patterning the epitaxial stack to form a first fin structure over a first device region of the substrate, a second fin structure over a second device region, and a third fin structure over a connecting region, wherein the third fin structure interconnects the first fin structure and the second fin structure, and the first fin structure is offset from the second fin structure; forming a dielectric fin over the substrate and in contact with the first fin structure and the second fin structure but spaced apart from the third fin structure; forming a first transistor over the first device region, wherein the second semiconductor layers of the first fin structure are channel layers of the first transistor; forming a second transistor over the second device region, wherein the second semiconductor layers of the second fin structure are channel layers of the second transistor; and forming a first dielectric gate structure over the substrate and between the first device region and the connecting region and a second dielectric gate structure over the substrate and between the second device region and the connecting region.

According to some embodiments, a device includes a substrate, a first nanostructure device, a second nanostructure device, and an isolation structure. The substrate has a first device region, a connecting region, and a second device region sequentially arranged in a first direction in a top view. The first nanostructure device is over a first portion of a protruding structure protruding from substrate over the first device region. A gate structure of the first nanostructure device extends in a second direction different from the first direction in the top view. The second nanostructure device is over a second portion of the protruding structure protruding from substrate over the second device region. A gate structure of the second nanostructure device extends in the second direction, and the first nanostructure device and the second nanostructure device have different sizes in the second direction. The isolation structure is over the connecting region and in contact with the first portion and the second portion of the protruding structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

depositing an epitaxial stack over a substrate, wherein the epitaxial stack comprises first semiconductor layers and second semiconductor layers stacked alternately;

patterning the epitaxial stack to form a first fin structure over a first device region of the substrate, a second fin structure over a second device region, and a third fin structure over a connecting region, wherein the third fin structure interconnects the first fin structure and the second fin structure, and the first fin structure is offset from the second fin structure;

forming a dielectric fin over the substrate and in contact with the first fin structure and the second fin structure but spaced apart from the third fin structure;

forming a first transistor over the first device region, wherein the second semiconductor layers of the first fin structure are channel layers of the first transistor;

forming a second transistor over the second device region, wherein the second semiconductor layers of the second fin structure are channel layers of the second transistor; and forming a first dielectric gate structure over the substrate and between the first device region and the connecting region and a second dielectric gate structure over the substrate and between the second device region and the connecting region.

2. The method of claim 1, wherein a width of the first fin structure is different from a width of the second fin structure.

3. The method of claim 1, wherein a width of the third fin structure is greater than a width of the first fin structure.

4. The method of claim 1, further comprising:

removing a portion of the third fin structure; and after removing the portion of the third fin structure, depositing a dummy epitaxial structure over the connecting region, wherein the dummy epitaxial structure is in contact with the dielectric fin.

5. The method of claim 1, further comprising:

forming a dummy gate structure over the connecting region, and the dummy gate structure comprises a metal gate material covering the first semiconductor layers and the second semiconductor layers of the third fin structure.

6. The method of claim 1, wherein forming the first dielectric gate structure over the substrate comprises:

forming a polysilicon gate structure over the substrate and between the first device region and the connecting region;

forming gate spacers to surround the polysilicon gate structure;

removing the polysilicon gate structure and portions of the first fin structure and the third fin structure covered by the polysilicon gate structure to form an opening between the gate spacers, wherein a portion of the dielectric fin is etched during the formation of the opening; and filling the opening with a dielectric material to form the first dielectric gate structure.

7. The method of claim 1, wherein patterning the epitaxial stack is further to form a fourth fin structure over the first device region of the substrate, and the third fin structure is further connected to the fourth fin structure.

8. The method of claim 7, further comprising forming an isolation structure between the first fin structure and the fourth fin structure.

9. The method of claim 8, wherein the first fin structure is formed between the isolation structure and the dielectric fin, and a width of the isolation structure is greater than a width of the dielectric fin.

10. A method comprising:

depositing a stacking structure over a substrate, wherein the stacking structure comprises first semiconductor layers and second semiconductor layers alternately arranged;

forming a mask layer over the stacking structure, wherein the mask layer comprises:

a first hard mask extending in a first direction and having a first width in a second direction different from the first direction in a top view;

a second hard mask extending in the first direction and having a second width greater than the first width in the second direction in the top view; and a third hard mask interconnecting the first hard mask and the second hard mask and having a third width different from the first width and the second width in the second direction in the top view;

patterning the stacking structure by using the mask layer as an etch mask to form a first fin structure patterned from the first hard mask, a second fin structure patterned from the second hard mask, and a third fin structure patterned from the third hard mask;

forming a dielectric fin on a sidewall of the first fin structure and a sidewall of the third fin structure, wherein sidewalls of the second fin structure are uncovered by the dielectric fin;

forming a first isolation structure on another sidewall of the first fin structure;

forming second isolation structures on the sidewalls of the second fin structure;

forming a first transistor over the first fin structure, wherein the second semiconductor layers in the first fin structure are channel layers of the first transistor; and forming a second transistor over the second fin structure, wherein the second semiconductor layers in the second fin structure are channel layers of the second transistor.

11. The method of claim 10, wherein the third width of the third hard mask is greater than the first width of the first hard mask and the second width of the second hard mask.

12. The method of claim 10, wherein a sidewall of the third hard mask is misaligned with a sidewall of the second hard mask.

13. The method of claim 10, wherein a portion of the first isolation structure is in contact with the third fin structure.

14. The method of claim 10, wherein the second semiconductor layers of the first transistor is in contact with the dielectric fin.

15. The method of claim 10, further comprising:

forming a dielectric gate structure between the first fin structure and the third fin structure after forming the first transistor.

16. The method of claim 10, further comprising:

forming a dielectric gate structure between the second fin structure and the third fin structure after forming the second transistor.

17. A method comprising:

depositing a stacking structure over a substrate, wherein the stacking structure comprises first semiconductor layers and second semiconductor layers alternately arranged;

patterning the stacking structure to form a first fin structure extending in a first direction, a second fin structure extending in the first direction in a top view, and a third fin structure interconnecting the first fin structure and the second fin structure, wherein the first fin structure, the third fin structure, and the second fin structure are arranged in the first direction and have different widths in a second direction different from the first direction in the top view, and a sidewall of the third fin structure is substantially aligned with a sidewall of the first fin structure and is misaligned with a sidewall of the second fin structure;

forming a first transistor over the first fin structure, wherein the second semiconductor layers in the first fin structure are channel layers of the first transistor;

forming a second transistor over the second fin structure, wherein the second semiconductor layers in the second fin structure are channel layers of the second transistor; and forming a dielectric gate structure between the second fin structure and the third fin structure after forming the second transistor.

18. The method of claim 17, further comprising forming a dielectric fin in contact with the sidewall of the first fin structure and the sidewall of the third fin structure.

19. The method of claim 18, further comprising forming an isolation structure on the sidewall of the second fin structure.

20. The method of claim 19, wherein the isolation structure is in contact with the dielectric fin.

* * * * *